United States Patent [19]
Nakagawa et al.

[11] Patent Number: 5,640,040
[45] Date of Patent: Jun. 17, 1997

[54] HIGH BREAKDOWN VOLTAGE SEMICONDUCTOR DEVICE

[75] Inventors: Akio Nakagawa, Hiratsuka; Norio Yasuhara, Yokohama; Tomoko Matsudai, Tokyo; Yoshihiro Yamaguchi, Urawa; Ichiro Omura, Yokohama; Hideyuki Funaki, Tokyo, all of Japan

[73] Assignee: Kabushiki Kaisha Toshiba, Kawasaki, Japan

[21] Appl. No.: 481,097

[22] Filed: Jun. 7, 1995

Related U.S. Application Data

[63] Continuation of Ser. No. 85,056, Jul. 2, 1993, Pat. No. 5,438,220, which is a continuation-in-part of Ser. No. 829,214, Jan. 31, 1992, Pat. No. 5,343,067, which is a continuation-in-part of Ser. No. 642,565, Jan. 18, 1991, Pat. No. 5,241,210, which is a continuation-in-part of Ser. No. 236,746, Aug. 26, 1988, abandoned, which is a continuation-in-part of Ser. No. 161,102, Feb. 26, 1988, abandoned.

[30] Foreign Application Priority Data

| Feb. 26, 1987 | [JP] | Japan | 62-43564 |
| Jul. 29, 1987 | [JP] | Japan | 62-189420 |
| Jul. 4, 1988 | [JP] | Japan | 63-166403 |
| Jan. 31, 1991 | [JP] | Japan | 3-31720 |
| Mar. 28, 1991 | [JP] | Japan | 3-90068 |
| Apr. 16, 1991 | [JP] | Japan | 3-109605 |
| Sep. 20, 1991 | [JP] | Japan | 3-268970 |
| Jul. 2, 1992 | [JP] | Japan | 4-175777 |
| Mar. 11, 1993 | [JP] | Japan | 5-50534 |

[51] Int. Cl.$^6$ .................. H01L 23/58
[52] U.S. Cl. .................. 257/487; 257/491; 257/492
[58] Field of Search .................. 257/487, 492, 257/493, 525, 524, 491

[56] References Cited

U.S. PATENT DOCUMENTS 5,448,100  9/1995  Beasom .................. 257/524

Primary Examiner—Sara W. Crane
Assistant Examiner—Roy Potter
Attorney, Agent, or Firm—Oblon, Spivak, McClelland, Maier & Neustadt, P.C.

[57] ABSTRACT

A high breakdown voltage semiconductor device comprising a semiconductor substrate, an insulating layer formed on the semiconductor substrate, an active layer formed on the insulating layer and made of a high resistance semiconductor of a first conductivity type, a first impurity region of the first conductivity type formed in the active layer, and a second impurity region of a second conductivity type formed in the active layer and spaced apart from the first impurity region by a predetermined distance. The first impurity region is formed of diffusion layers. The diffusion layers are superimposed one upon another and differ in diffusion depth or diffusion window width, or both.

5 Claims, 90 Drawing Sheets

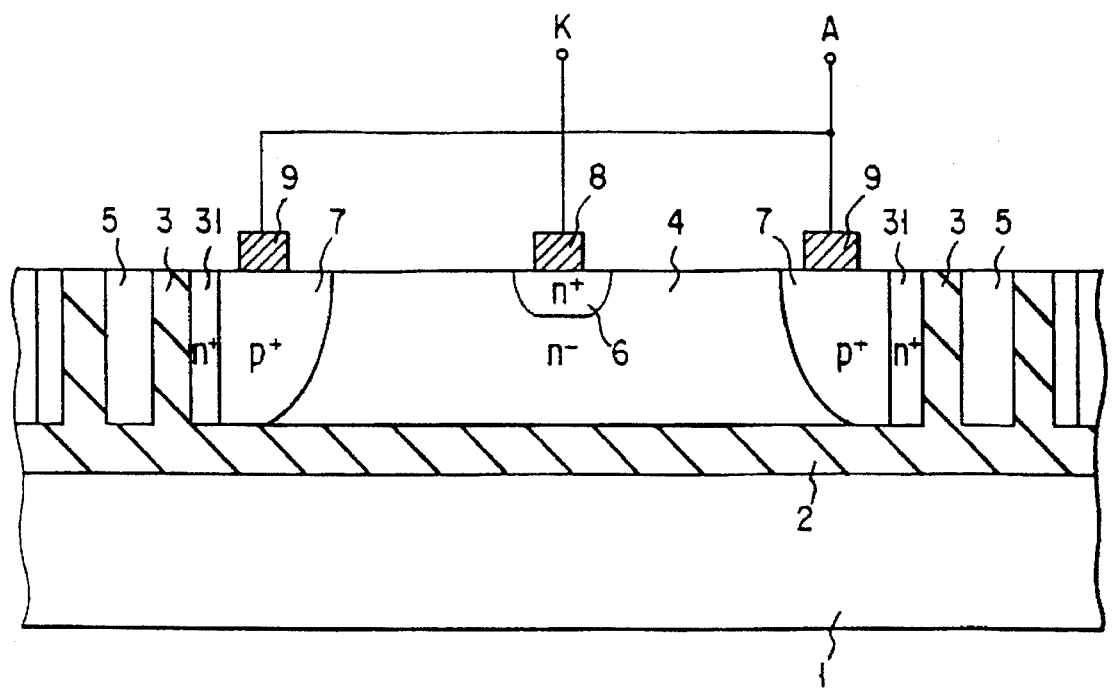
F I G. 3
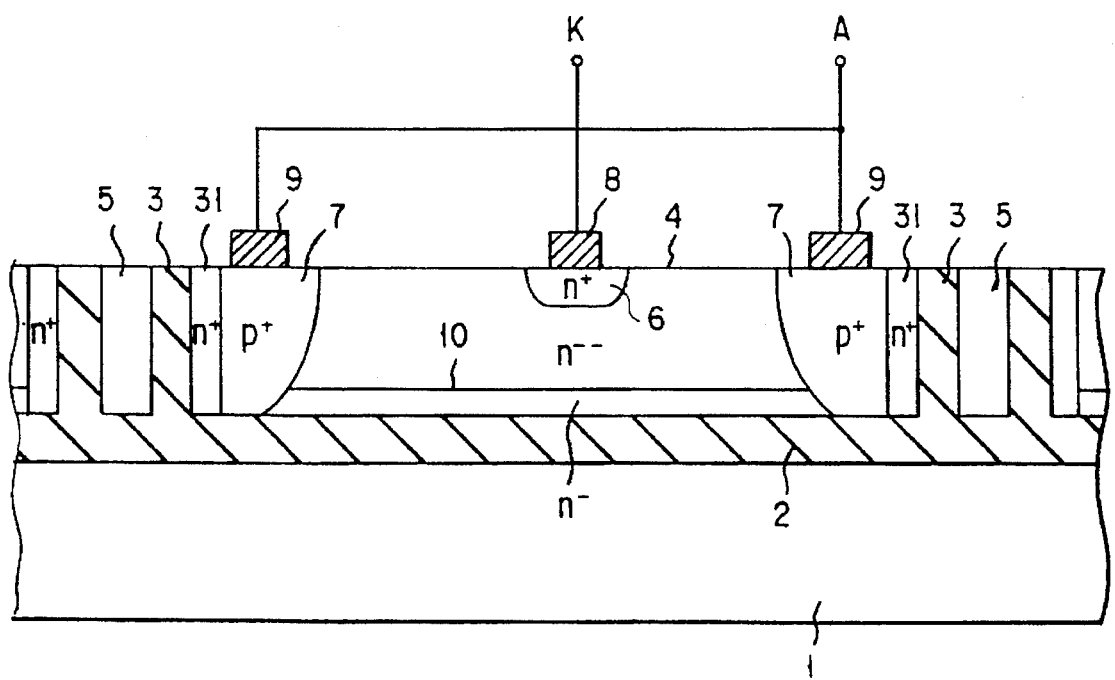
F I G. 4

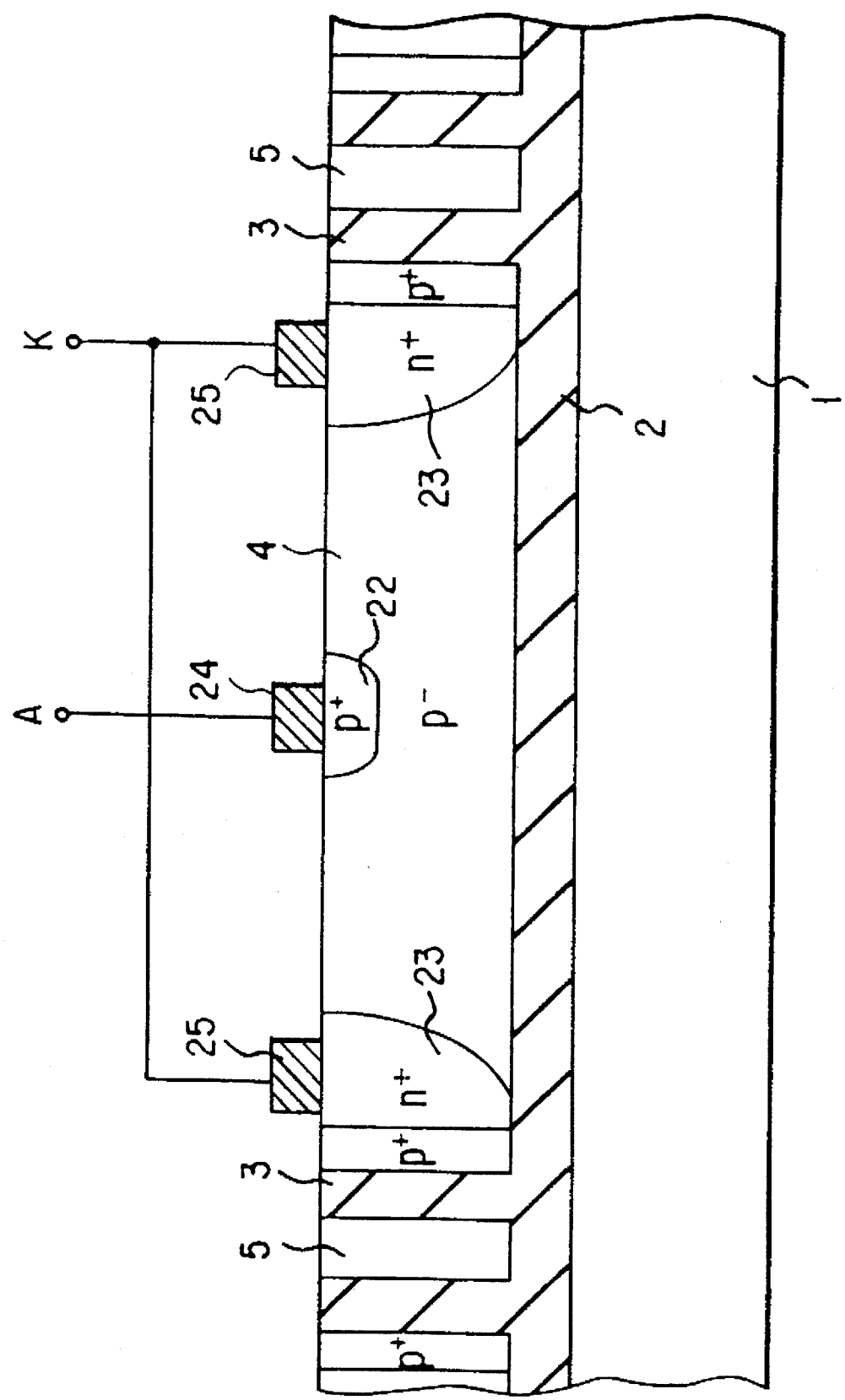
F I G. 5

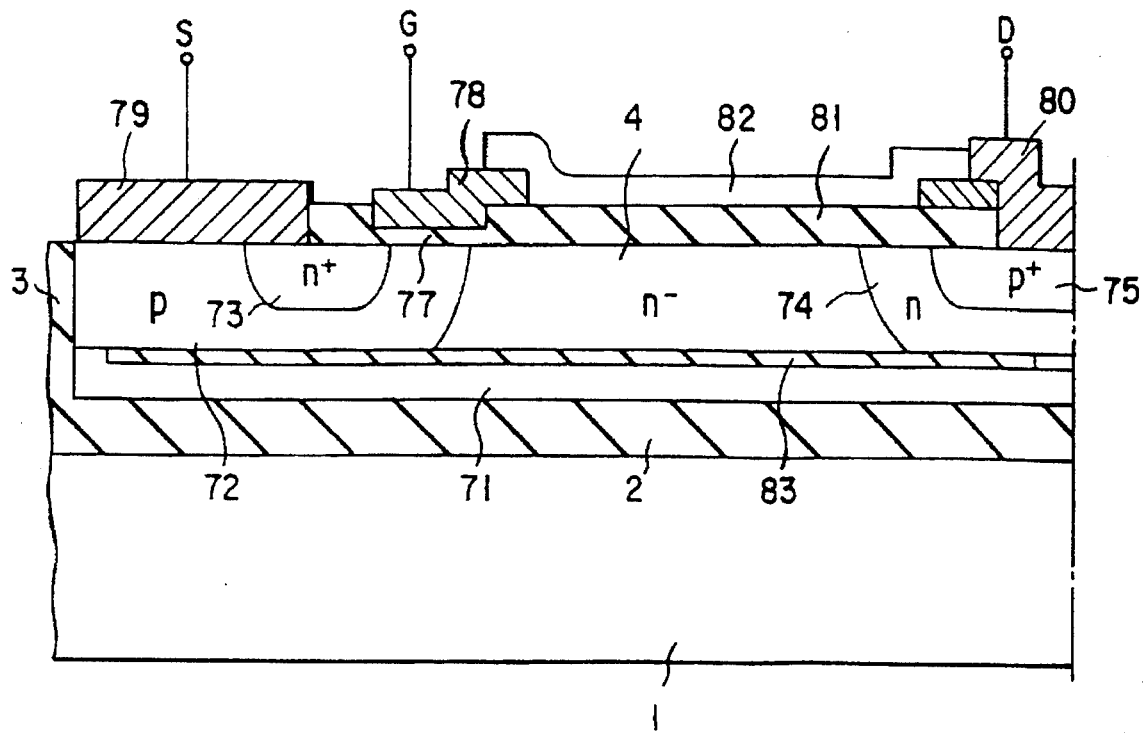
F I G. 6
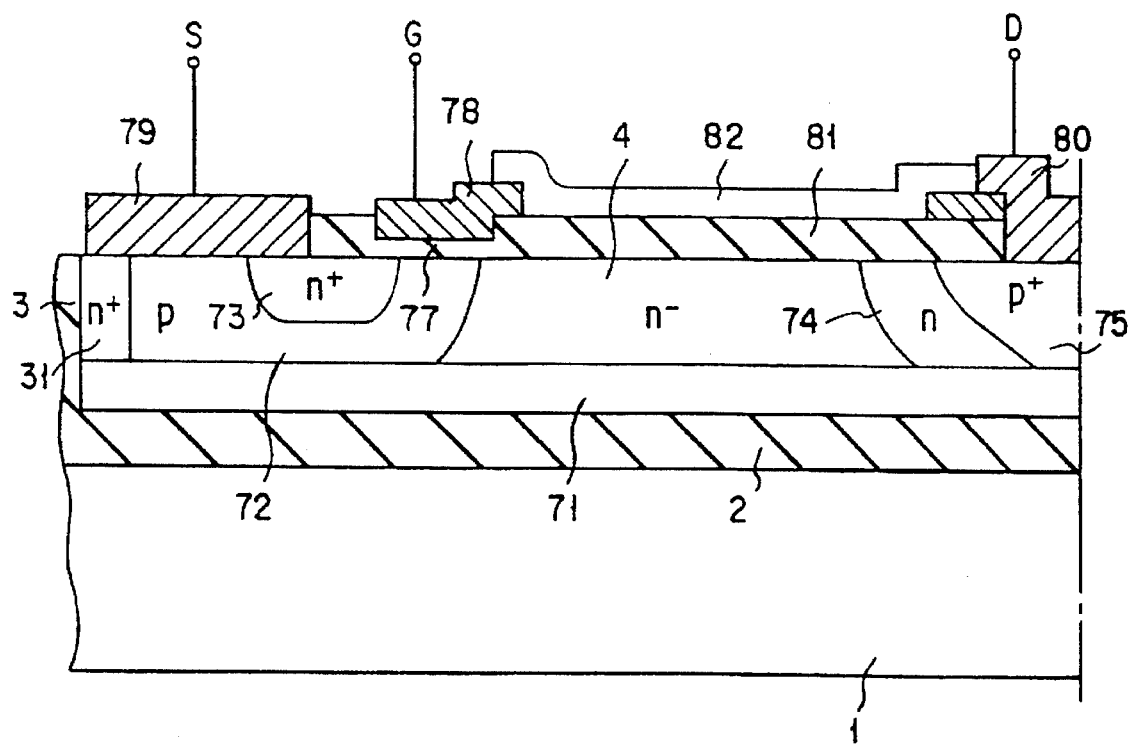
F I G. 7

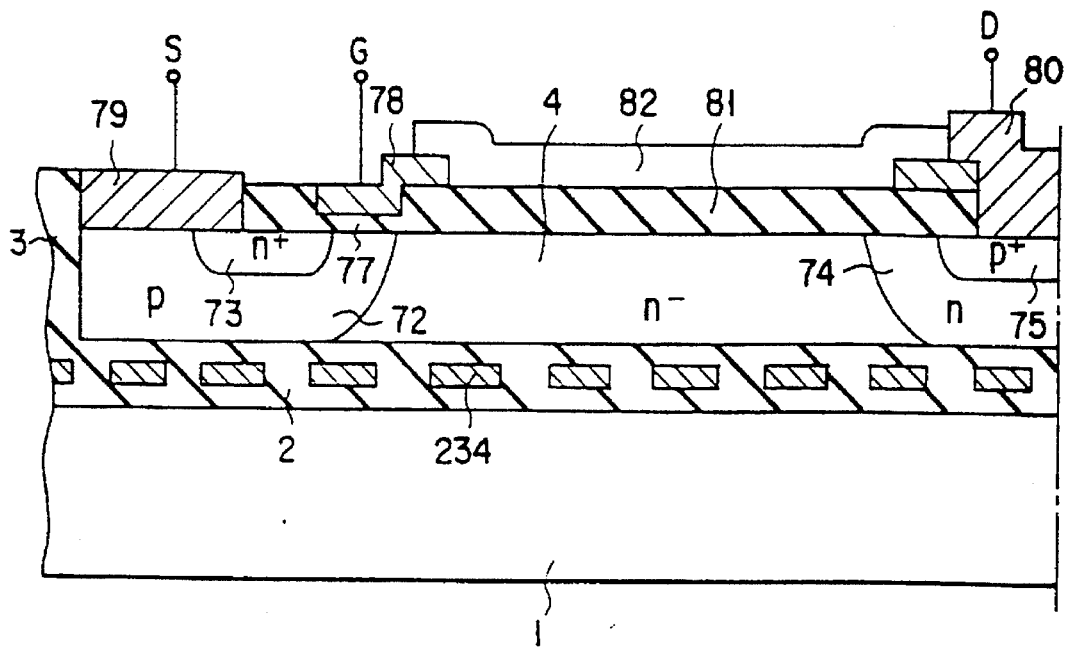
F I G. 15
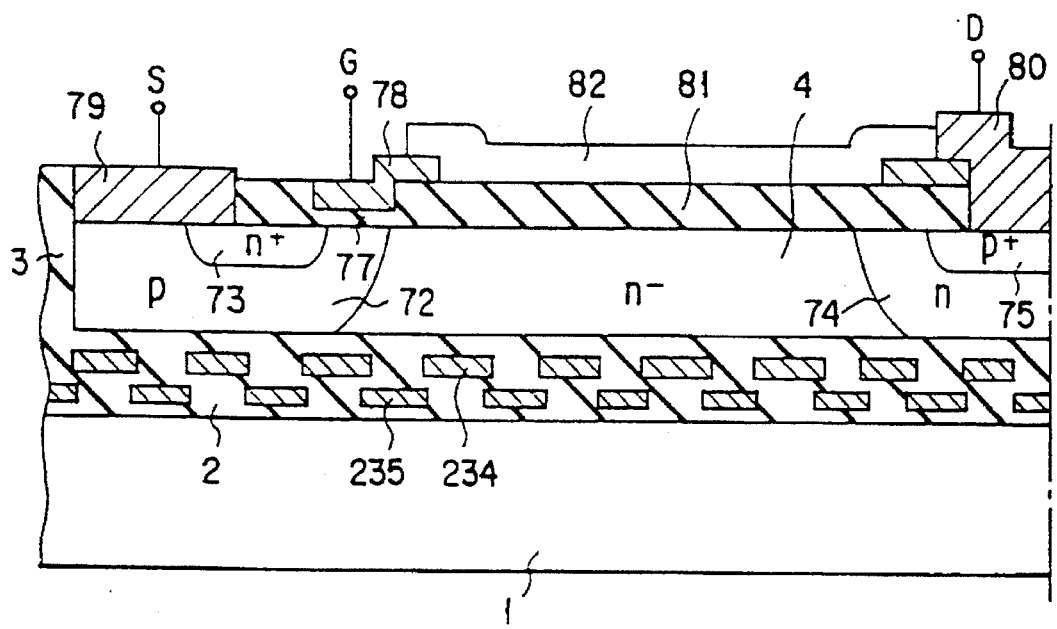
F I G. 16

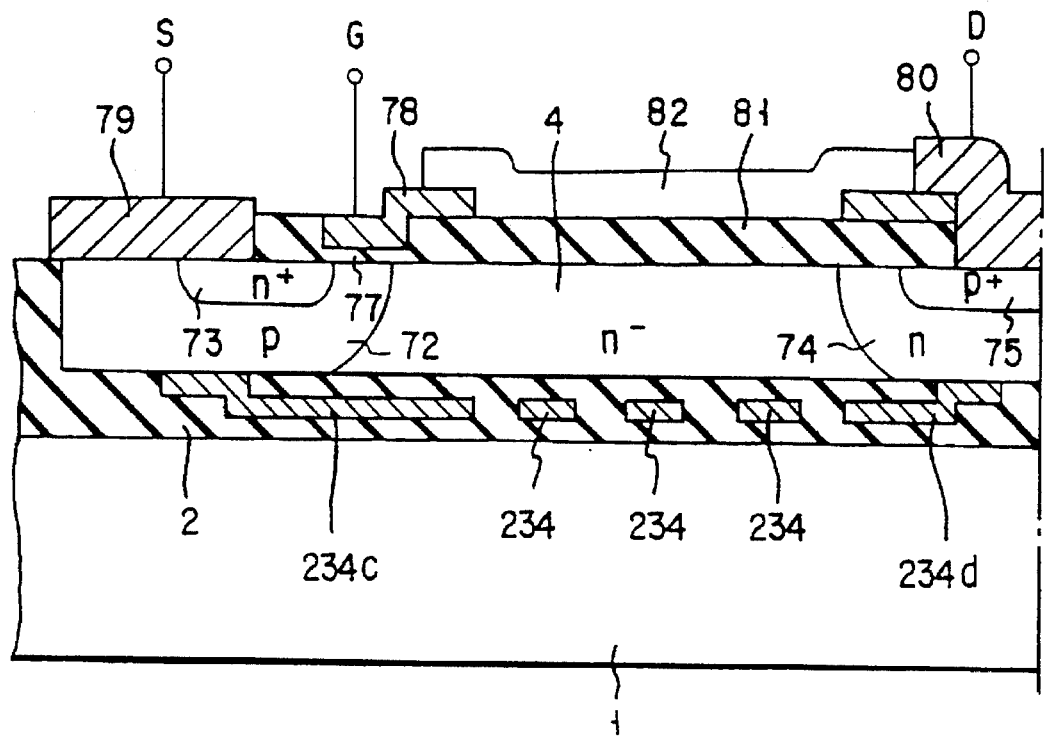
F I G. 22
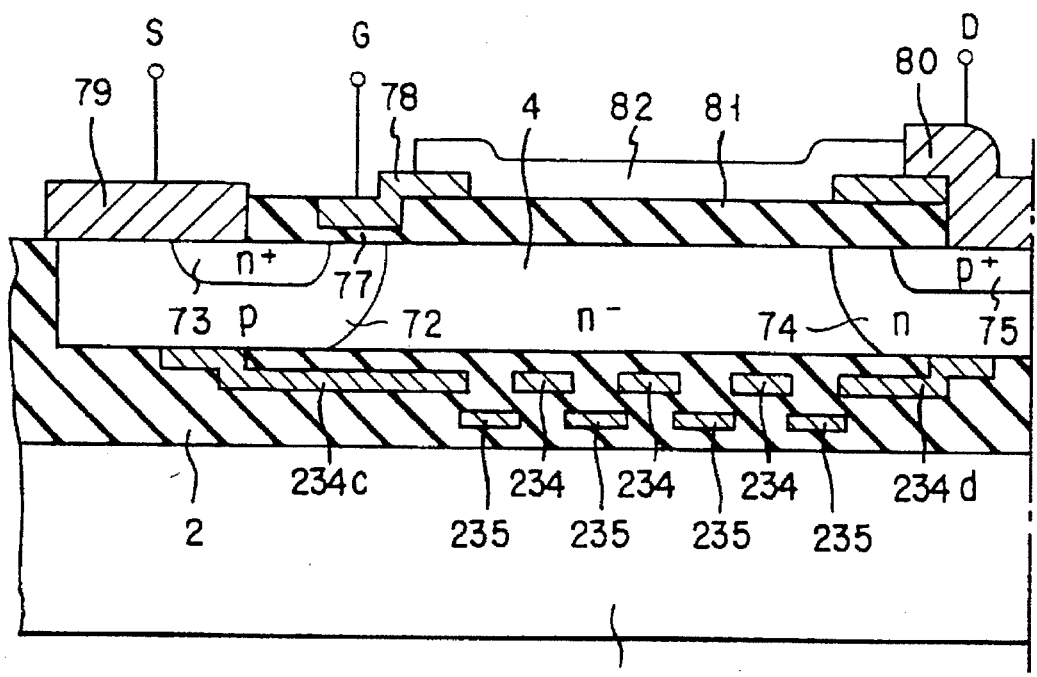
F I G. 23

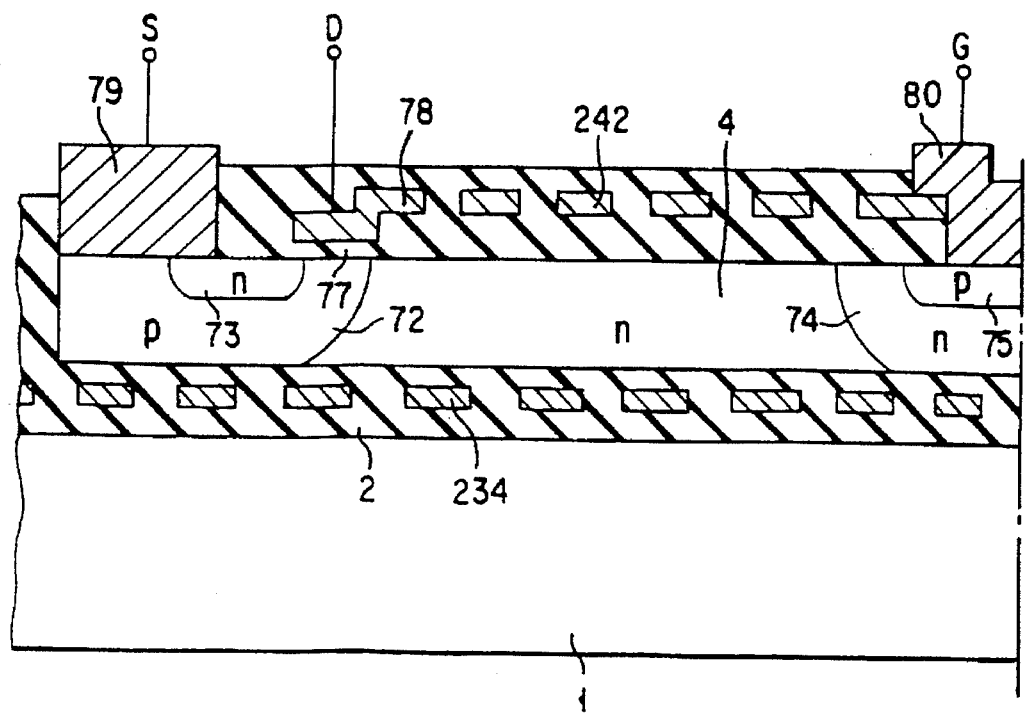
F I G. 24
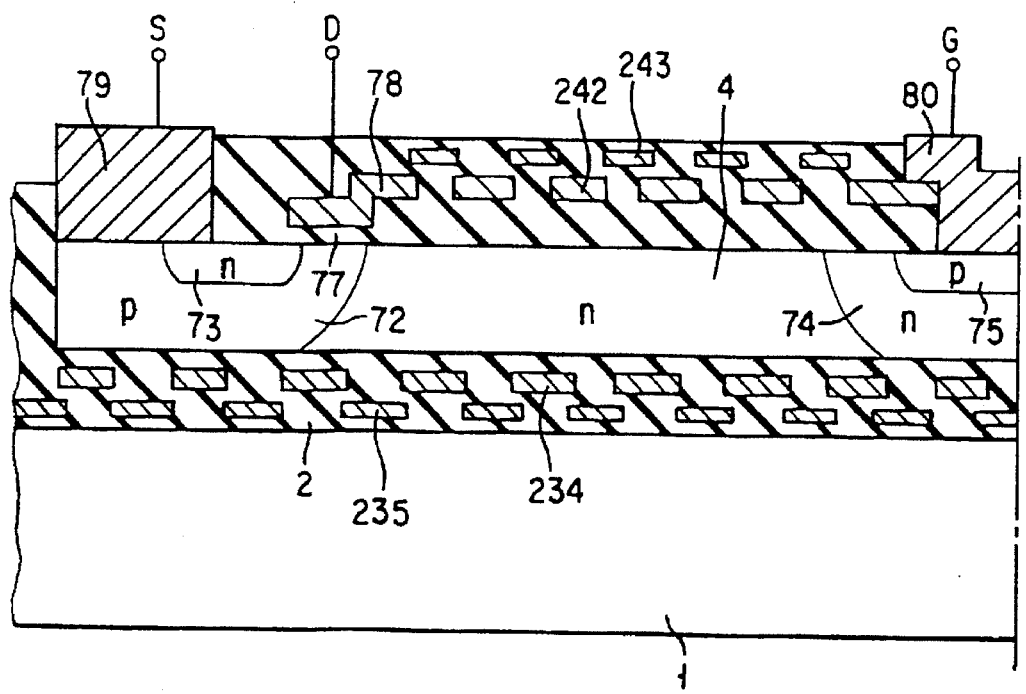
F I G. 25

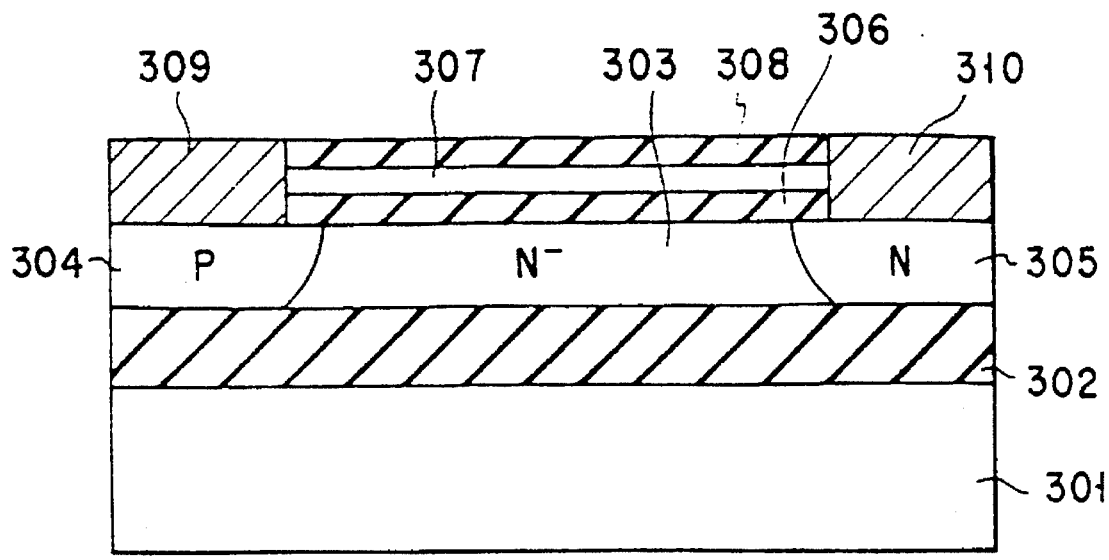
F I G. 26
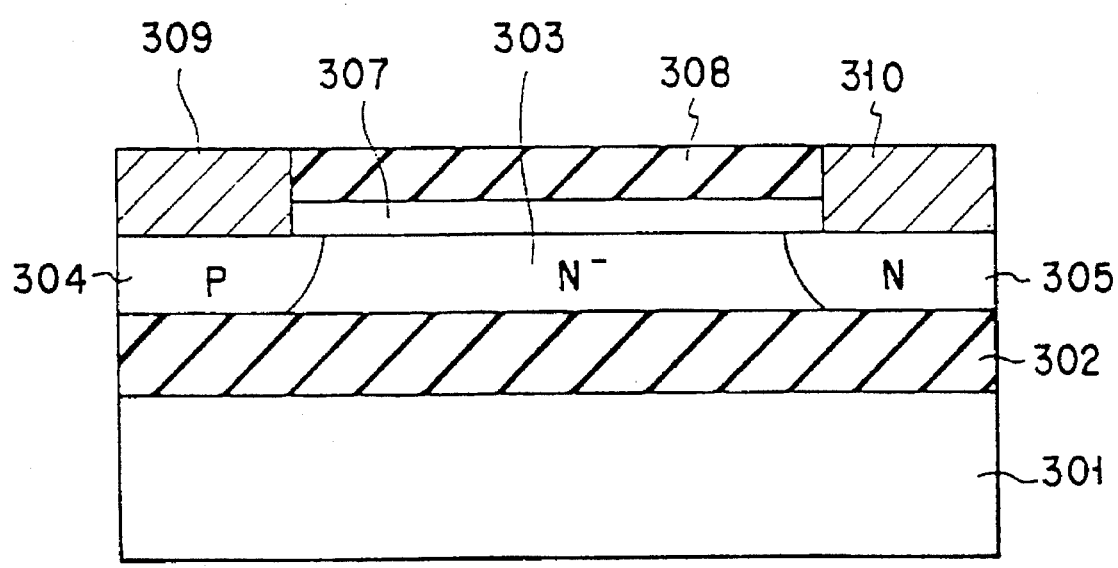
F I G. 27

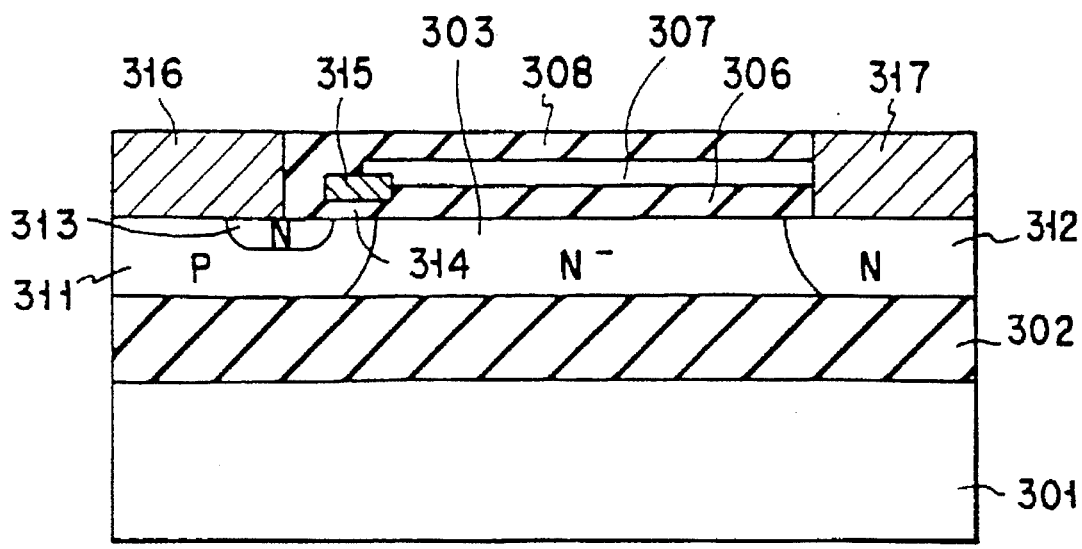
F I G. 28
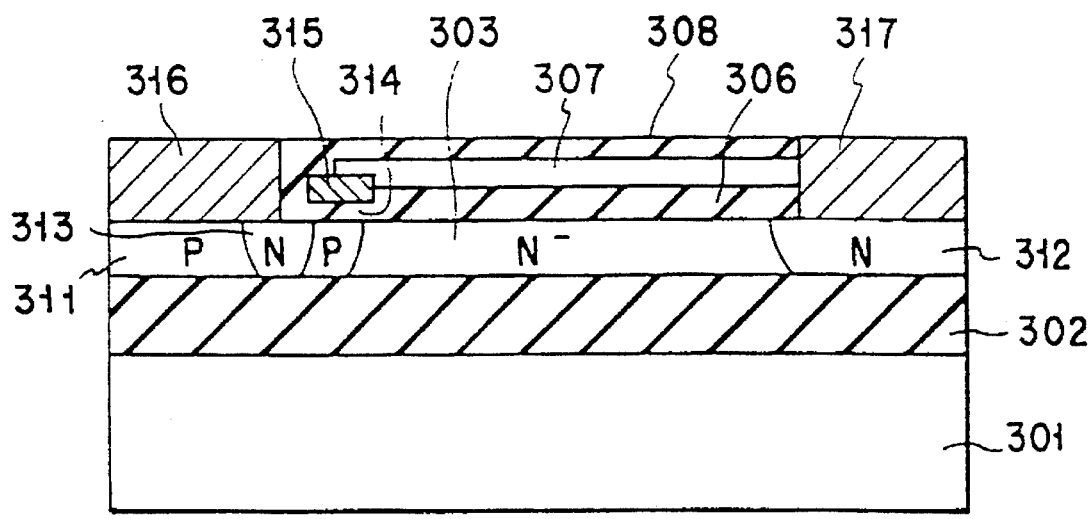
F I G. 29

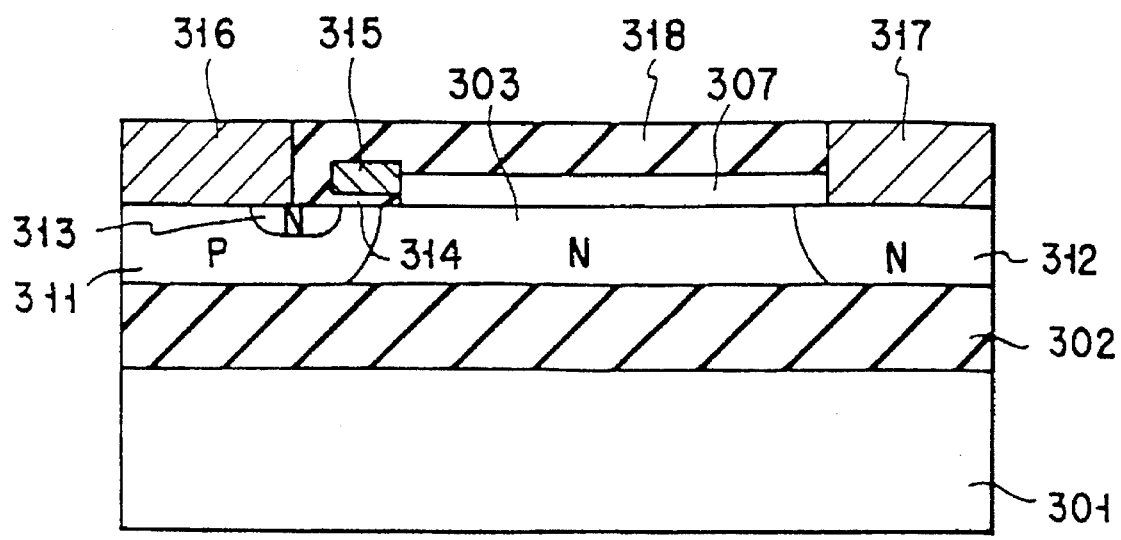
F I G. 30
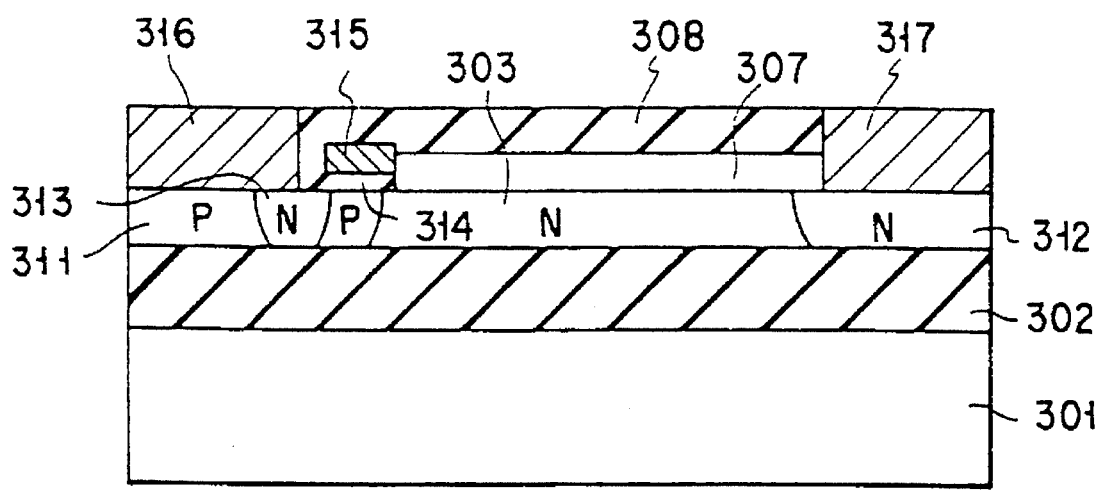
F I G. 31

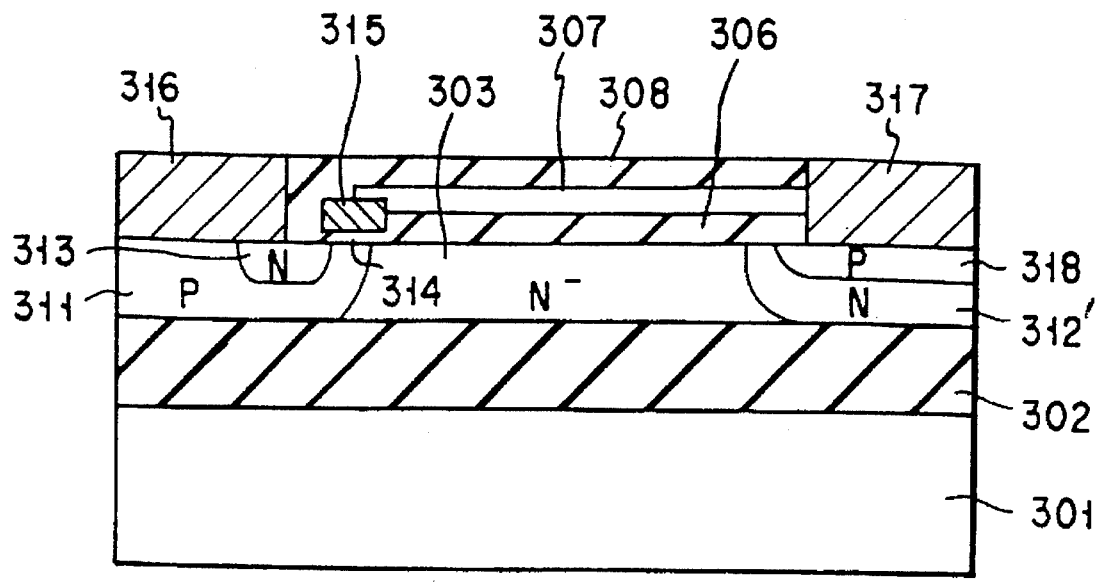
F I G. 32
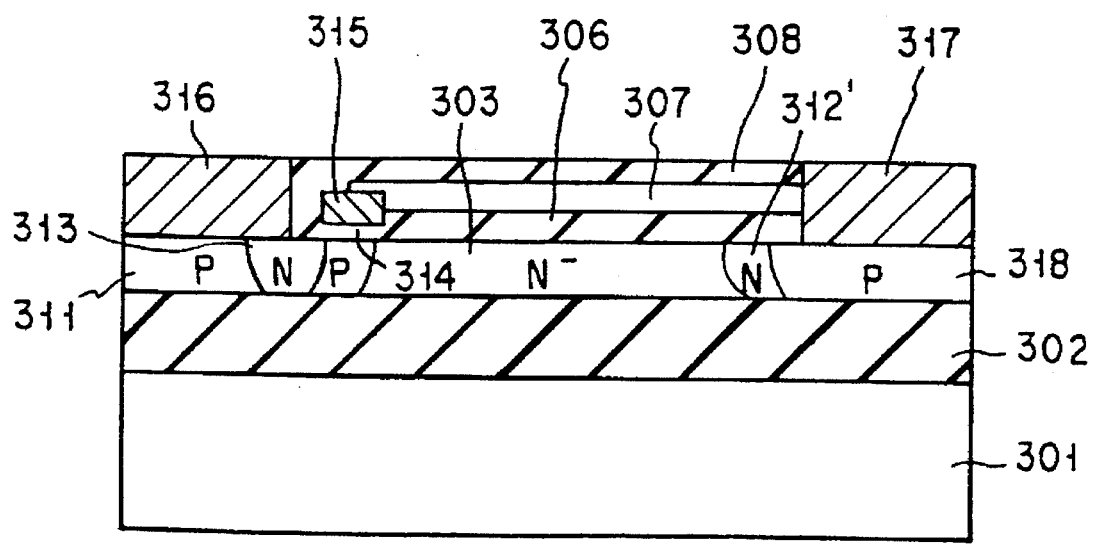
F I G. 33

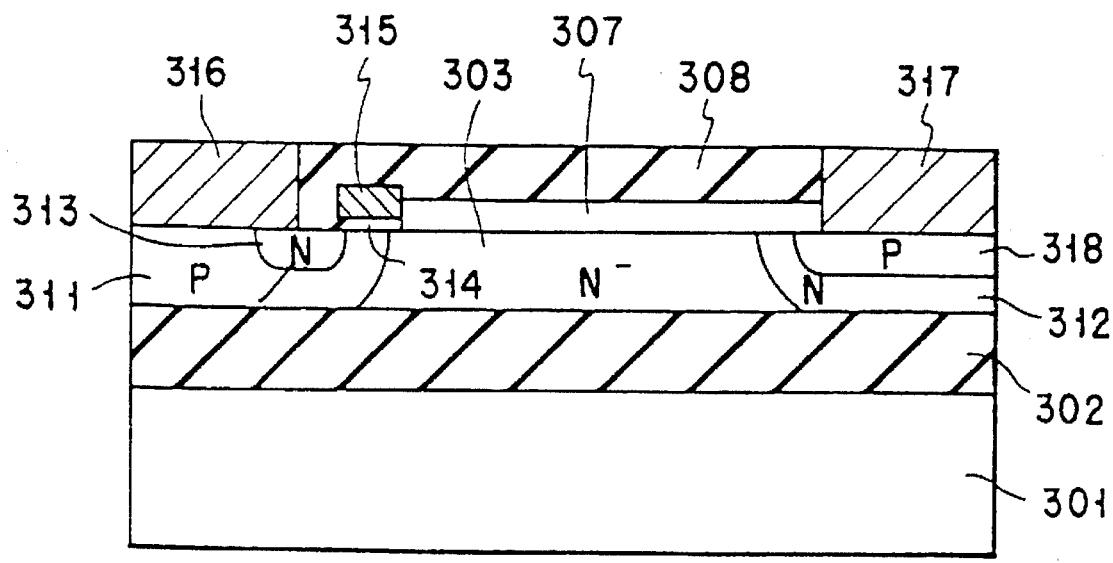
F I G. 34
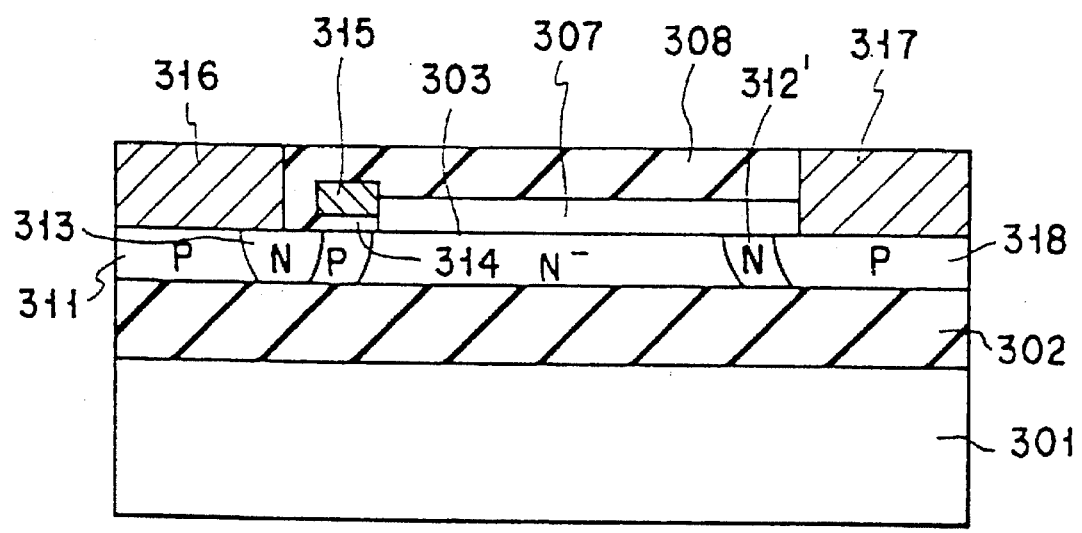
F I G. 35

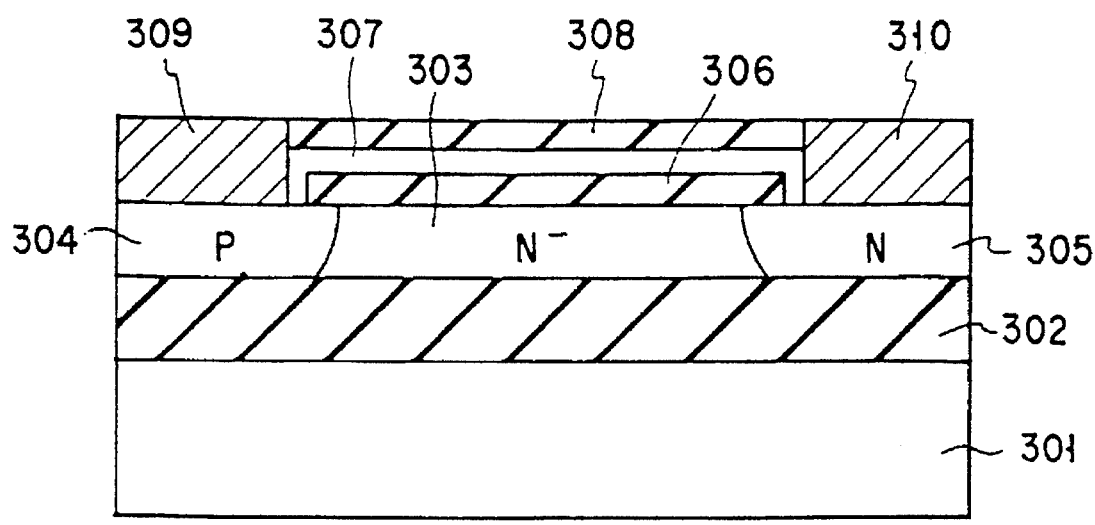
F I G. 36
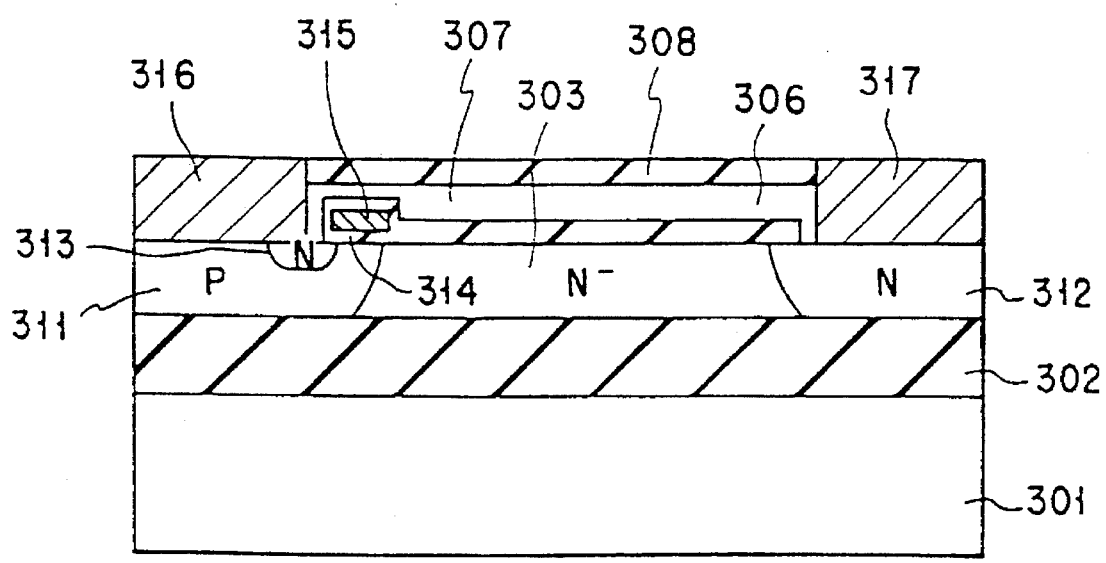
F I G. 37

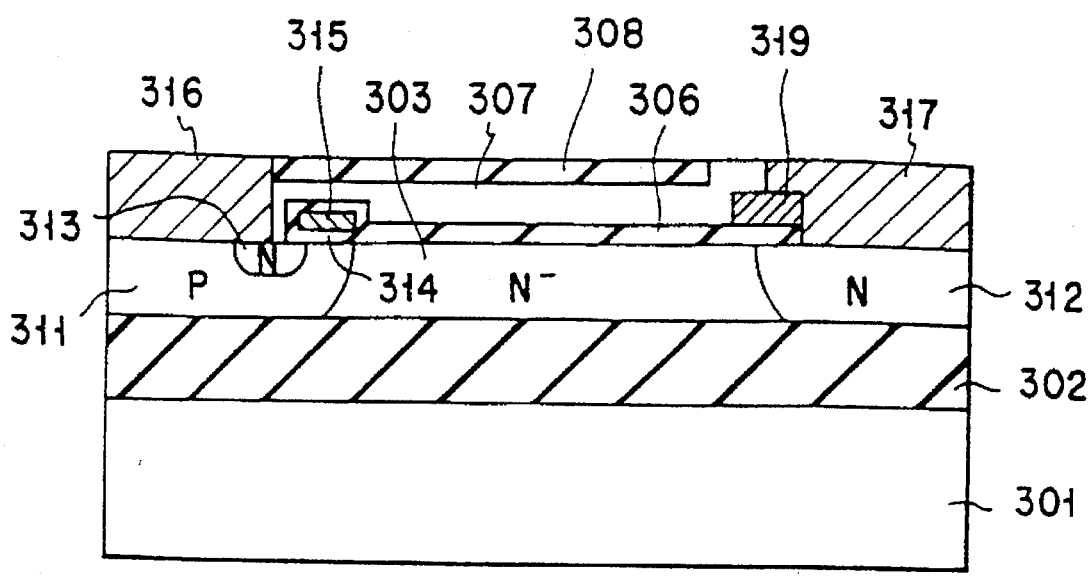
F I G. 38
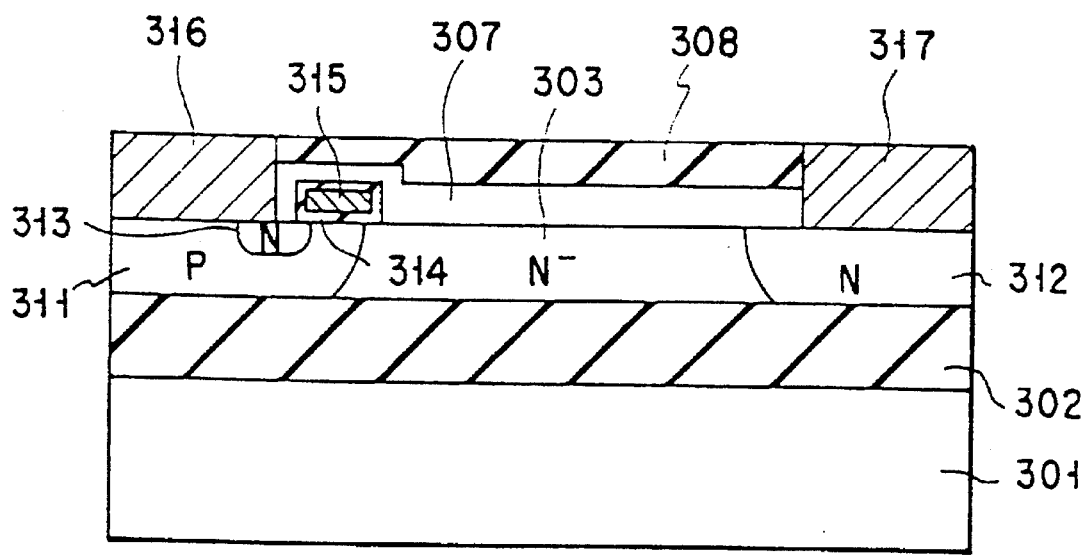
F I G. 39

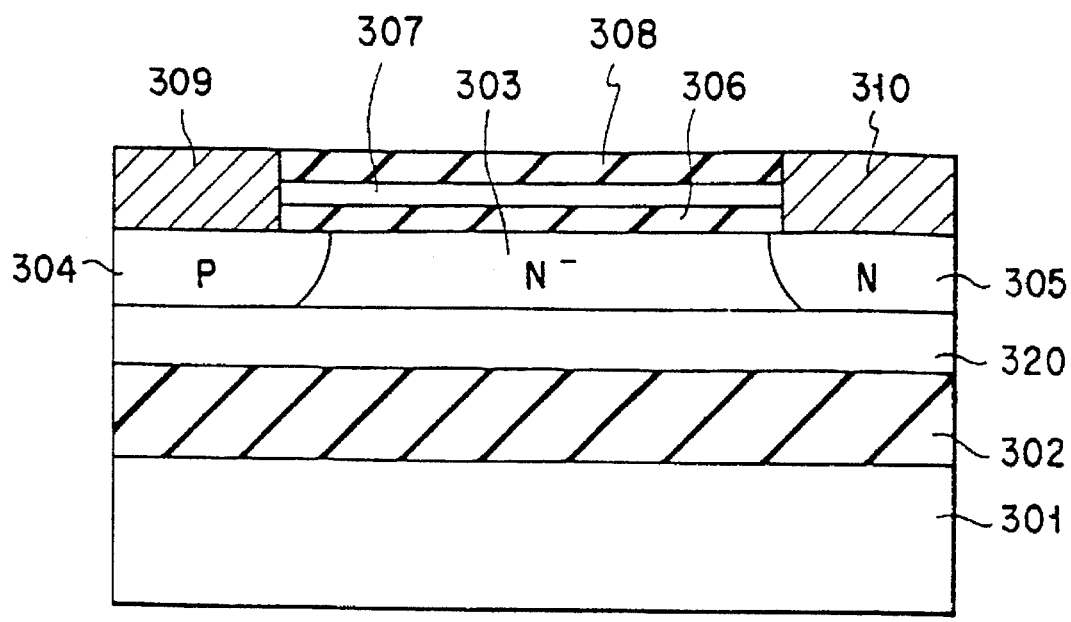
F I G. 40
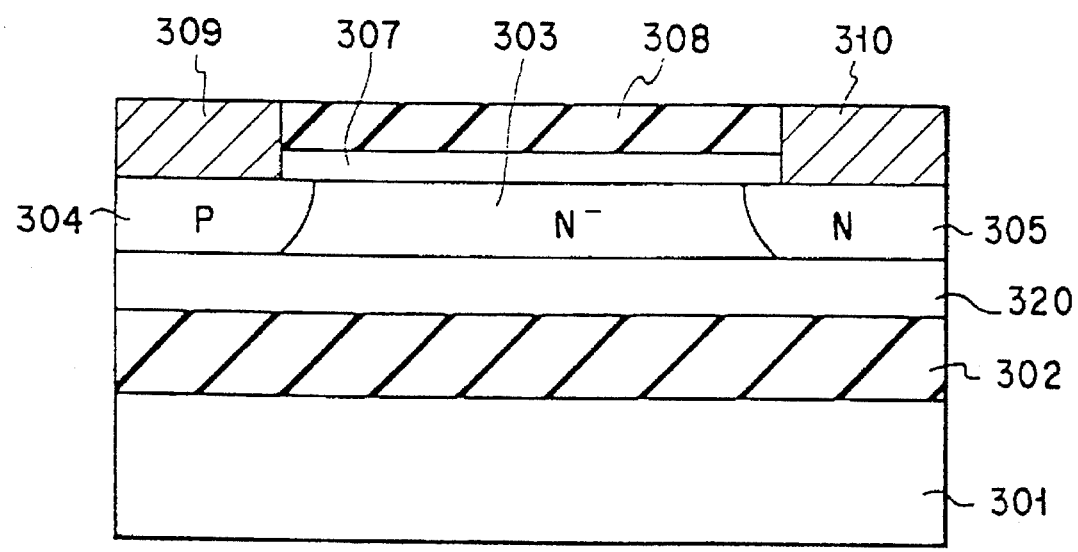
F I G. 41

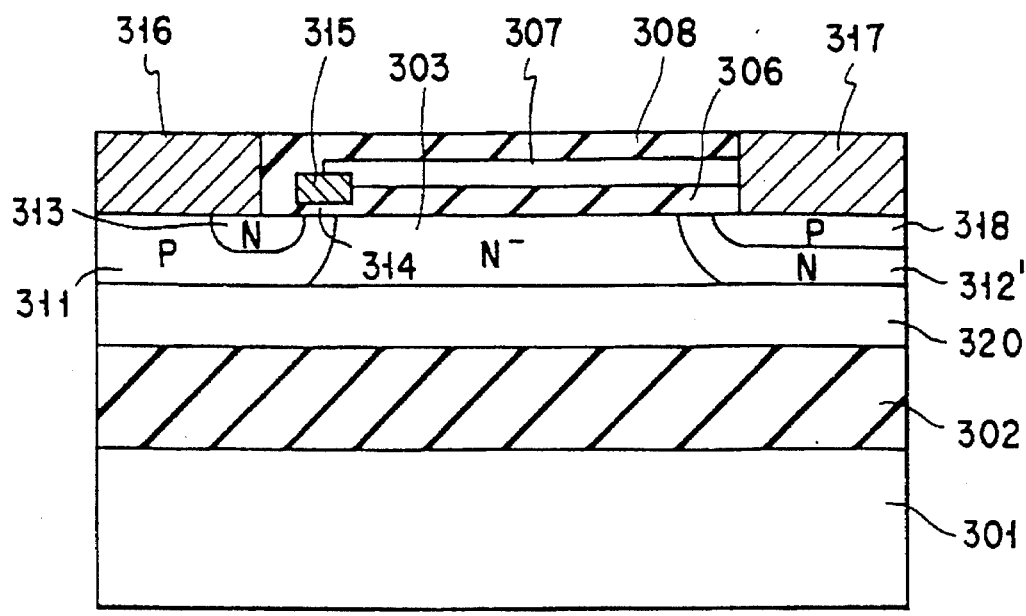
F I G. 46
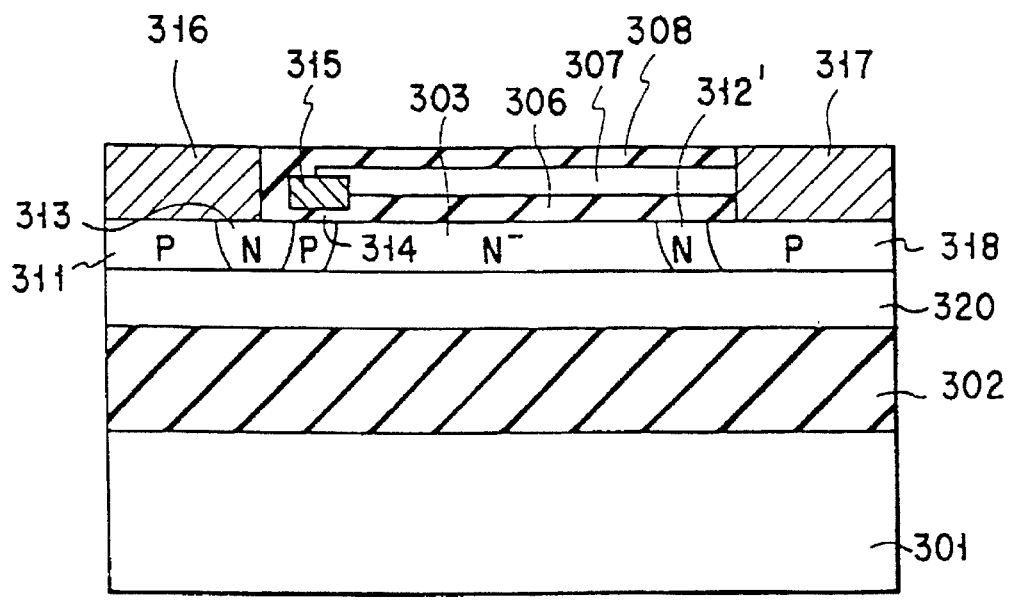
F I G. 47

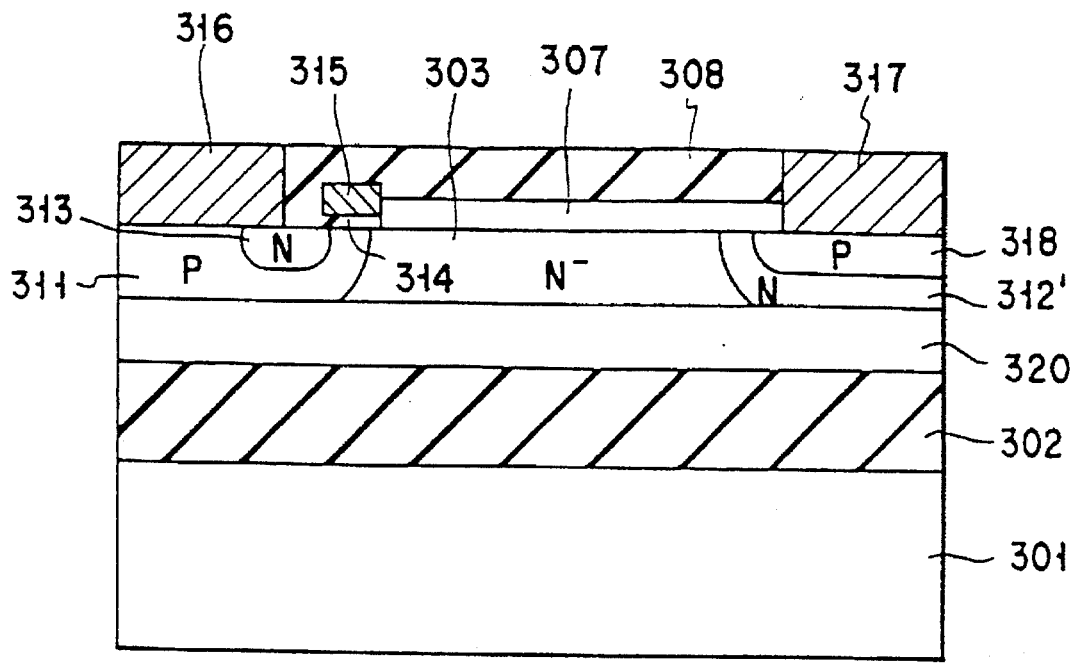
F I G. 48
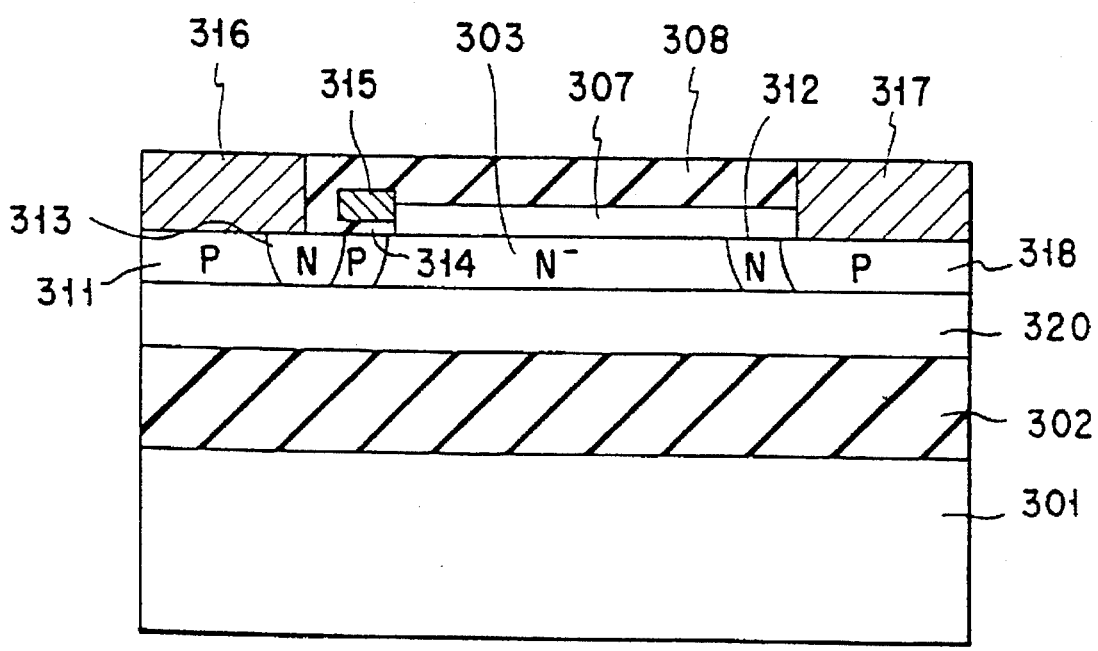
F I G. 49

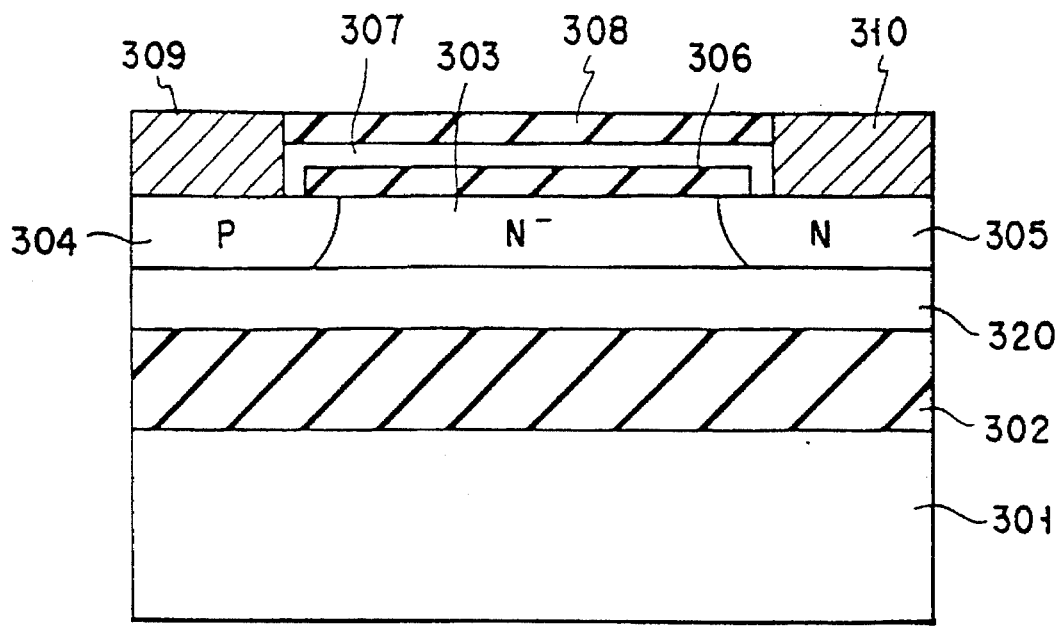
F I G. 50
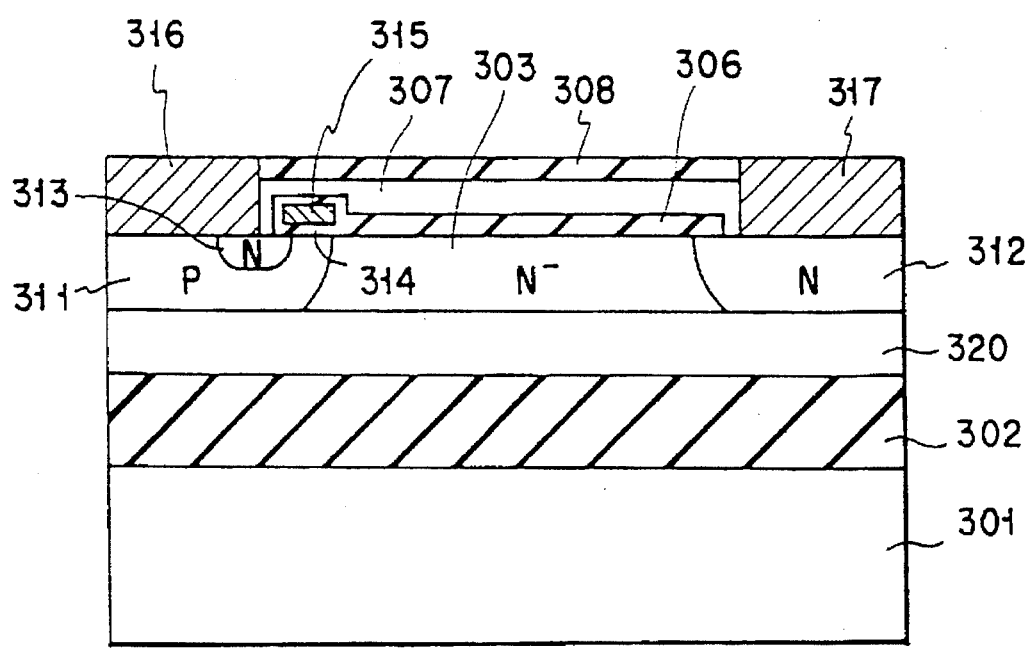
F I G. 51

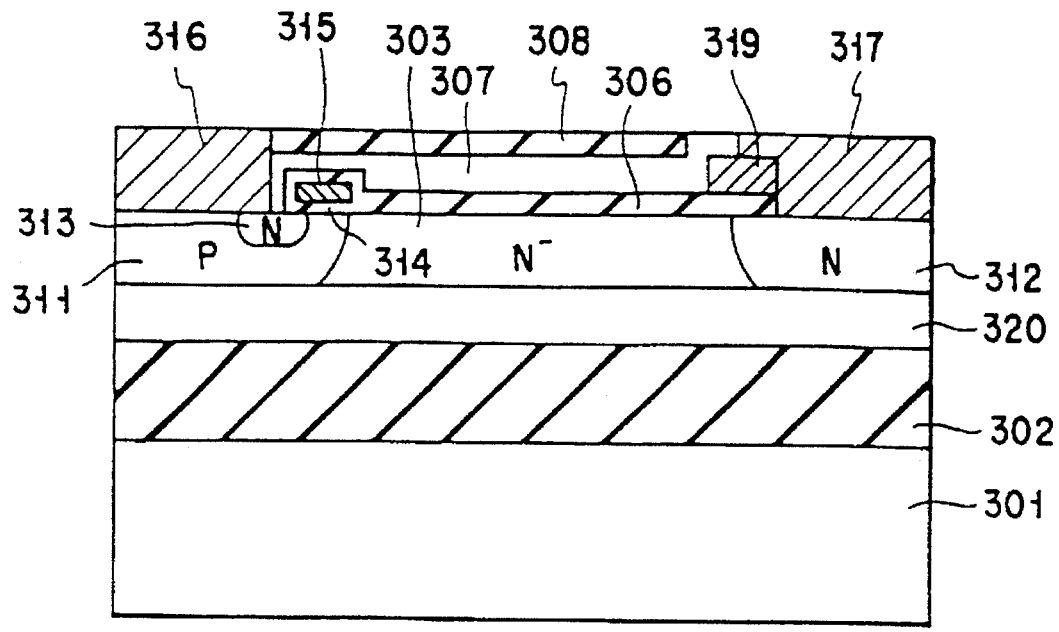
F I G. 52
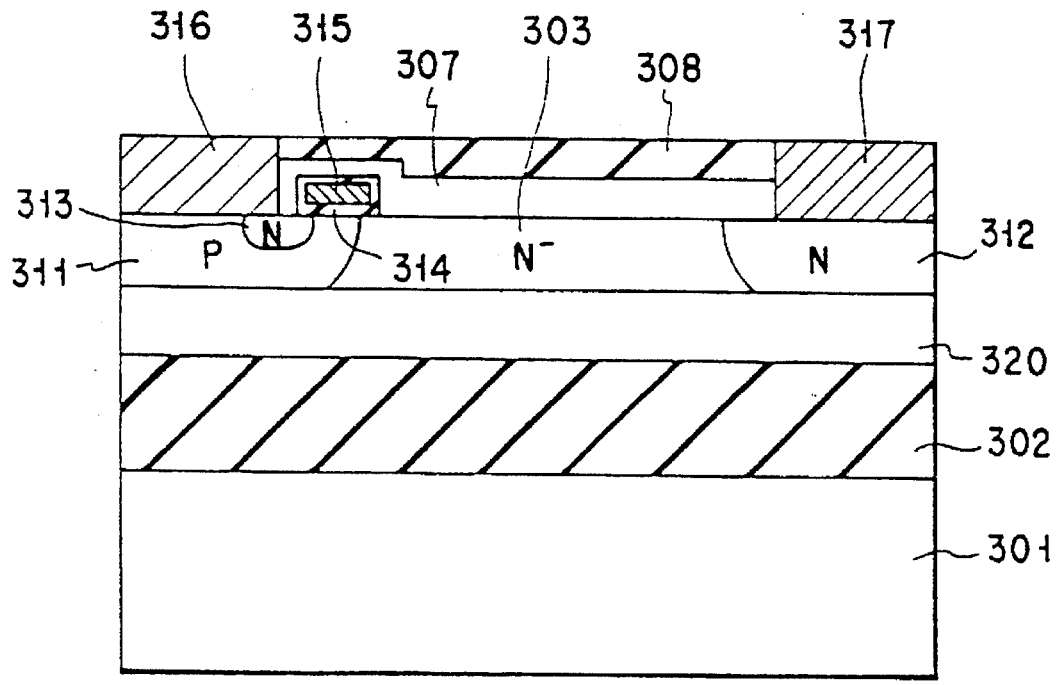
F I G. 53

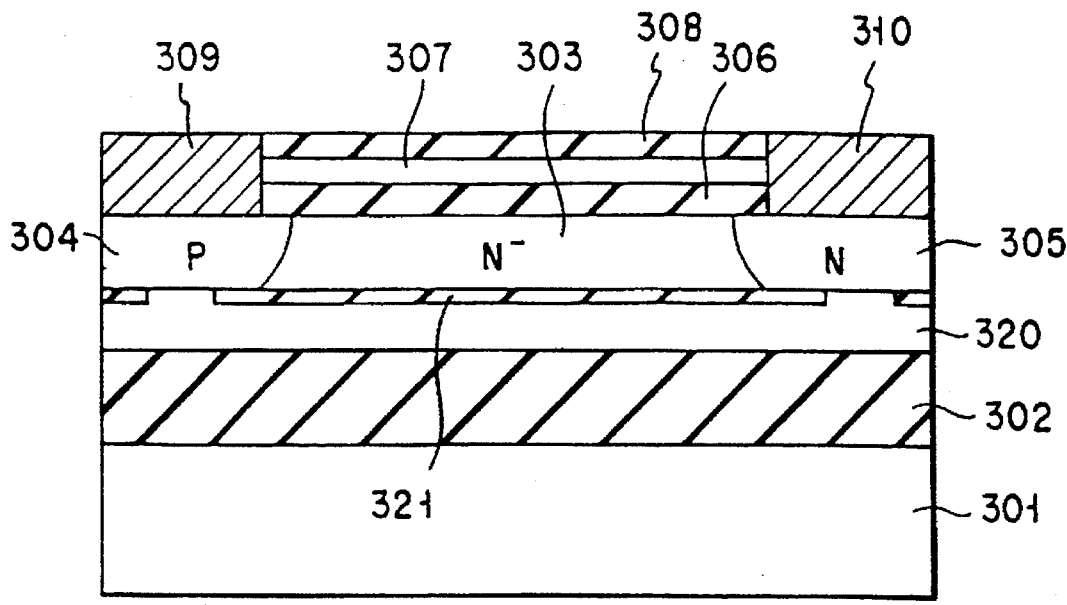
F I G. 54
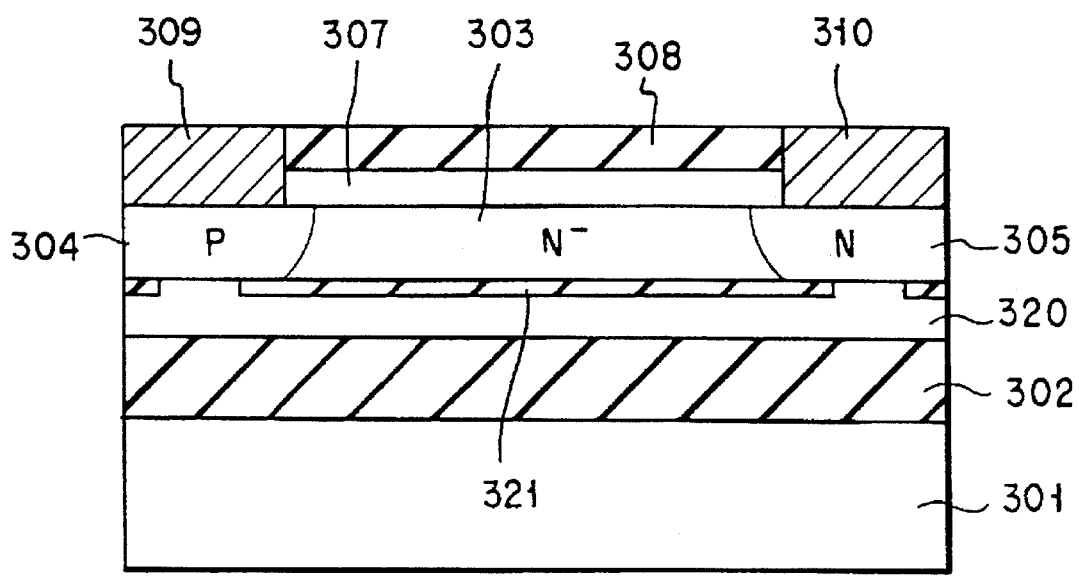
F I G. 55

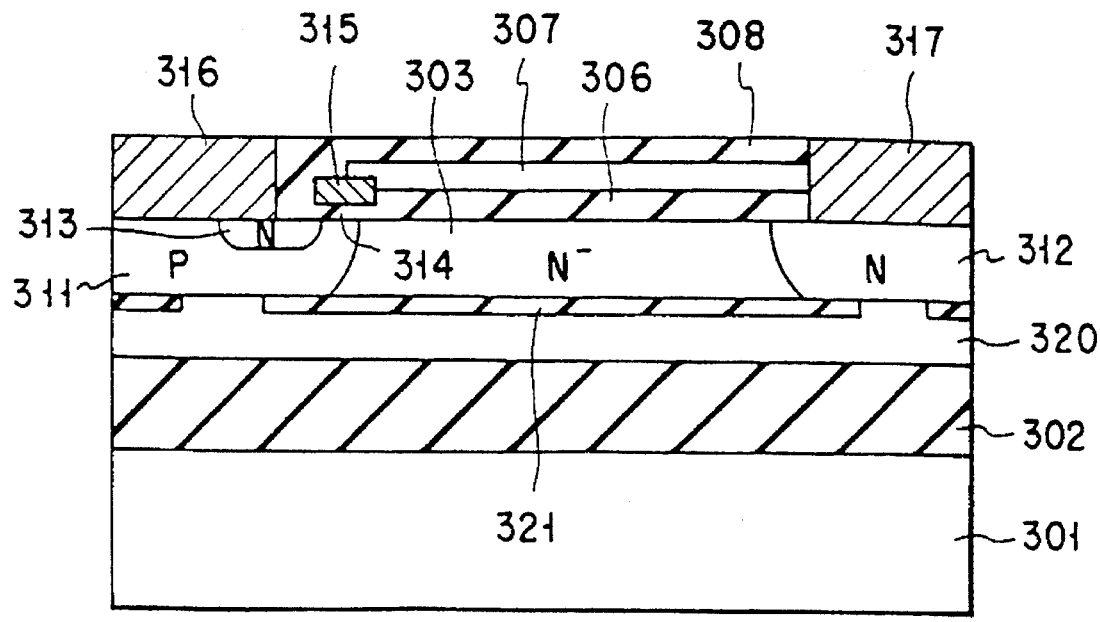
F I G. 56
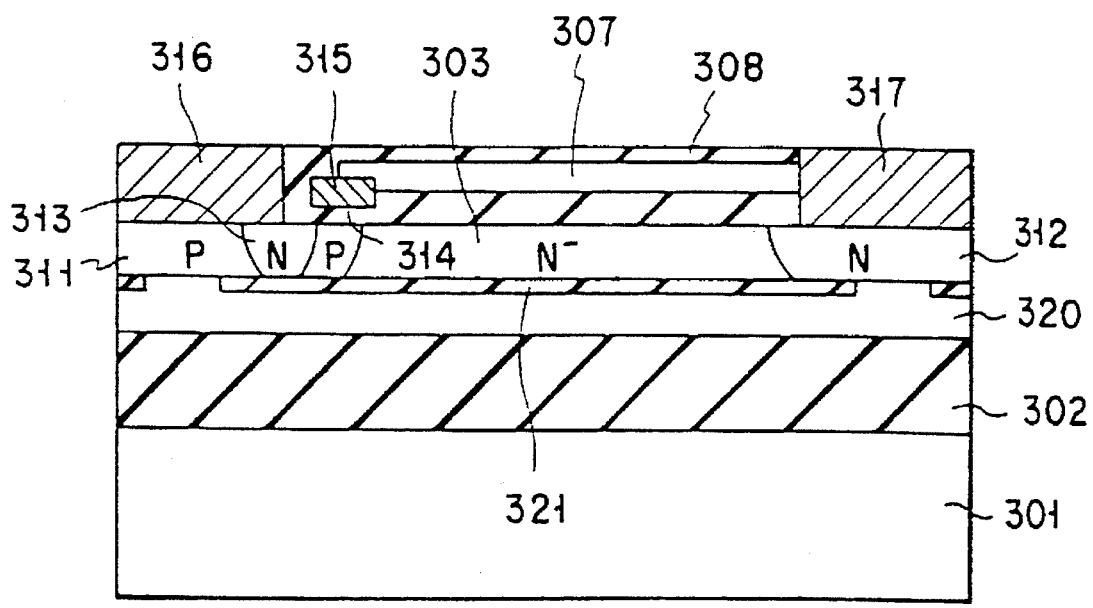
F I G. 57

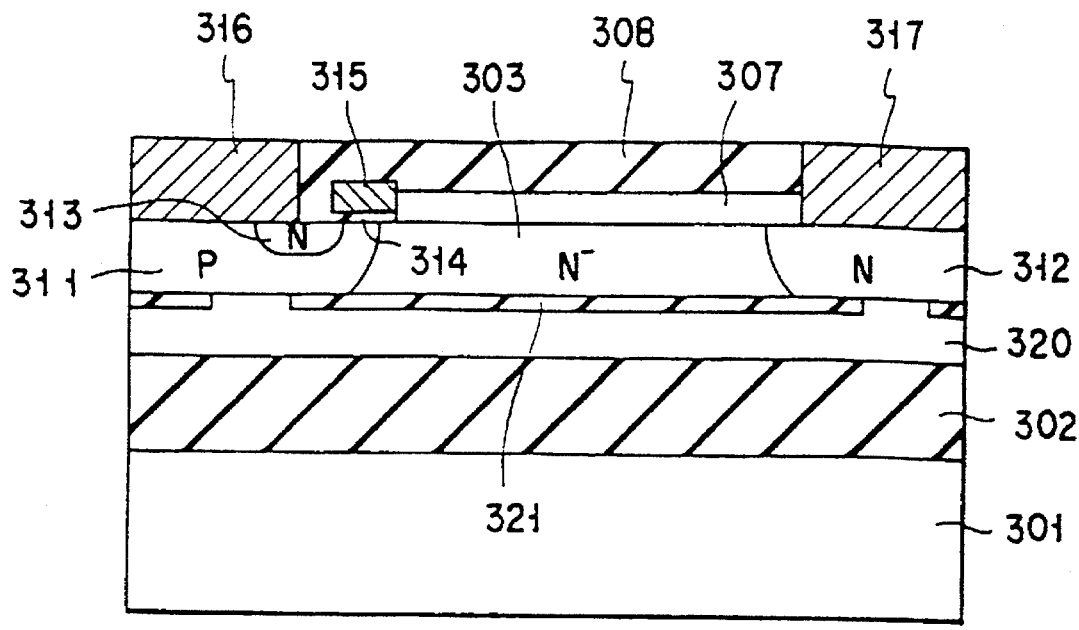
F I G. 58
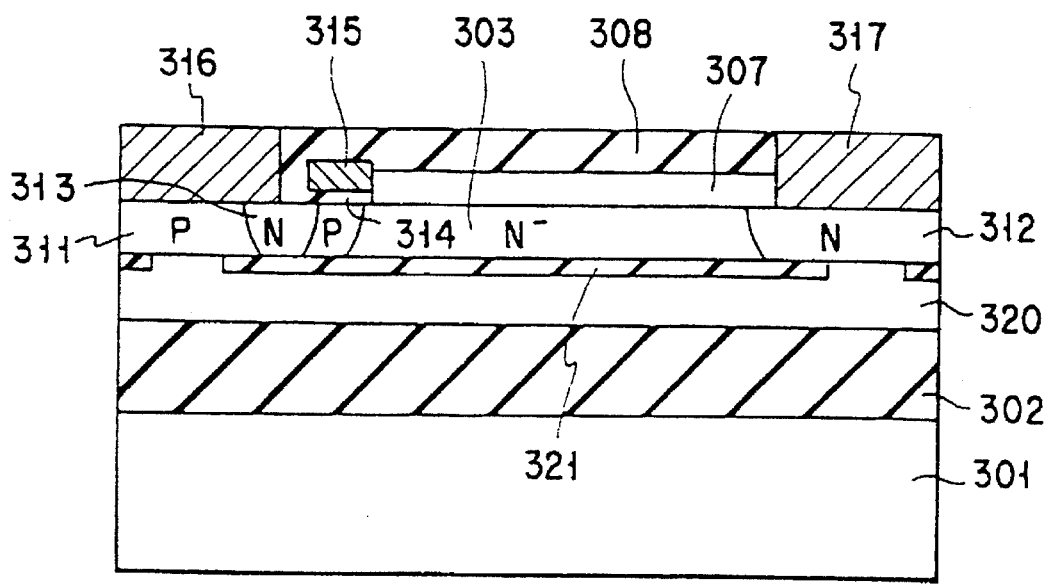
F I G. 59

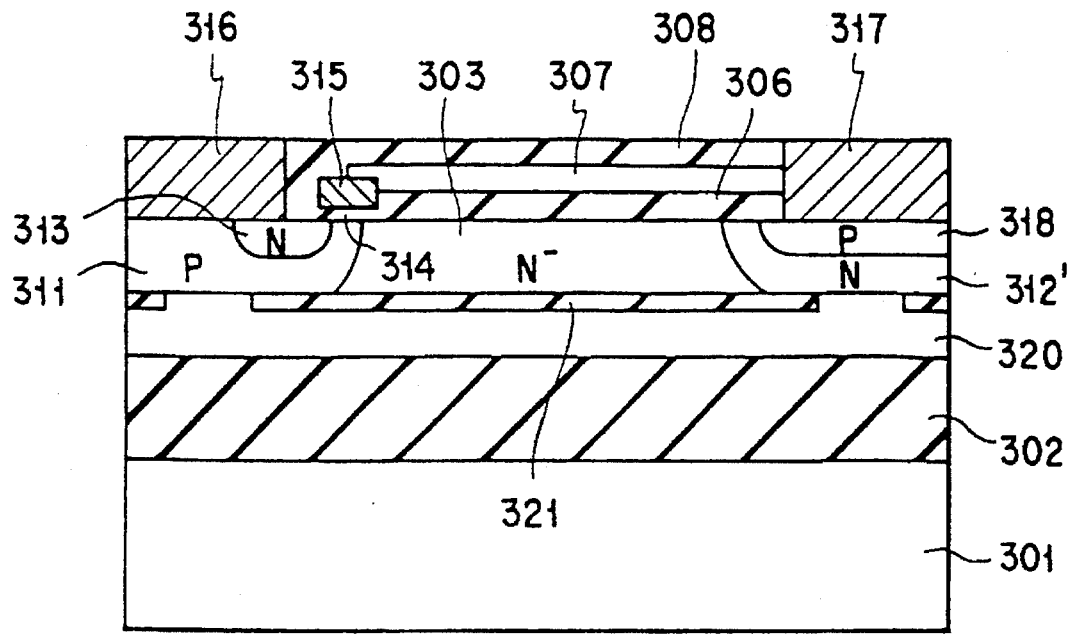
F I G. 60
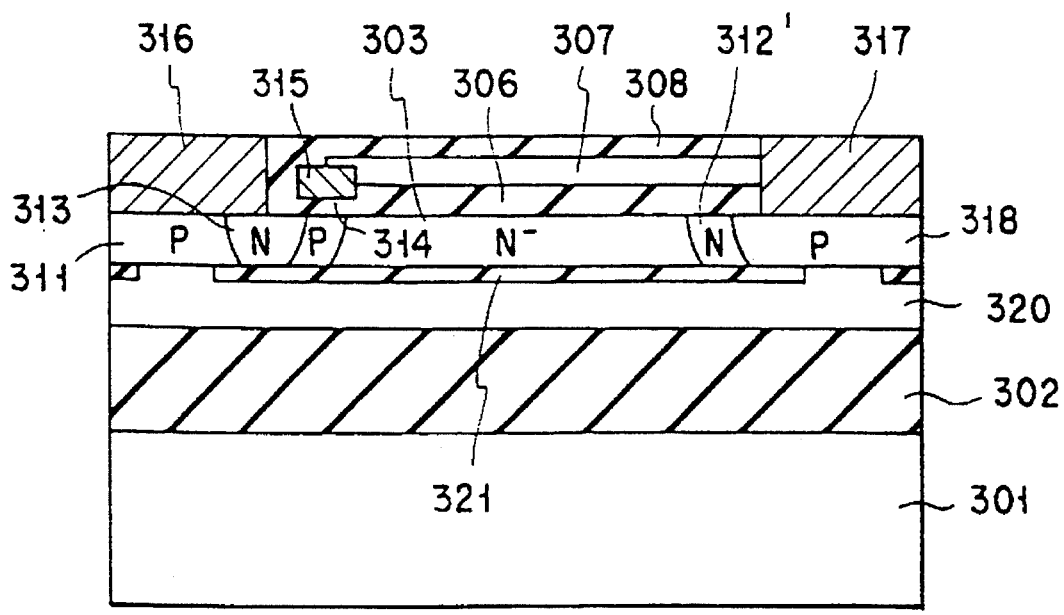
F I G. 61

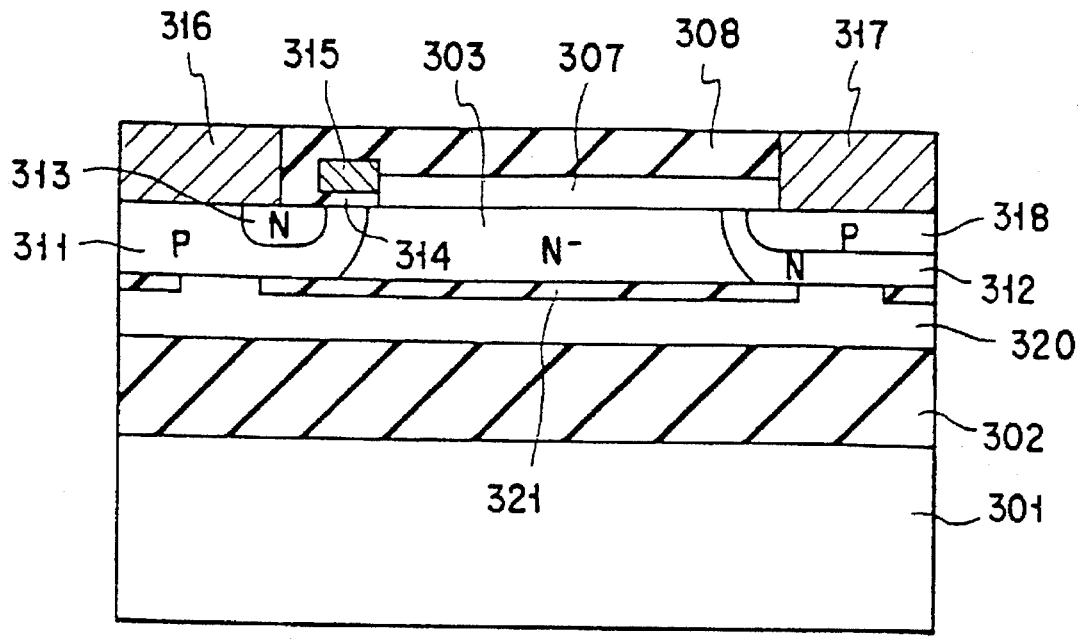
F I G. 62
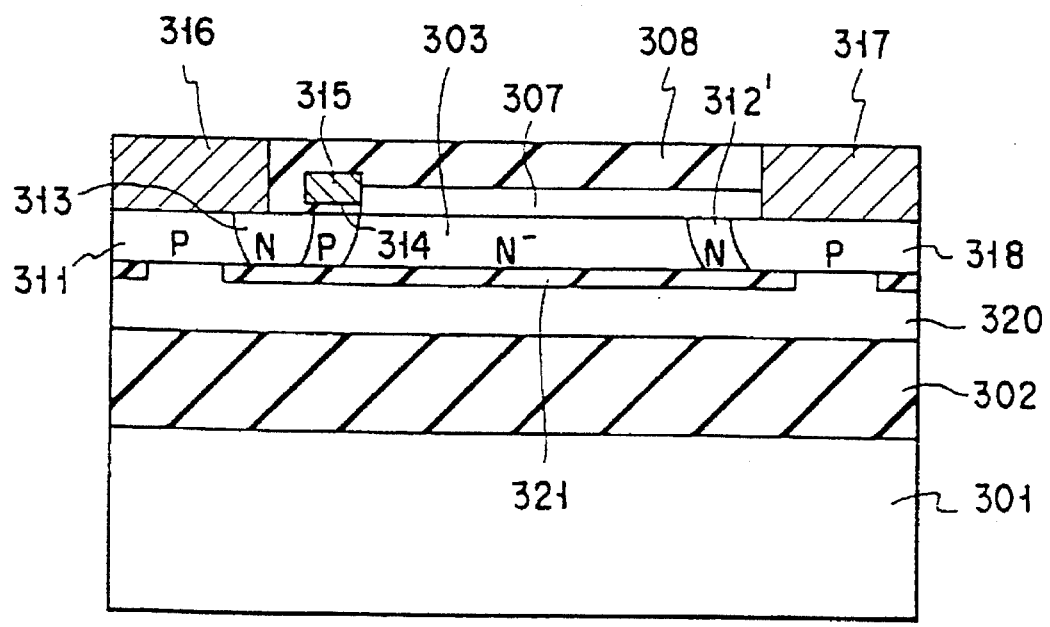
F I G. 63

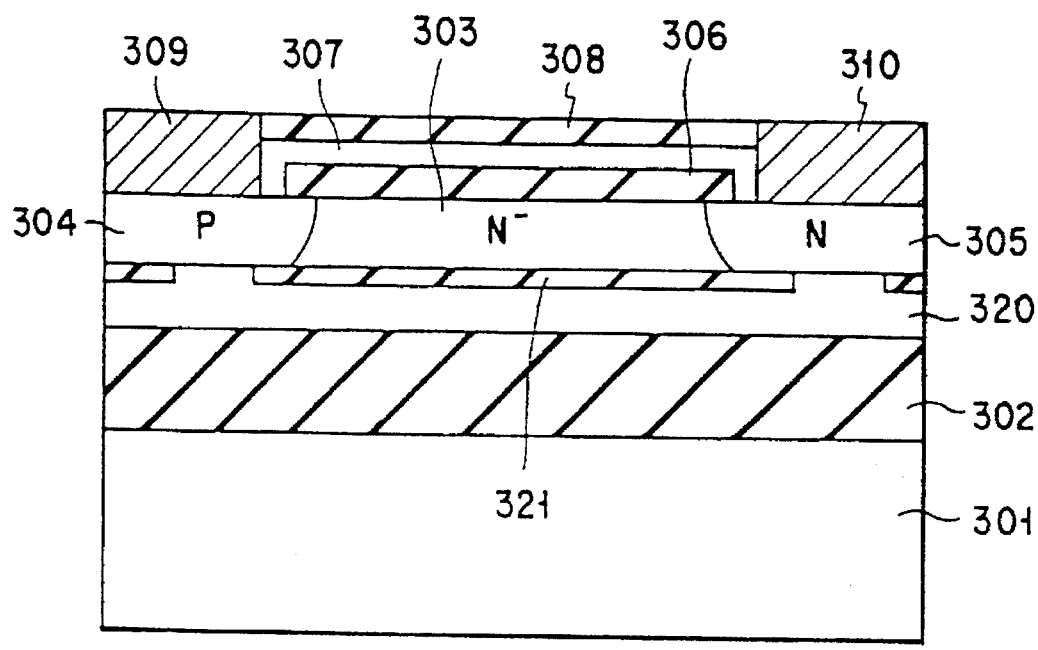
F I G. 64
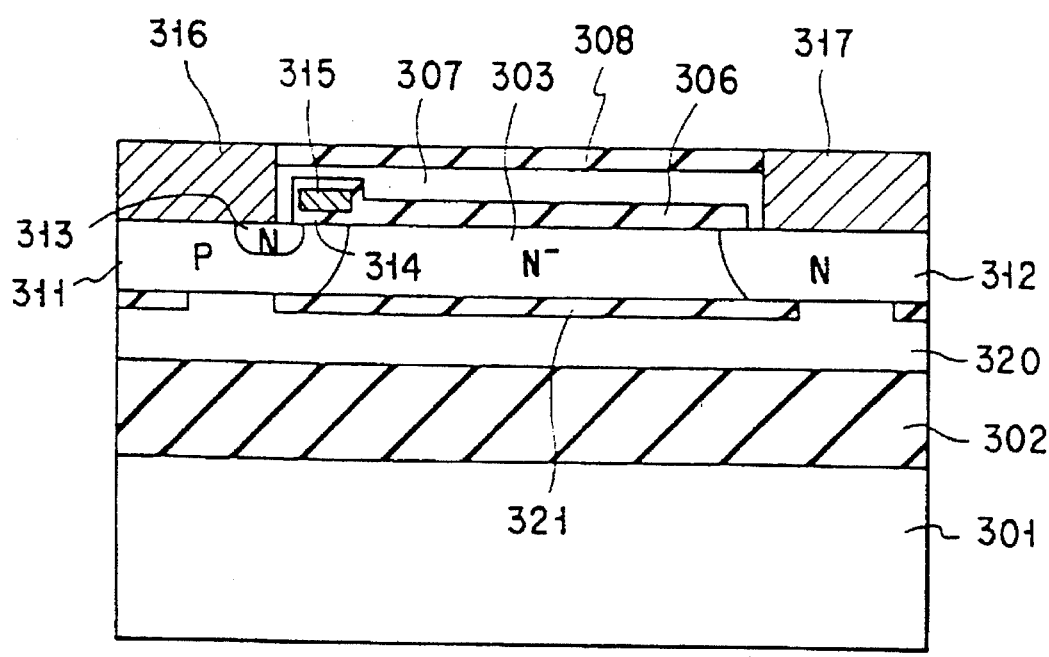
F I G. 65

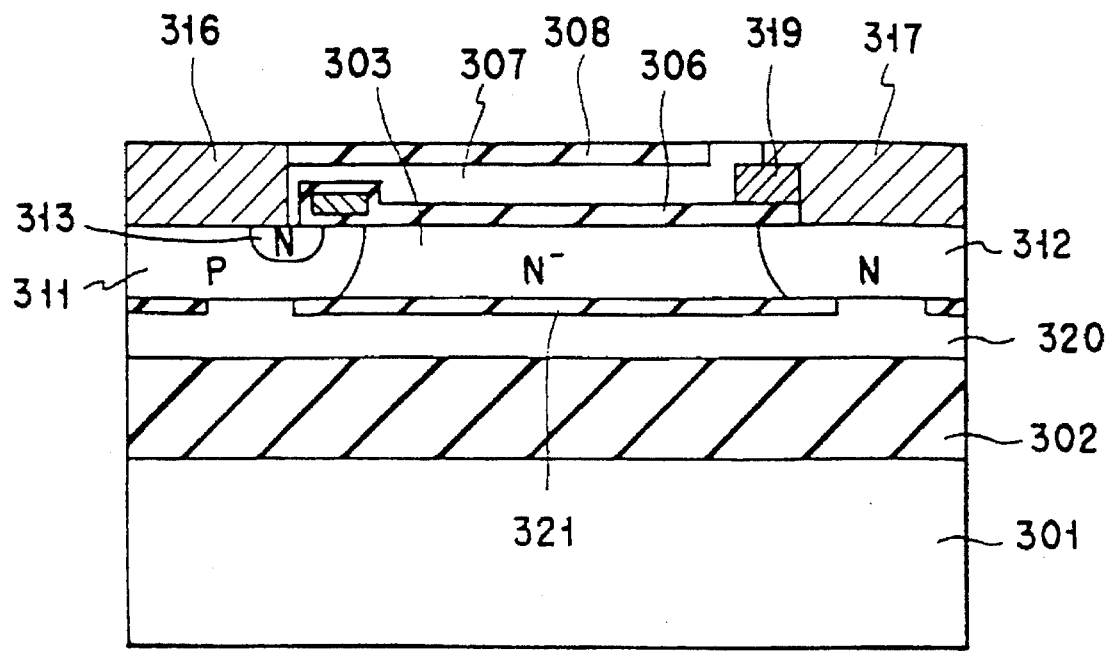
F I G. 66
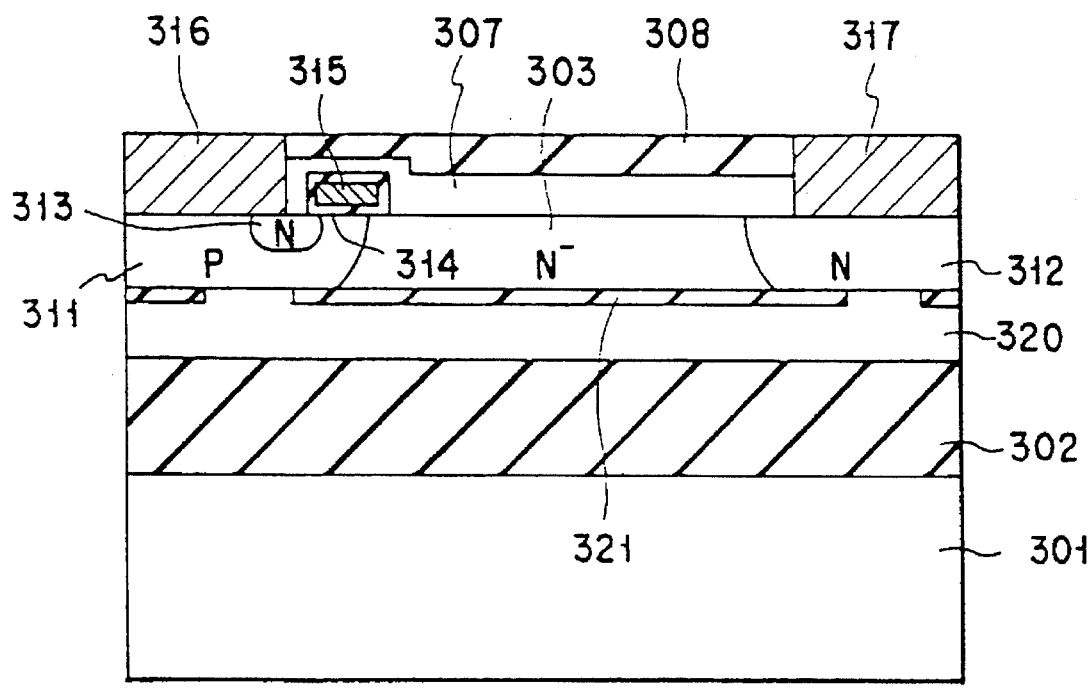
F I G. 67

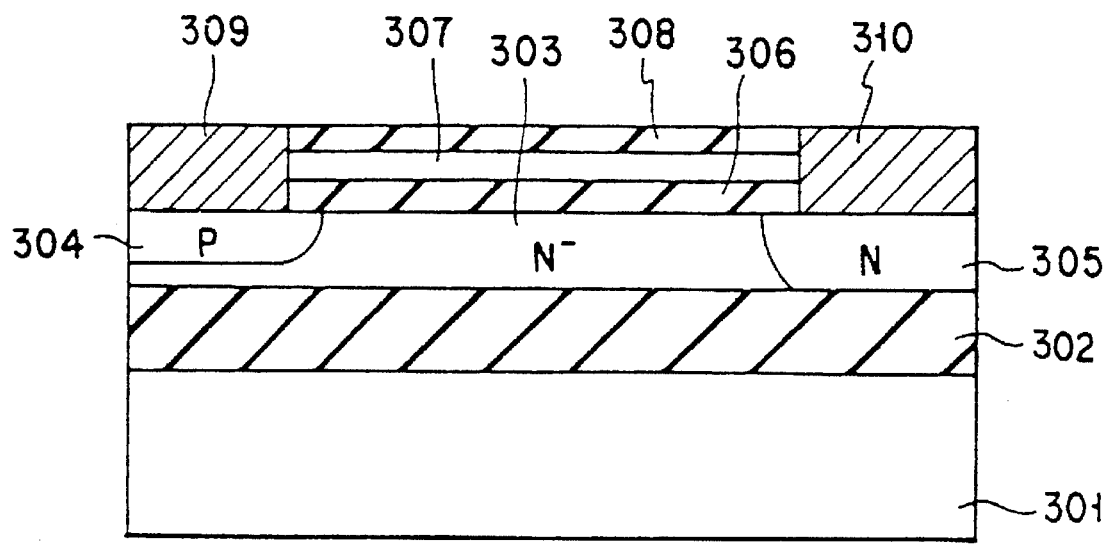
F I G. 68
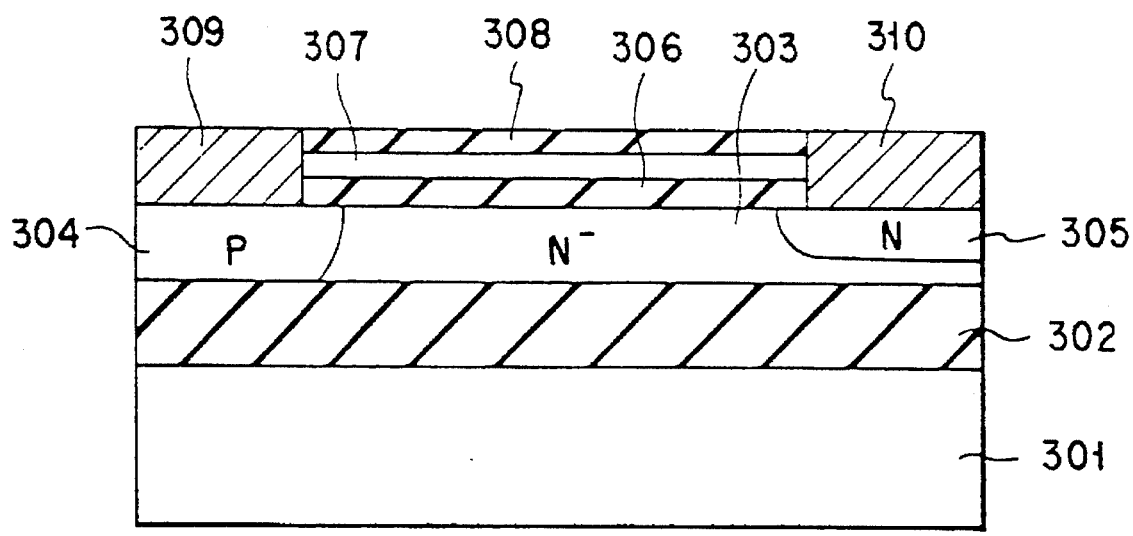
F I G. 69

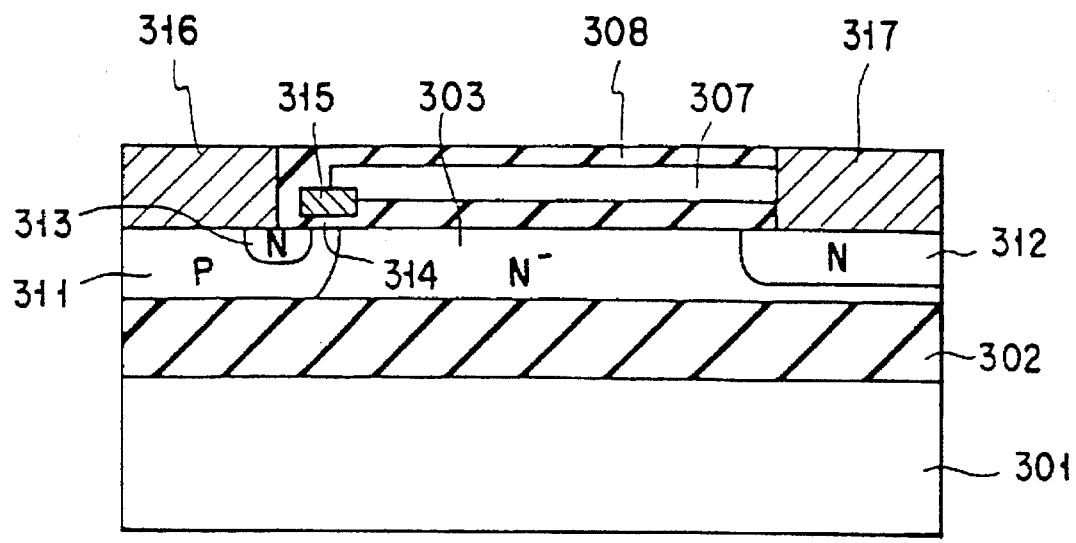
F I G. 70
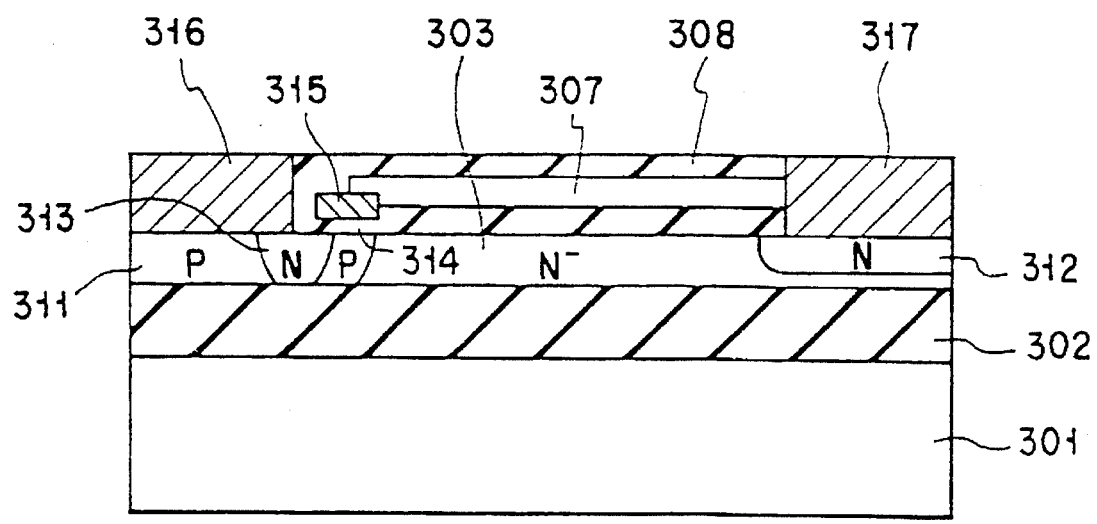
F I G. 71

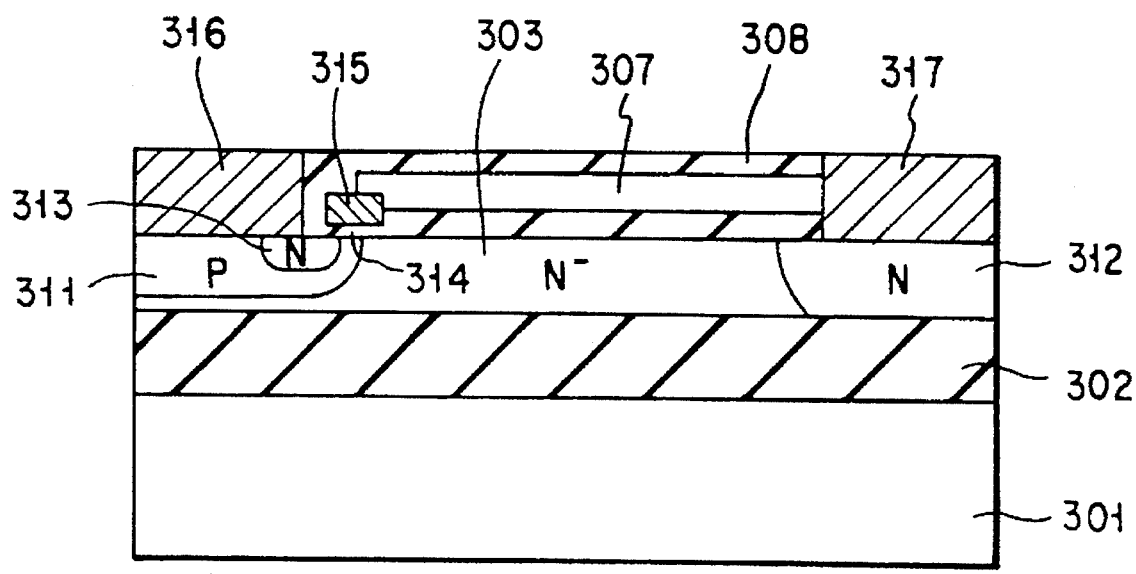
F I G. 72
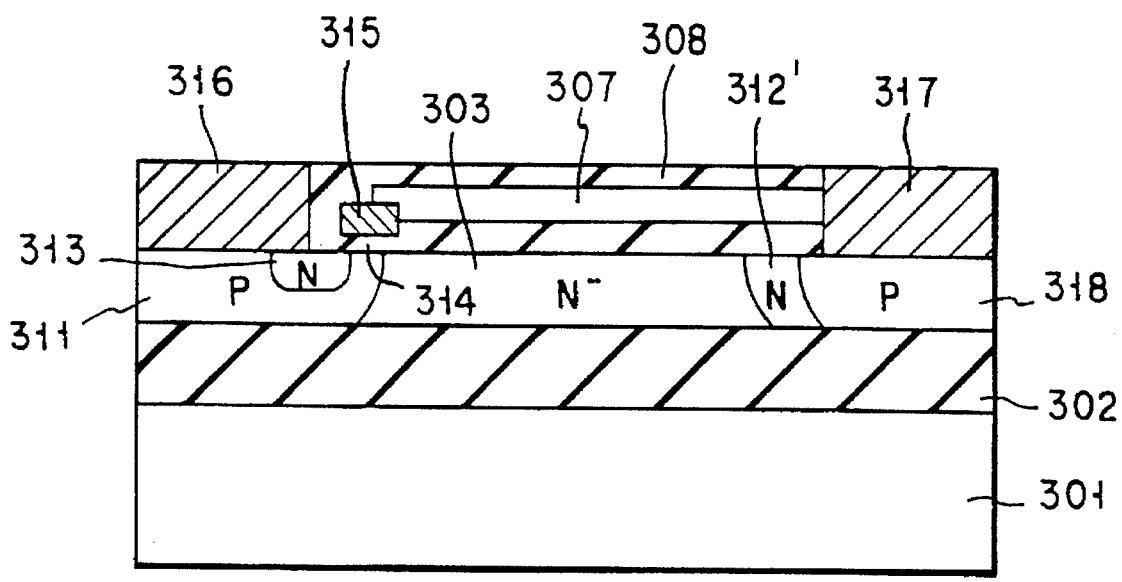
F I G. 73

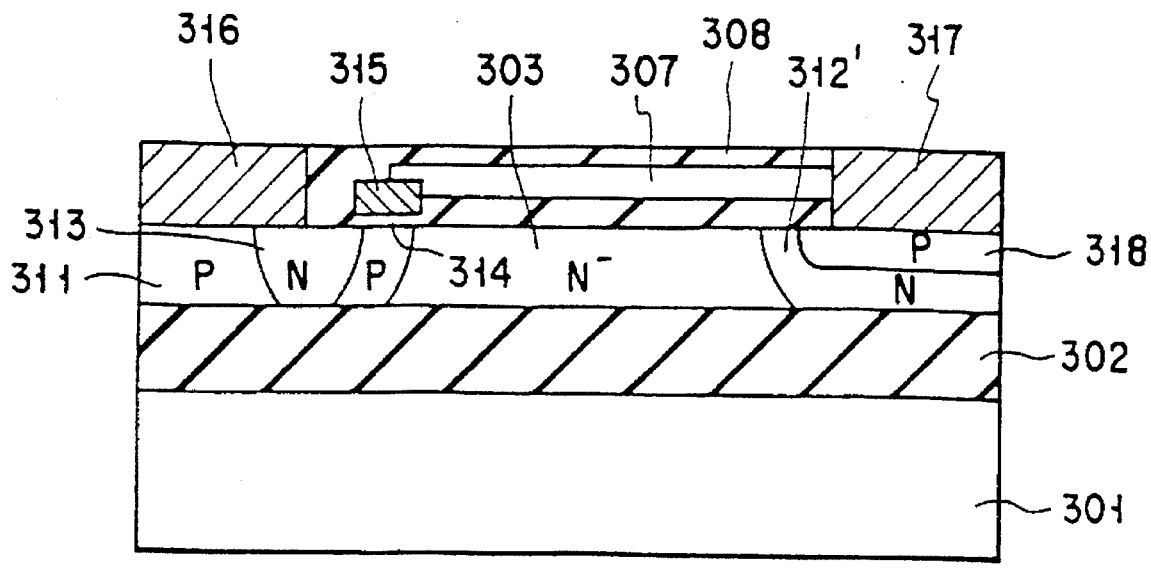
F I G. 74
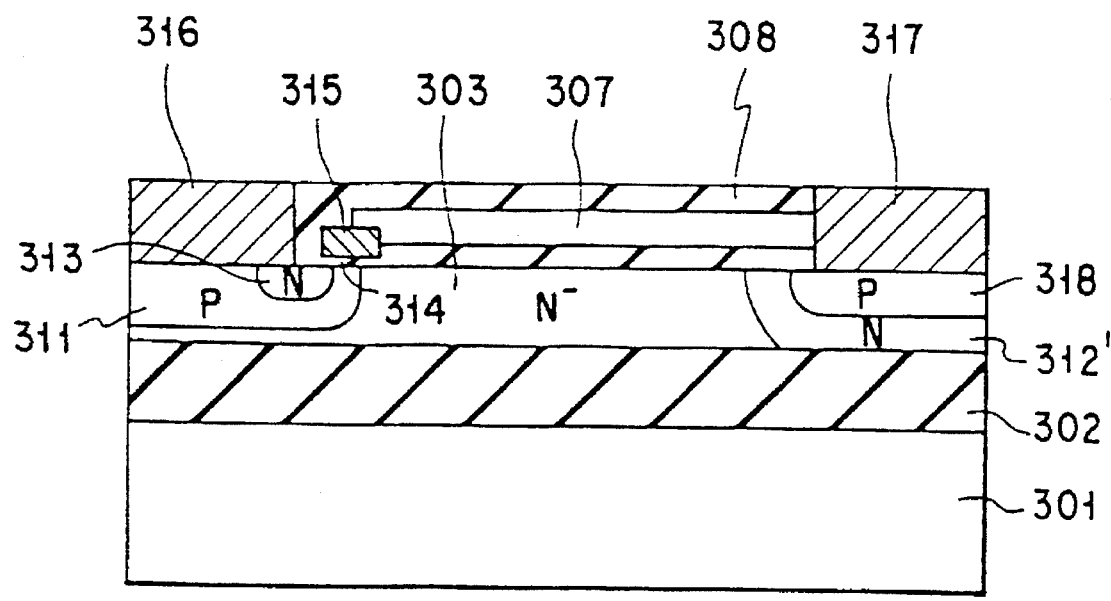
F I G. 75

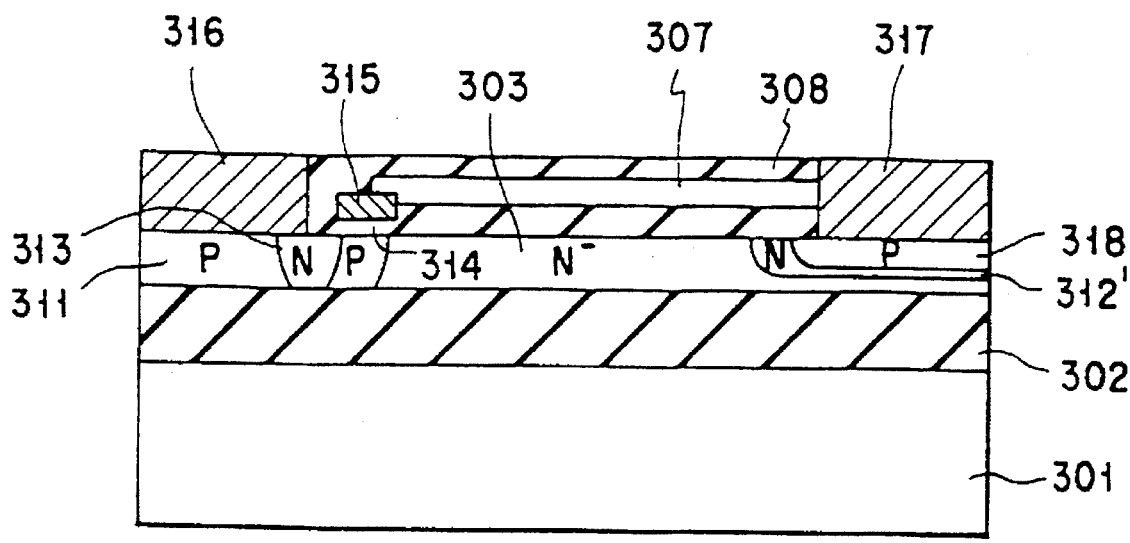
F I G. 78
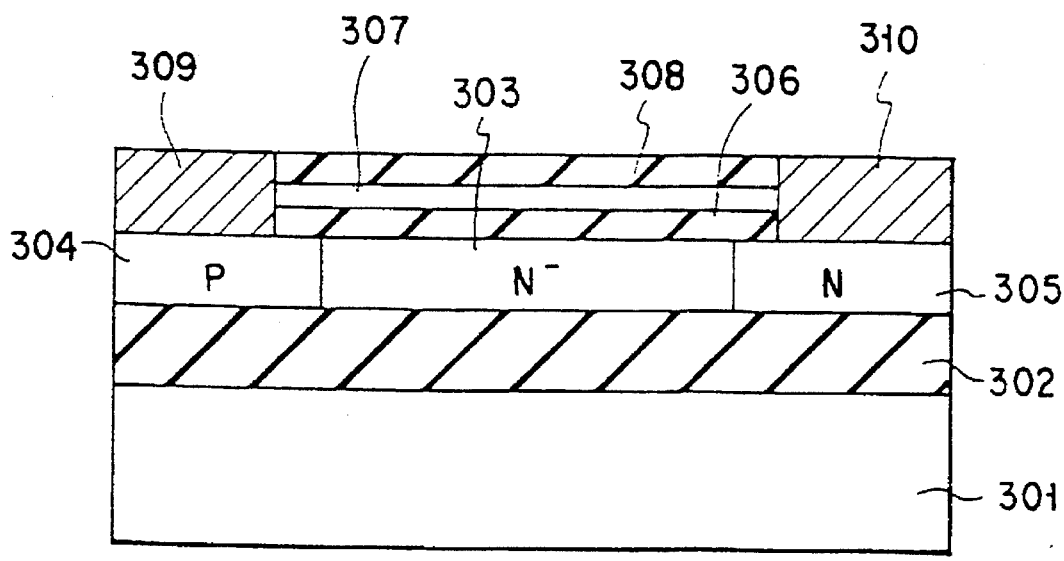
F I G. 79

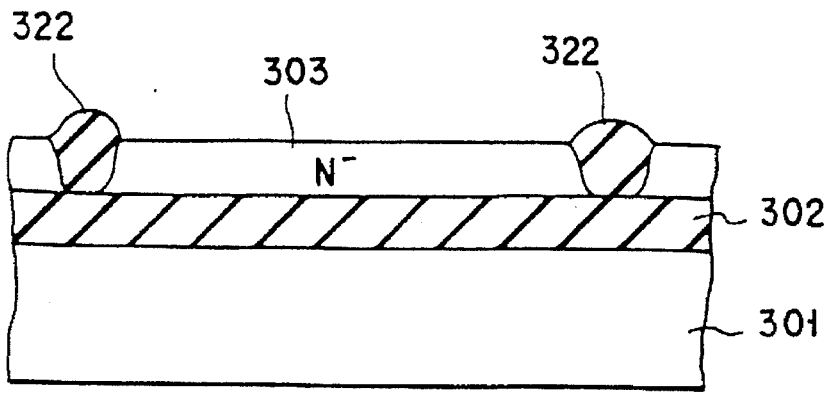
F I G. 80A
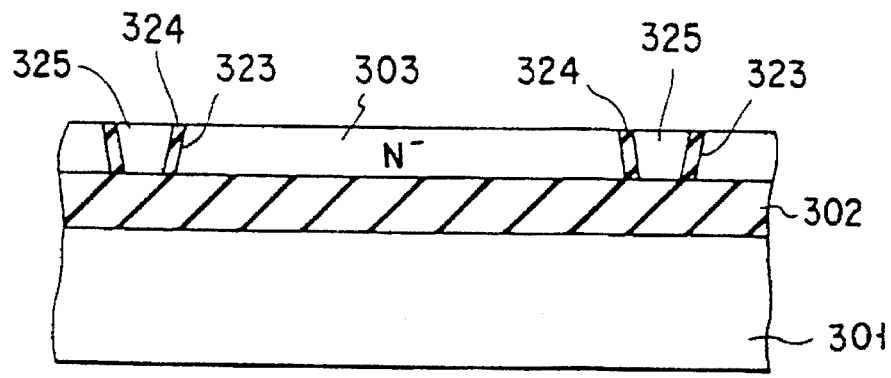
F I G. 80B
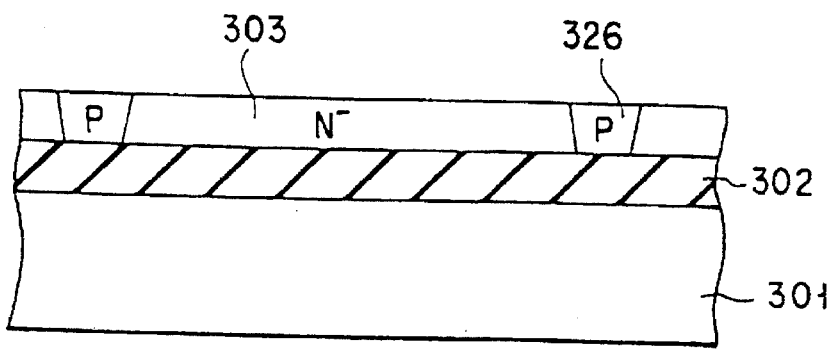
F I G. 80C

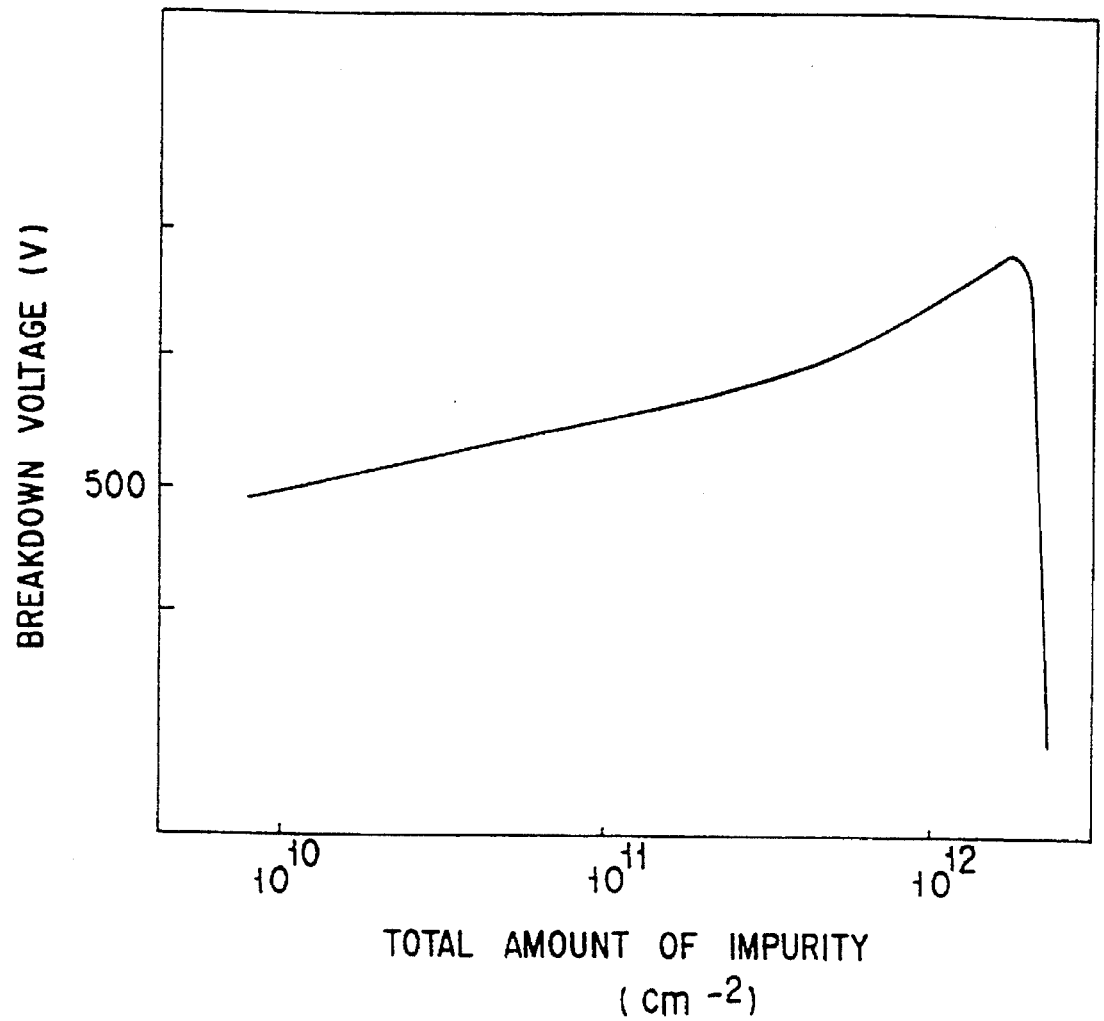
F I G. 81

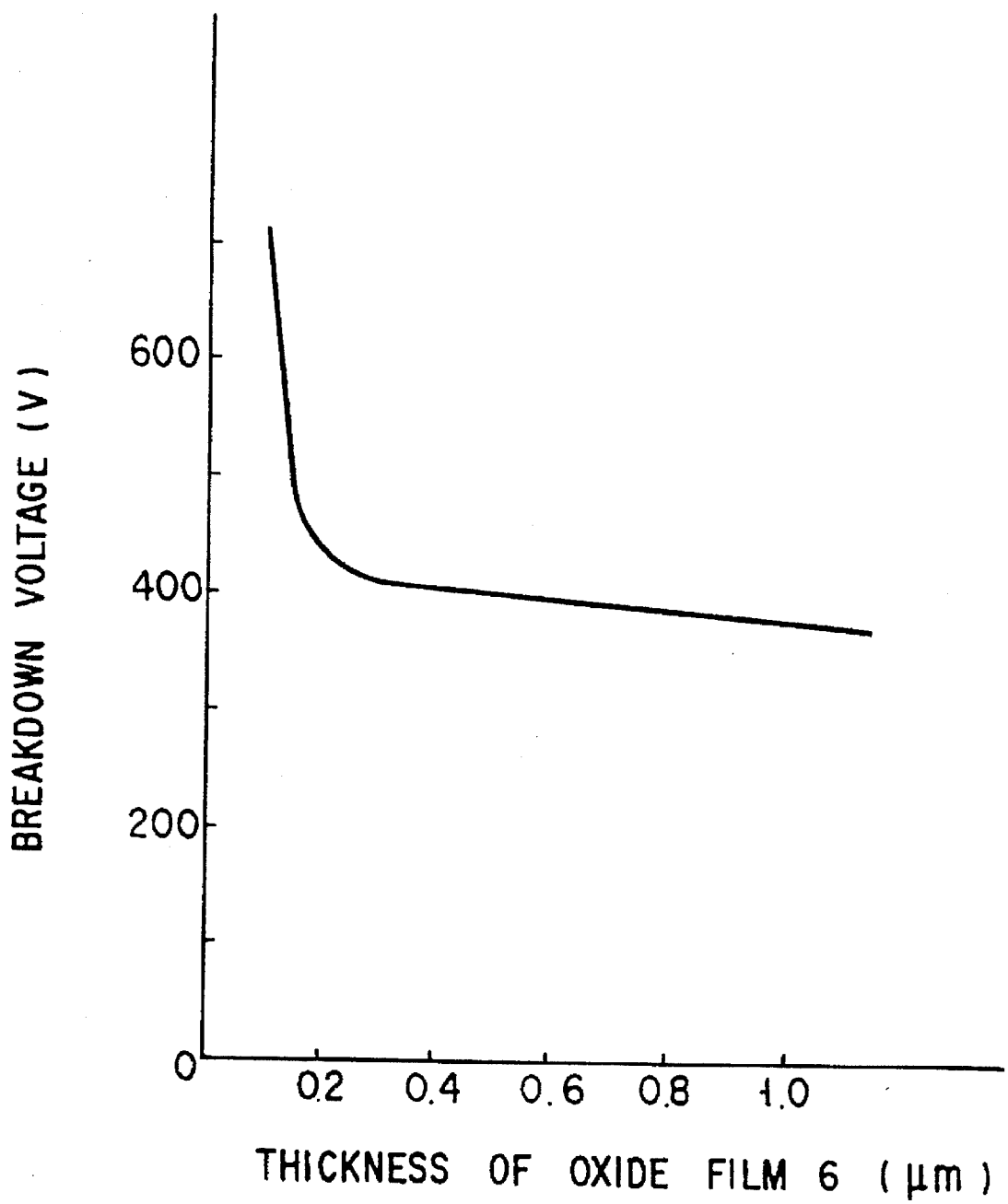
F I G. 82

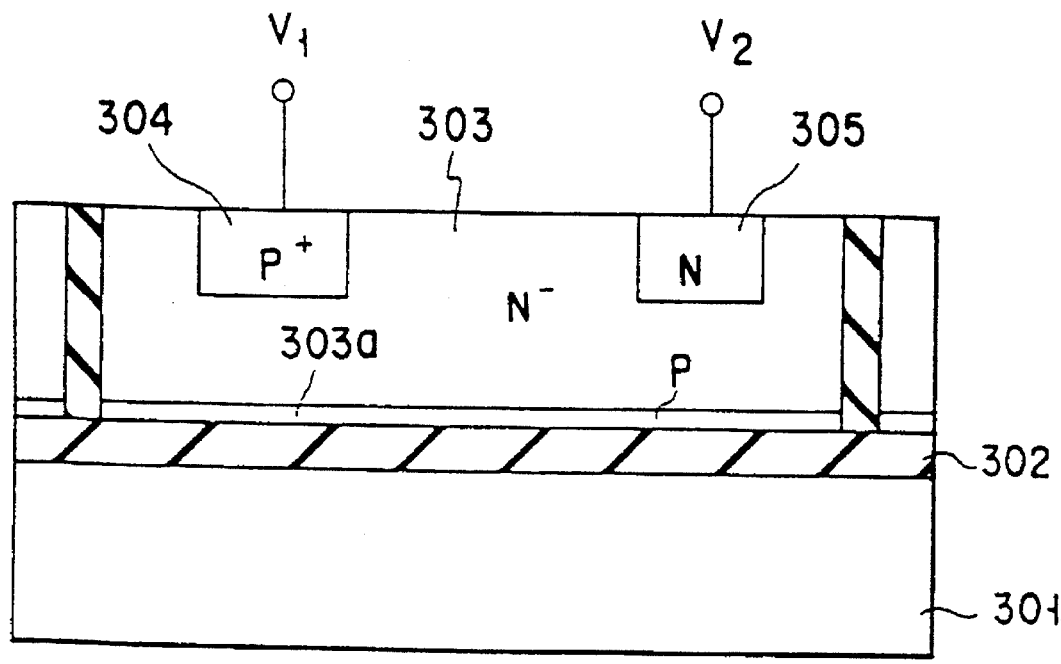
F I G. 84
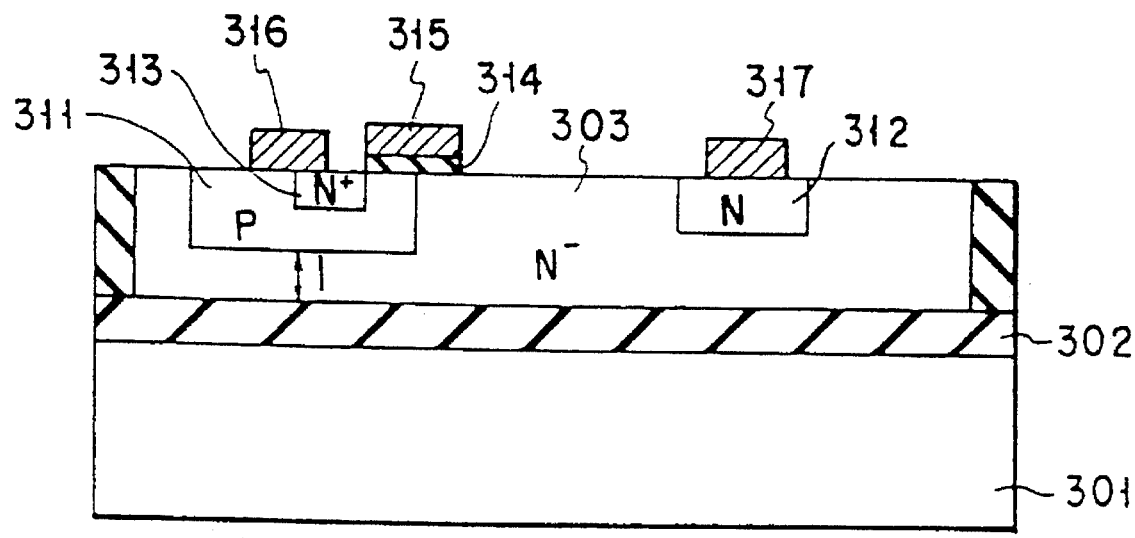
F I G. 85

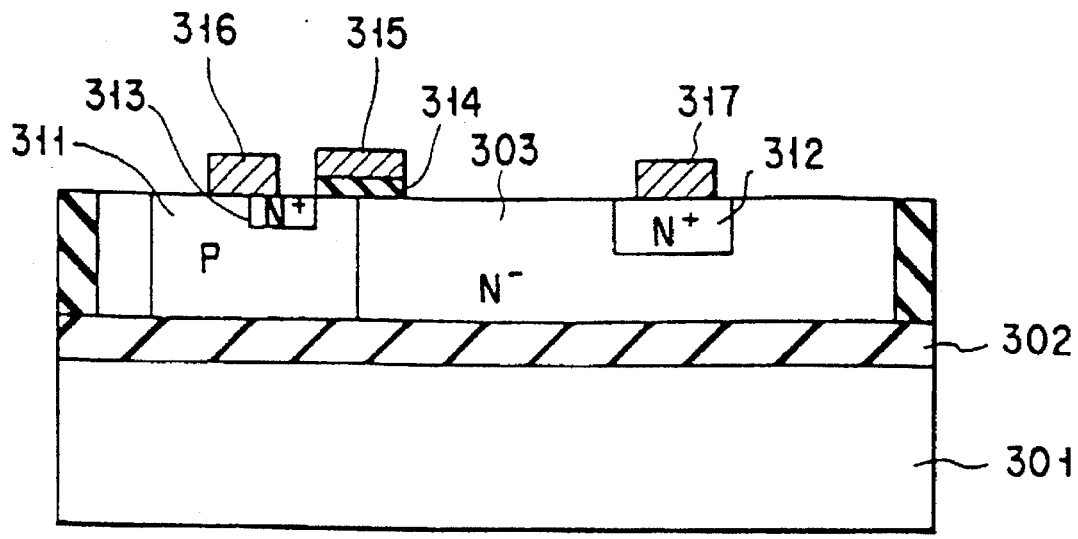
F I G. 86
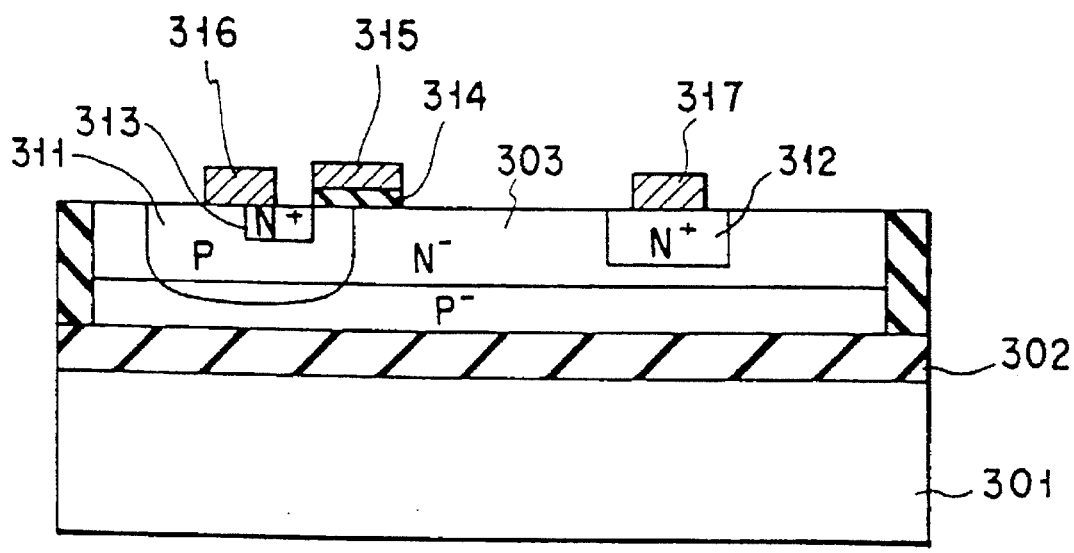
F I G. 87

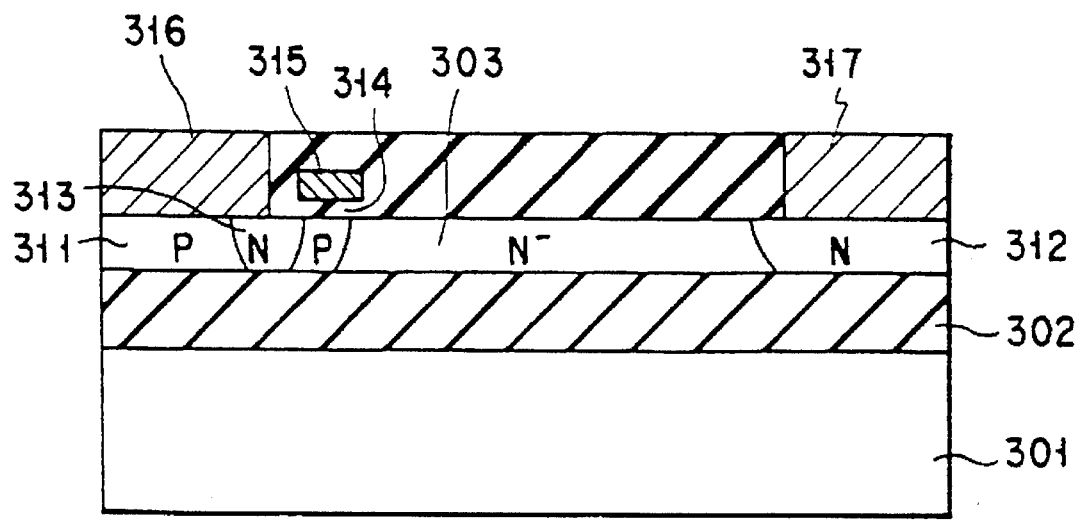
F I G. 90
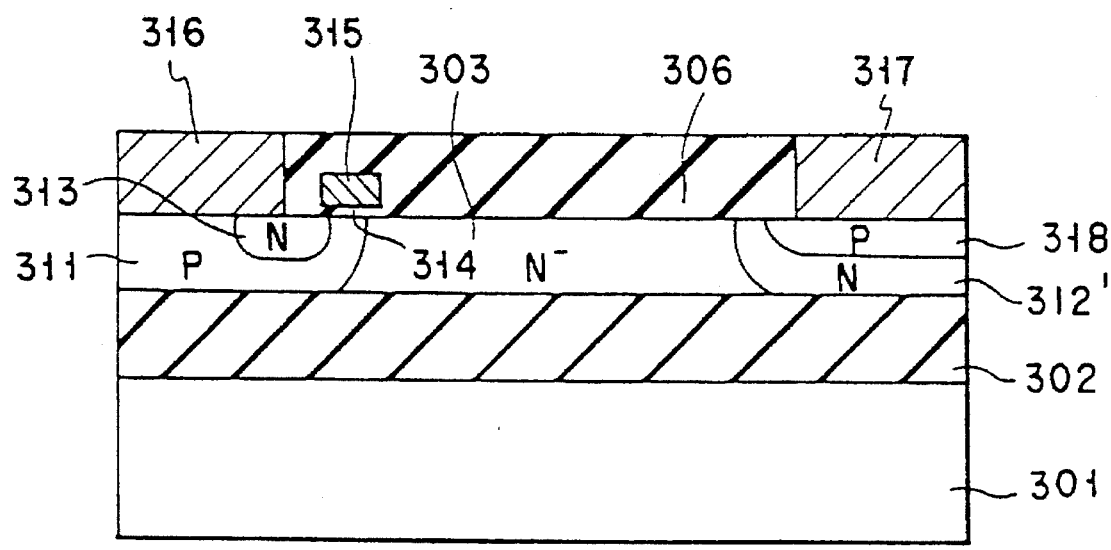
F I G. 91

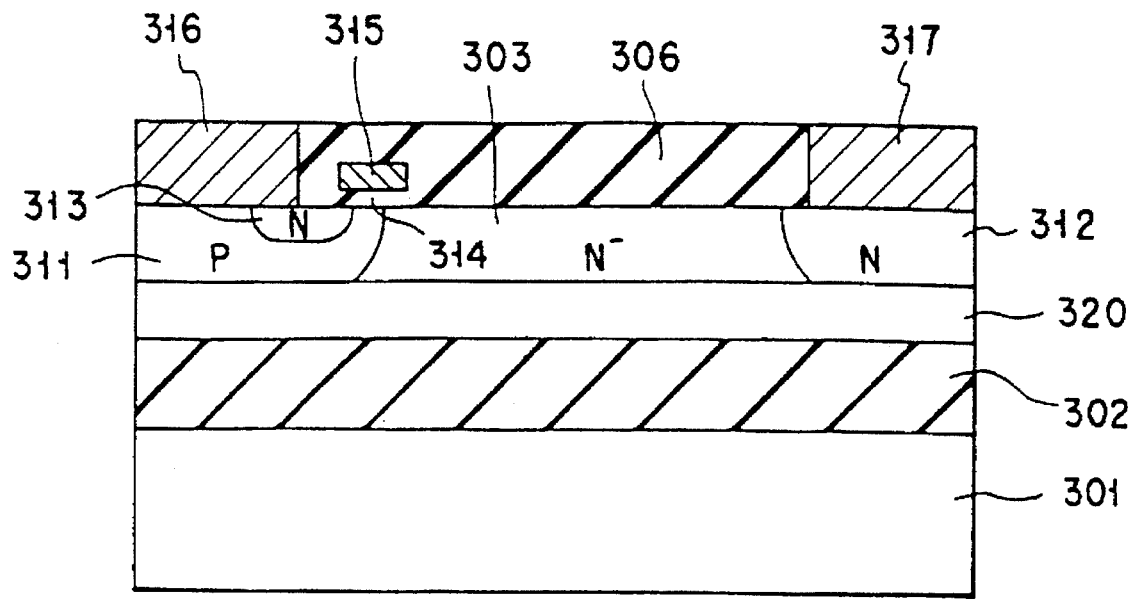
F I G. 94
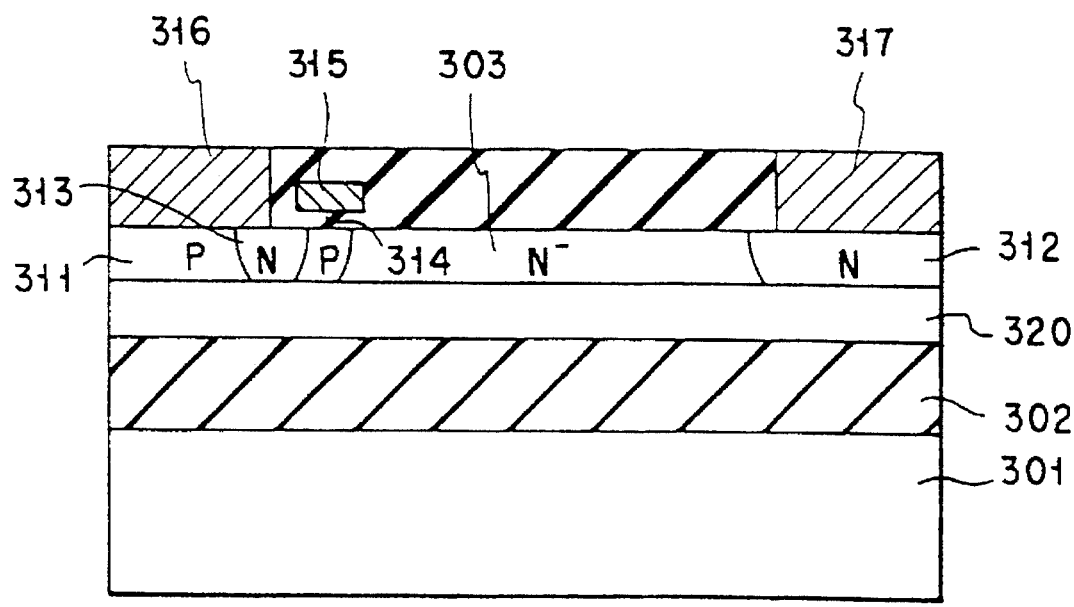
F I G. 95

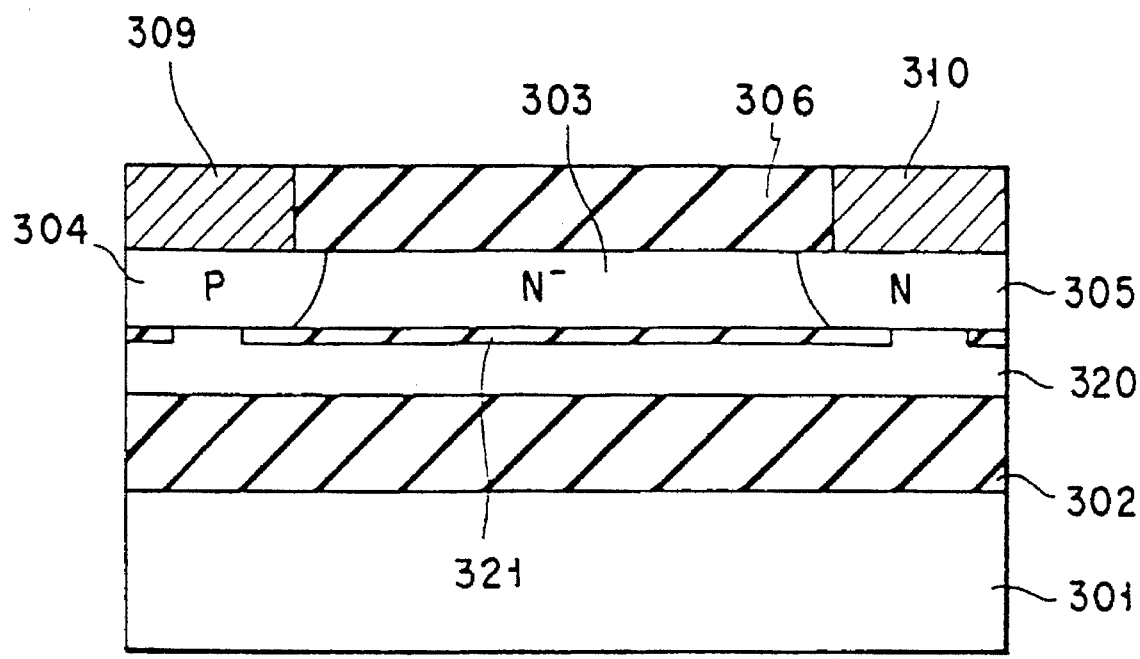
F I G. 96

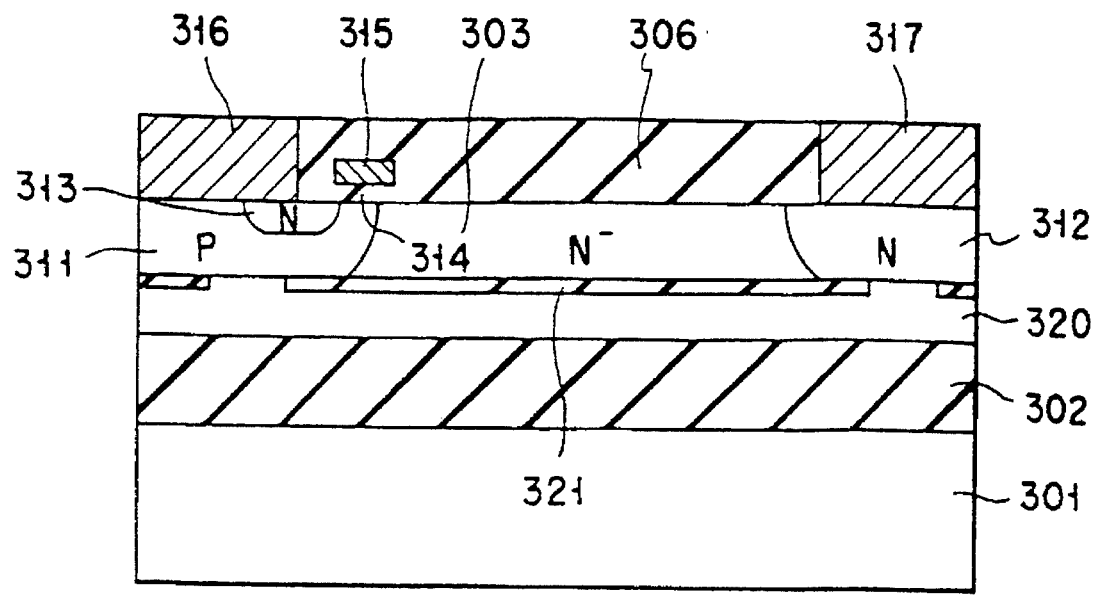
F I G. 97
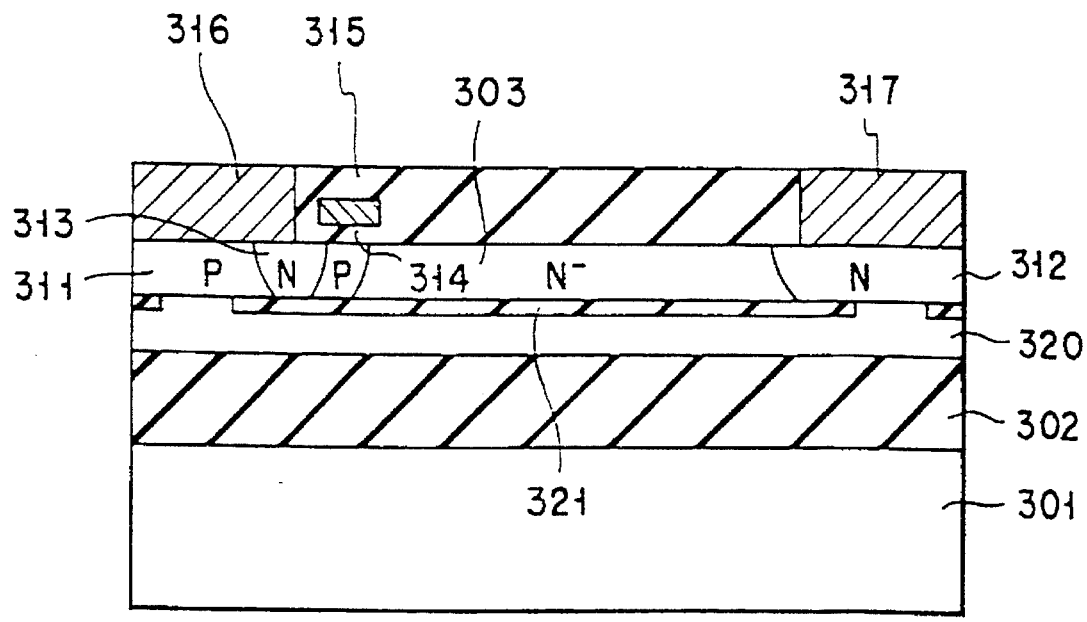
F I G. 98

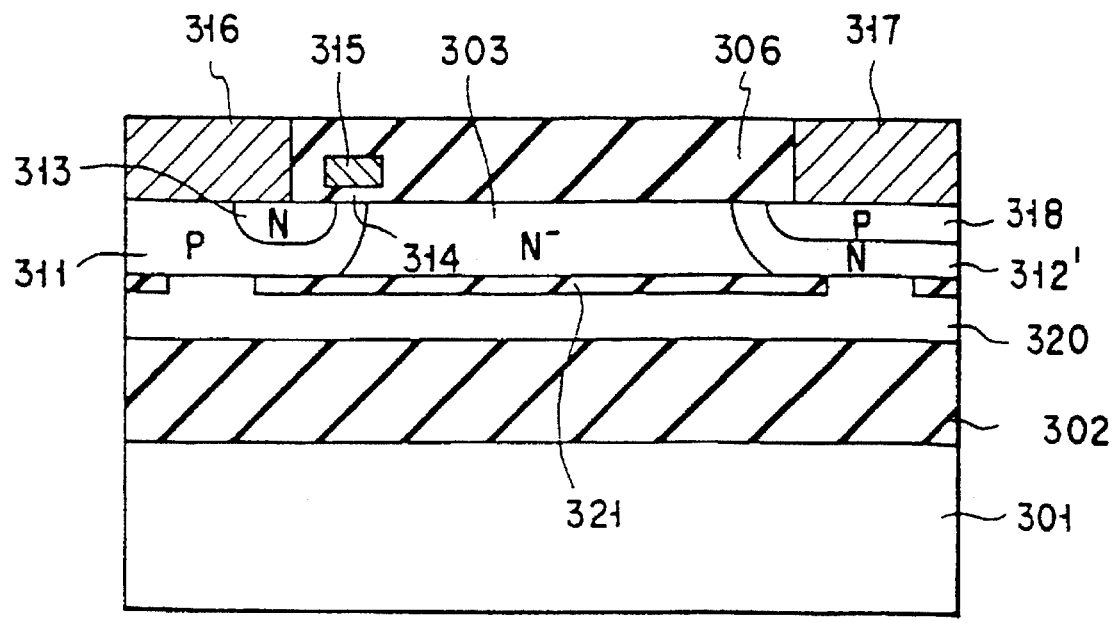
F I G. 99
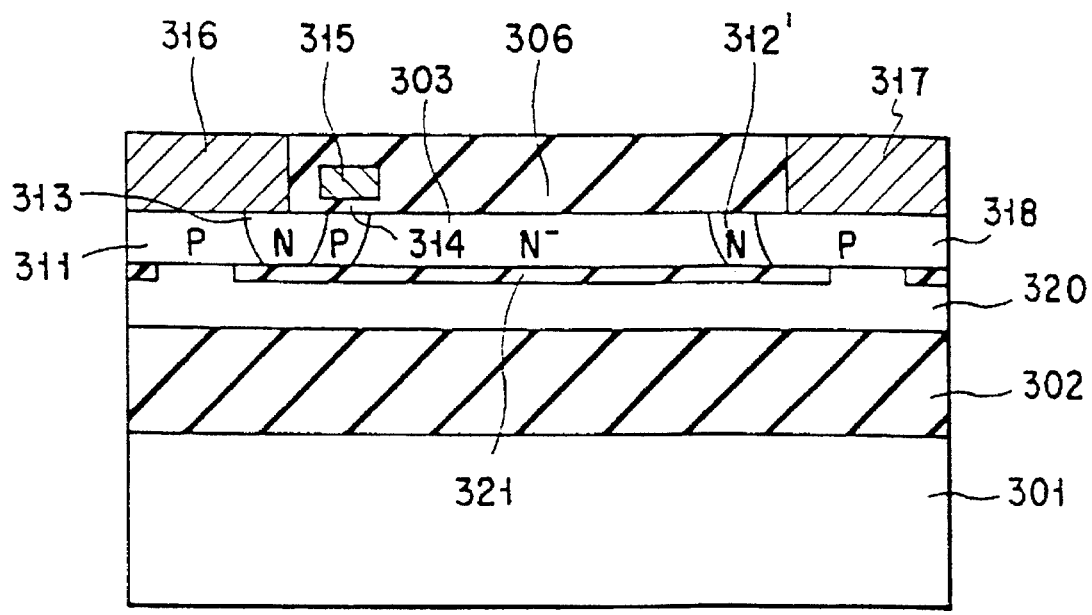
F I G. 100

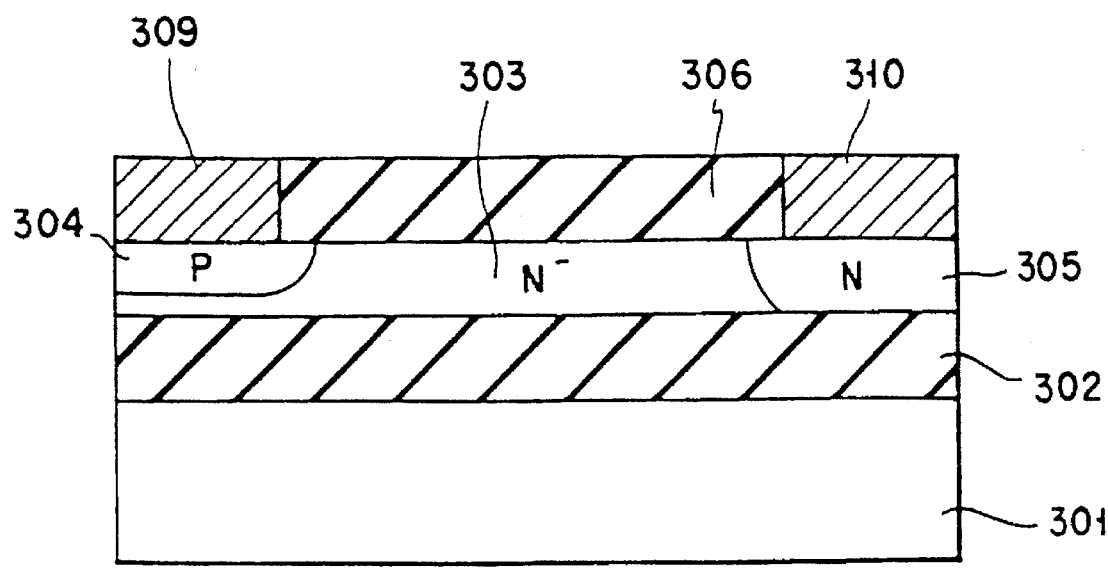
F I G. 101
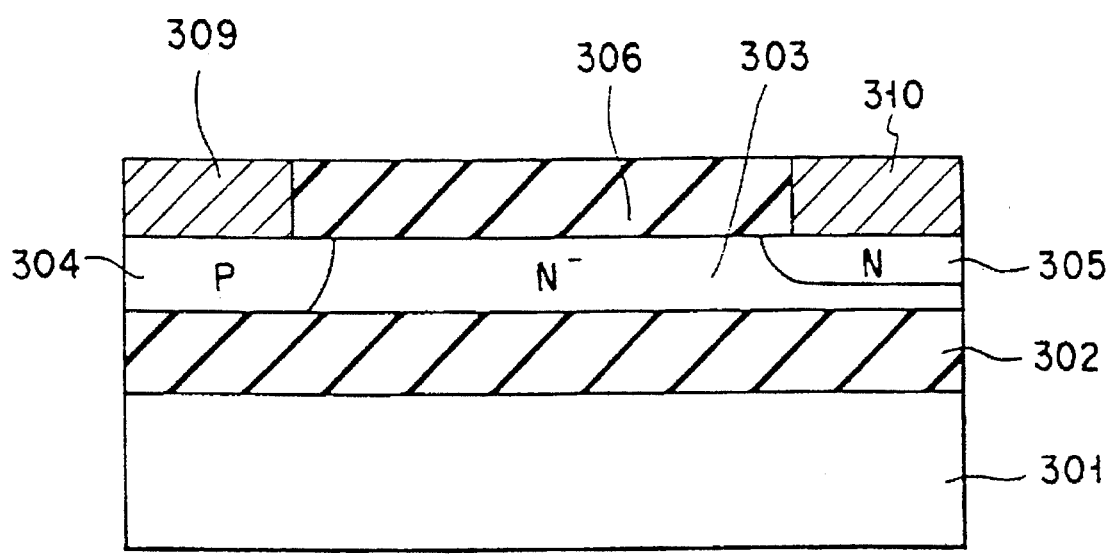
F I G. 102

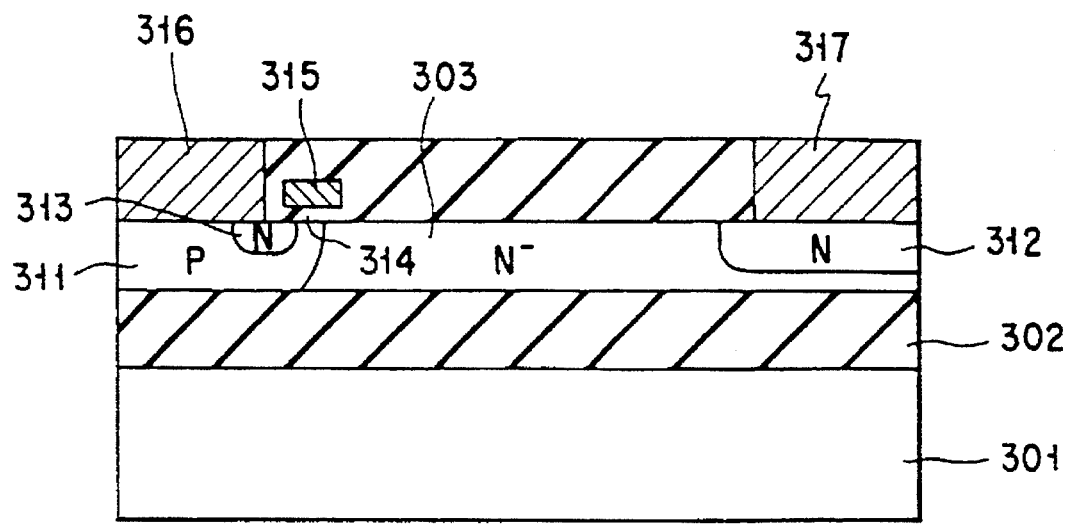
F I G. 103
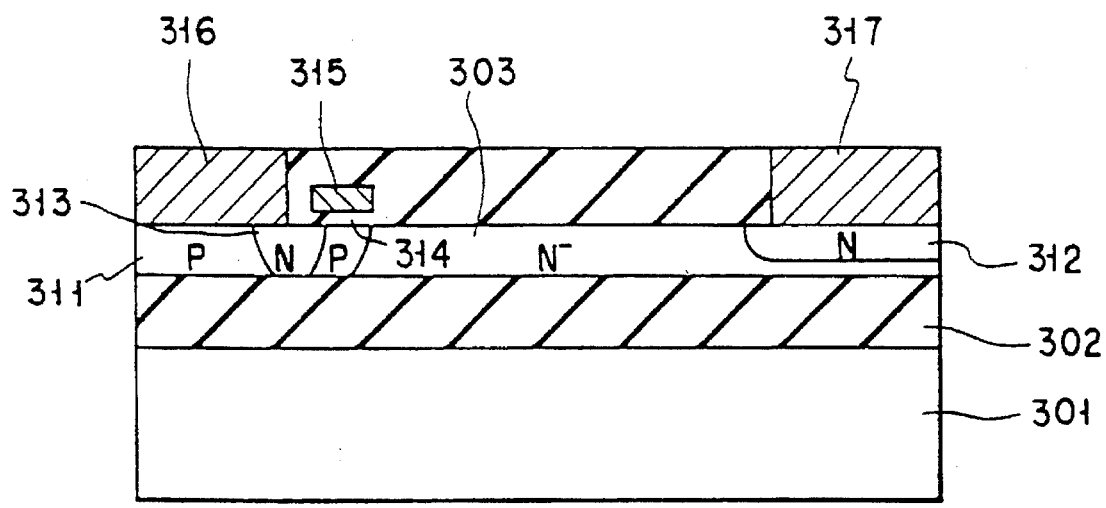
F I G. 104

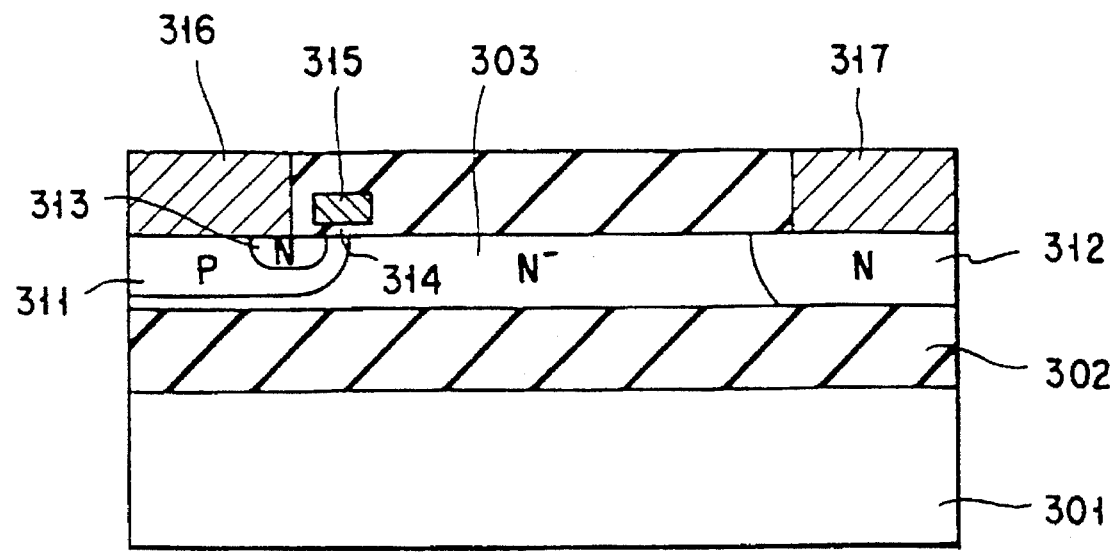
F I G. 105
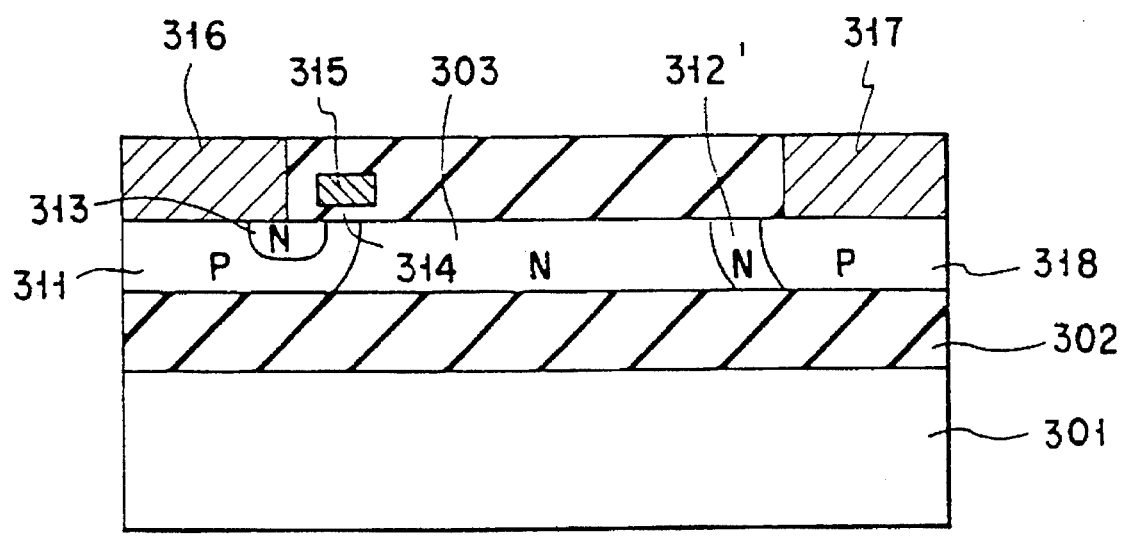
F I G. 106

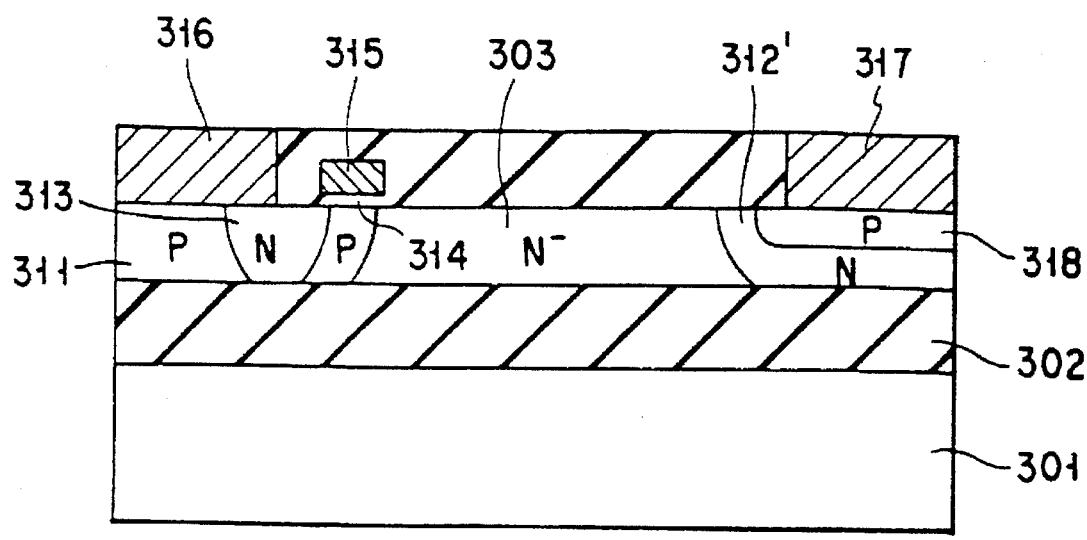
F I G. 107
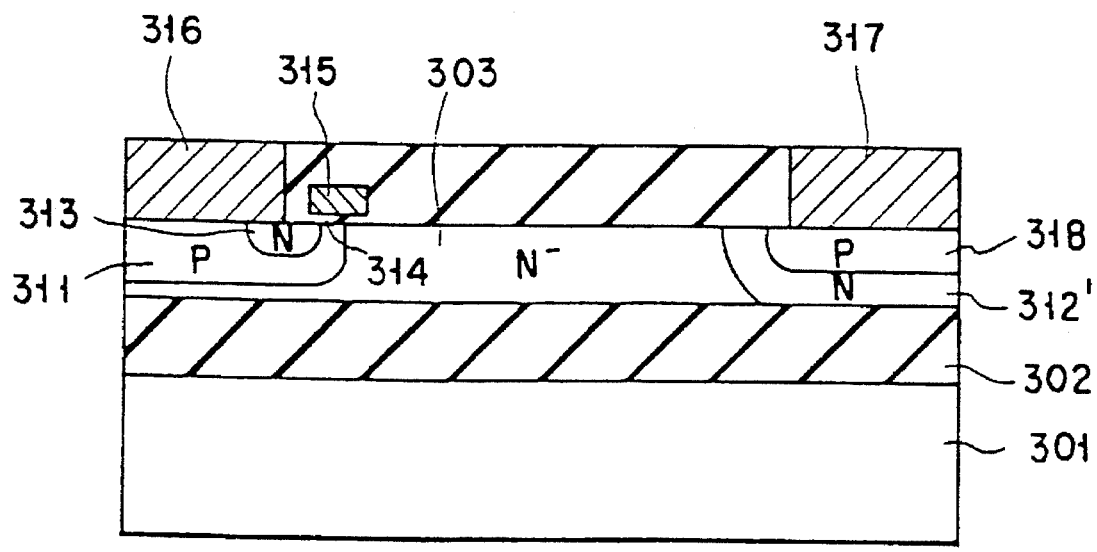
F I G. 108

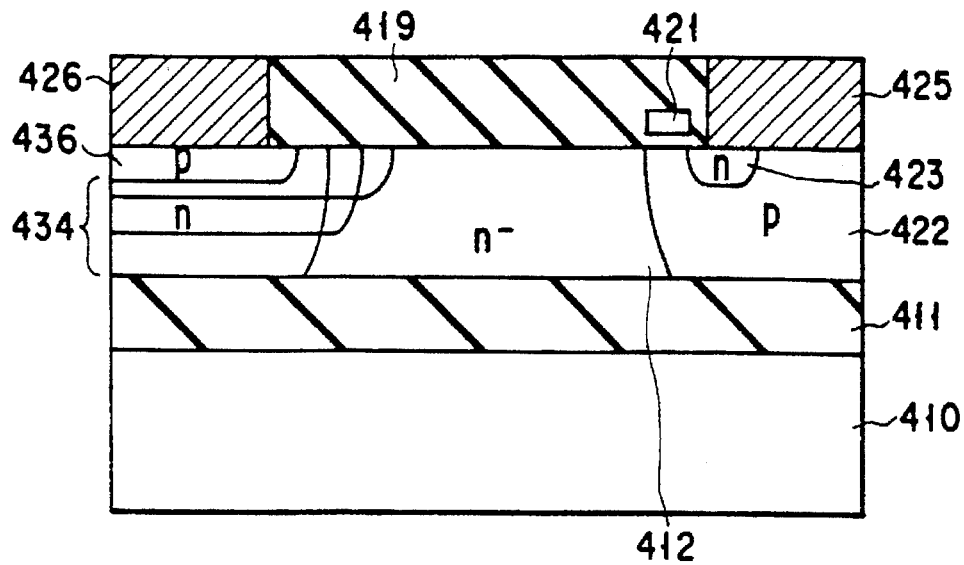
F I G. 134
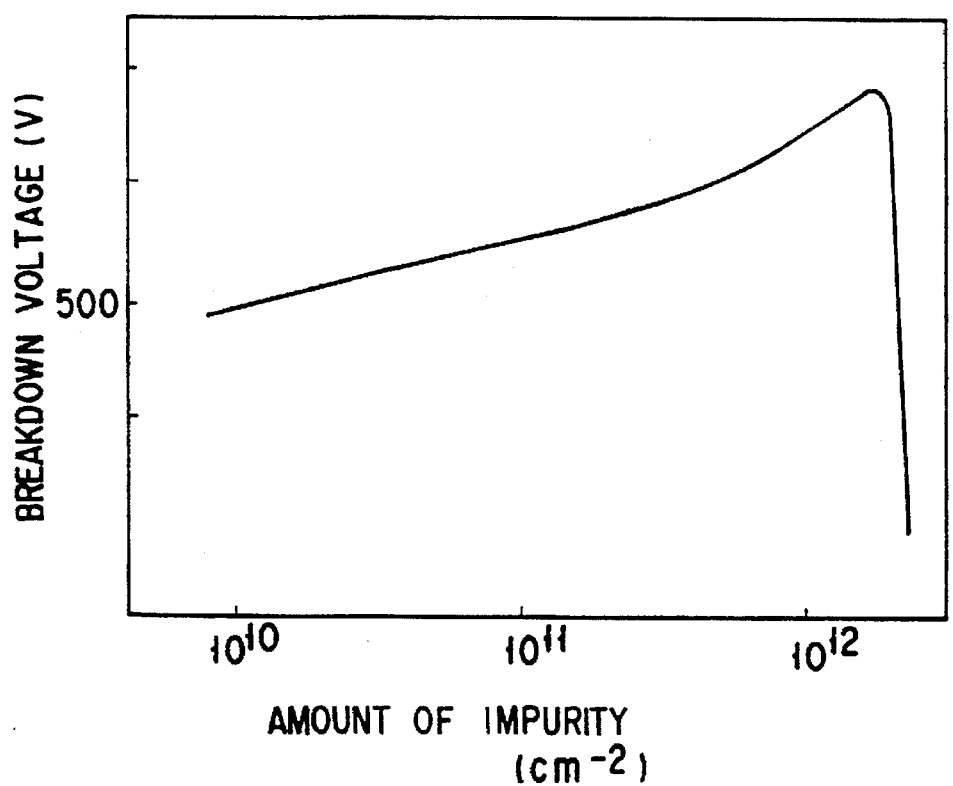
F I G. 135

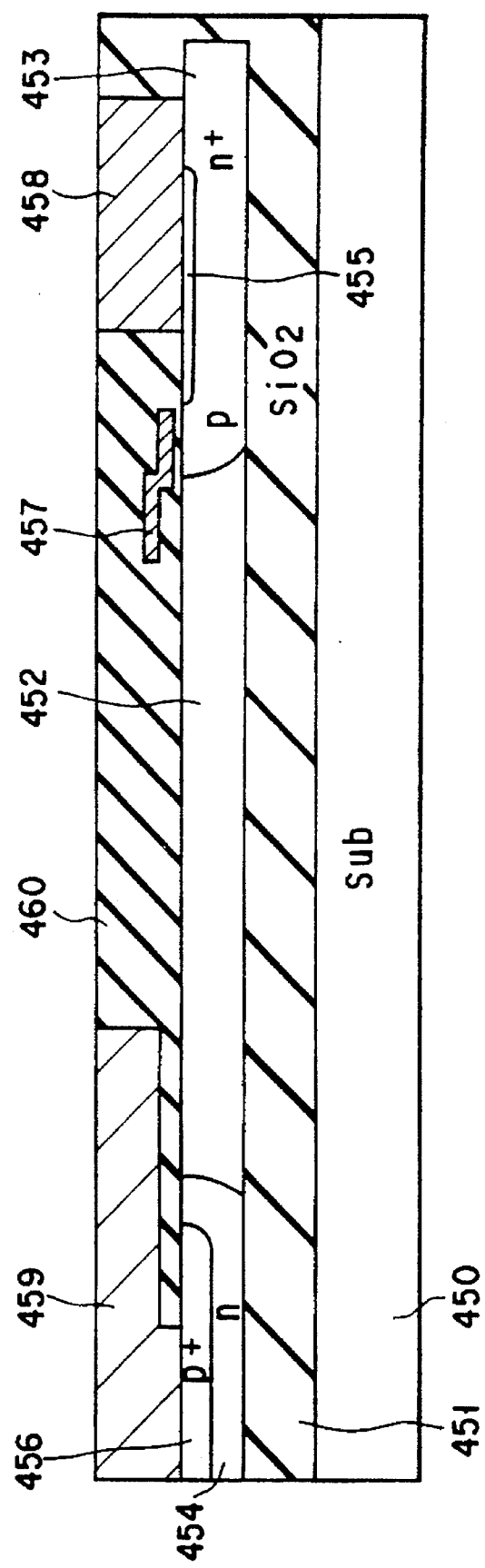
F I G. 136

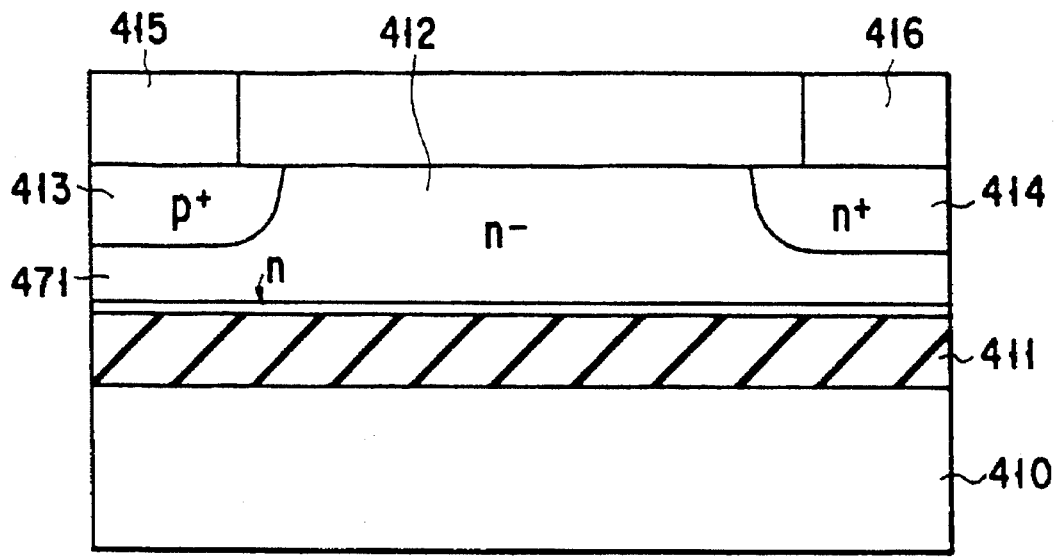
F I G. 153
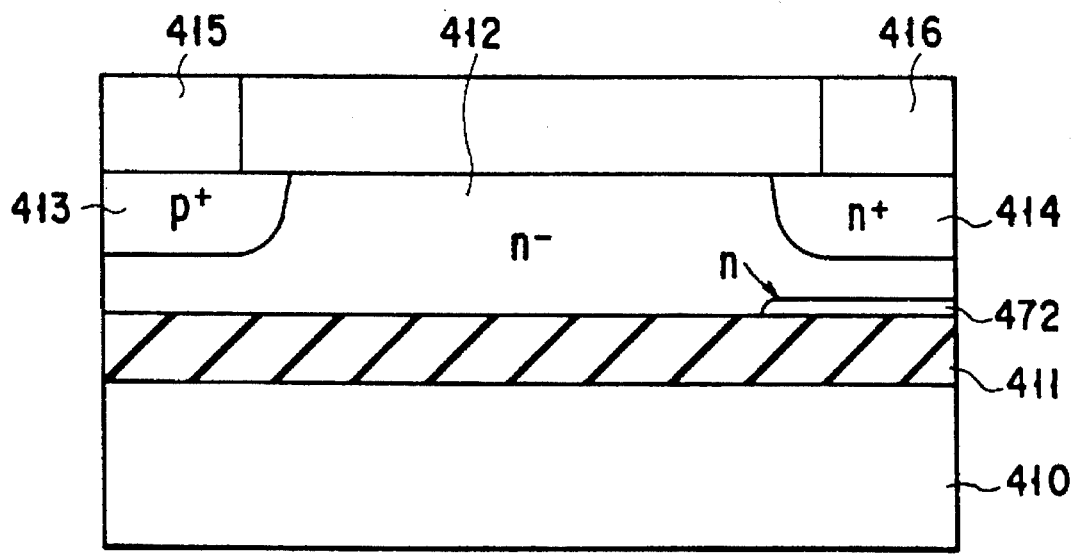
F I G. 154

HIGH BREAKDOWN VOLTAGE SEMICONDUCTOR DEVICE

CROSS-REFERENCE TO THE RELATED APPLICATION

This is a continuation of application Ser. No. 08/085,056 filed on Jul. 2, 1993, now U.S. Pat. No. 5,438,220; which is a CIP of application Ser. No. 07/829,214 filed Jan. 31, 1992, now U.S. Pat. No. 5,343,067; which is a CIP of application Ser. No. 07/642,565 filed Jan. 18, 1991, now U.S. Pat. No. 5,241,210; which is a CIP of application Ser. No. 07/236,746 filed Aug. 26, 1988 now abandoned; which is a CIP of application Ser. No. 07/161,102 filed Feb. 26, 1988, now abandoned.

BACKGROUND OF THE INVENTION

1. Field of the Invention

The present invention relates to a high breakdown voltage semiconductor device.

2. Description of the Related Art

In a high breakdown voltage semiconductor device, dielectric isolation method is known as an effective method of isolating each element.

FIG. 1 shows a conventional high breakdown voltage diode obtained by using such a dielectric isolation method. Reference numeral 101 denotes a p$^+$ type silicon substrate. and there is formed a substrate wafer in which the p$^+$ type silicon substrate and an n$^-$ (or p$^-$) type silicon substrate are bonded to each other by a direct bonding method. Reference numeral 102 is an oxide film of a bonding interface. The n$^-$ type substrate of the substrate wafer is selectively etched up to the depth reaching the oxide film 102. so that a groove is formed. Thereby, an n$^-$ type layer 103, which is an island element region, is formed. In the groove, an oxide film 104 is formed inside and a polycrystalline silicon film 105 is buried therein. An n$^+$ type layer 106, serving as a cathode region, is formed in the central surface portion of the island n$^-$ type layer 103 isolated from other portions by the oxide films 102 and 104. Then, p$^+$ type layer 107, serving as an anode region, is formed in the peripheral surface portion. As result, a diode is formed. p$^+$ layers 108 and 109 are formed along the oxide films 102 and 104 so as to enclose the surroundings of the island n$^-$ type layer 103. The p$^+$ type layers 108 and 109 are formed so as to allow large current to flow. A cathode electrode 110 and an anode electrode 111 are formed on the n+ type layer 106 and p$^+$ type layer 107, respectively.

In the above diode, if reverse bias is applied to the portion between the anode and the cathode and a depletion layer extends to the n$^-$ type layer 103, and all applied voltages are applied between the n$^+$ type layer 106 of the surface portion and the p$^+$ type layer 108 of the bottom portion. Therefore, in order to obtain a diode having sufficient high breakdown voltage, it is required that a distance d between the n+ type layer 106 and the p$^+$ type layer 108 be sufficiently largely made. More specifically, in order to obtain voltage of 600 V, d=45 µm is needed.

If the thickness of the n$^-$ type layer 103 is made larger so as to ensure the above-mentioned distance d, the groove for the element isolation in a lateral direction must be deepened in accordance with the thickness of the n$^-$ type layer 103. This makes it extremely difficult to perform the element isolation in the lateral direction.

As mentioned above, according to the semiconductor device having the conventional dielectric isolation structure, it is necessary to make the thickness of the high resistance semiconductor layer whose depletion layer extends sufficiently large so as to obtain a sufficient high breakdown voltage. Due to this, there is a problem that the element isolation becomes difficult to be performed.

The following explains the other examples of the semiconductor device having the conventional dielectric isolation structure.

FIG. 2 shows a conventional lateral type diode having the conventional dielectric isolation structure. An n$^-$ type silicon layer (active layer) 133 is formed on a semiconductor substrate 131 via an insulating film 132 for isolation. An n$^+$ type layer 134 having a high impurity concentration is formed in the bottom portion of the active layer 133. A p-type anode layer 135 is formed in the active layer 133 and an n-type cathode layer 136 is formed in a portion which is away from the p-type anode layer 135 with a predetermined distance, and an anode electrode 137 and a cathode electrode 138 are formed on the anode layer 135 and the cathode layer 136, respectively.

In the above-mentioned lateral type diode, for example, considering a reverse bias state in which the anode electrode 137 and the substrate 131 are grounded and a positive voltage is applied to the cathode electrode 138, the voltage to be applied to the cathode is applied to the depletion layer extending to the active layer under the p-type anode layer 137, and the insulating film 132 for isolation.

Due to this, if the thickness of the active layer 133 under n-type cathode layer 136 is thin, a large electric field is shared at this portion, and an electric field concentration occurs in the vicinity of the curved portion of the bottom of the n-type cathode layer 136, and avalanche breakdown is generated at a low applied voltage. In order to avoid the above problem and realize the sufficient high breakdown voltage, the thickness of the active layer 133 is conventionally set to be 40 µm or more.

However, if the thickness of the active layer is large, a deep isolation groove is needed for the element isolating in the lateral direction by a V-groove, and an area of the isolation groove reaction becomes large. Due to this, work processing becomes difficult and an effective area of the element becomes small, so that the cost of an integrated circuit having the high breakdown voltage element increases.

As mentioned above, in the high breakdown voltage semiconductor device having the conventional dielectric isolation structure, if the active layer is thin, a sufficient breakdown voltage cannot be obtained. Moreover, if the active layer is thick, the element isolation in the lateral direction becomes difficult.

SUMMARY OF THE INVENTION

In order to solve the above-mentioned problems, an object of the present invention is to provide a semiconductor device having high breakdown voltage using the dielectric isolation structure wherein a sufficiently high breakdown voltage can be obtained even if a relative thin high resistance semiconductor layer is used.

According to the first aspect of the present invention, there is provided a high breakdown voltage semiconductor device comprising a semiconductor substrate, an insulating layer formed on the semiconductor substrate, a high resistance semiconductor layer formed on the insulating layer, an isolation region formed in the high resistance semiconductor layer, an element region formed in the high resistance semiconductor layer isolated by the isolation region in a lateral direction, a first low resistance region of a first conductivity type formed in a central surface portion of the element regions and a second low resistance region of a second conductivity type formed in a peripheral surface portion of the element region, wherein dose of impurities in the element region is set such that a portion of the element region between the first low resistance region and the second low resistance region is completely depleted when voltage is applied between the first and second low resistance regions.

According to the second aspect of the present invention, there is provided a high breakdown voltage semiconductor device comprising a semiconductor substrate, an insulating layer formed on the semiconductor substrate, a high resistance semiconductor layer formed on the insulating layer, an isolation region formed in the high resistance semiconductor layer, an element region formed in the high resistance semiconductor layer isolated by the isolation region in a lateral direction from the isolation region, a first low resistance region of a first conductivity type formed in a region extending from a surface of the element region to the insulating layer, and a second low resistance region of a second conductivity type formed in a region extending from a surface of the element region to the insulating layer, wherein dose of impuritiez in the element region is set such that a portion of the element region between the first low resistance region and the second low resistance region is completely depleted when voltage is applied between the first and second low resistance regions.

According to the third embodiment of the present invention, there is provided a lateral type insulated gate bipolar transistor comprising a semiconductor substrate, an insulating layer formed on the semiconductor substrate, a high resistance semiconductor layer formed on the insulating layer, an isolation region formed in the high resistance semiconductor layer, an element region formed in the high resistance semiconductor layer isolated by the isolation region in a lateral direction, a first low resistance region of a first conductivity type formed in a central surface portion of the element region, a second low resistance region of a second conductivity type formed in a peripheral surface portion of the element region, a drain region of a second conductivity type formed in the first low resistance region, and a source region of a first conductivity type formed in the second low resistance region, wherein dose of impurities in the element region is set such that a portion of the element region between the source region and the drain region is completely depleted when voltage is applied between the source region and the drain region.

According to the fourth aspect of the present invention, there is provided a high breakdown voltage semiconductor device comprising a semiconductor substrate, an insulating layer formed on the semiconductor substrate, a high resistance semiconductor layer formed on the insulating layer, an isolation region formed in the high resistance semiconductor layer, an element region formed in the high resistance semiconductor layer isolated by the isolation region in a lateral direction, a first low resistance region of a first conductivity type formed in a central surface portion of the element region, and a second low resistance region of a second conductivity type formed in a surface portion of the element region to be separated from the first low resistance region, wherein when voltage is applied between the first low resistance region and the second low resistance region and that both potential of the first low resistance region and that of the second low resistance region are higher than potential of the semiconductor substrate, a channel region of a second conductive type is formed in the bottom portion of the element region, whereby influence of potential of the semiconductor substrate is shielded.

According to the fifth aspect of the present invention, there is provided a high breakdown voltage semiconductor device comprising a semiconductor substrate, an insulating layer formed on the semiconductor substrate, an active layer formed on the insulating layer and made of high-resistance semiconductor of a first conductivity type, a first impurity region of the first conductivity type formed in the active layer, and a second impurity region of a second conductivity type formed in the active layer and spaced apart from the first impurity region for a predetermined distance, wherein the first impurity region comprises a plurality of diffusion regions which are superimposed one upon another and which differ in the diffusion depth or the diffusion window width, or both.

According to the sixth aspect of the present invention, there is provided a high breakdown voltage semiconductor device comprising a semiconductor substrate, an insulating layer formed on the semiconductor substrate, an active layer formed on the insulating layer, made of high-resistance semiconductor and having a thickness of 0.3 μm or less, wherein the active layer has a lateral impurity-concentration distribution of 2-step to 10-step, each step having Gaussian distribution with a step interval of twice or more the diffusion length.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a cross sectional view showing a diode of an embodiment in which a second low resistance region is deeply formed by impurity diffusion;

FIG. 4 is a cross sectional view showing a diode of an embodiment in which the buffer layer is formed in the bottom portion of the device of FIG. 3;

FIG. 5 is a cross sectional view showing a diode of an embodiment in which each conductivity type of each portion of FIG. 3 is reversed;

FIG. 6 is a cross sectional view showing an embodiment in which the present invention is applied to a IGBT;

FIG. 7 is a cross sectional view showing an IGBT of an embodiment in which the structure of FIG. 6 is modified;

FIG. 15 is a cross sectional view showing an embodiment in which the IGBT of the embodiment of FIG. 6 is partially modified;

FIG. 16 is a cross section view showing an embodiment of FIG. 6 is partially modified;

FIG. 22 is a cross sectional view showing an embodiment in which the embodiment of FIG. 15 is partially modified;

FIG. 23 is a cross sectional view showing an embodiment in which the embodiment of FIG. 22 is partially modified;

FIG. 24 is a cross sectional view showing an embodiment in which the embodiment of FIG. 15 is partially modified;

FIG. 25 is a cross sectional view showing an embodiment in which the embodiment of FIG. 24 is partially modified; and FIG. 26 is a view showing an embodiment in which the present invention is applied to the lateral type diode;

FIG. 27 is a view showing a diode of an embodiment in which the structure of FIG. 26 is slightly modified;

FIG. 28 is a view showing an embodiment in which the present invention is applied to the MOSFET;

FIG. 29 is a view showing a MOSFET of an embodiment in which the structure of FIG. 28 is modified;

FIG. 30 is a view showing a MOSFET of an embodiment in which the structure of FIG. 28 is modified;

FIG. 31 is a view showing a MOSFET of an embodiment in which the structure of FIG. 29 is modified;

FIG. 32 is a view showing an embodiment in which the present invention is applied to the lateral type IGBT;

FIG. 33 is a view showing an IGBT of an embodiment in which the structure of FIG. 32 is modified;

FIG. 34 is a view showing an IGBT of an embodiment in which the structure of FIG. 32 is modified;

FIG. 35 is a view showing an IGBT of an embodiment in which the structure of FIG. 33 is modified;

FIG. 36 is a view showing a diode of an embodiment in which the structure of FIG. 26 is modified;

FIG. 37 is a view showing a MOSFET of an embodiment in which the structure of FIG. 28 is modified;

FIG. 38 is a view showing a MOSFET of an embodiment in which the structure of FIG. 37 is modified;

FIG. 39 is a view showing a MOSFET of an embodiment in which the structure of FIG. 35 is modified;

FIG. 40 is a view showing a diode of an embodiment in which a base high resistance film is added to the structure of FIG. 26;

FIG. 41 is a view showing a diode of an embodiment in which a base high resistance film is added to the structure of FIG. 27;

FIG. 46 is a view showing an IGBT of an embodiment in which a base high resistance film is added to the structure of FIG. 32;

FIG. 47 is a view showing an IGBT of an embodiment in which a base high resistance film is added to the structure of FIG. 33;

FIG. 48 is a view showing an IGBT of an embodiment in which a base high resistance film is added to the structure of FIG. 34;

FIG. 49 is a view showing an IGBT of an embodiment in which a base high resistance film is added to the structure of FIG. 35;

FIG. 50 is a view showing a diode of an embodiment in which a base high resistance film is added to the structure of FIG. 36;

FIG. 51 is a view showing a MOSFET of an embodiment in which a base high resistance film is added to the structure of FIG. 37;

FIG. 52 is a view showing a MOSFET of an embodiment in which a base high resistance film is added to the structure of FIG. 38;

FIG. 53 is a view showing a MOSFET of an embodiment in which a base high resistance film is added to the structure of FIG. 39;

FIG. 54 is a view showing a diode of an embodiment in which the structure of FIG. 40 is modified;

FIG. 55 is a view showing a diode of an embodiment in which the structure of FIG. 41 is modified;

FIG. 56 is a view showing a MOSFET of an embodiment in which the structure of FIG. 42 is modified;

FIG. 57 is a view showing a MOSFET of an embodiment in which the structure of FIG. 43 is modified;

FIG. 58 is a view showing a MOSFET of an embodiment in which the structure of FIG. 44 is modified;

FIG. 59 is a view showing a MOSFET of an embodiment in which the structure of FIG. 45 is modified;

FIG. 60 is a view showing an IGBT of an embodiment in which the structure of FIG. 46 is modified;

FIG. 61 is a view showing an IGBT of an embodiment in which the structure of FIG. 47 is modified;

FIG. 62 is a view showing an IGBT of an embodiment in which the structure of FIG. 48 is modified;

FIG. 63 is a view showing an IGBT of an embodiment in which the structure of FIG. 49 is modified;

FIG. 64 is a view showing a diode of an embodiment in which the structure of FIG. 50 is modified;

FIG. 65 is a view showing a MOSFET of an embodiment in which the structure of FIG. 51 is modified;

FIG. 66 is a view showing a MOSFET of an embodiment in which the structure of FIG. 52 is modified;

FIG. 67 is a view showing a MOSFET of an embodiment in which the structure of FIG. 53 is modified;

FIG. 68 is a view showing a diode of an embodiment in which the structure of FIG. 26 is modified;

FIG. 69 is a view showing a diode of an embodiment in which the structure of FIG. 26 is modified;

FIG. 70 is a view showing a MOSFET of an embodiment in which the structure of FIG. 28 is modified;

FIG. 71 is a view showing a MOSFET of an embodiment in which the structure of FIG. 29 is modified;

FIG. 72 is a view showing a MOSFET of an embodiment in which the structure of FIG. 28 is modified;

FIG. 73 is a view showing an IGBT of an embodiment in which the structure of FIG. 32 is modified;

FIG. 74 is a view showing an IGBT of an embodiment in which the structure of FIG. 32 is modified;

FIG. 75 is a view showing an IGBT of an embodiment in which the structure of FIG. 32 is modified;

FIG. 78 is a view showing an IGBT of an embodiment in which the structure of FIG. 32 is modified;

FIG. 79 is a view showing a diode of an embodiment in which the structure of FIG. 26 is modified;

FIGS. 80A to 80C are view a showing an example of the structure of the lateral isolation of the device of the present invention;

FIG. 81 is a view showing the relationship between the total amount of impurities of an active layer and breakdown voltage in the embodiment of FIG. 26;

FIG. 82 is a view showing the relationship between the thickness of an oxide film under the high resistance film and breakdown voltage in the embodiment of FIG. 26;

FIG. 84 is a view showing a diode relating to the other embodiment of the present invention;

FIG. 85 is a view showing an IGBT relating to the other embodiment of the present invention;

FIG. 86 is a view showing an IGBT of an embodiment in which the structure of FIG. 89 is modified;

FIG. 87 is a view showing an IGBT of an embodiment in which the structure of FIG. 85 is modified;

FIGS. 88 to 112 are views showing a diode or an IGBT of an embodiment in which a high resistance film is removed in the embodiments of FIGS. 26 to 79.

FIG. 134 is a cross sectional view showing a fifth modification of the IGBT shown in FIG. 129, which has no high resistance film;

FIG. 135 is a characteristic diagram representing the relationship between the breakdown voltage of the IGBT and the amount of impurity contained in the active layer;

FIG. 136 is a cross sectional view illustrating another lateral type IGBT which is a fourth embodiment of the fifth aspect of this invention;

FIG. 145 is a cross sectional view a second modification of the IGBT shown in FIG. 142, wherein the n type impurity layer has been formed by diffusing the impurity from the entire bottom of the active layer;

FIG. 146 is a cross sectional view illustrating a thyristor manufactured by partly modifying the structure shown in FIG. 136;

FIG. 147 is a cross sectional view showing a lateral type IGBT manufactured by modifying the drain of the IGBT shown in FIG. 137;

FIG. 148 is a cross sectional view showing another IGBT manufactured by modifying the drain of the IGBT shown in FIG. 137;

FIG. 149 is a cross sectional view showing a modification of the IGBT shown in FIG. 137;

FIG. 150 is a cross sectional view showing another modification of the IGBT shown in FIG. 137;

FIG. 151 is a cross sectional view showing still another modification of the IGBT shown in FIG. 137;

FIG. 152 is a cross sectional view showing even another modification of the IGBT shown in FIG. 137;

FIG. 153 is a cross sectional view illustrating a high breakdown voltage diode which is a fifth embodiment of the fifth aspect of the invention;

FIG. 154 is a cross sectional view showing a first modification of the diode shown in FIG. 153, wherein the n type buffer layer is formed in a selected bottom portion of the active layer;

FIG. 155 is a graph representing the relationship between the diffusion length, $2\times(Dt)^{1/2}$, and the breakdown voltage of the device;

FIG. 156 is a cross sectional view showing a second modification of the diode shown in FIG. 153, wherein the n type buffer layer is relatively thin;

Figure 157:
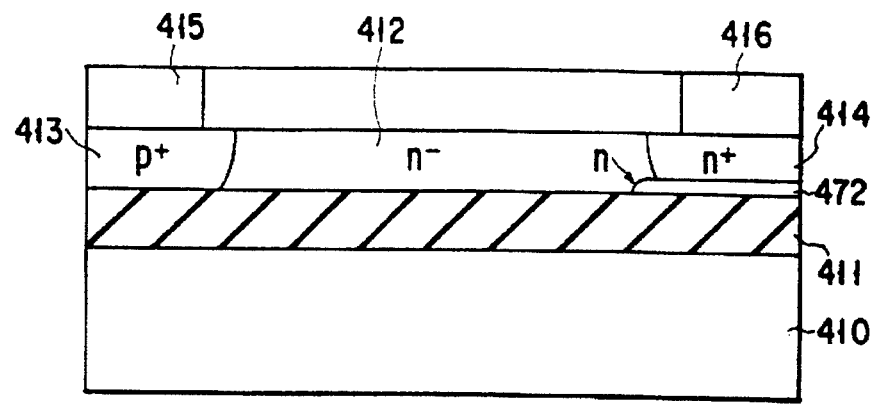
Figure 158:
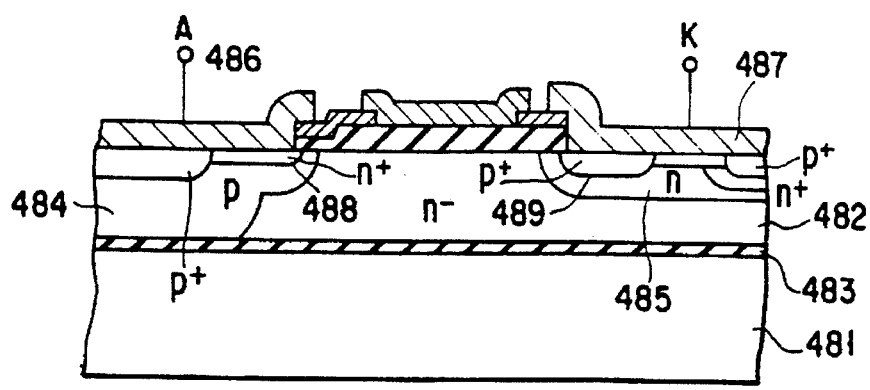
Figure 159:
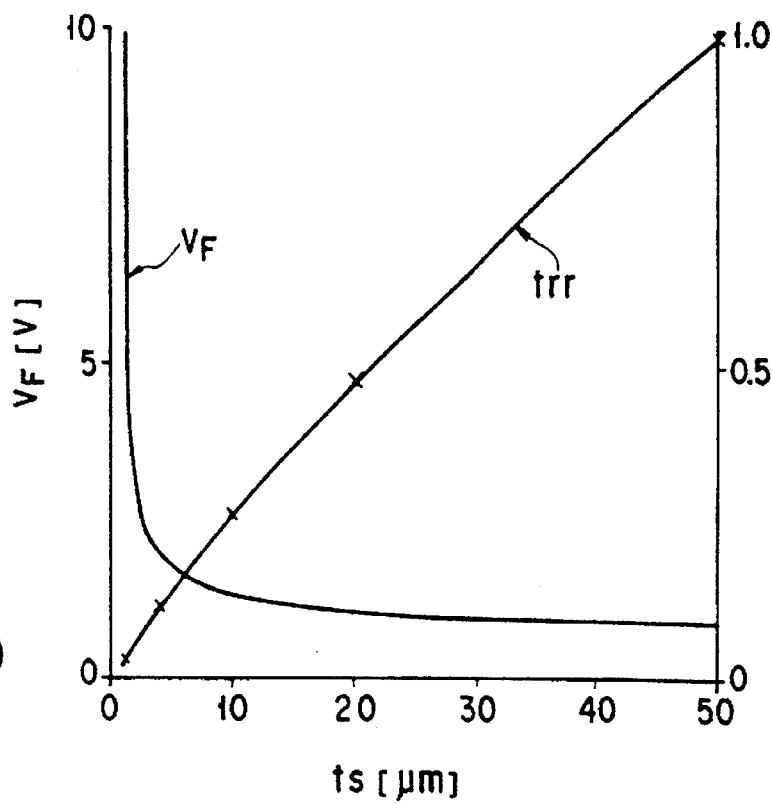
Figure 160A:
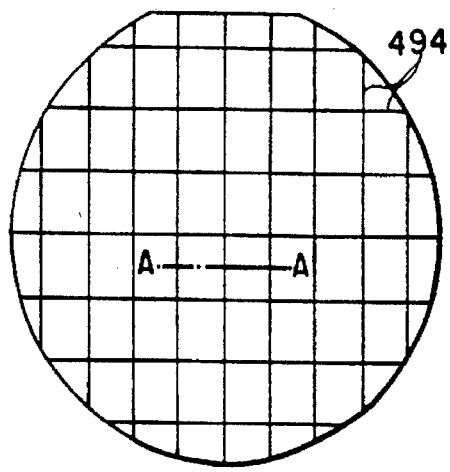
Figure 160B:
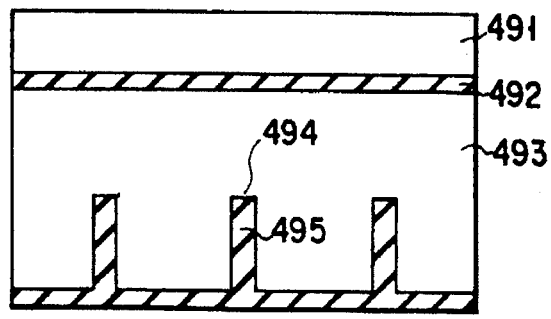
Figure 161A:
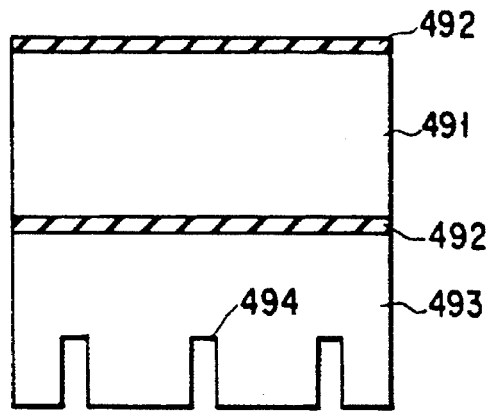
Figure 161B:
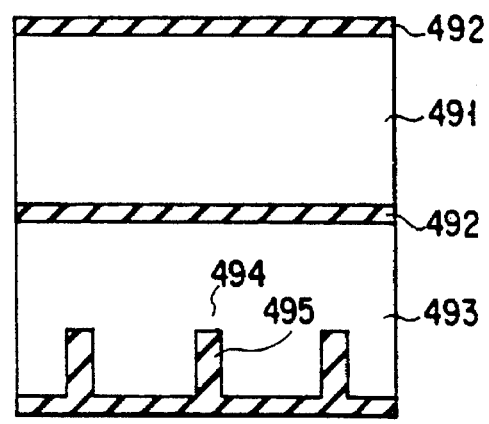
Figure 161C:
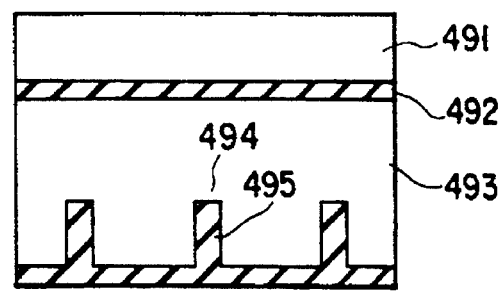
Figure 162:
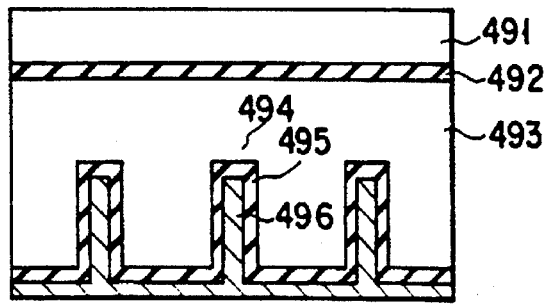
Figure 163:
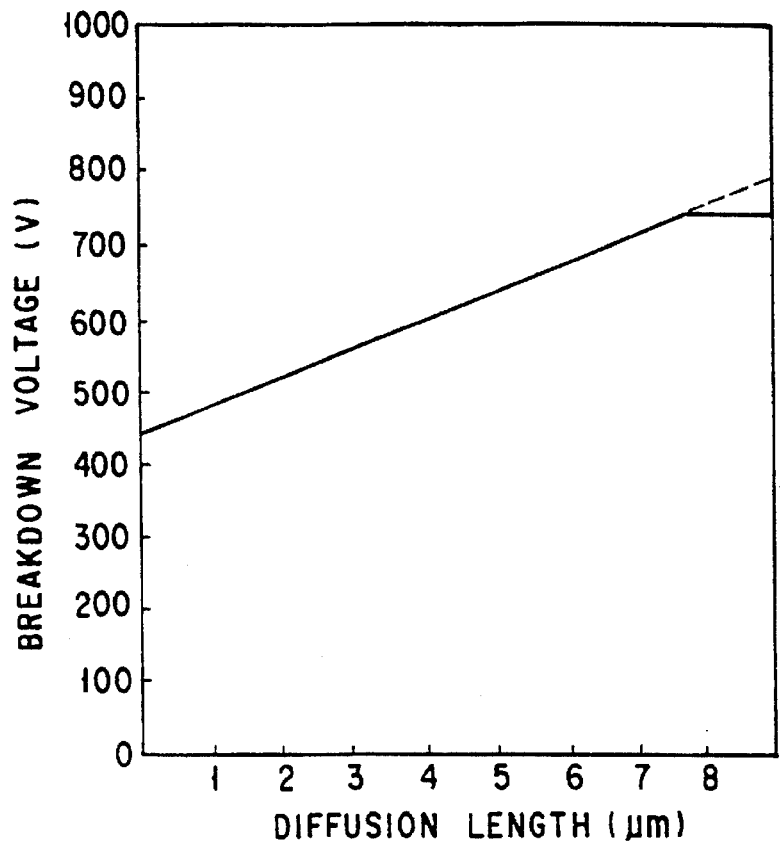
Figure 164:
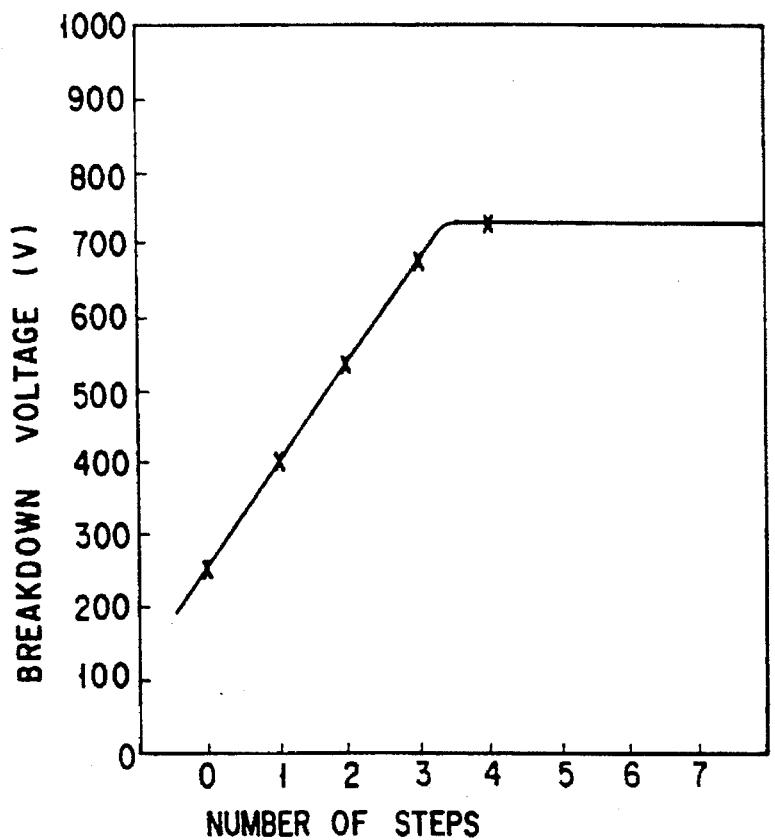
Figure 165:
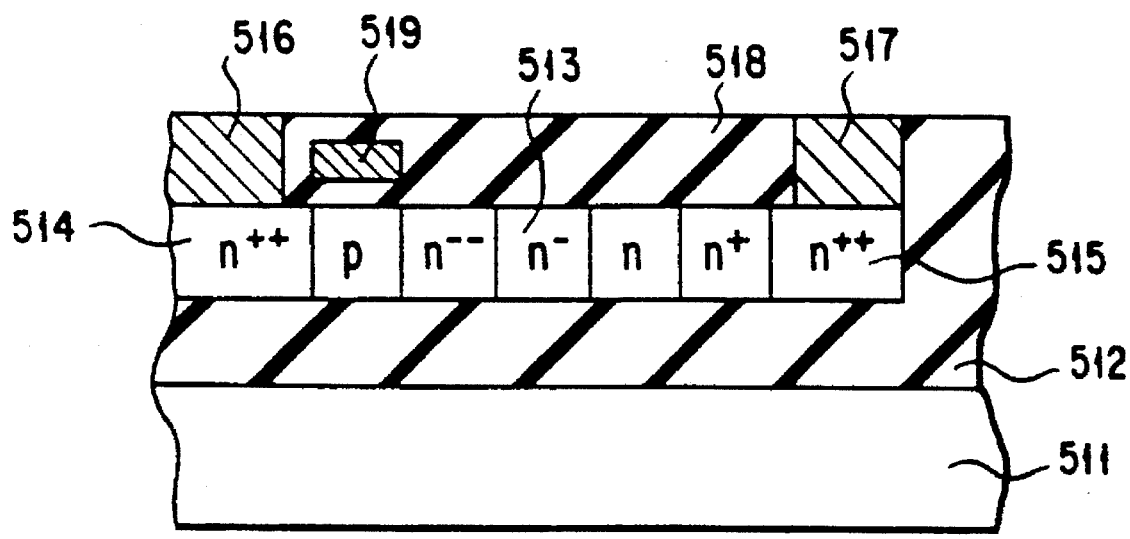
Figure 166:
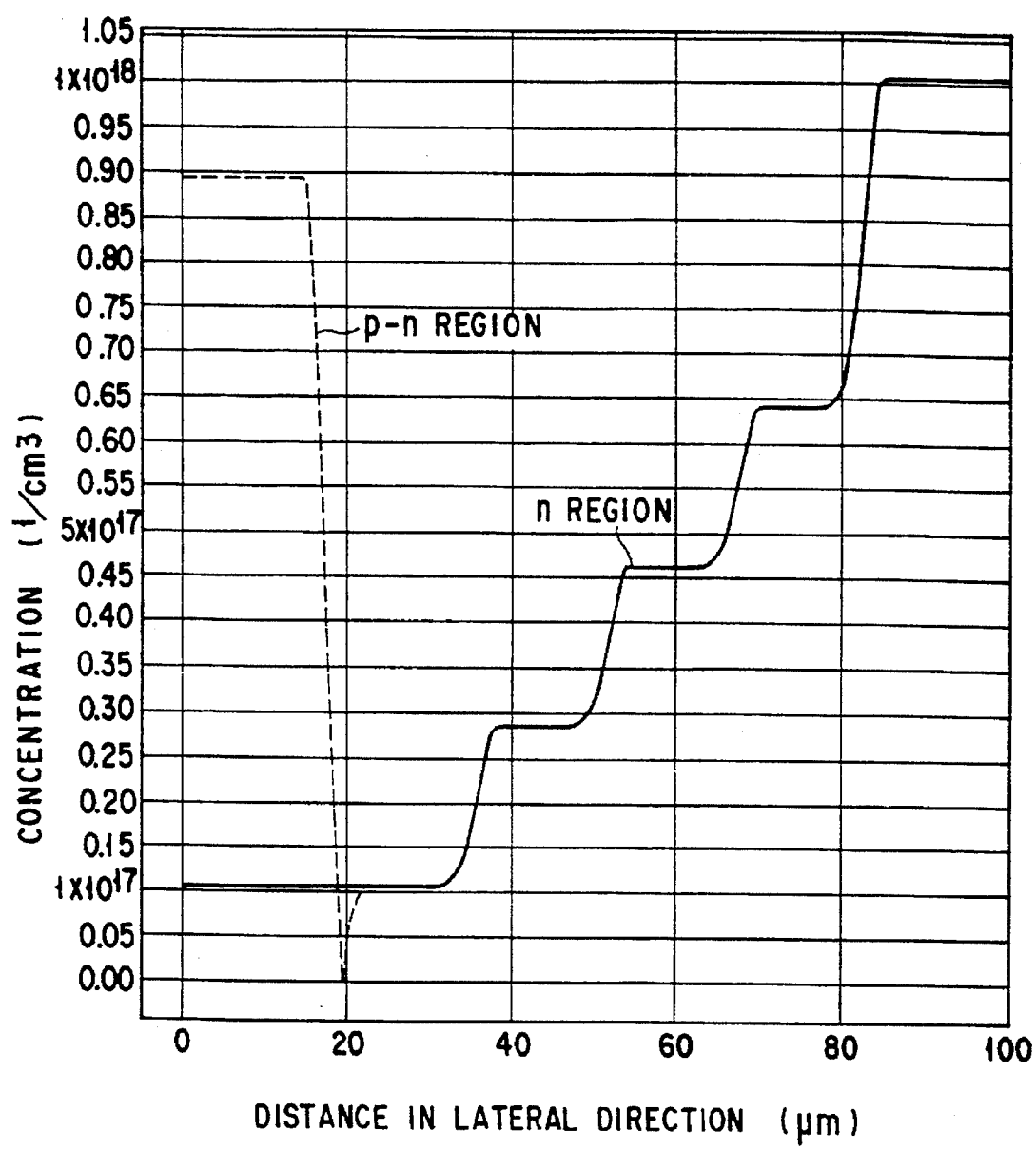
Figure 167:
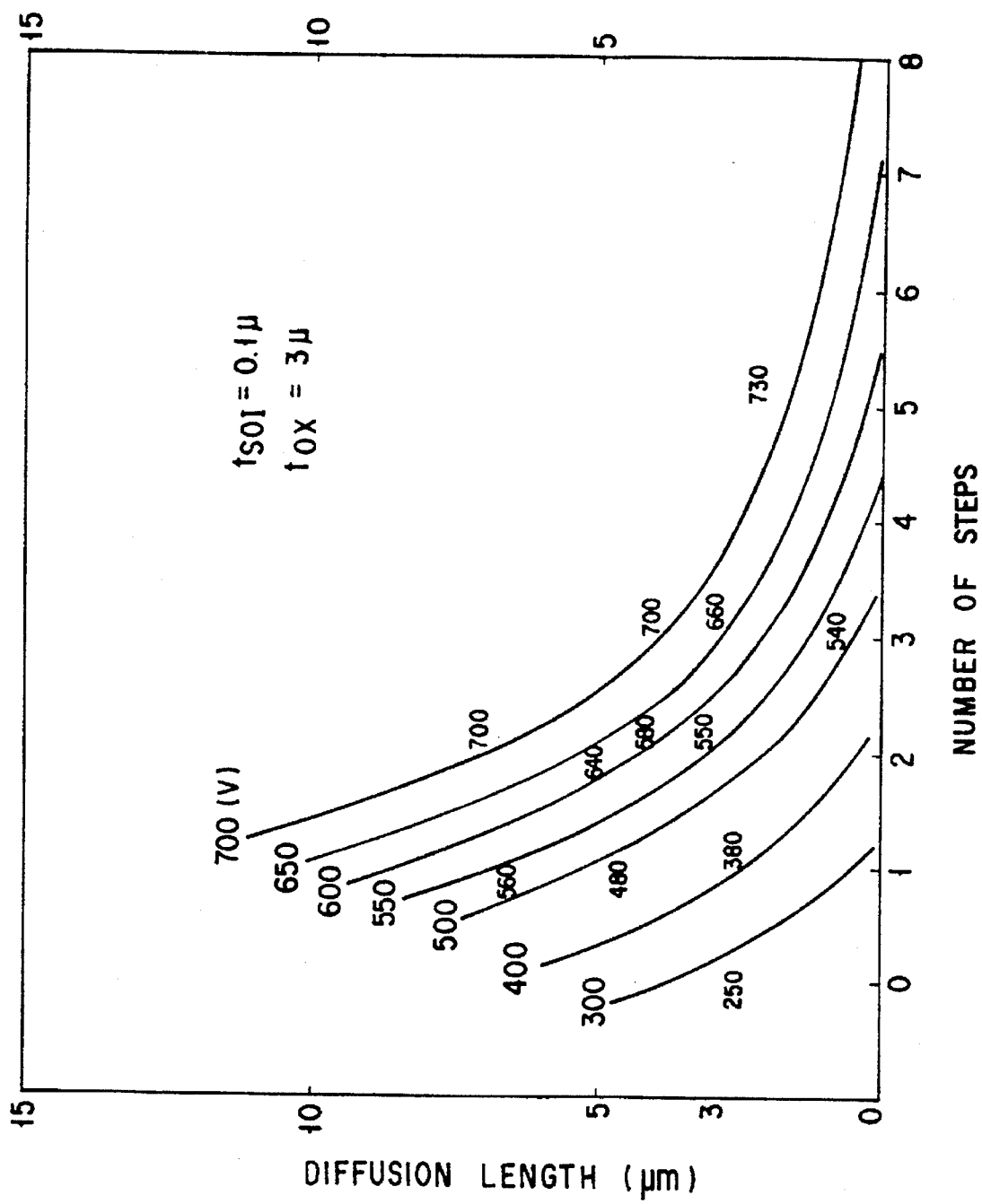

FIG. 157 is a cross sectional view showing a third modification of the diode shown in FIG. 153, wherein the active layer is relatively thin;

FIG. 158 is a cross sectional view illustrating a high-speed diode which is a sixth embodiment of the fifth aspect of the present invention;

FIG. 159 is a graph representing the relationship which the on-voltage Vf and reverse restoration time trr of a diode formed on a dielectric isolation semiconductor substrate have with respect to the thickness ts of the semiconductor substrate which is a component of the dielectric isolation semiconductor substrate;

FIGS. 160A and 160B are respectively a plan view and a sectional view, both showing the dielectric isolation semiconductor substrate used in a seventh embodiment of the fifth aspect of the invention;

FIGS. 161A to 161C are cross sectional views, explaining how the substrate shown in FIGS. 160A and 160B is manufactured;

FIG. 162 is a cross sectional view showing a modification of the semiconductor substrate shown in FIGS. 160A and 160B;

FIG. 163 is a graph representing the relationship between diffusion length and breakdown voltage;

FIG. 164 is a graph representing the relationship between the breakdown voltage and the number of times diffusion has been repeated;

FIG. 165 is a cross sectional view illustrating a dielectric isolation semiconductor device according to a sixth aspect of the present invention;

FIG. 166 is a graph representing the lateral impurity-concentration distribution observed in an active layer which has been formed by repeating impurity diffusion three times; and FIG. 167 is a graph illustrating the relationship which the number of diffusions repeated and the diffusion length have when the breakdown voltage of the device is taken as parameter.

DETAILED DESCRIPTION OF THE PREFERRED EMBODIMENTS

According to a first high breakdown voltage semiconductor device relating to the present invention, for example, it is assumed that reverse bias voltage is applied between first and second low resistance regions in a state that the first low resistance region is set to be a high potential and the second low resistance region is set to be a ground potential. At this time, the applied voltage is impressed to the high resistance semiconductor layer in a deep direction at the same time with the lateral direction. This is because a base semiconductor substrate is normally set to be a ground potential. Then, a depletion layer extends to the high resistance semiconductor layer from a pn junction around of the first or second low resistance region. When the applied voltage runs up to a certain value, the depletion layer reaches up to a first insulating film on the base semiconductor substrate, and the voltage in the deep direction is shared by the high resistance semiconductor layer and the first insulating film.

In order to prevent the avalanche breakdown in such a high voltage applying state, it is better that portion of the applied voltage, which is shared by the first insulating film, is set to be larger. Moreover, since a dielectric flux density is continuous at the boundary surface between the high resistance semiconductor layer and the first insulating film it is better that the electric field in the first insulating film is set to be small not to strengthen the electric field in the vertical direction in the high resistance semiconductor layer.

In the first high breakdown voltage semiconductor device relating to the present invention, since the thickness of the first insulating film is 1 μm or more, the electric filed in the first insulating film is relatively small even in a state that the depletion layer extends as mentioned above. Due to this, the vertical electric field of the high resistance semiconductor layer is controlled to be small. Moreover, since the applied voltage is mainly shared by the first insulating film, the applied voltage to be applied in the deep direction of the high resistance semiconductor layer is controlled to be small. As mentioned above, according to the semiconductor device relating to the present invention, even if the high resistance semiconductor is formed relatively thin, high breakdown voltage characteristic can be sufficiently obtained.

According to the first high breakdown voltage semiconductor device relating to the present invention, particularly, if in the bottom portion of the high resistance layer, there is formed a buffer layer having low impurity concentration such that a total amount of impurity per a unit area is set to be $3\times10^{12}/cm^2$ or less, preferably 0.5 to $2.0\times10^{12}/cm^2$, much higher breakdown voltage can be obtained. This is because space charge having high concentration occurs from the high resistance semiconductor layer if the buffer layer is completely depleted at the time of reverse bias application. If a vertical component of the electric field at the boundary surface between the buffer layer and the first insulating film is Es on the semiconductor layer side, Ei on the insulating film side, a dielectric constant of the semiconductor layer is εs, and a dielectric constant of the insulating film is εi, an equation of Es=(εi/εs) Ei can be obtained. Due to this, as the electric field in the first insulating film becomes larger, the electric field in the semiconductor layer becomes large in accordance with this. However, the space charge occurred in the buffer layer acts to relax the electric field on the semiconductor layer side. Therefore, by providing such a buffer layer, it is possible to make the electric field of the first insulating film larger as the electric field of the semiconductor layer is maintained small, thereby the high breakdown voltage can be obtained.

According to a second high breakdown voltage semiconductor device relating to the present invention, the element isolation in the vertical direction is made by not the insulating film but the pn junction. Other than that, the structure of the second semiconductor device is the same as that of the first semiconductor device. Therefore, the second semiconductor device is a relatively thin high resistance semiconductor layer and can obtain a sufficient high breakdown voltage characteristic.

In the first high breakdown voltage semiconductor device, there is considered a case in which a third low resistance region of a first conductivity type is formed in the boundary surface portion between the second insulating film (isolating region) and the high resistance semiconductor layer of the element region. This structure cannot be avoided in a case in which a low resistance region of the first conductive type is formed on the groove side wall of the adjacent element region. This is because it is difficult to selectively diffuse a low resistance region in only one side of the groove side walls. According to this structure, there is a problem in breakdown occurring between the second and third low resistance regions when reverse bias is applied. First, if reverse bias is applied, the depletion layer extends to the high resistance semiconductor layer from the surroundings of the second low resistance region and the upper surface of the first insulating film. Where the first and third low resistance regions are connected through a neutral region, the potential of the third low resistance region follows the potential of the first low resistance region. When breakdown voltage of the pn junction between the second and third low resistance regions is $V_B$ and reverse bias voltage reaches to $V_B$ while the first and third low resistance regions regions are connected through the neutral region, breakdown is generated. If the thickness of the high resistance semiconductor layer and impurity concentration thereof are set such that the applied voltage at the time when the depletion layer under the second low resistance region reaches to the first insulating film is lower than $V_B$, the first and third low resistance regions is separated from each other by the depletion layer before breakdown occurs. As mentioned above, if the third low resistance region is separated from the first low resistance region by the depletion layer, the potential difference between the second low resistance region and the third low resistance region does not increase and breakdown between these low resistance regions is prevented.

According to a third high breakdown voltage semiconductor device, the second low resistance region is formed up to the depth reaching the first insulating film, so that the first and third low resistance regions are separated from each other. Therefore, the potential of the third low resistance region does not increase in accordance with the first low resistance region, and breakdown does not occur in the pn junction between the second and the third low resistance regions. Due this, high breakdown voltage characteristic can be improved even if there is the third low resistance region.

According to a fourth high breakdown voltage semiconductor device relating to the present invention, a high resistance film formed on the boundary surface between the first insulating film and the high resistance semiconductor layer acts to shield influence of the potential of the case semiconductor substrate, thereby excellent high breakdown voltage characteristic can be obtained.

Various embodiments of the present invention will be explained with reference to the drawings as follows.

FIG. 3 is an embodiment in which the p$^+$ type layer 7, serving as an anode region of, is formed in the peripheral portion up to the depth reaching to the oxide film 2 of the base.

According to the structure of this embodiment, the n$^+$ type layer 6 formed in the central portion of the device and the n$^+$ type layer 31 formed in the peripheral side portion of the device are electrically separated, and are not connected to each other at the neutral region unlike the embodiment of FIG. 16. Due to this, breakdown voltage of the pn junction between the p$^+$ type layer 7 and the n$^+$ type layer 31 has no influence on the breakdown voltage characteristic of the device, and high breakdown voltage characteristic can be obtained.

FIG. 4 is an embodiment in which the n$^-$ type buffer layer 10 is formed in the bottom portion of the high resistance silicon layer 4 so as to obtain further high breakdown voltage.

FIG. 5 is an embodiment in which the n$^+$ type layer 23 in the peripheral portion is formed up to the depth reaching to the oxide film 2. In other words, this is the embodiment in which the conductivity type of each portion of FIG. 4 is reversed. This embodiment also shows that high breakdown voltage characteristic can be obtained.

FIG. 6 is an embodiment of IGBT. According to this embodiment, an oxide film 83 is formed between the high resistance silicon layer 4 and the high resistance film 71. The oxide film 83 has an opening under the source region and the drain region. Due to this, one end of the high resistance film 71 is set to be source potential through the p type base layer 72, and the other end is set to be drain potential through the n type base layer 74. Since the portion therebetween is insulated from the high resistance silicon layer 4 by the oxide film 83, potential gradient generated in the high resistance film 71 is more equalized than that of FIG. 6.

Figure 43:
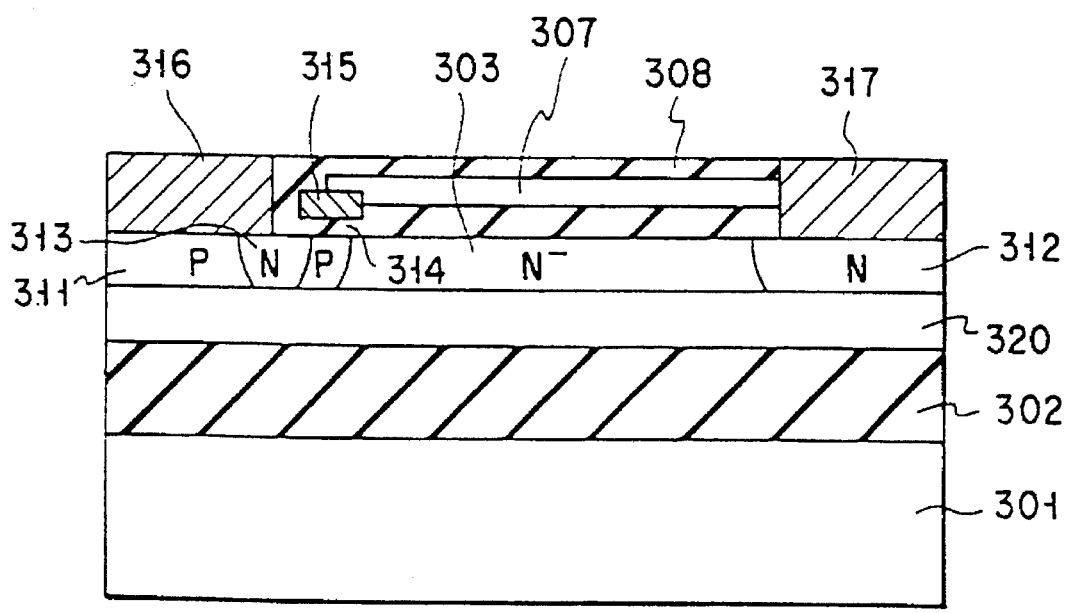
FIG. 43 is a view showing a MOSFET of an embodiment in which a base high resistance film is added to the structure of FIG. 29.
Figure 44:
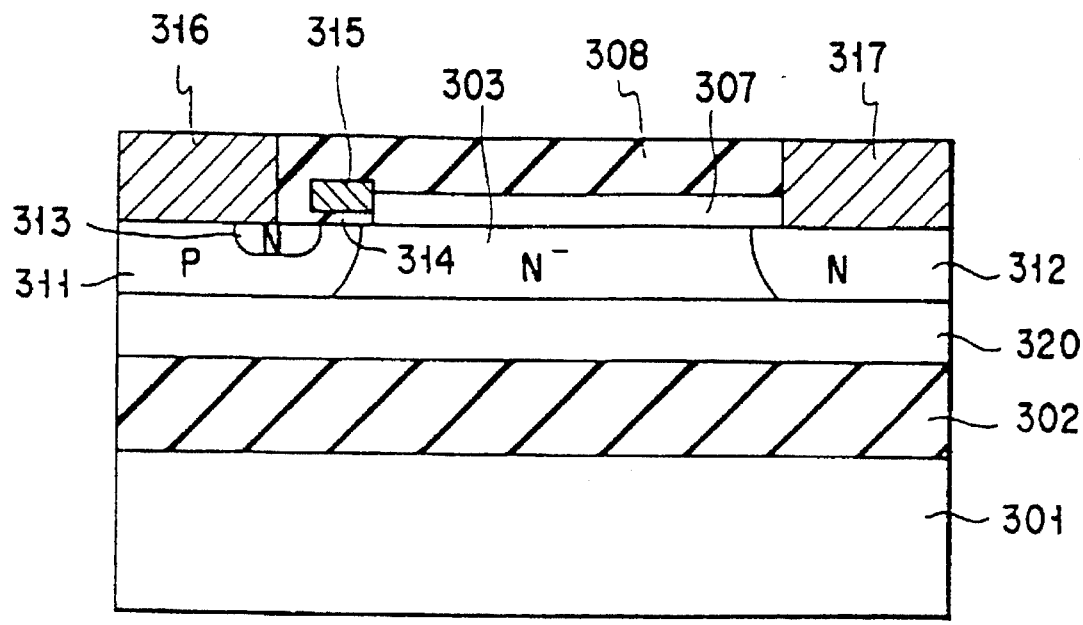
FIG. 44 is a view showing a MOSFET of an embodiment in which a base high resistance film is added to the structure of FIG. 30.
Figure 45:
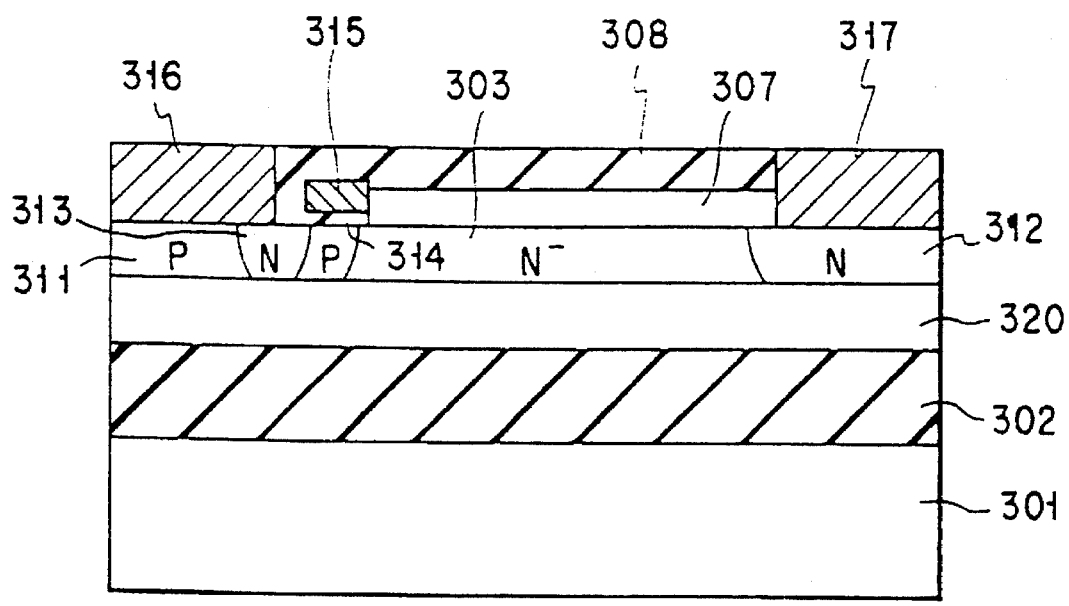
FIG. 45 is a view showing a MOSFET of an embodiment in which a base high resistance film is added to the structure of FIG. 31.

In order to prepare such IGBT, the oxide film 83 is formed on the surface of the substrate, serving as the high resistance silicon layer 4, an opening for contact is formed, and the high resistance film 71 such as SIPOS is deposited thereon. An oxide film is formed on either the surface of the high resistance film 71 or that of the base substrate 1 or both surfaces by CVD or thermal oxidation, and these substrates are directly bonded. The base substrate may be formed by depositing polycrystalline silicon in place of the bonding. The method of performing the element isolation due to the trench groove thereafter is the same as that of FIG. 43. Moreover, similar to the embodiment of FIG. 44, since the thickness of the high resistance silicon layer is set to be about 1 μm to 5 μm, the p type base layer 72 and the n type base layer 74 reach to the high resistance film 71.

According to this embodiment, the high resistance film 71 of the bottom portion of the high resistance silicon layer 4 shields influence of the potential of the substrate. As the same time, similar to the upper high resistance film 8, the high resistance film 71 serves as a field plate. Due to this, this embodiment also shows that the sufficiently high breakdown voltage characteristic can be obtained.

FIG. 7 is an embodiment of IGBT in which the embodiment of FIG. 6 is modified. The drain layer 75 reaches up to the high resistance film 71. The n⁺ type layer 31 is formed in the side portion of the high resistance silicon layer 4. Due to this, the high resistance voltage characteristic can be also obtained according to this embodiment.

Figure 1:
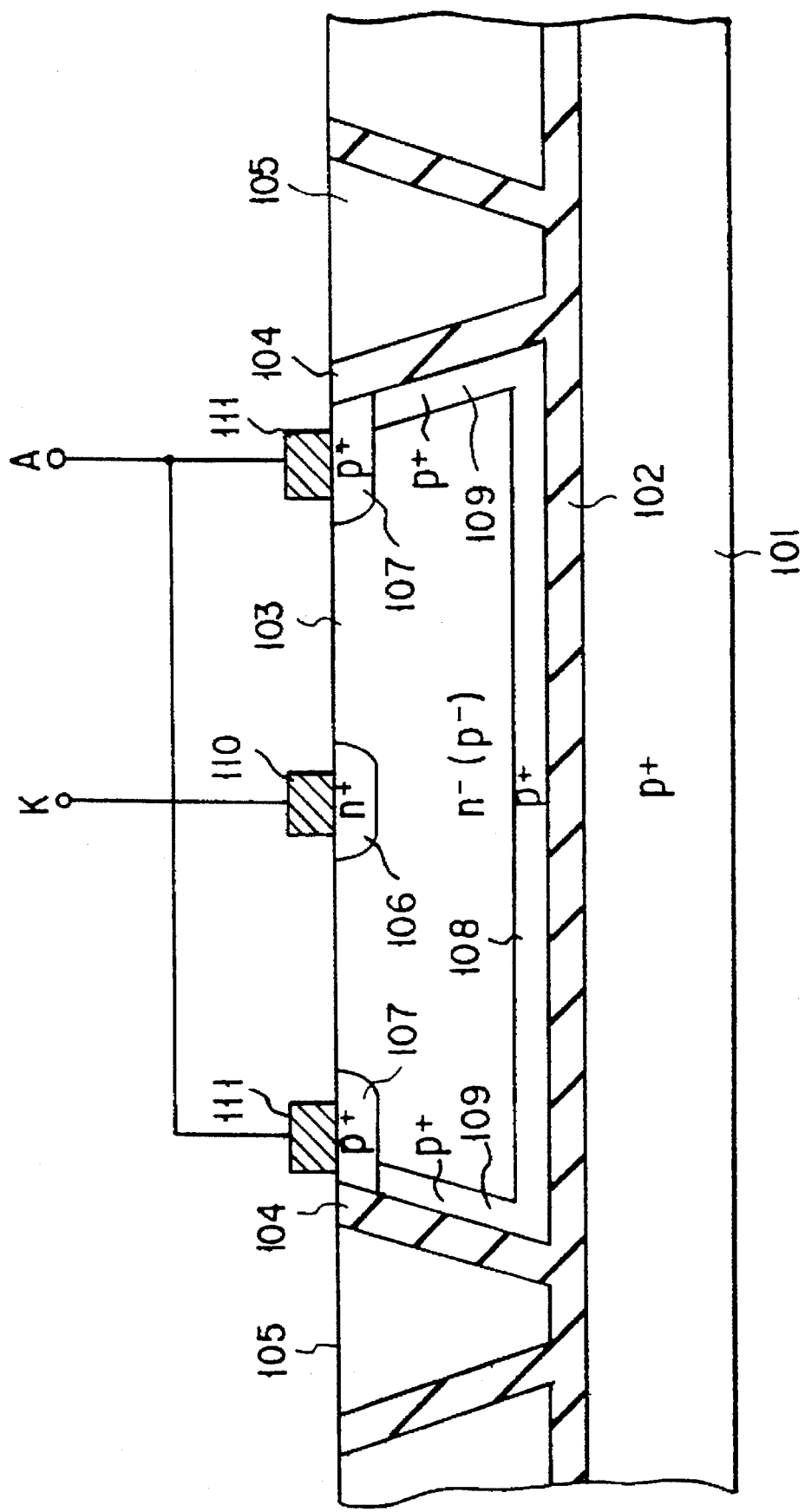
FIGS. 1 and 2 are cross sectional views showing a conventional high breakdown voltage diode.
Figure 2:
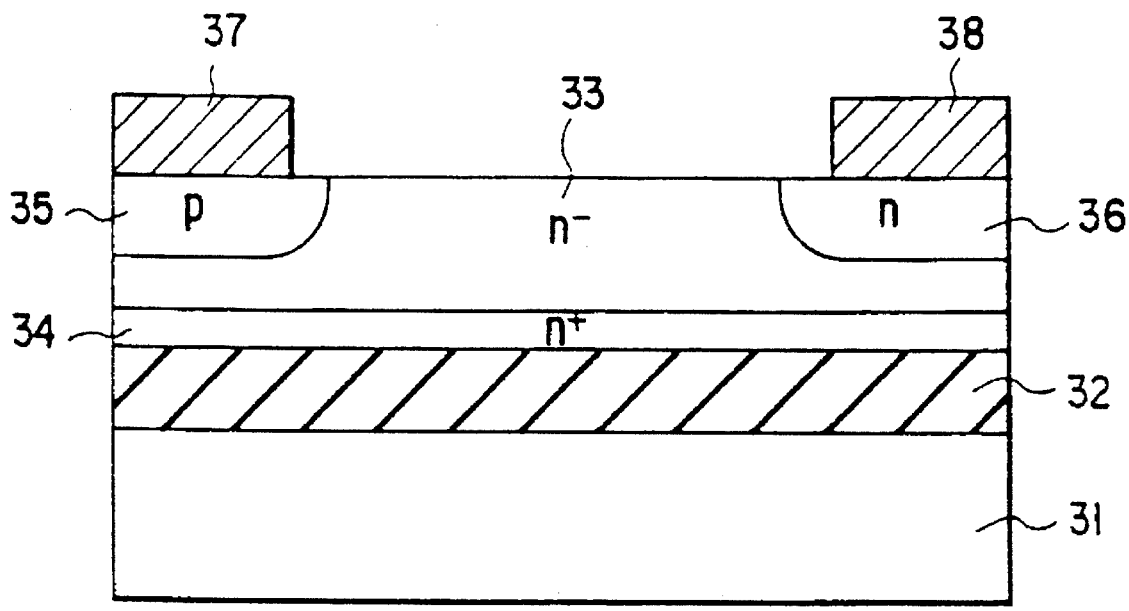
Figure 8:
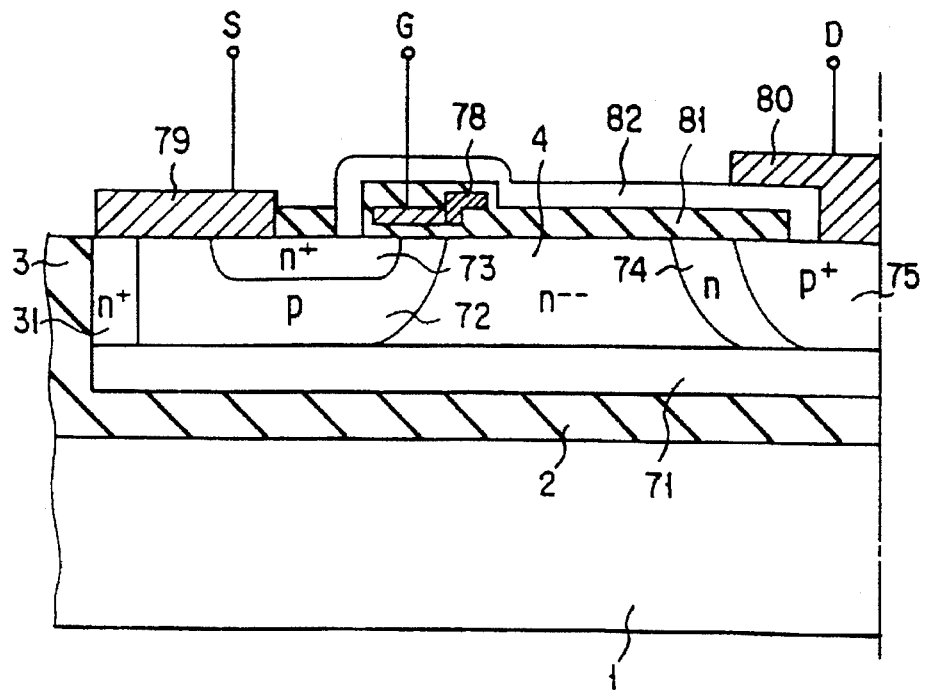
FIG. 8 is a cross sectional view showing an IGBT of an embodiment in which the structure of FIG. 6 is modified.

FIG. 8 is an embodiment of IGBT in which the connection method of the high resistance film 82 is changed based on the embodiment of FIG. 7. One of the high resistance film 82 is connected to the surface of the n⁺ type source layer 73, and the other end is connected to the p⁺ type drain layer 75 and the drain electrode 80. On the drain side, the high resistance film 82 and the drain side electrode 18 may be separated from each other. Moreover, the source side end of the high resistance film 82 may be connected to the source electrode 19.

Figure 9:
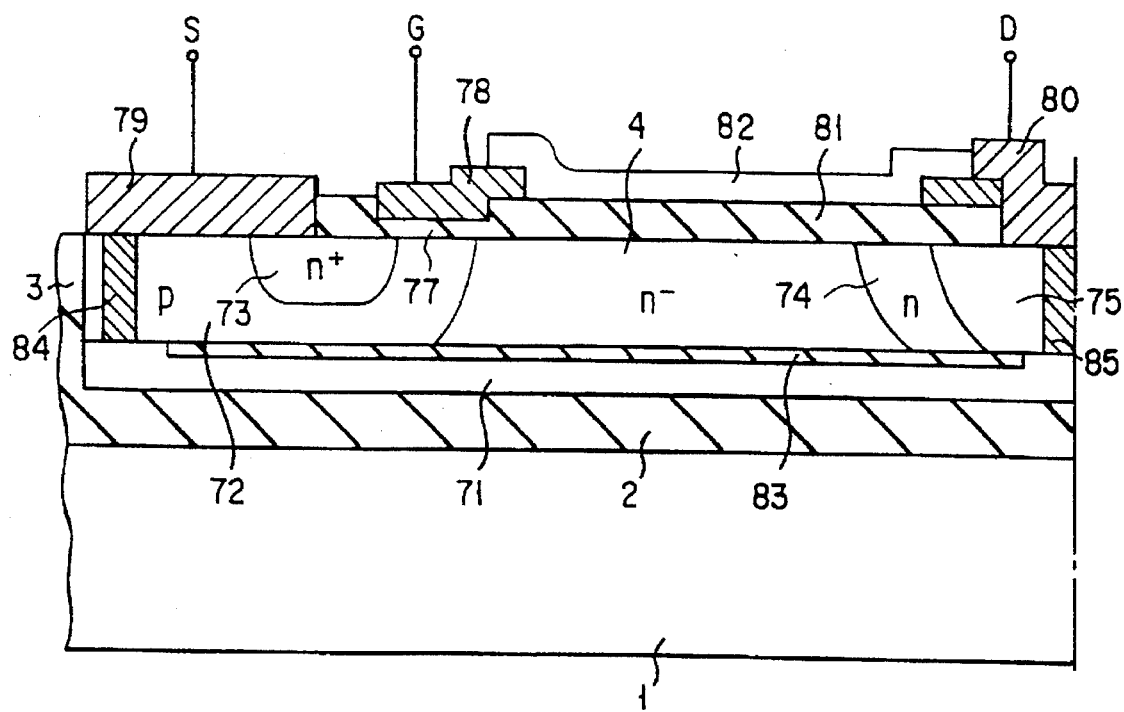
FIG. 9 is a cross sectional view showing an IGBT of an embodiment in which the structure of FIG. 7 is modified.

FIG. 9 is an embodiment of IGBT in which the embodiment of FIG. 6 is modified. The drain layer 75 is formed to reach the high resistance film 71. Conductive members 84 and 85 such as metallic wires are connected to the source electrode 79, the drain electrode 80 and the high resistance film 71, thereby further high breakdown voltage can be obtained.

The formation of the high resistance film such as SIPOS in the bottom portion of the element as explained in the embodiments of FIGS. 6 to 9 is useful to the embodiments previously shown.

Since the high resistance silicon layer 4 is thin in the embodiments of FIGS. 6 to 9, the oxide film reaching to the high resistance film 71 from the surface can be easily formed. Due to this, the element isolation can be performed by an LOCOS method in place of the formation of the element isolation groove.

Figure 10:
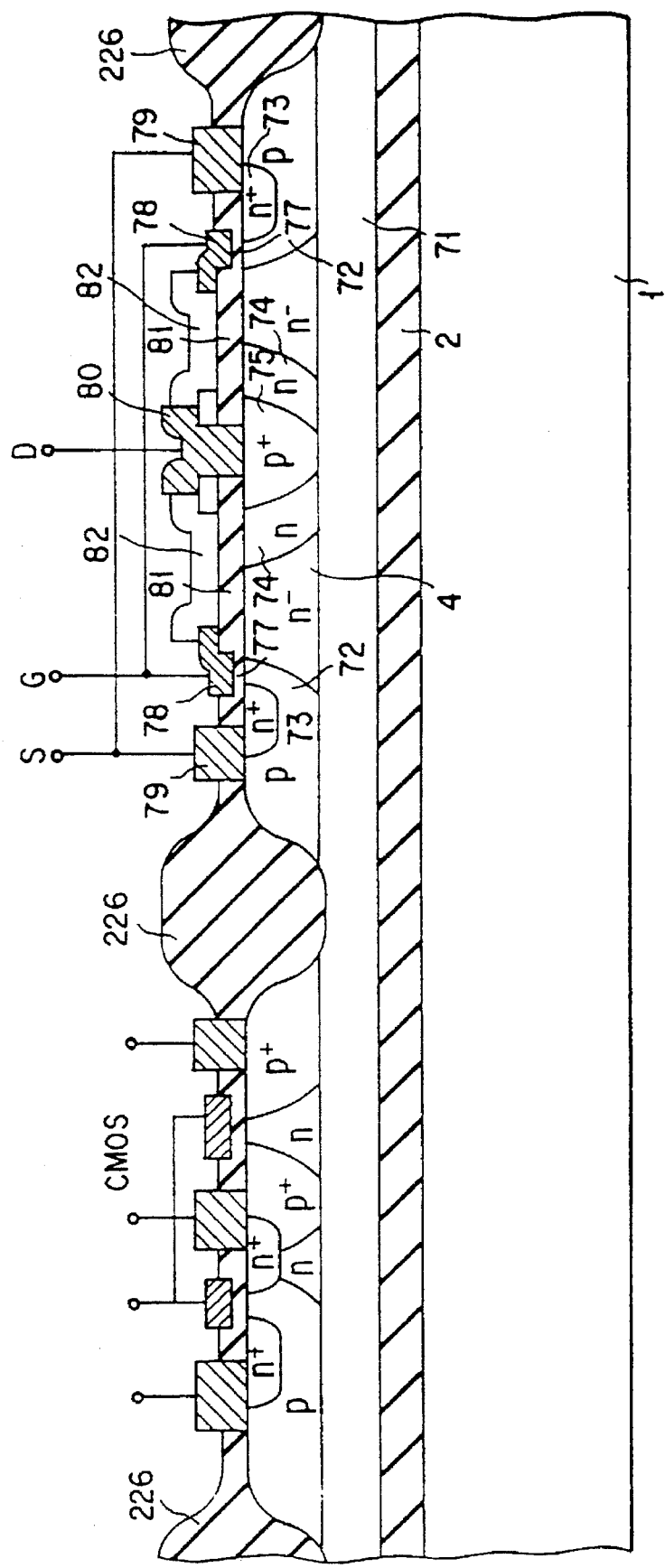
FIG. 10 is a cross sectional view showing an embodiment in which the lateral element isolation of the element of FIG. 7 is performed by LOCOS method.

FIG. 10 is an embodiment in which the element isolation is performed by the LOCOS method. There is locally formed an oxide film 226 reaching to the high resistance film 71 from the surface of the high resistance silicon layer 4, thereby the element isolation in the lateral direction is performed. According to this embodiment, IGBT shown in FIG. 46 is formed in one of the regions separated by the oxide film 226, and a CMOS circuit, serving as a logic circuit, is formed in the other region. It is noted that the n⁺ type layer 31 of FIG. 46 is formed on the side surface of the trench and is not shown in FIG. 49. An n⁺ type layer corresponding to the n+ type layer 31 may be formed under the source electrode 79 of IGBT to reach to the high resistance film 71. Thereby, the electrical connection between the source electrode 79 and the high resistance film 71 can be much improved.

Figure 11:
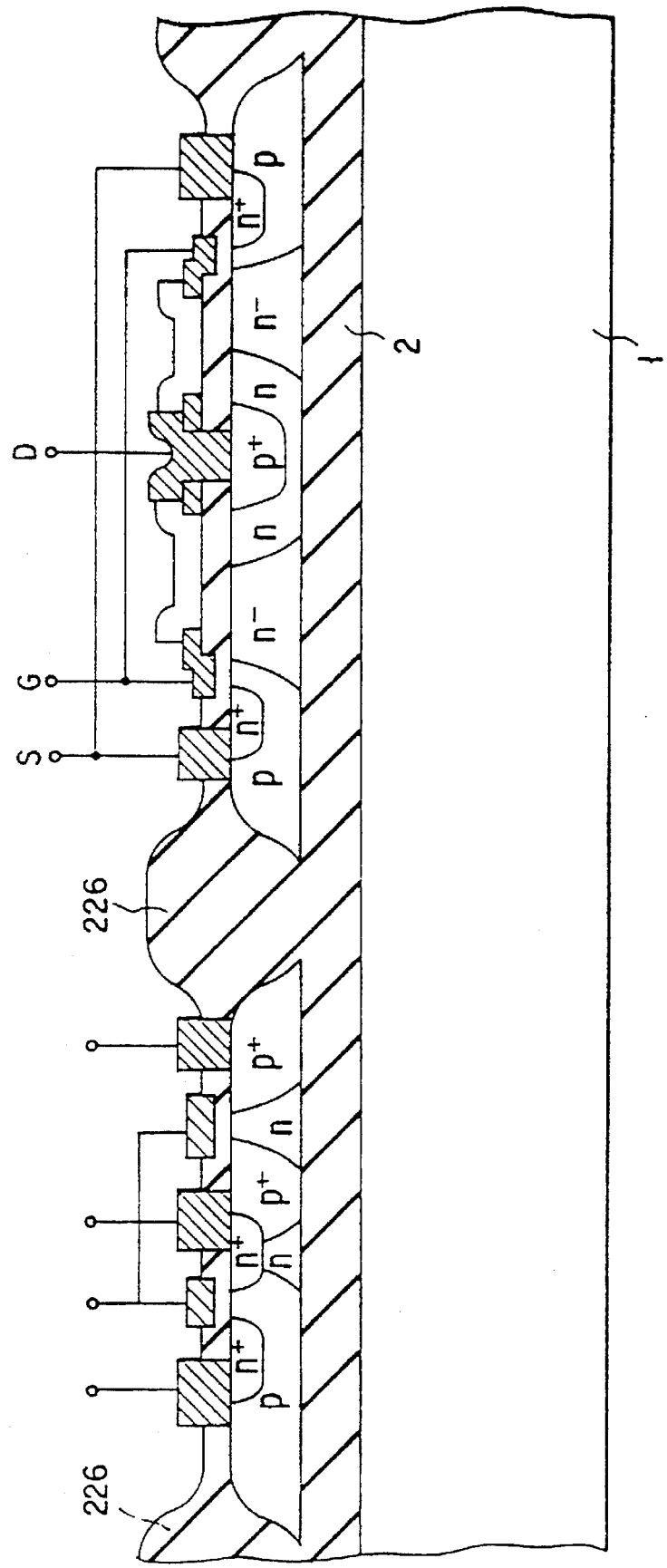
FIG. 11 is a cross sectional view showing an embodiment in which the structure of FIG. 10 is partially modified.

FIG. 11 is an embodiment in which no high resistance film 7 of FIG. 10 is formed. In place of the high resistance film 71, the thickness of the oxide film 2 is set to be 2μ or more, thereby the high breakdown voltage characteristic can be obtained.

Figure 12:
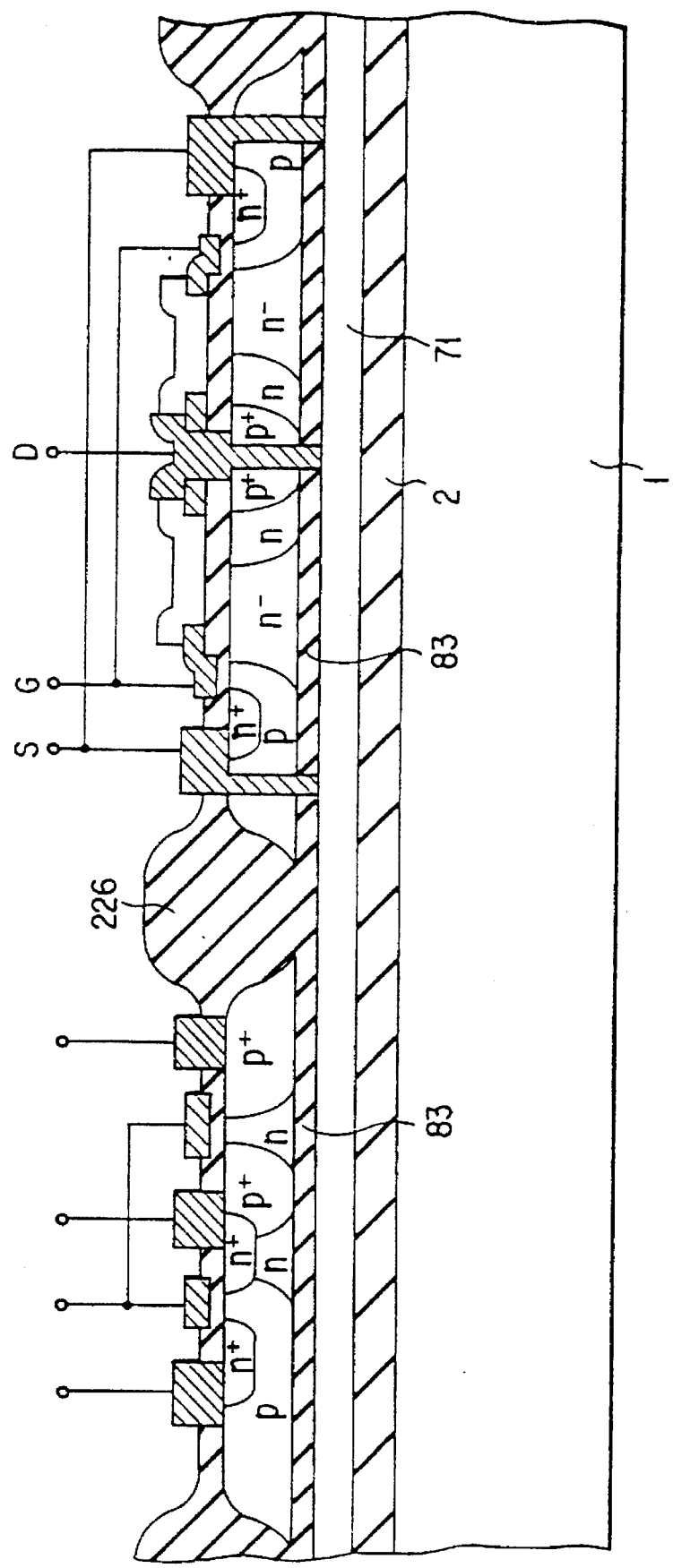
FIG. 12 is a cross sectional view showing an embodiment in which the element isolation due to LOCOS method is applied to the embodiment of FIG. 9.

FIG. 12 is an embodiment in which the element isolation by the LOCOS method is applied to the embodiment of FIG. 9. The LOCOS oxide film 226 is formed so as so reach the oxide film 83 from the surface of the high resistance silicon layer 4.

Figure 13:
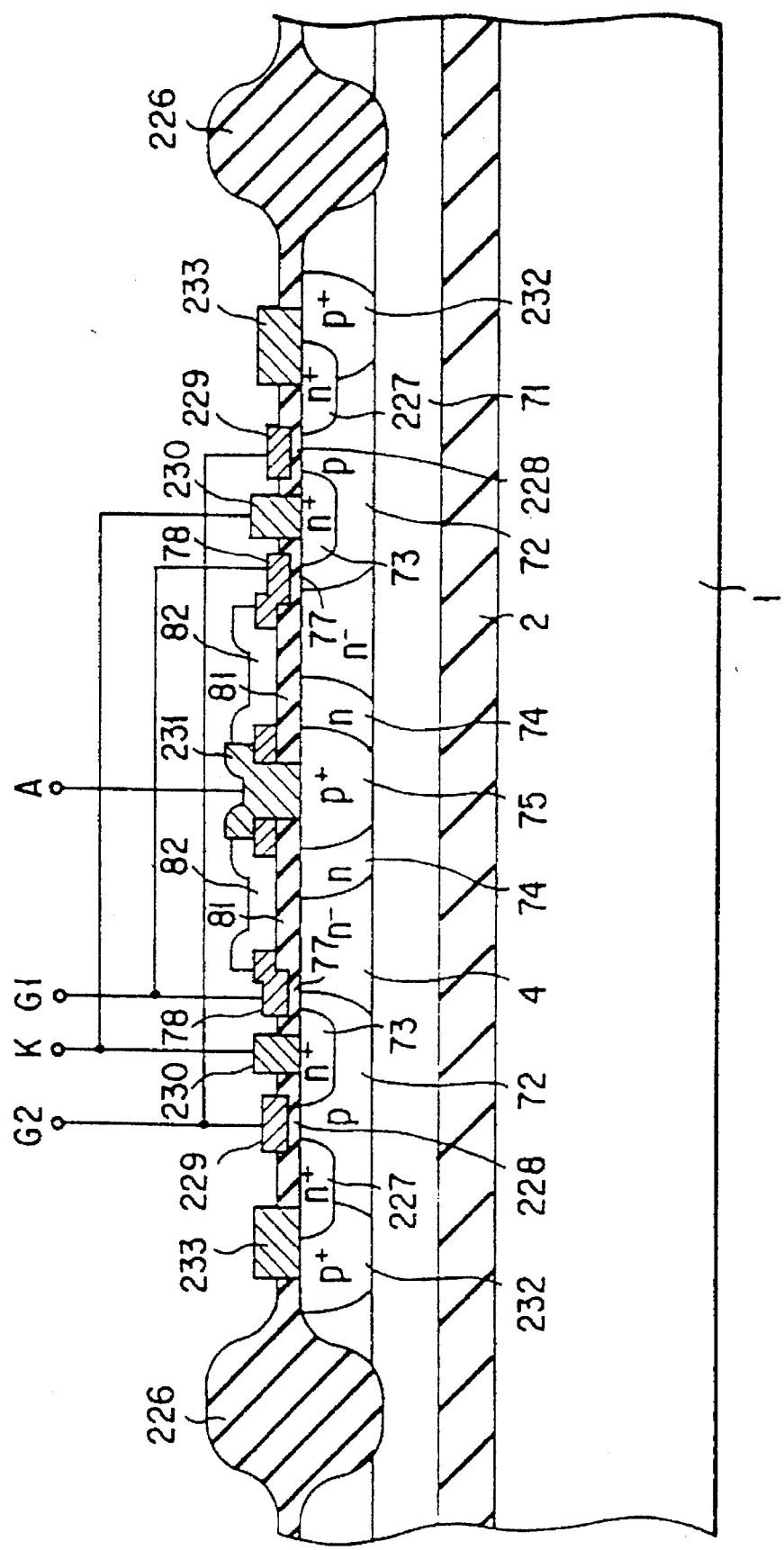
FIG. 13 is a cross sectional view showing an embodiment in which an MCT is formed in the region isolated by the LOCOS.

FIG. 13 is an embodiment in which MCT is formed in the region separated by the LOCOS method. The MCT is formed by partially modifying IGBT of the embodiment of FIG. 10. An n⁺ type region 227 is formed in the p type region 72 to be parallel to the n⁺ type region 73. On the surface portion of the p type region 72 sandwiched between the n⁺ region 73 and the n⁺ region 227, there is formed a second gate electrode 229 through the gate insulating film 228. A cathode electrode 230 is formed on the n⁺ type region 73, and an anode electrode 231 is formed on the p⁺ type region 75. A p⁺ type region 232 is formed adjacent to the n⁺ type region 227 so as to improve contact with the p type region. An electrode 233 is formed over the n⁺ type region 227 and the p⁺ region 232. It is noted that the electrode 233 may not be formed in this case.

The element of this embodiment is driven to be on by the first gate electrode 78, and off by the second gate electrode 229.

Figure 14:
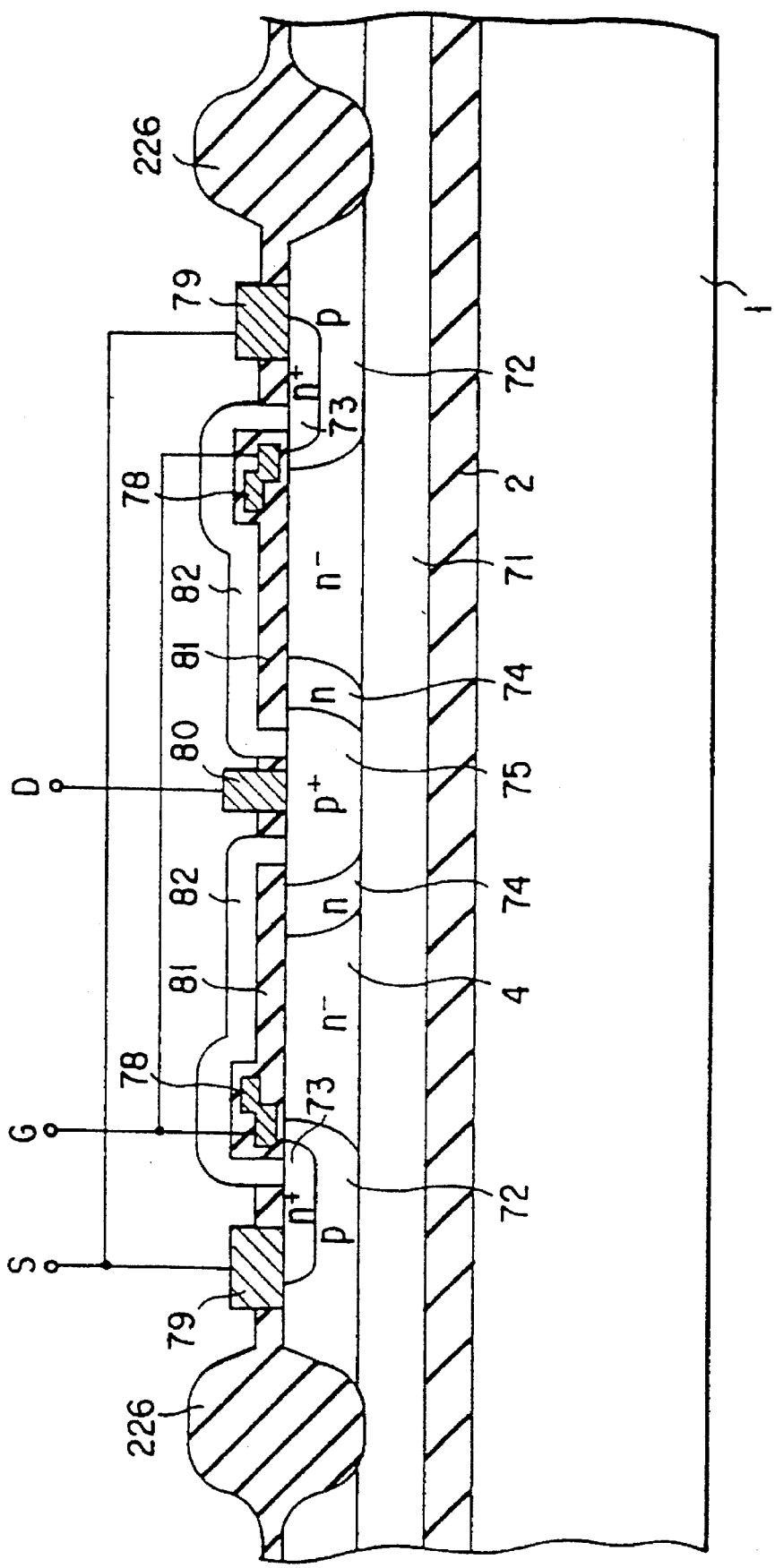
FIG. 14 is a cross sectional view showing an embodiment in which IGBT of the embodiment of FIG. 10 is partially modified.

FIG. 14 is an embodiment in which the IGBT of the embodiment of FIG. 10 is partially modified. Both ends of the high resistance film 82 are connected to the surface of the n⁺ type source layer 73 and the surface of the p⁺ type drain layer 75, respectively. The source side end may be connected to the source electrode 79.

FIG. 15 is an embodiment in which the IGBT of the embodiment of FIG. 10 is partially modified. In place of the high resistance film 71, a polycrystalline silicon film 234 is buried in the oxide film 2. The polycrystalline silicon film 234 is set to have a predetermined resistivity by an ion implantation, and patterned in a strip form or a mesh form with a suitable space. The polycrystalline silicon film 234 serves as a field plate, and the element having the high voltage characteristic can be realized.

FIG. 16 is an embodiment in which a polycrystalline silicon film 235, which is similar to the polycrystalline silicon film 234, under the polycrystalline silicon film 234 based on the element of the embodiment of FIG. 54. These two-layered polycrystalline silicon layers 234 and 235 are alternately arranged such that the spaces thereof do not correspond to each other. More specifically, these films are patterned such that the polycrystalline silicon film 235 is surely arranged under the space of the polycrystalline silicon film 234. By such an arrangement of the polycrystalline silicon films, influence of the potential of the substrate 1 on the element is effectively shielded.

Figure 17A:
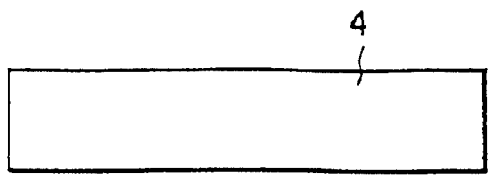
FIGS. 17A to 17P are cross sectional views showing a manufacture process of the device substrate of the embodiment of FIG. 16.
Figure 17B:
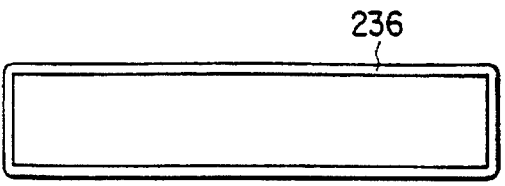
Figure 17C:
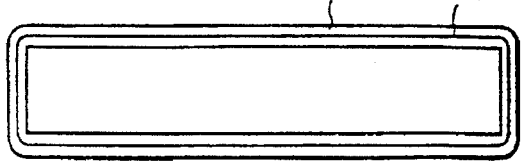
Figure 17D:
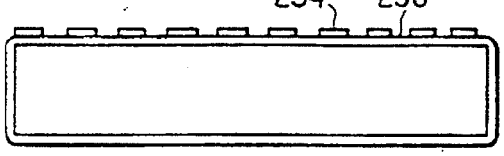
Figure 17E:
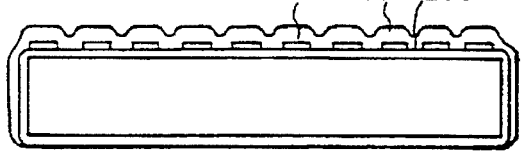
Figure 17F:
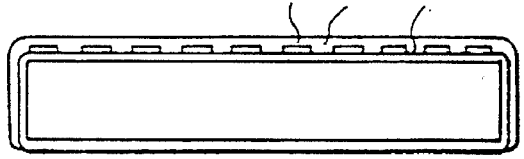
Figure 17G:
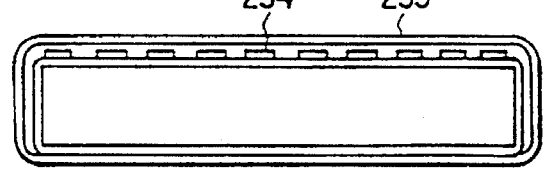
Figure 17H:
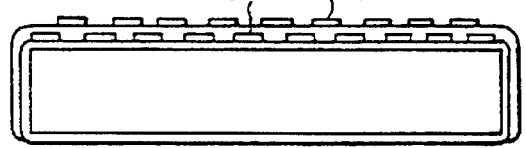
Figure 17I:
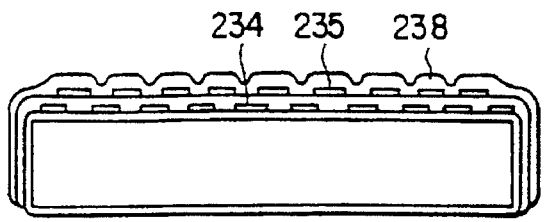
Figure 17J:
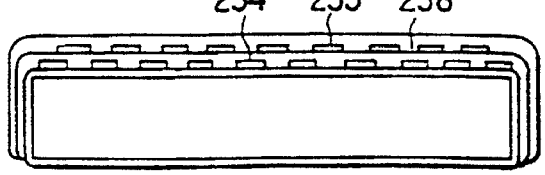
Figure 17K:
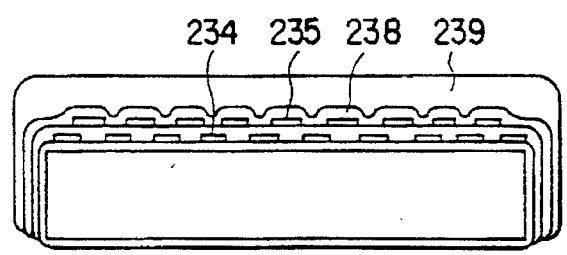
Figure 17L:
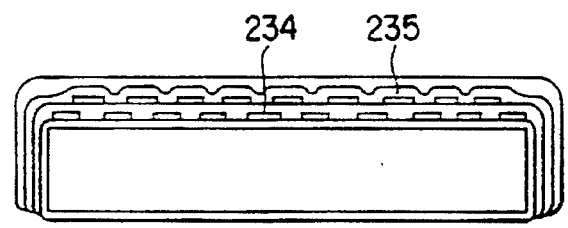
Figure 17M:
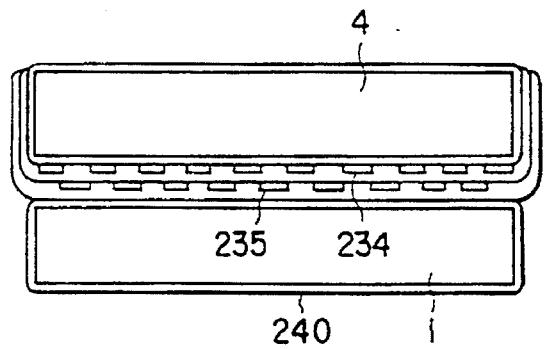
Figure 17N:
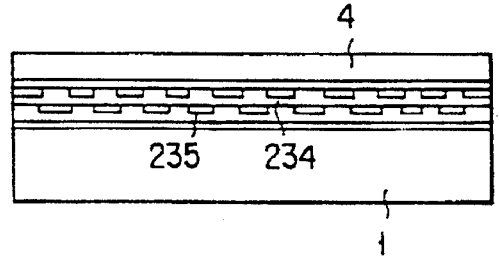
Figure 17O:
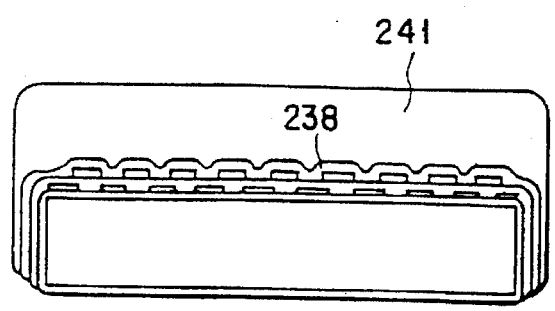
Figure 17P:
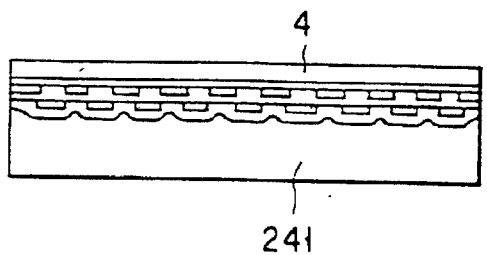

FIGS. 17A to 17P are views showing the manufacturing process of the dielectic isolation element substrate of FIG. 16.

A silicon substrate of FIG. 17A is used as the high resistance silicon layer 4 which is the element region. As shown in FIG. 17B, an oxide film 236 is formed on the silicon substrate by thermal oxidation. Then, as shown in FIG. 17C, a polycrystalline silicon film 236 is formed thereon. Thereafter, an impurity is doped by the ion plantation, and as a result, a predetermined resistivity is applied to the polycrystalline silicon film 236. Then, as shown in FIG. 17D, the polycrystalline silicon film 234 is formed in a stripe pattern or a mesh pattern to have a predetermined space. Thereafter, as shown in FIG. 17E, the upper portion of the polycrystalline silicon film 234 and the space portion are completely buried with an oxide film 237 by CVD.

Then, as shown in FIG. 17F, the surface of the film is polished and flattened, and the polycrystalline silicon film 235 is again deposited thereon, and patterned as shown in FIG. 17H. Thereafter, as shown in FIG. 56I, a CVD oxide film 238 is deposited thereon, and the surface thereof is polished and flattened as shown in FIG. 56J. The process shown in FIGS. 17G to 17J is the repetition of the process shown in FIGS. 17C to 17F.

In place of the process in which the deposited film of FIG. 17I is polished as shown in FIG. 17J, it is possible to perform a process in which a thicker polycrystalline silicon film 239 is deposited, and polished as shown in FIG. 17K, so that the flattened substrate can be obtained as shown in FIG. 17L.

Other than the substrate of FIG. 17J (or FIG. 17L) having the oxide film formed by burying two-layered polycrystalline silicon films, the silicon substrate having a thermal oxide film 240 is prepared. Then, as shown in FIG. 17M, the silicon substrate is directly bonded to the two-layered polycrystalline silicon films, thereby obtaining the integrated substrate. Then, as shown in FIG. 17N, the integrated substrate is polished such that the high resistance silicon layer 4 has a predetermined thickness, so that the device substrate is completed. In this case, an incomplete bonded portion which is the peripheral portion of the device substrate is cut. The thermal oxide film 240 of the substrate 1 of FIG. 17M is not always formed.

In the above example, the manufacturing process of the dielectric isolation element using two substrates has been explained. However, the device substrate can be obtained using one substrate. For example, after the substrate is formed as shown in FIG. 17I, a polycrystalline silicon 241 is deposited thick as shown in FIG. 17O, and the polycrystalline silicon 241 is used as a base substrate as it is. Then, as shown in FIG. 17P, the high resistance silicon layer 4 is polished to have a predetermined thickness, thereby obtaining the same device substrate.

In the above element substrate forming process, if the deposition step of a polycrystalline silicon film 235, and the patterning step are omitted, the device substrate shown in the embodiment of FIG. 55 can be obtained.

Figure 18:
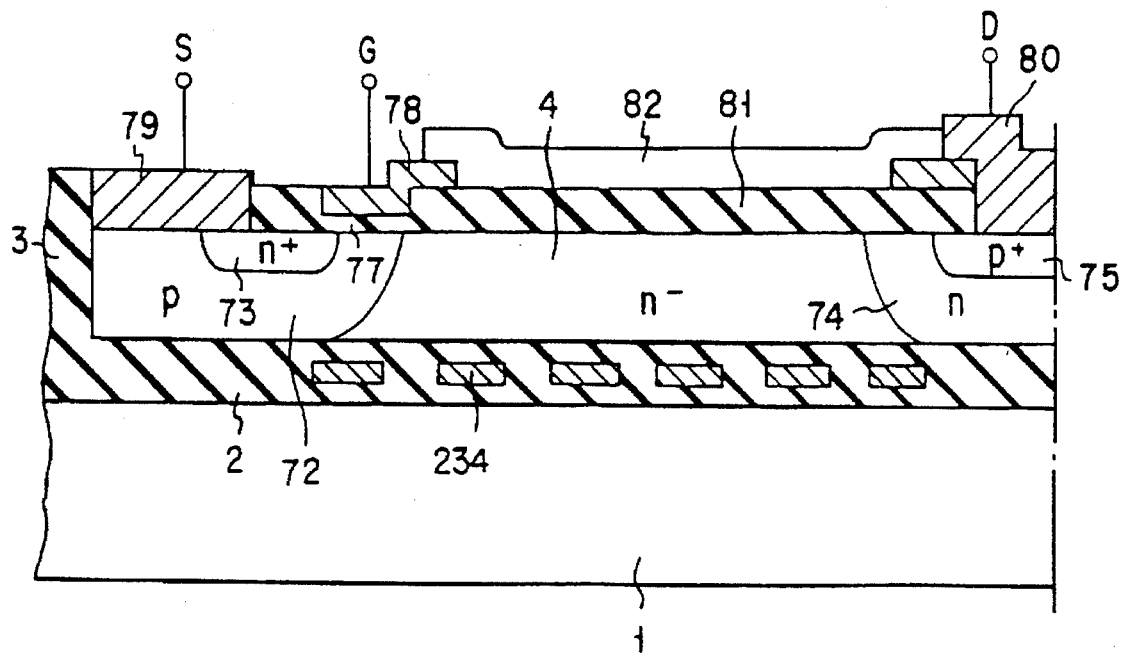
FIG. 18 is a cross sectional view showing an embodiment in which the embodiment of FIG. 15 is partially modified.

FIG. 18 is an embodiment in which the embodiment of FIG. 16 is partially modified. In this embodiment, the polycrystalline silicon film 234 is formed only under a drift layer between the p type base layer 72 and the n type base layer 74.

Figure 19:
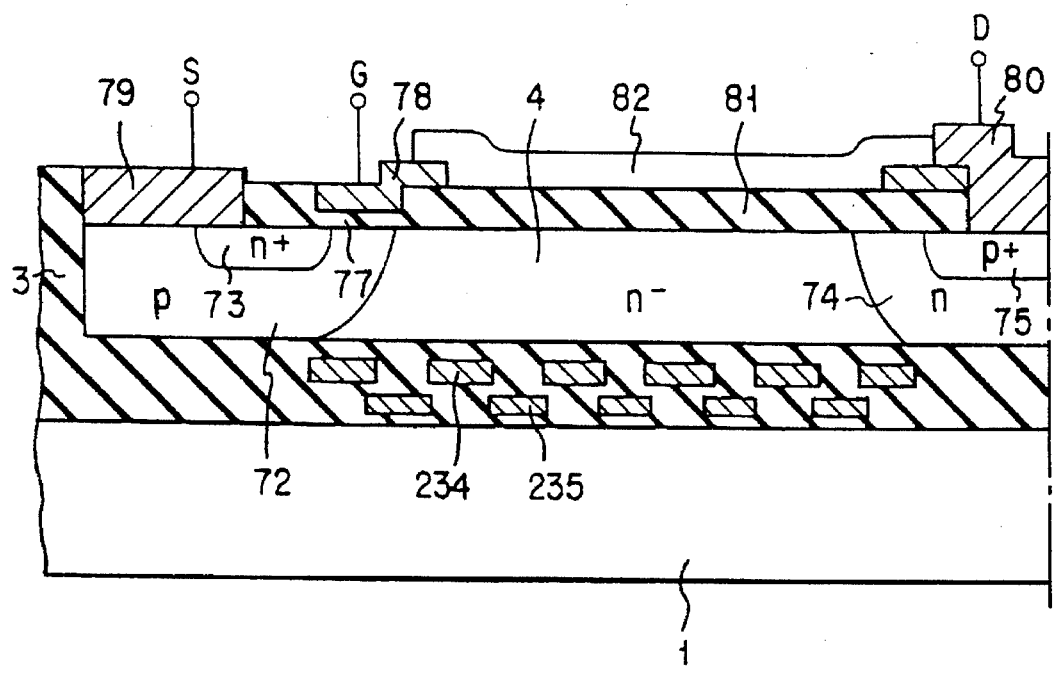
FIG. 19 is a cross sectional view showing an embodiment in which the embodiment of FIG. 16 is partially modified.

FIG. 19 is an embodiment in which the embodiment of FIG. 16 is partially modified. In this embodiment, the polycrystalline silicon films 234 and 235 are formed only under the drift layer between the p type base layer 72 and the n type base layer 74.

Figure 20:
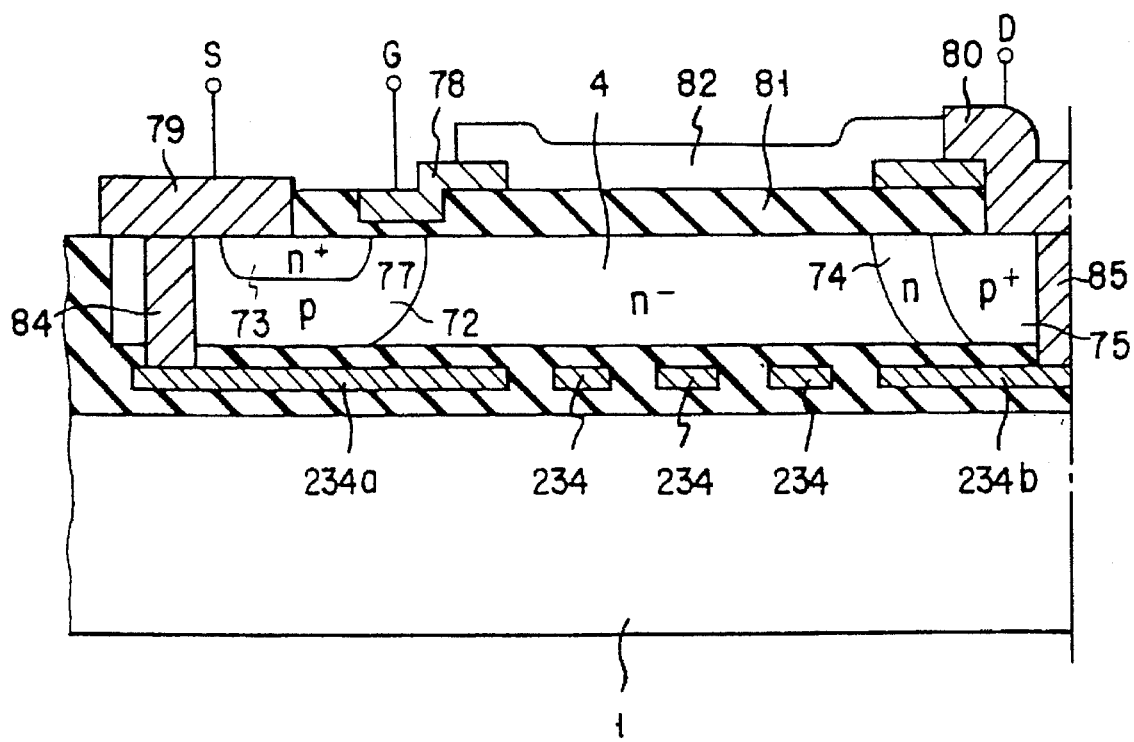
FIG. 20 is a cross sectional view showing an embodiment in which the embodiment of FIG. 15 is partially modified.

FIG. 20 is an embodiment in which the embodiment of FIG. 15 is partially modified. Similar to the embodiment of FIG. 9, the conductive members 84 and 85 such as mental are buried under the source electrode 79 and the drain electrode 80, thereby the polycrystalline silicon 234 formed in the bottom portion of the device is connected to the source electrode 79 and the drain electrode 80. Each of portions 234a and 234b to be connected to each of conductive members 84 and 85 is designed to have a suitable length for a field plate.

Figure 21:
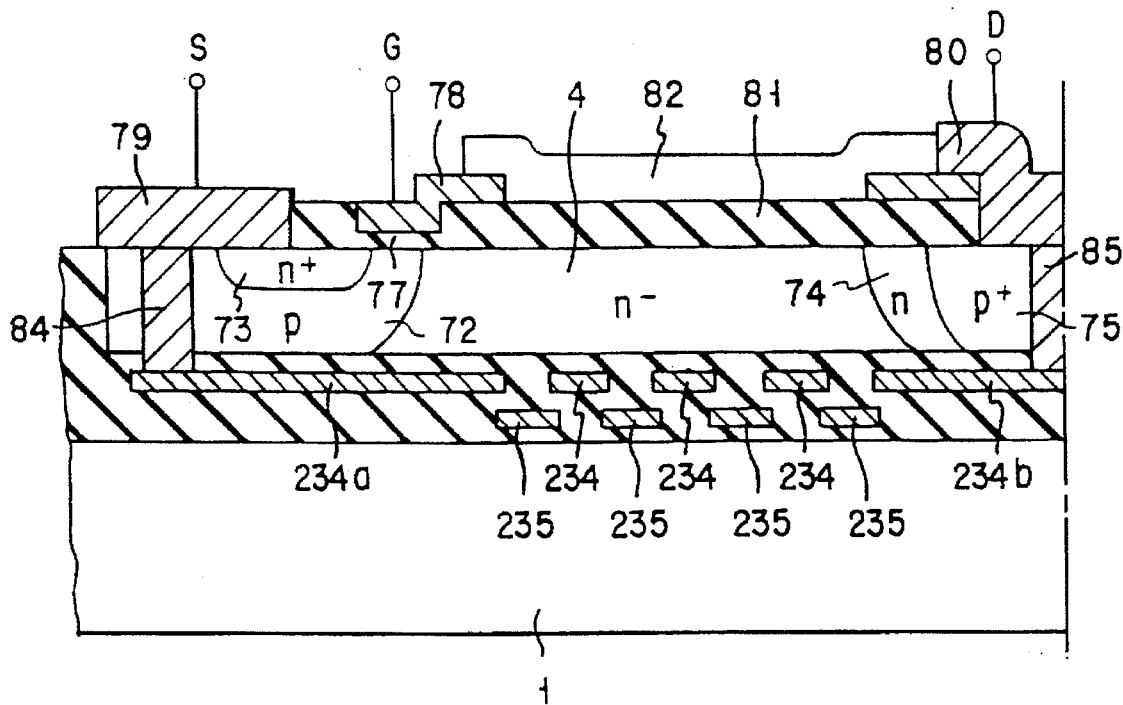
FIG. 21 is a cross sectional view showing an embodiment in which the embodiment of FIG. 20 is partially modified.
Figure 42:
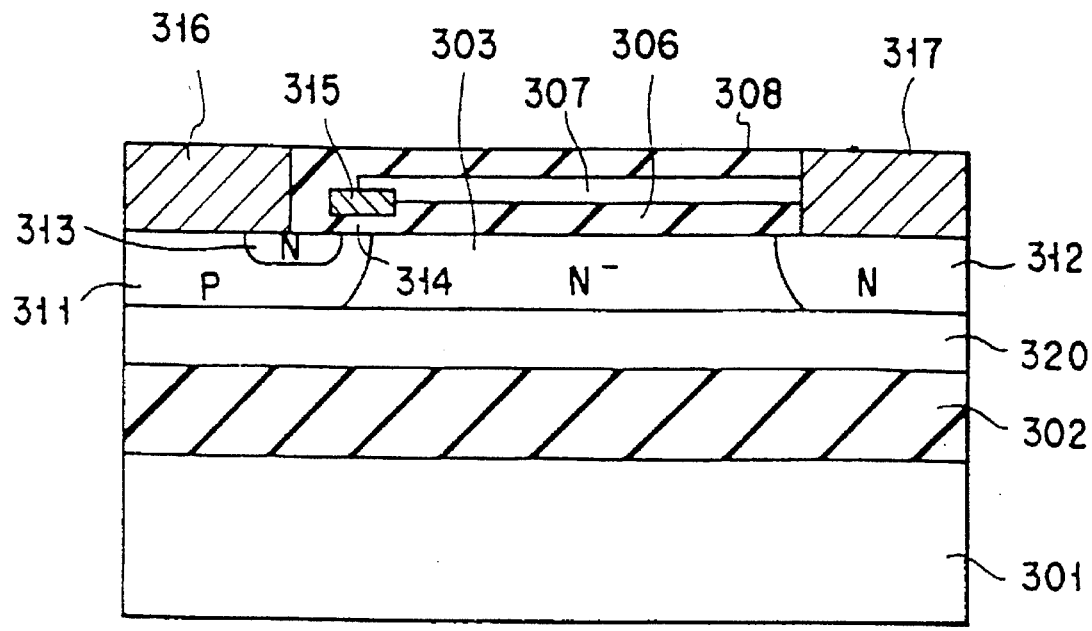
FIG. 42 is a view showing a MOSFET of an embodiment in which a base high resistance film is added to the structure of FIG. 28.

FIG. 21 is an embodiment in which the polycrystalline silicon 235 is formed under the polycrystalline silicon 234 as shown in the embodiment of FIG. 16 and influence of the substrate potential is effectively shielded based on the embodiment of FIG. 20.

FIG. 22 is an embodiment in which the embodiment of FIG. 15 is partially modified. That portions 234c and 234d of the polycrystalline silicon film 234 buried in the silicon oxide film 2 which are formed under the p type base layer 72 and the n type buffer layer 74, are exposed to the upper surface of the oxide film 2, and connected to the p tape base layer 72 and the n type buffer layer 74, respectively. Due to this, that portion of the polycrystalline film 234, which is just under the source and that portion of the polycrystalline film 234, which is just under the drain thereof, are set to be source potential and drain potential, respectively. The portions 234c and 234d of the polycrystalline silicon film 234 having the above-set potential are set to have suitable lengths as field plates similar to the embodiment of FIG. 20.

In order to manufacture the above-mentioned device structure, to the steps explained in FIGS. 17A to 17P, there may be added a step of forming an opening in an oxide film 236 at a portion to be used as a connecting portion between the p type base layer 72, and the polycrystalline silicon 234c, and between the n type buffer layer 74, and and the polycrystalline silicon 234d.

FIG. 23 is an embodiment in which the polycrystalline silicon film 235 is formed at a level lower that that of the polycrystalline silicon film 234 similar to the embodiment of FIG. 19.

FIG. 24 is an embodiment in which IGBT of the embodiment of FIG. 15 is partially modified. In this embodiment, in place of the high resistance film 82 of the embodiment of FIG. 15, a polycrystalline silicon film 242, which is similar to the polycrystalline silicon film 234 buried in the oxide film 2, is formed as a field plate. Since the polycrystalline silicon film 242 can be formed at the same time with the gate electrode 78, the manufacturing process of this embodiment is easier than that of the embodiment of FIG. 15.

FIG. 25 is an embodiment in which the polycrystalline silicon film 235 is further formed at a level lower than that of the polycrystalline silicon film 234 of the bottom portion as in the embodiment of FIG. 16 and the polycrystalline silicon film 243 is further formed at a level higher than that of the polycrystalline silicon film 242. Thereby, shield effect against the upper and lower elements increases.

The material of the films 234, 235, 242, and 243 explained the embodiments of FIGS. 15 to 25 are not limited to polycrystalline silicon. It is possible to replace polycrystalline silicon with SIPOS and the other conductive materials, or resistance materials. Moreover, the modifications explained in FIGS. 15 to 25 are useful for the diode, MOSFET, MCT, EST.

As explained above, according to the present invention, in the high breakdown voltage semiconductor device comprising the high resistance semiconductor layer, which is separated from the base semiconductor substrate by the first insulating film and separated in the lateral direction by the second insulating film or the pn junction, and the first low resistance region of the first conductive type and the low resistance region of the second conductive type formed in the surface portion of the high resistance semiconductor layer, the thickness of the first insulating film is set to be 1 µm or more, reverse bias voltage of the device is largely shared by the first insulating film, and electrical field in the high resistance semiconductor layer, which depends on the electrical field in the first insulating film, is weakened, thereby sufficiently high breakdown voltage can be obtained even if the high resistance semiconductor layer is thin. Moreover, since the high resistance semiconductor layer can be made thin, the element separation can be easily made.

According to the second specific form of the present invention, a thin active layer is used such that high impurity concentration layer formed in a high resistance active layer reaches to the first insulating film for isolation. With the structure of the present invention, for example, it is assumed that the high impurity concentration layer of the first conductivity type is formed to reach to the depth of the first insulating film, and high voltage is applied to the high impurity concentration layer of the first conductivity type such that the pn junction becomes reverse bias in a state that the high impurity concentration of the second conductivity type and the substrate are grounded. At this time, voltage to be applied to the high impurity concentration layer of the first conductivity type is all shared by the first insulating film in the vertical direction. The lateral potential distribution of the surface of the active layer is made uniform in accordance with the uniform potential distribution to be formed in the high resistance film formed in the surface of the active layer. Thereby, the field concentration in the active layer is relaxed and the high breakdown voltage characteristic, which cannot be expected from the prior art, can be obtained.

Moreover, according to the present invention, since the thin active layer is used, the element isolation in the lateral direction can be easily performed.

The second specific form of the present invention will be explained with reference to the drawings.

FIG. 26 shows a lateral type diode relating to one embodiment of the present invention. An n⁻ type high resistance silicon layer (active layer) 303 is formed on a silicon substrate 301 through a silicon oxide film (first insulating layer) 302. The thickness of the silicon oxide film 302 is set to be about 1 to 5 µm. The n⁻ type active layer 303 is set to have the thickness of 2 µm or less, preferably 0.4µ or less, the total amount of impurities of $1.0 \times 10^{10}/cm^2$ to $2.0 \times 10^{12}/cm^2$, preferably 0.5 to $1.8 \times 10^{12}/cm^2$. A p type anode layer 304 having high impurity concentration and an n type cathode layer 305 having high impurity concentration are formed in the active layer 303 to be separated from each other with a predetermined distance. The p type anode layer 304 and the n type cathode layer 305 are formed by impurity diffusion to the depth reaching to the silicon oxide film 302 as shown in the drawing. However, the p type anode layer 304 may be formed by impurity diffusion to the depth which does not reach to the silicon oxide film 302.

On the region sandwiched between the p type anode layer 304 of the active layer 303 and the n type cathode layer 305, there is formed a high resistance film 307 through a silicon oxide film (second insulating film) 306. The thickness of the high resistance film 307 is set to be 0.3 µm or less, preferably 0.2 µm or less. As the high resistance film 307, for example, SIPOS (Semi-Insulating Polycrystalline Silicon) is used. The surface of the high resistance film 307 is coated with a silicon oxide film 308, serving as a protection film.

An anode electrode 309 and a cathode electrode 310 are formed on the p type anode layer 304 and the n type cathode layer 305, respectively. Both ends of the high resistance film 307 are connected to the anode electrode 309 and the cathode electrode 310.

According to this embodiment, excellent high breakdown voltage can be obtained. For example it is assumed that the p type anode layer 304 and the substrate 301 are grounded and positive high voltage is applied to the n type cathode layer 305. Since the n type cathode layer 305 is formed to the depth reaching to the silicon oxide film 302, voltage to be applied to the n type cathode layer 305 is all shared by the silicon oxide film 302. Moreover, micro-current flows in the high resistance film 307 formed on the surface of the active layer 303, and a uniform potential distribution is formed in the high resistance film 307 in the lateral direction. Also, in the active layer 303 right under the high resistance film 397, such a uniform potential distribution is formed in the lateral direction by influence of the potential distribution in the high resistance film 307. As a result, field concentration in the device is relaxed and high breakdown voltage can be realized.

In order to have sufficient influence of the uniform potential distribution in the high resistance film 307 on the active layer 303, it is better that the silicon oxide film 306 under the high resistance film 307 is thinned, and favorable high voltage characteristic strength can be obtained if the thickness of the high resistance film 307 is 0.2 µm or less. Moreover, in order to make influence of the substrate potential on the active layer 3 small and make influence of the potential of the high resistance film 307 thereon relatively large, it is better that the silicon oxide film 302 under the active layer 303 is thicker than the active layer.

The specific data supporting the effect of the above embodiment will be explained as follows.

FIG. 81 shows the relationship between the total amount in impurities of the n⁻ type active layer 303 and voltage strength. As is obvious from FIG. 81, when the total amount of impurities exceeds the point of about $1.8 \times 10^{12}/cm^2$, breakdown voltage rapidly drops. Therefore, the range of the total amount of impurities, which can be allowed to obtain breakdown voltage of about 500 V or more, is $1.0 \times 10^{10}/cm^2$ to $2.0 \times 10^{12}/cm^2$.

FIG. 82 shows the relationship between the thickness of the oxide film 306 under the high resistance film 307 and breakdown voltage when the thickness of the active layer 303 is 0.1 µm. If the thickness of the oxide film 306 is too large, the effect of the uniform potential distribution of the active layer due to high resistance film 307 cannot be obtained. If the thickness of the oxide film 306 is 0.3 µm or less, the effect can be brought about. Particularly, if the thickness is 0.2 µm or less, it is understood that the effect to improvement of high breakdown voltage can be considerably brought about.

Figure 83:
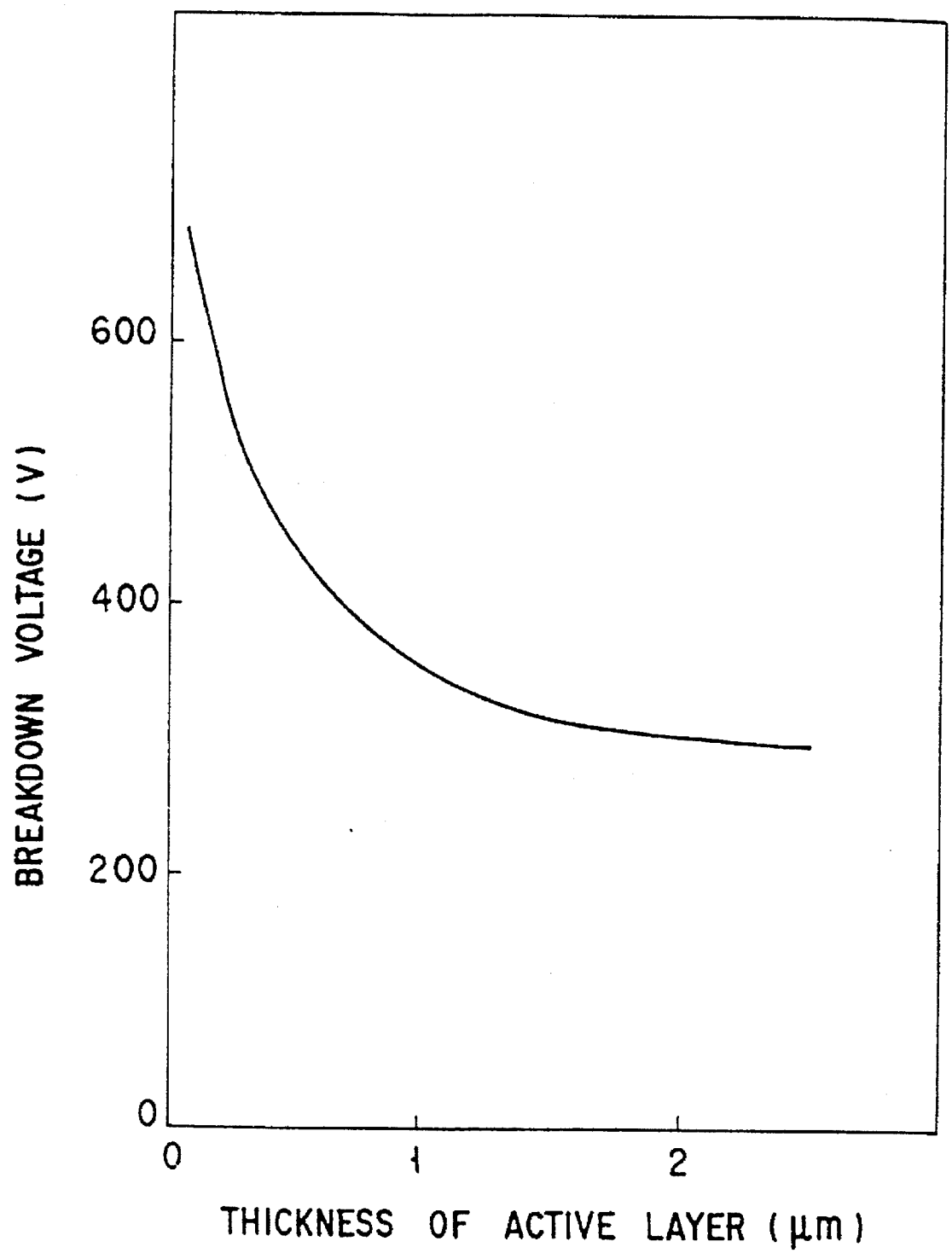
FIG. 83 is a view showing the relationship between the thickness of the active layer and breakdown voltage in the embodiment of FIG. 26.
Figure 88:
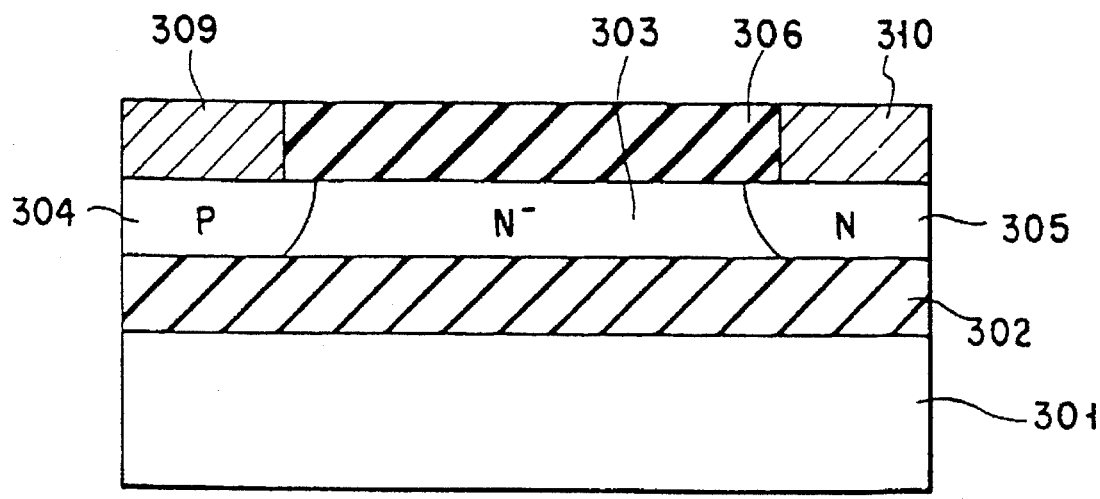
Figure 89:
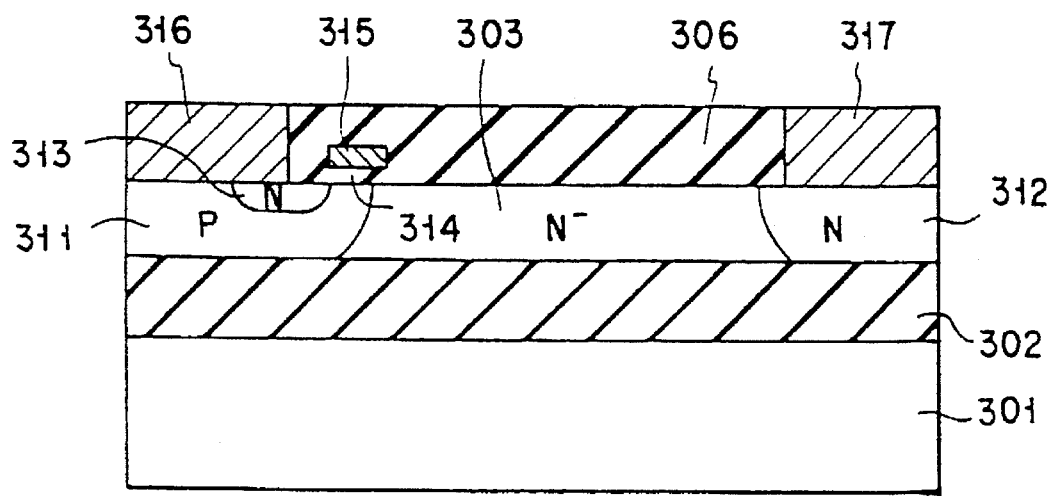
Figure 92:
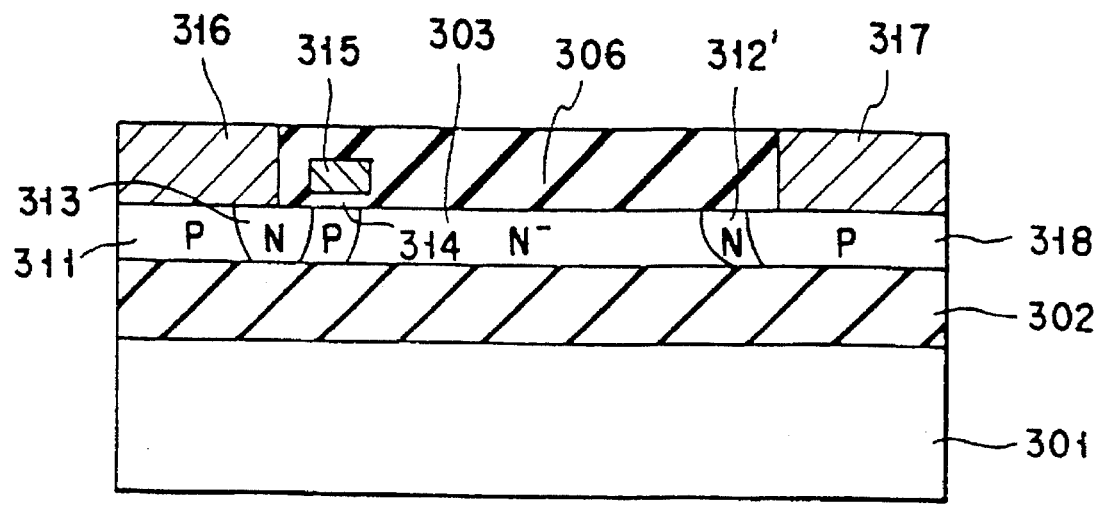
Figure 93:
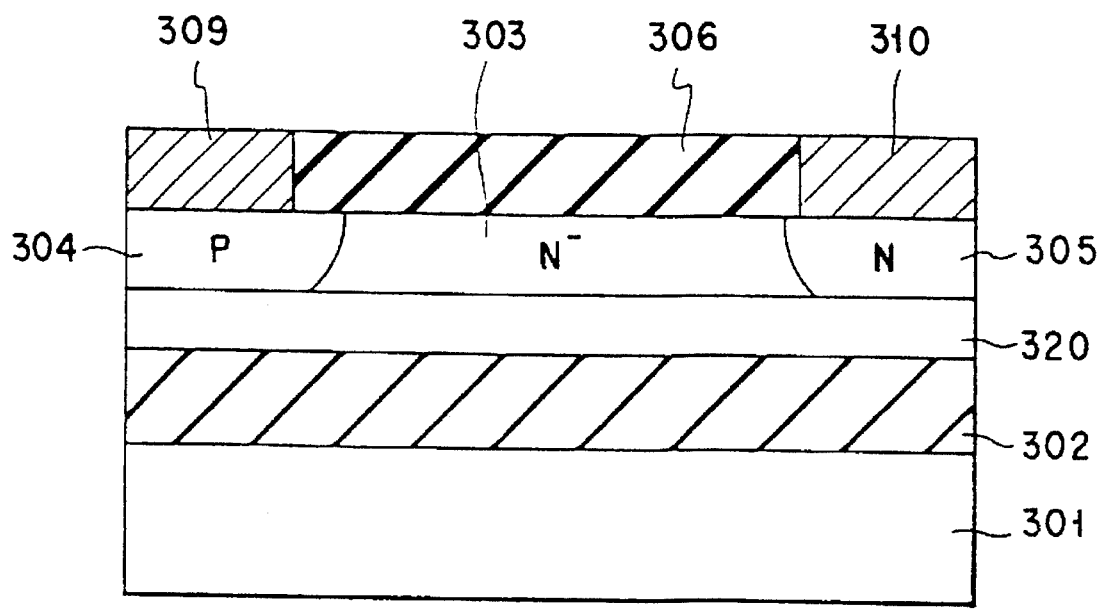
Figure 109:
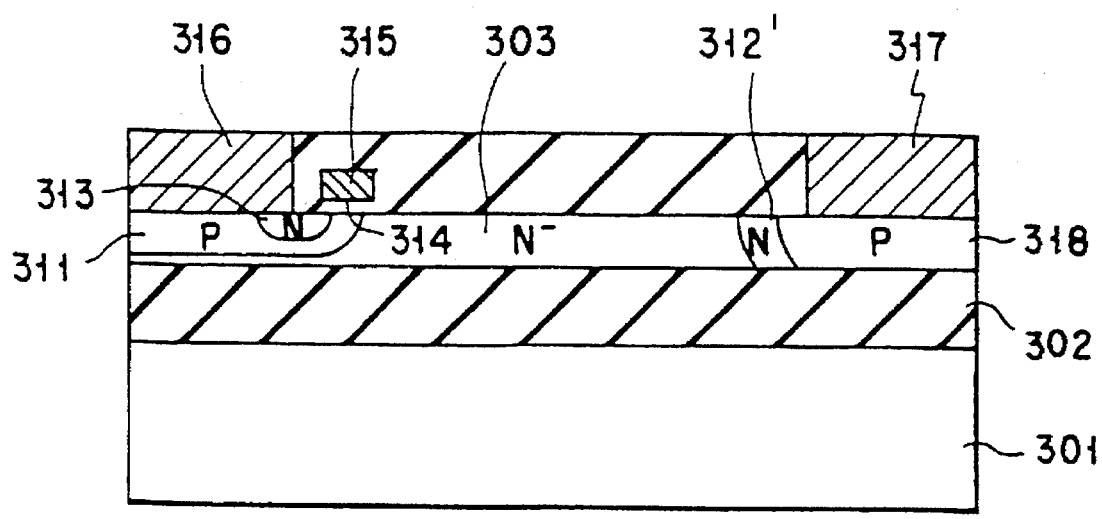
Figure 110:
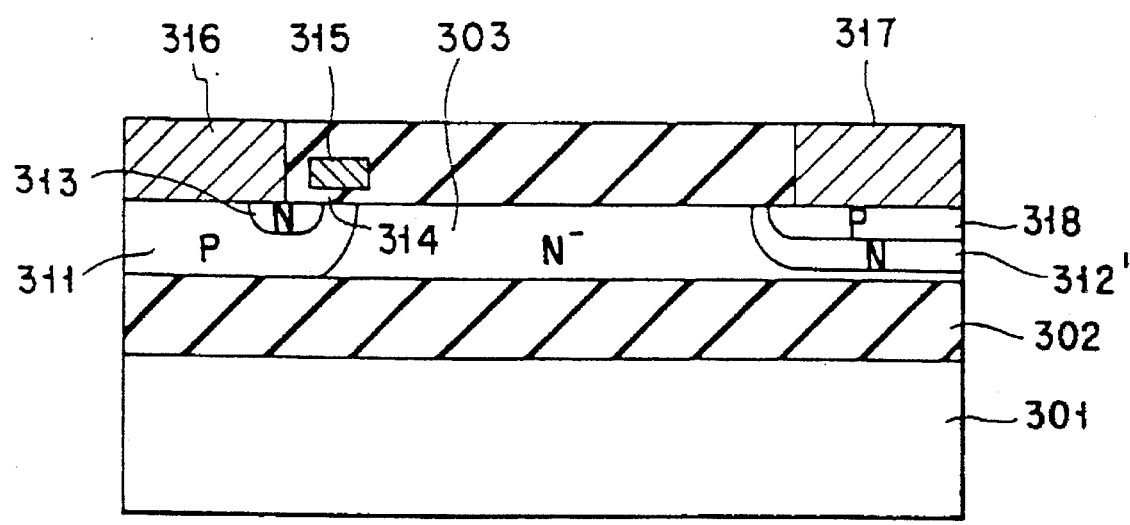
Figure 111:
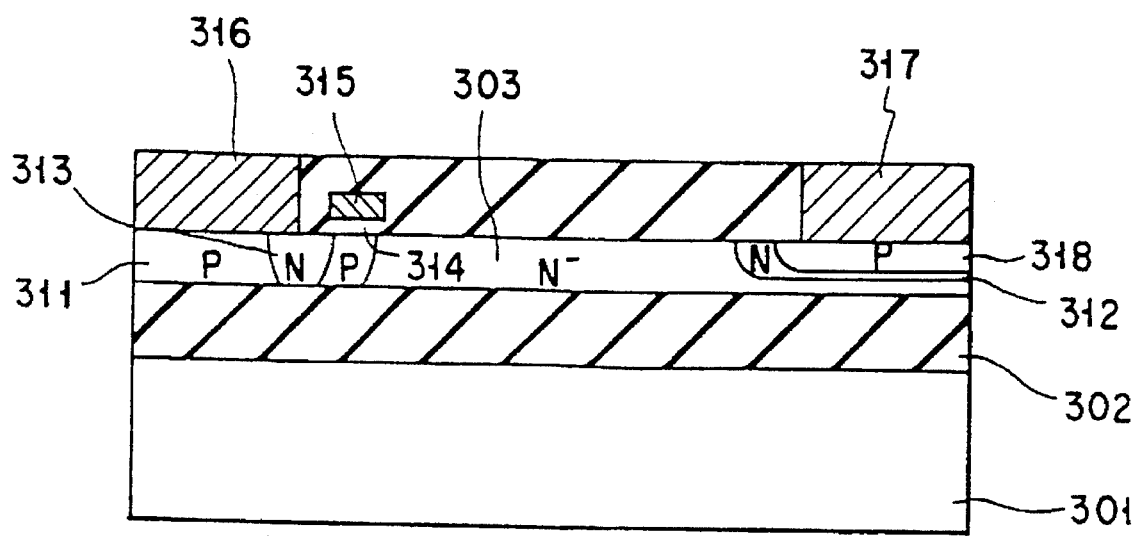
Figure 112:
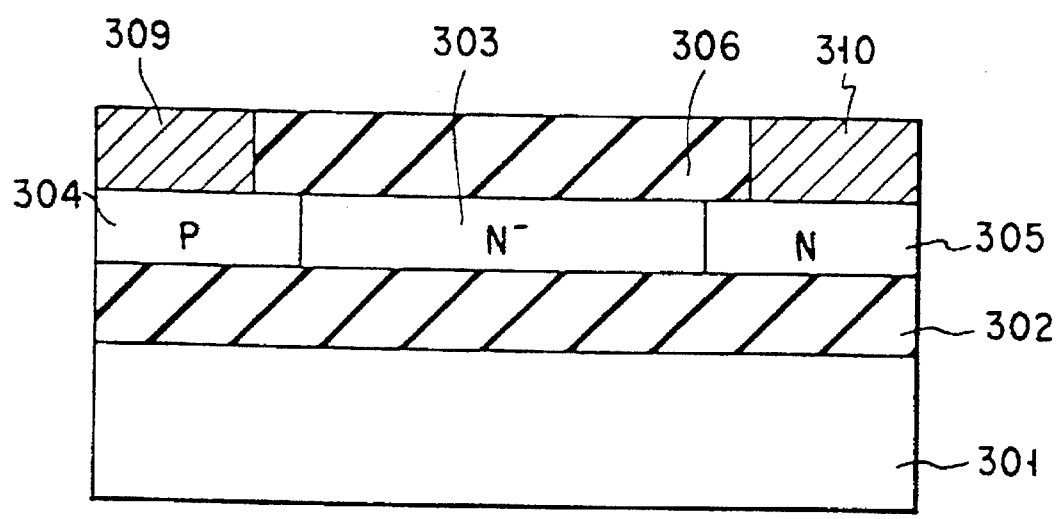

FIG. 83 is data showing the relationship between the thickness of the active layer 303 and breakdown voltage. In a case where the thickness of the active layer is 2 µm or less, breakdown voltage is improved as the active layer becomes thinner. This is because the p type anode layer 304 and the cathode layer 305 are formed to reach the depth of the oxide film 302 and there is the effect of the uniform potential distribution in the active layer 303 due to the high resistance film 307 on the active layer 303.

FIG. 27 is an embodiment in which the formation of the silicon oxide film under the high resistance film 307 is omitted and the high resistance film 307 is directly formed on the surface of the active layer 303 based on the structure of the embodiment of FIG. 65. According to this structure, the uniform potential distribution of the high resistance film 307 is directly transmitted to the inside of the active layer, and field concentration is effectively relaxed.

FIG. 28 is an embodiment in which the present invention is applied to MOSFET. Similar to the embodiment of FIG. 26, the n⁻ type high resistance silicon thin layer 303 having a thickness of 2 μm or less is formed on the silicon substrate 301 through the silicon oxide film 302. The total amount of impurities of the n⁻ type active layer 303 is also the same as that of the embodiment of FIG. 26. A p type base layer 311 and an n type drain layer 312, which correspond to the p type anode layer 304 and the n type cathode layer 305, respectively, are formed in the active layer 303. The p type base layer 311 and the n type drain layer 312 are formed to reach to the depth of the silicon oxide film 302. However, the p type base layer 311 may be formed to be shallower than the depth of the silicon oxide film 302. An n type source layer 313 is formed in the p type base layer 311. The surface portion of the p type base layer 311, which is sandwiched between the n type source layer 313 and the n⁻ type active layer 303, is used as a channel region, and a gate electrode 315 is formed thereon through a gate oxide film 314 having a thickness of about 60 nm.

On the surface of the active layer 303, which is sandwiched between the p type base layer 311 and the n type drain layer 312, similar to the the embodiment of FIG. 26. there is formed the high resistance film 307 through the silicon oxide film 306 having a thickness of 0.3 μm or less, preferably 0.2 μm or less. The upper portion of the high resistance film 307 is coated with the silicon oxide film 308.

A source electrode 316 is formed to be in contact with the n type source layer 313 and the p type base layer 311 at the same time. A drain electrode 317 is formed on the n type drain layer 312. The end portion of the high resistance film 307 is connected to the gate electrode 315 and the drain electrode 317.

MOSFET of this embodiment can also obtain the excellent high breakdown voltage characteristic which is similar to the diode of the embodiment of FIG. 26.

FIG. 29 is an embodiment in which the active layer 303 is formed to be thinner such that the n type source layer 313 reaches to the silicon oxide film 302 based on the structure of FIG. 28. FIGS. 30 and 31 are embodiments in which the high resistance film 307 is directly formed on the surface of the n⁻ type active layer 303.

These embodiments also show that excellent high breakdown voltage.

FIG. 32 is an embodiment in which the present invention is applied to the lateral type IGBT. The basic structure is the same as that of the embodiment of FIG. 28. In this embodiment, an n⁻ type base layer 312' corresponds to the n type drain layer 312 of FIG. 28, and the p type drain layer 318 is formed in the n type base layer 12'.

FIG. 33 is an embodiment in which the active layer 303 is formed to be thinner such that the n type source layer 313 and the p type drain layer 318 reach to the silicon oxide film 302, similar to the embodiment of FIG. 29. At this time, since the p type drain layer 318 is in contact with the silicon oxide film 302, there is a case that a channel using a p type inversion layer is formed in the bottom portion of the active layer. In order to prevent this case, impurity concentration of the n type base layer 312' must be set to be higher. More specifically, impurity concentration of the n type base layer 312' may be $1\times10^{17}/cm^3$ or more.

FIGS. 34 and 35 are embodiments in which the high resistance film 307 is directly formed on the surface of the active layer 303 based on the structure of FIGS. 32 and 33.

These embodiments also show that excellent high breakdown voltage.

FIG. 36 is an embodiment in which both ends of the high resistance film 307 is directly brought into contact with the p type anode layer 304 and the n type cathode layer 305.

FIG. 37 is an embodiment in which the both ends of high resistance film 307 are brought into contact with the n type source layer 313 and the n type drain layer 312, respectively, based on the MOSFET of FIG. 28. FIG. 38 is an embodiment in which the drain side end portion of the high resistance film 307 is connected to the drain electrode 317 through a polycrystalline silicon film 319 doped with impurity based on the structure of FIG. 37. FIG. 39 is an embodiment in which the source side end portion of the high resistance film 307 is connected to the n type source layer 313 based on MOSFET of FIG. 30.

In the embodiments of IGBT shown in FIGS. 32 to 35. the connection of the end portions of the high resistance film 307 can be modified (not shown) similar to the embodiment of MOSFET.

These embodiments also show that excellent high breakdown voltage.

FIGS. 40 to 53 are embodiments in which a high resistance film 320 such as SIPOS is formed in the bottom portion of the active layer 303 based on the embodiments of FIGS. 26 to 39.

The high resistance film 320 formed in the bottom portion of the active layer 303 has the same function as the high resistance film 307 formed on the surface of the active layer 303. Thereby, field concentration in the element is further effectively relaxed and high breakdown voltage characteristic can be obtained.

FIGS. 54 to 67 are embodiments in which a thin silicon oxide film 321 is formed between the active layer 303 and the high resistance film 320 based on the structure of FIGS. 40 to 53. These embodiments also show that excellent high breakdown voltage characteristic can be obtained if the silicon oxide film 321 is sufficiently thinned, preferably 0.2 μm or less.

In FIGS. 40 to 53 and FIGS. 54 to 67, the anode—cathode potential or the drain—source potential is applied to the high resistance film 320 of the bottom portion of the device through the diffusion layer. However, the electrode may be connected to the high resistance film 320 by, for example, forming the groove.

In the embodiment, explained so far, like the anode and cathode impurity layers of the diodes, there was explained the case in which the impurity layers of different conductivity types opposing to each other in the lateral direction in the active layer are in contact with the base oxide film of the active layer. However, the present invention is effective if at least one of impurity layers is in contact with the lower oxide film. The following explains several embodiments having such the structure.

FIG. 68 is an embodiment in which the p type anode layer 304 is not in contact with the lower oxide film 302 based on the embodiment of FIG. 26. Since it is the side of the n type cathode layer 305 that breakdown occurs by field concentration at the time of application of reverse bias. the high breakdown voltage characteristic can be sufficiently obtained in the embodiment.

Reversing to the FIG. 68, FIG. 69 is an embodiment in which the p type anode layer 304 is formed so as to reach the oxide film 302, and the n type cathode layer 305 is formed not to reach the oxide film 302. In the structure of this embodiment, if the thickness of the active layer remaining under the n type cathode layer 305 is extremely small, sufficiently high breakdown voltage characteristic can be obtained.

The similar modification can be made in the other embodiments of the diode.

FIGS. 70 and 71 are embodiment in which the n type drain layer 312 is formed not to reach the base oxide film 302 in MOSFET of the embodiments of FIGS. 30 and 31. In these embodiments, necessary high breakdown voltage characteristic can be obtained if the thickness of the active layer remaining under the n type drain layer 312 is small.

FIG. 72 is an embodiment in which the p type base layer 311 is formed to have a depth which does not contact the base oxide film 302 in the MOSFET of the embodiment of FIG. 30. In this case, for the same reason as the embodiment of the diode of FIG. 68, the high breakdown voltage characteristic can be obtained.

FIGS. 73 and 74 are embodiments in which either the source layer or the drain layer is formed to have a depth contacting the oxide film 302 in the embodiment of IGBT. In the case of IGBT, since the source and drain layers do not relate to the high breakdown voltage characteristic, there is no influence on the high breakdown voltage characteristic even if such a modification is made. Particularly in FIG. 74, the p type drain layer does not contact the oxide film 302 and the channel using the p type reverse layer can be prevented from being formed in the bottom portion of the active layer.

Figure 76:
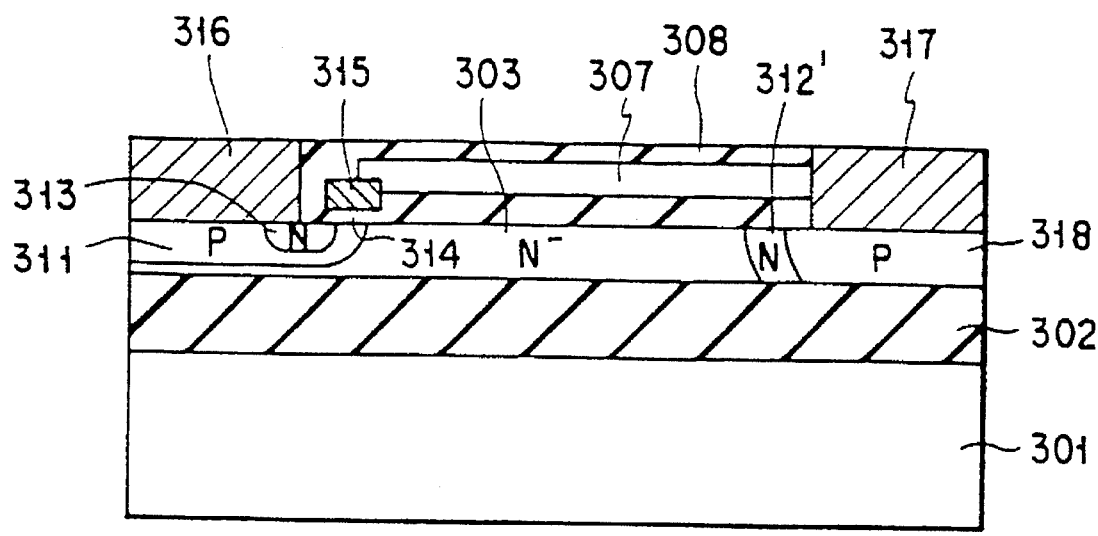
FIG. 76 is a view showing an IGBT of an embodiment in which the structure of FIG. 32 is modified.
Figure 77:
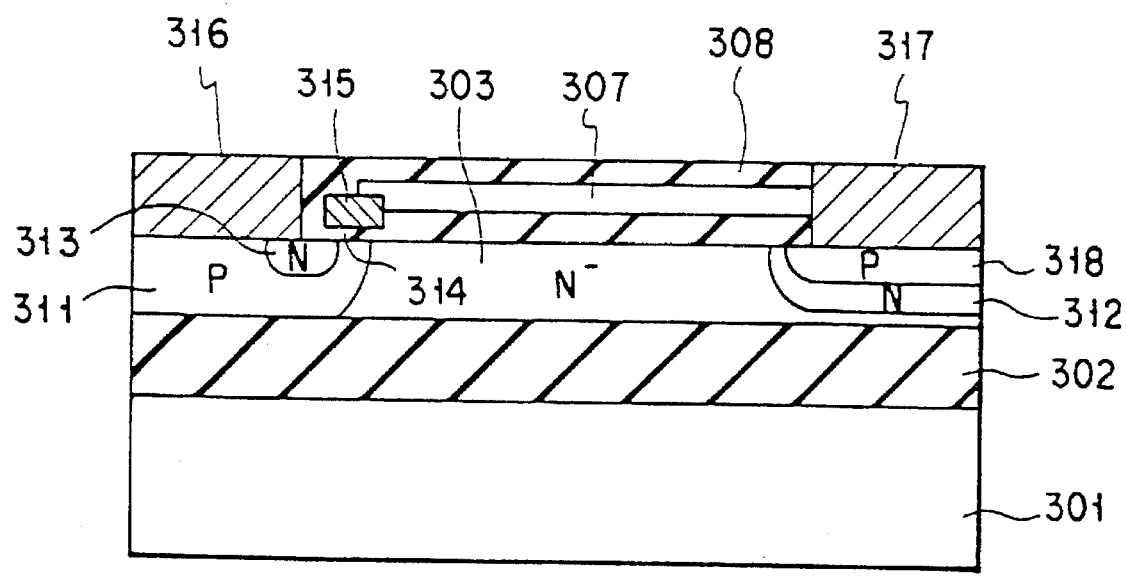
FIG. 77 is a view showing an IGBT of an embodiment in which the structure of FIG. 32 is modified.

FIGS. 75 and 76 are embodiments in which the p type base layer 311 is formed to have a depth which does not reach to the oxide film 302 in IGBT of the embodiments of FIGS. 34 and 35. In IGBT, there is the problem in field concentration of the side of the n type base layer on the drain side at the time of application of reverse bias. Due to this, if an n type base layer 312' is formed to a depth reaching to the oxide film, high breakdown voltage characteristic can be sufficiently obtained.

Reversing to FIGS. 75 and 76, FIGS. 77 and 78 are embodiments in which the n type base layer 312' is formed to a depth which does not reach to the oxide film 302. In this case, the high breakdown voltage can be also obtained if the thickness of the active layer remaining under the n type base layer 312' is sufficiently small.

FIG. 79 is an embodiment in which the p type anode layer 304 and the n type cathode layer 305 are formed by not impurity diffusion from the top portion but lateral impurity diffusion, and the junction surface is formed to be substantially vertical to the active layer. The similar modifications can be made in the other embodiments explained so far.

In the above embodiments, the explanation of the lateral isolation of the element was omitted. However the isolation structure as shown in FIGS. 80A to 80C can be used.

FIG. 80A shows that a silicon oxide film 322 for lateral isolation is formed to have a depth reaching to the silicon oxide film 302 of the bottom portion of the active layer 303 by LOCOS. According to the present invention, since the active layer 303 is formed to be 2 µm, the complete dielectric isolation structure can be easily obtained by such LOCOS.

In FIG. 80B, an isolation groove 323 having a depth reaching to the silicon oxide film 302 is formed and a silicon oxide film 324 is formed on the side surface thereof. Thereafter, for example, a polycrystalline silicon film 325 is buried therein.

FIG. 80C shows a pn junction isolation structure using a p type diffusion layer 326. Since the thickness of the active layer 303 is thin. the lateral isolation can be easily performed without ensuring the large area in the isolation region.

In each embodiment of diode, MOSFET and IGBT, the conductivity type of each portion can be opposed, and the present invention is useful in such a case.

As explained above, according to the present invention, there is formed the dielectric isolation structure in which the high impurity concentration layer to which high voltage is applied reaches to the base insulating film. Also, the high resistance film in which the uniform potential distribution is formed is arranged on the surface of the active layer, thereby obtaining the semiconductor device wherein the lateral element isolation is easily performed and excellent high breakdown voltage characteristic is shown.

As a specific example of the semiconductor device having high breakdown voltage relating to the second specific form of the present invention, it has been explained that the high resistance film is formed on the high resistance semiconductor layer through the insulating layer or not therethrough. However, the high resistance film is not always necessary to be formed in view of the feature of the high breakdown voltage semiconductor device relating to the above-explained second specific form of the present invention. Therefore, the following explains an example in which the high resistance film is not formed.

FIG. 84 is a lateral type diode relating to the embodiment of the present invention. The n⁻ type high resistance silicon layer (active layer) 303 is formed on the silicon substrate 301 through the silicon oxide film (first insulating film) 302. The thickness of the silicon oxide film 302 is about 1 to 5 µm. The n-type active layer 303 has and the total amount of impurities of $1.0 \times 10^{10}/cm^2$ to $2.0 \times 10^{12}/cm^2$, preferably $0.5 \times 10^{12}$ to $1.8 \times 10^{12}/cm^2$. The p type anode layer 304 having high impurity concentration and the n type cathode layer 305 having high impurity concentration are formed in the active layer 303 to be separated from each other with a predetermined distance. The p type anode layer 304 and the n type cathode layer 305 are formed to have the depth which does not reach to the silicon oxide film 302 as shown in the drawing. If voltage $V_1$ and voltage $V_2$ are applied to the p type anode layer 304 and the n type cathode layer 305, respectively, and voltages $V_1$ and $V_2$ are higher than the voltage Vsub of the silicon substrate 301, a p type channel region 303a is formed in the bottom portion of the high resistance silicon layer 303. Since the p⁻ type channel region 303a has positive charge, capacitance is formed together with the substrate 301. Thereby, influence of the potential of the substrate 301 is shielded, and the high resistance silicon layer 303 is prevented from being depleted.

Figure 123:
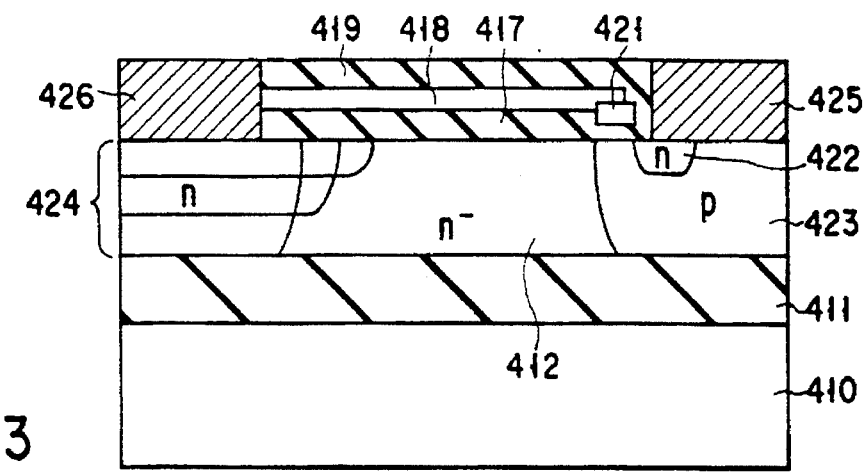
FIG. 123 is a cross sectional view showing a high breakdown voltage MOSFET which is a second embodiment of the fifth aspect of the present invention.

FIG. 85 is a MOSFET showing other example in which the p⁻ type channel region 303a shown in FIG. 123 is formed. The n⁻ type active layer 303 is formed on the substrate 301 through the silicon oxide film 302. The p type base layer 311 and the n type drain layer 312 are formed in the active layer 303. The p type base layer 311 and the n type drain layer 312 are formed to have the depth which does not reach to the silicon oxide film 302.

The n type source layer 313 is formed in the p type base layer 311, and the the surface portion of the p type base layer 311, which is sandwiched between the n type source layer 313 and the n⁻ type active layer 303, is used as a channel region, and the gate electrode 315 is formed on the channel region through the gate oxide film 314 having a thickness of about 60 nm.

The MOSFET shown in FIG. 85 is used as a switch on the high potential side of the circuit. If the MOSFET is turned on, both source potential and the drain potential become high potential to the substrate 301. In this case, if the influence of the potential of the substrate 301 is not shielded, the active layer 303 is depleted, and on resistance of the MOSFET becomes extremely high.

However, the distance between the p type base layer 311 and the oxide film 302 and impurity concentration of the p type base layer 311 are suitably selected, a hole is injected from the p type base layer 311 and the p⁻ channel region is formed in the bottom portion of the active layer 303 when the source potential $V_1$ is a certain constant value or more. Thereby, the active layer 303 is prevented from being depleted.

In this case, the source potential Vp to form the p⁻ type channel region can be obtained from the following equation.

$$V_P = qC_N l^2/2\epsilon$$

wherein (q: $1.6\times10^{-19}$ C) CN: N type impurity concentration and ε: dielectric constant ($1.05\times10^{-12}$ F/cm).

VP is preferably 10 V or less. That is, $1 \leq 20\epsilon/qC_N$.

In order to set VP to zero, the distance 1 may be changed to 0. In other words, the structure shown in FIGS. 86 and 87 may be used.

Figure 124:
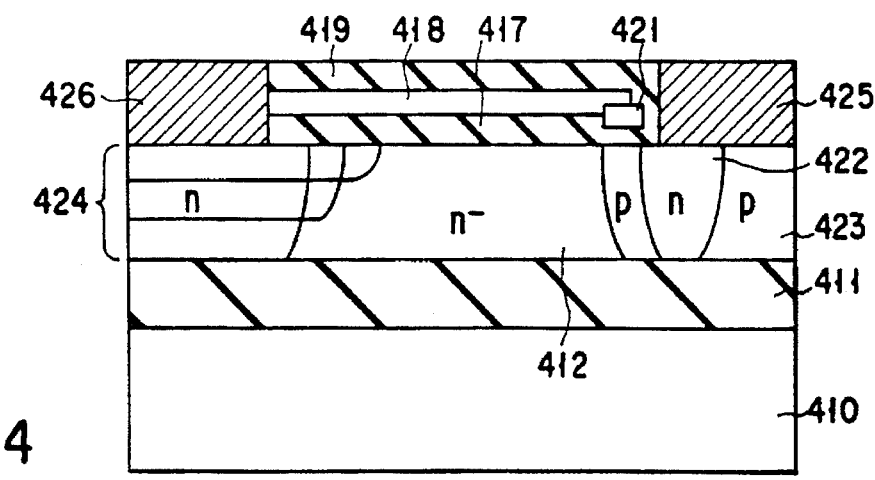
FIG. 124 is a cross sectional view illustrating a first modification of MOSFET shown in FIG. 123, wherein the n type source layer reaches the oxide film.

In FIG. 124, if the conductivity type of the drain region 312 is changed to p type, the device becomes IGBT. For such IGBT, the potential of n⁻ type active layer is floating and the p-channel region on the bottom oxide layer 302 is always formed even if the distance 1 is greater than zero. The n⁻ type active layer may be formed by impurity diffusion.

Figure 118:
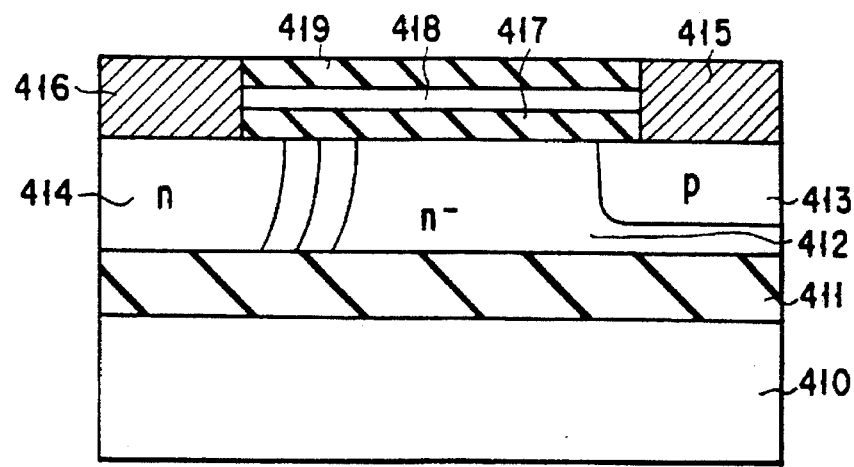
FIG. 118 is a cross sectional view showing a modification of the diode shown in FIG. 117, wherein the p type anode layer is shallower than the oxide film.

The structure in which the high resistance film is not formed on the high resistance semiconductor layer is not limited to the above-mentioned examples. There can be used the structure in which the high resistance film shown in FIGS. 3 to 118 is removed from the high resistance semiconductor layer. Such the structure is shown in FIGS. 88 to 112.

High breakdown voltage semiconductor device according to a fifth aspect of the present invention will be described.

The following are features which the device according to the fifth aspect should preferably have:

(1) Two impurity layers of first and second conductivity types, respectively, are formed deep, reaching the insulating film.

(2) A high resistance film is formed on that portion of the active layer which is located between the two impurity layers.

(3) The active layer contains an impurity in an amount ranging from $1\times10^{10}$ cm⁻² to $2\times10^{12}$ cm⁻².

(4) The active layer has a thickness of 10 μm or less, preferably 5 μm or less.

Assume that, in a high breakdown voltage semiconductor device of dielectric isolation structure, a high reverse bias voltage may be applied to the impurity layer of the first conductivity type, while the impurity layer of the second conductivity type remains connected to the ground. The bias voltage is shared by the active layer and the insulating film with respect to the vertical direction. If an electric field concentrates in the vicinity of the curved portion of the bottom of the impurity layer of the first conductivity type, avalanche breakdown will occur at a low voltage applied.

In the present invention, the impurity layer of the first conductivity type comprises two or more diffusion layers which are superimposed one upon another and which differ in the diffusion depth or the diffusion window width, or both. Hence, the electric field concentration is moderated mitigated at the curved bottom portion of the diffusion layer. More specifically, the concentration of the electric field in the active layer is mitigated, particularly near the curved portion of the bottom of the diffusion layer. This helps to provide a device which has a breakdown voltage higher than that of any conventional device. In addition, when the active layer is relatively thin, it is easy to isolate the device in the lateral direction by a trench isolation.

Further, when both impurity layers are formed deep, reaching the insulating film, the voltage applied to the impurity layer of the first conductivity type is applied hence to the insulating film only. This makes it possible to reduce the electric field extending vertically in the active layer. Also, when a high resistance film is formed on the active layer, the high resistance film has a uniform potential distribution, whereby the lateral potential distribution in the surface of the active layer is rendered uniform. This serves to effectively mitigate the electric field concentration within the active layer.

Various high breakdown voltage semiconductor devices according to the fifth aspect of the present invention will be described in detail, with reference to the accompanying drawings.

Figure 113:
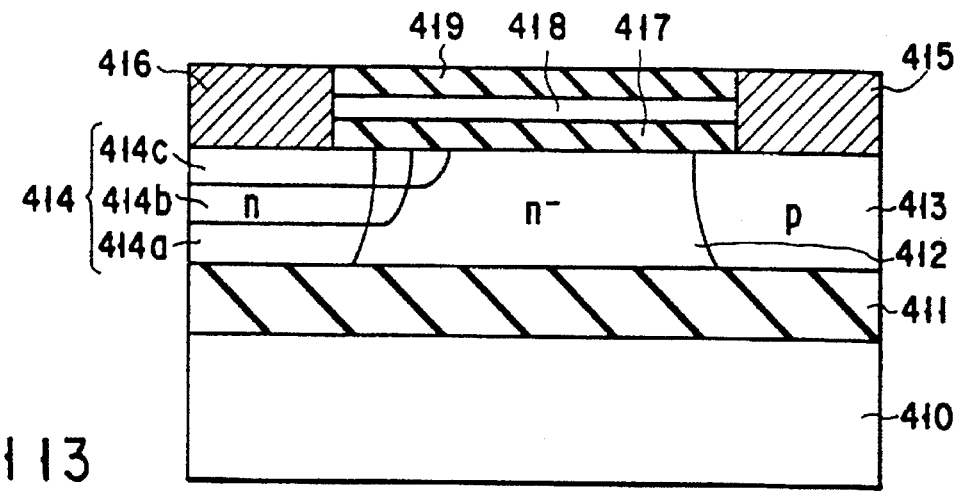
FIG. 113 is a cross sectional view showing a high breakdown voltage diode which is a first embodiment of the fifth aspect of the invention.

FIG. 113 shows a high breakdown voltage diode which is a first embodiment of the fifth aspect of the invention.

As shown in FIG. 113, a silicon oxide film (isolation insulating film) 411 is formed on a silicon substrate 410. An n⁻ type high resistance silicon layer (active layer) 412 is formed on the silicon oxide film 411. This structure can be formed by, for example, forming the film 411 on the substrate 410, then bonding a mirror-polished silicon substrate to the film 411, and finally grinding the silicon substrate to a reduced thickness. The silicon oxide film has a thickness of about 1 to 5 μm. The n⁻ type active layer 412 contains an impurity in an amount of $1\times10^{10}$ cm⁻² to $2\times10^{12}$ cm⁻², and has a thickness of about 10 μm.

A p type anode layer 413 and an n type cathode layer 414 are formed in the active layer 412, spaced apart from each other by a predetermined distance. The anode layer 413 and the cathode layer 414 have been formed by diffusing impurities. As shown in FIG. 113, the layers 413 and 414 are so deep that they reach the silicon oxide film 411 which contacts the bottom of the active layer 412. The n type cathode layer 414 comprises three diffusion layers 414a, 414b, and 414c which have been formed by diffusing an impurity three times, each time to different diffusion depth using a diffusion window having a different width. The total amount of the impurity contained in all diffusion layers, but the layer 414a, ranges from $1\times10^{11}$ cm⁻² to $3\times10^{12}$ cm⁻².

An anode electrode 415 is formed on the anode layer 413, and a cathode electrode 416 on the cathode layer 414. A silicon oxide film 417 is formed on that portion of the active layer 412 on which neither the electrode 415 nor the electrode 416 is formed. A high resistance film 418 is formed on the silicon oxide film 147. The high resistance film 148 is made of, for example, a SIPOS (Semi-Insulating Polycrystalline Silicon), and has its ends connected to the electrodes 415 and 416, respectively. The surface of the high resistance film 418 is covered with a silicon oxide film 419 which serves as protective film.

Assume the substrate 410 and the p type anode layer 413 are connected to the ground, and that a high voltage is applied to the n type cathode layer 414. Then, with respect to the vertical direction, the voltage applied on the cathode layer 414 is applied hence to the silicon oxide film 411 only. The silicon oxide film 411 has a breakdown voltage much higher than that of the active layer 412.

Due to the voltage applied between the anode electrode 415 and the cathode electrode 416, a small current flows in the high resistance film 418 formed above the active layer 412. The film 418 thereby has a potential distribution which is uniform in the lateral direction. This uniform potential distribution induces a potential distribution in the surface of the active layer 412, which is also uniform in the lateral direction. Since the n type cathode layer 414 comprises three diffusion layers 414a, 414b, and 414c which have been formed by diffusing an impurity three times, the gradient of impurity concentration is moderated in the curved portion of the bottom of the lowermost diffusion layer. Hence, the isopotential lines representing the potential distribution in the cathode layer 414 are spaced apart by long distances. A prominent electric field concentration is therefore prevented from occurring near the curved portion of the bottom of the lowermost diffusion layer. As a result, the electric field concentration in the diode is mitigated, whereby the diode has a high breakdown voltage.

The breakdown voltage of the diode varies with the total amount of the impurity contained in the active layer 412 as is illustrated in FIG. 135. As can be understood from FIG. 135, the breakdown voltage gradually rises as the impurity amount increases from $1 \times 10^{10}$ cm$^{-2}$ to $3 \times 10^{10}$ cm$^{-2}$. Once the impurity amount increases over $3 \times 10^{10}$ cm$^{-2}$, the breakdown voltage abruptly decreases. Hence, it is desirable that the active layer 412 contain the impurity in a total amount of $1 \times 10^{10}$ cm$^{-2}$ to $2 \times 10^{10}$ cm$^{-2}$.

As indicated above, the n type cathode layer 414 comprises three diffusion layers 414a, 414b, and 414c formed by diffusing an impurity three times, each time to different diffusion depth using a diffusion window having a different width, is relatively deep, reaching the silicon oxide film 411. As has been described, the high resistance film 148 is formed above the active layer 412. Therefore, the electric field concentration in the diode can be mitigated, whereby the diode can have a high breakdown voltage even if the active layer 412 is made comparatively thin.

Figure 114:
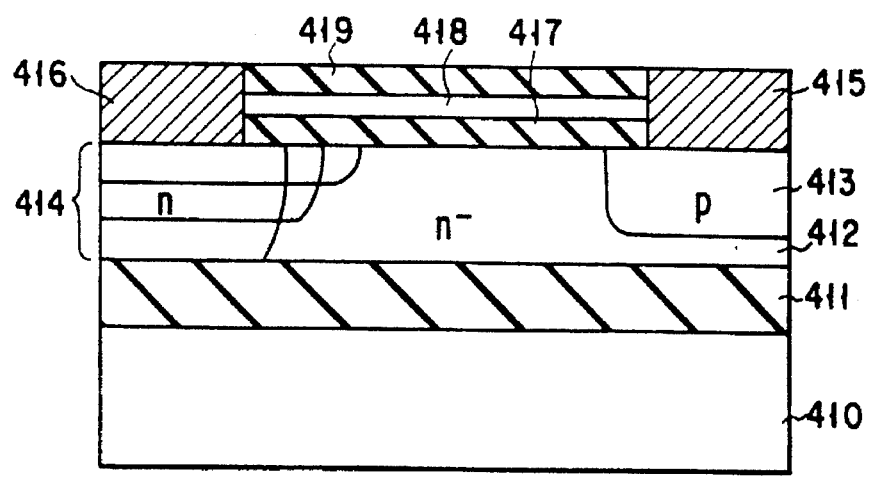
FIG. 114 is a cross sectional view illustrating a first modification of the diode shown in FIG. 113, wherein the p type anode layer is shallower than the oxide film.
Figure 115:
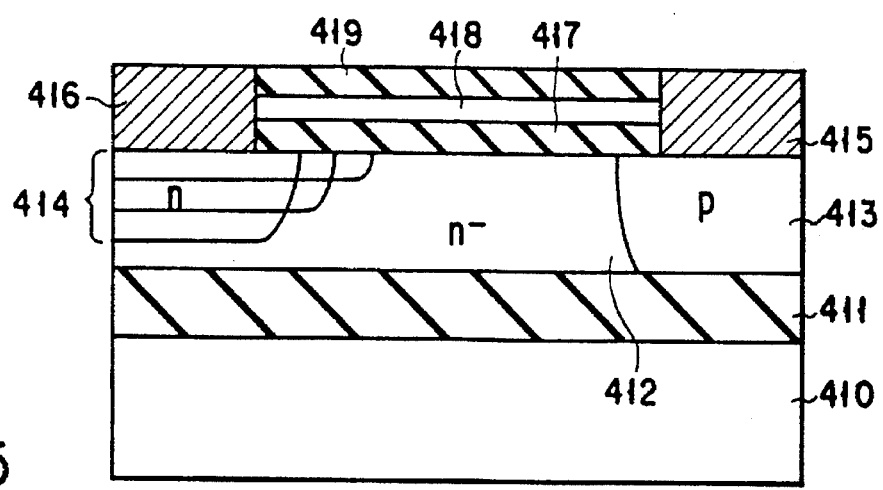
FIG. 115 is a cross sectional view showing a second modification of the diode shown in FIG. 113, wherein the p type cathode layer is shallower than the oxide film.
Figure 116:
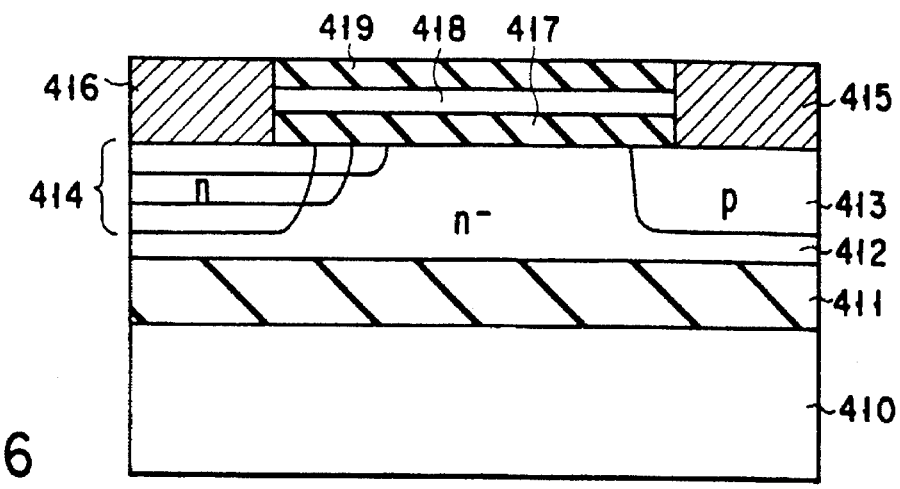
FIG. 116 is a cross sectional view showing a third modification of the diode shown in FIG. 113, wherein the p type anode layer and the n type cathode layer are shallower than the oxide film.

FIGS. 114 to 116 show three modifications of the diode shown in FIG. 113, respectively. The modified diode of FIG. 114 is characterized in that the p type anode layer 413 is shallower than the silicon oxide film 411. The modified diode of FIG. 115 differs from the diode of FIG. 113 in that n type cathode layer 414 is shallower than silicon oxide film 411. The modified diode of FIG. 116 is characterized in that both the anode layer 413 and the cathode layer 414 are shallower than the silicon oxide film 411. In these modified diodes, too, the electric field concentration at the edge portion of the n type cathode layer 414 is mitigated, achieving the same advantage as the diode illustrated in FIG. 113.

Figure 117:
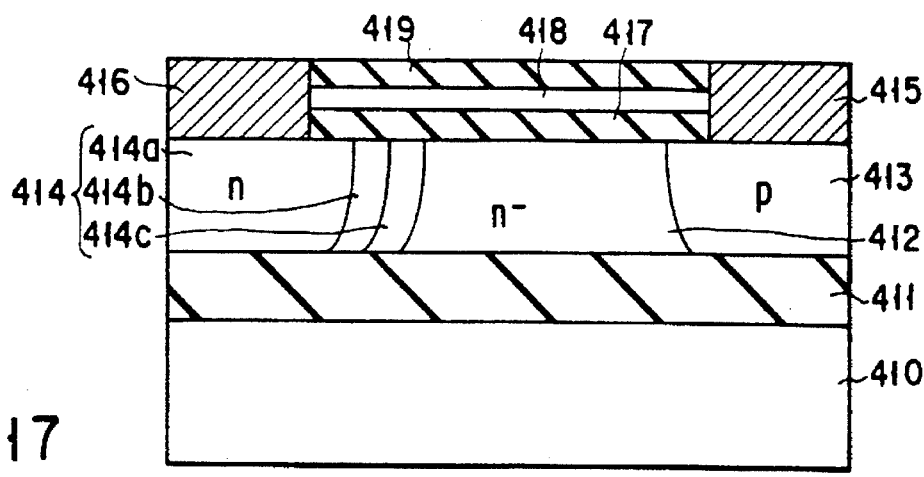
FIG. 117 is a cross sectional view illustrating a fourth modification of the diode shown in FIG. 113, wherein the n type cathode layer comprises three diffusion layers having the same depth.

FIG. 117 illustrates another modification of the diode shown in FIG. 113. As FIG. 117 shows, the n type cathode layer 414 is deep, reaching the silicon oxide film 411. It comprises three diffusion layers 414a, 414b and 414c which have been formed by diffusing the impurity three times to the same depth, each time using a diffusion window having a different lateral length. The diffusion layer 414a has a higher impurity concentration than the layer 414b, which has a higher impurity concentration than the layer 414c. The isopotential lines showing the potential distribution in the cathode layer 414 are spaced apart in the lateral direction by relatively long distances. A prominent electric field concentration is therefore prevented from occurring, as in the diode of FIG. 113. Instead of repeating the impurity diffusion, the impurity concentration in the cathode layer 414 may be continuously varied in the lateral direction.

Figure 119:
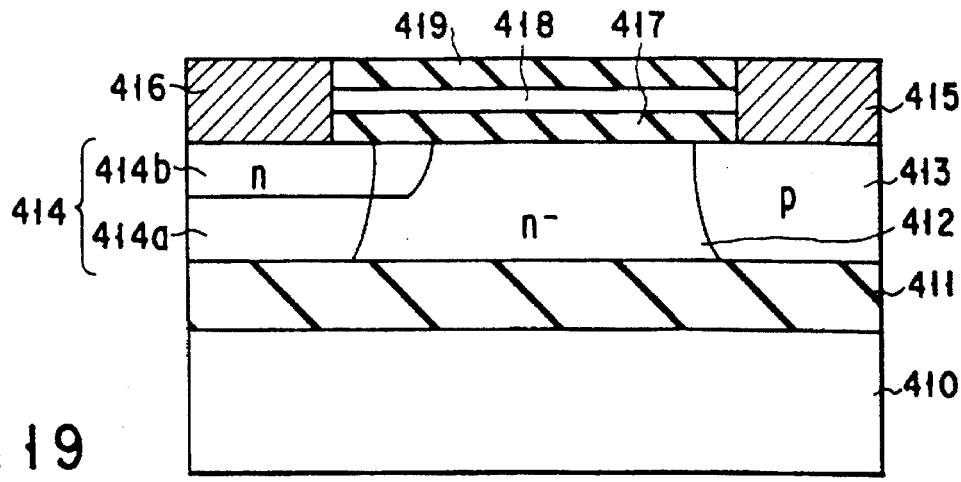
FIG. 119 is a cross sectional view showing a fifth modification of the diode shown in FIG. 113, wherein the n type cathode layer is formed by double diffusion.

FIG. 118 shows a modification of the diode shown in FIG. 117. As can be understood from FIG. 118, this modified diode has the structural features of the diode shown in FIG. 114. FIG. 119 illustrates a modification of the diode (FIG. 113), in which the n type cathode layer 414 is formed by double diffusion.

Figure 120:
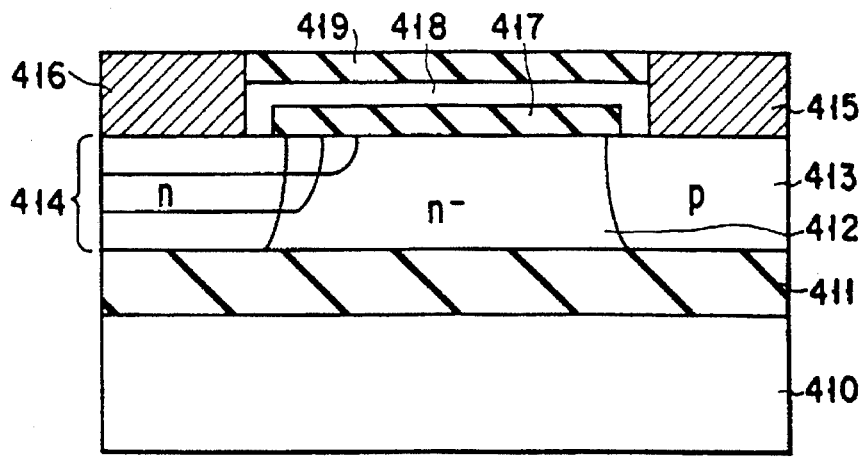
FIG. 120 is a cross sectional view showing a sixth modification of the diode shown in FIG. 113, wherein the high resistance film is connected to the p type anode layer and the n type cathode layer.
Figure 121:
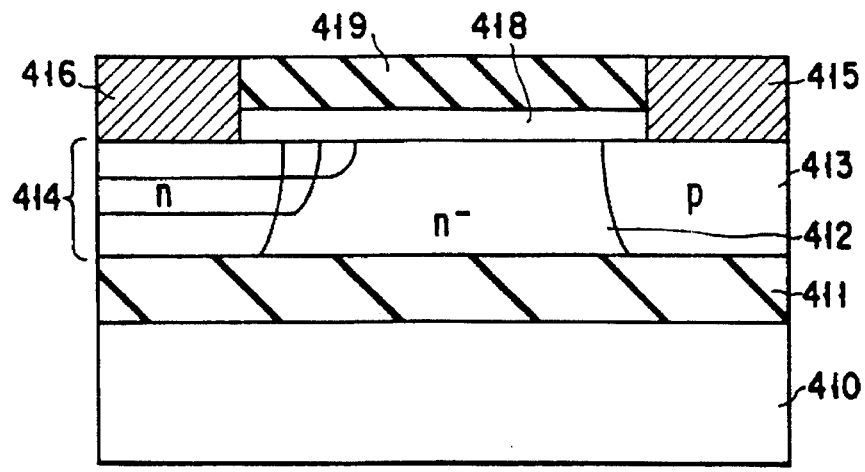
FIG. 121 is a cross sectional view showing a seventh modification of the diode shown in FIG. 113, wherein the high resistance film is formed directly on the active layer.

FIGS. 120 and 121 show two other modifications of the diode shown in FIG. 113. The modified diode of FIG. 120 is characterized in that the high resistance film 418 is connected not only to the electrodes 415 and 146, but also to the the p type anode layer 413 and the n type cathode layer 414. The modified diode of FIG. 121 is characterized in that the high resistance film 418 is formed directly on the active layer 412. In both diodes illustrated in FIGS. 120 and 121, too, the film 418 has so high a resistance that the anode layer 413 and the cathode layer 414 would not be short-circuited. The potential distribution in the region between the layers 413 and 414 can therefore be uniform.

Figure 122:
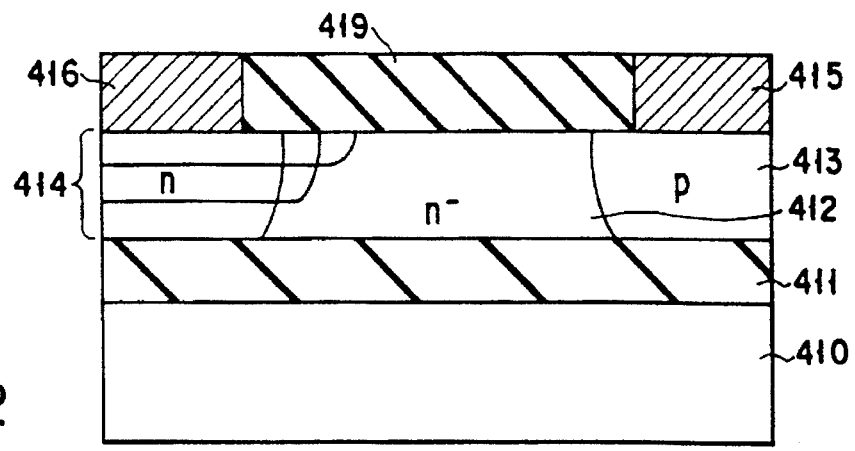
FIG. 122 is a cross sectional view illustrating a eighth modification of the diode shown in FIG. 113, which has no high resistance film.

FIG. 122 shows another modification of the diode illustrated in FIG. 113. In this modified diode, no high resistance film is formed at all, and only a protective insulating film 419 is formed directly on the active layer 412. Since no high resistance film is formed, the potential distribution in the region between the anode layer 413 and the cathode layer 414 cannot be uniform. Nevertheless, the electric field concentration at the edge portion of the n type cathode layer 414 is mitigated since the layer 414 has been formed by diffusing the impurity three times and is deep and reaching the silicon oxide film 411.

FIG. 123 illustrates a high breakdown voltage MOSFET which is a second embodiment of the fifth aspect of this invention. The elements identical or similar to those shown in FIG. 113 are designated at the same numerals in FIG. 123 and will not be described in detail.

As shown in FIG. 123, a silicon oxide film (isolation insulating film) 411 is formed on a silicon substrate 410, and an n$^-$ type high resistance silicon layer (active layer) 412 is formed on the silicon oxide film 411—exactly in the same way as in the diode of FIG. 113. The n$^-$ type active layer 412 contains an impurity in the same amount as in the diode of FIG. 113, i.e., $1 \times 10^{10}$ cm$^{-2}$ to $2 \times 10^{12}$ cm$^{-2}$. In the active layer 412, there are formed a p type base layer 423 and and n type drain layer 424. The base layer 423 and the drain layers 424 correspond to the p type anode layer 413 and n type cathode layer 414 of the diode (FIG. 113), respectively.

An n type source layer 422 is formed in the surface of the p type base layer 423. That surface portion of the p type base layer 423 which lies between the n$^-$ type active layer 412 and the n type source layer 422 functions as channel region. A gate insulating oxide film about 60 nm thick is formed on the channel region, and a gate electrode 421 is formed on the gate insulating oxide film.

A silicon oxide film 417 is formed on that portion of the active layer 412 which lies between the p type base layer 423 and the n type drain layer 424. A high resistance film 418 is formed on the silicon oxide film 147, and a silicon oxide film 419 covers the high resistance film 418.

A source electrode 425 is formed, partly on the n type source layer 422 and partly on the p type base layer 423. A drain electrode 426 is formed on the n type drain layer 424. The ends of the high resistance film 418 are connected to the gate electrode 421 and the drain electrode 426, respectively. The gate electrode 421 is at the ground potential of 0 V when the MOSFET is off. The voltage applied to the gate electrode while the MOSFET remains on is much lower than the high voltage applied to the drain electrode 426. The high resistance film 418 can therefore performs the same function as its counterpart of the diode shown in FIG. 113, though it is connected at its ends to the gate electrode 421 and the drain electrode 426.

As described above, the n type drain layer 424 has been formed by triple diffusion and is relatively deep, reaching the silicon oxide film 411, and the high resistance film 418 performs the same function as its counterpart of the diode of FIG. 113. Therefore, the MOSFET has a high breakdown voltage as does the diode shown in FIG. 113.

Figure 125:
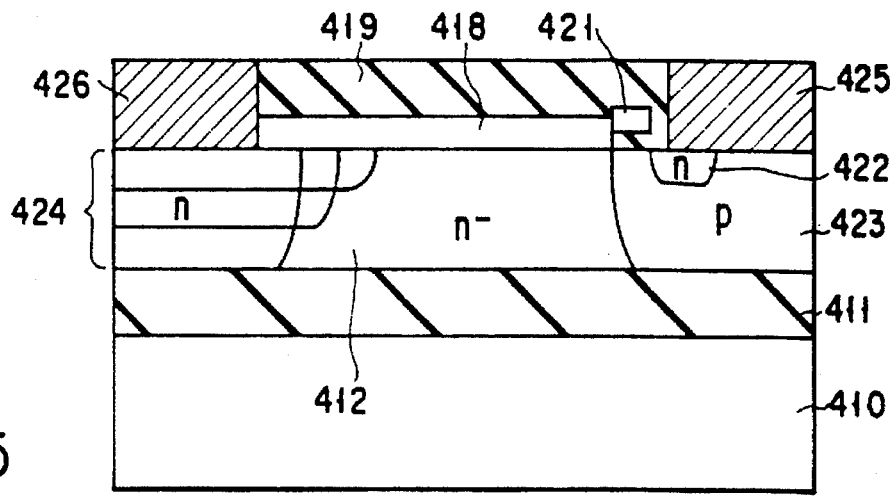
FIG. 125 is a cross sectional view showing a second modification of the MOSFET shown in FIG. 123, wherein the high resistance film is formed directly on the active layer.
Figure 126:
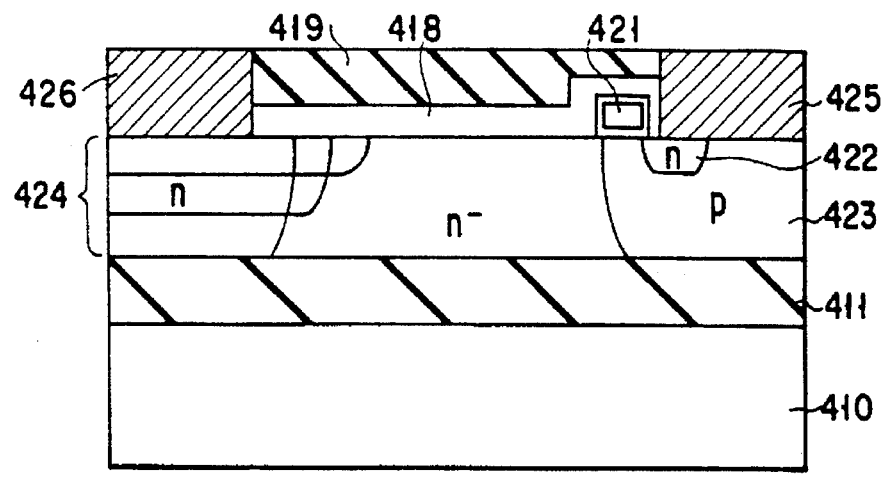
FIG. 126 is a cross sectional view showing a third modification of the MOSFET shown in FIG. 123, wherein the high resistance film is connected to the source electrode, not to the gate electrode.

Modifications of the MOSFET shown in FIG. 123 will be described, with reference to FIGS. 124 to 128. FIG. 124 shows a modified MOSFET, wherein the n type source layer 422 is deep, reaching the oxide film 411. FIG. 125 shows another modified MOSFET MOSFET, in which the high resistance film 418 is directly formed on the active layer 412. FIG. 126 illustrates another modified MOSFET, which is characterized in that the high resistance film 418 is connected to the source electrode 425, not to the gate electrode 421.

Figure 127:
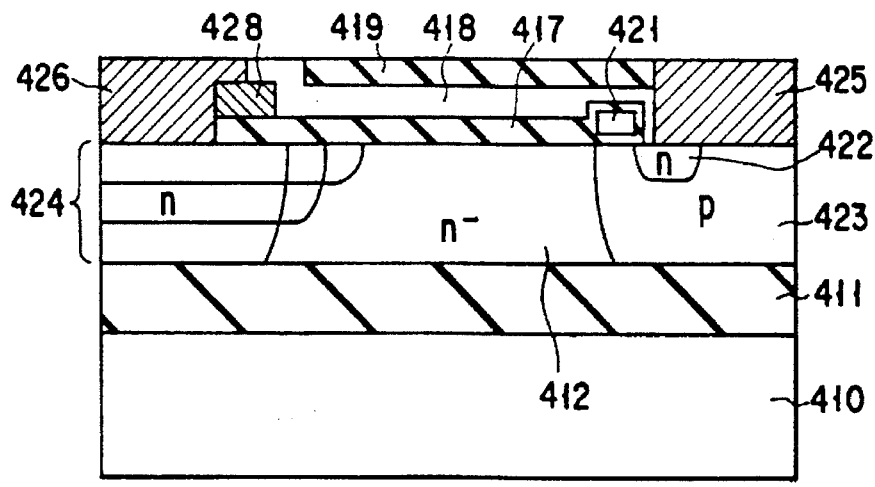
FIG. 127 is a cross sectional view showing a fourth modification of the MOSFET shown in FIG. 123, wherein the high resistance film has its drain-side portion connected to the drain electrode by an impurity-doped polycrystalline silicon film.

FIG. 127 shows another modified MOSFET, wherein the high resistance film 418 has its drain-side portion connected to the drain electrode 426 by an impurity-doped polycrystalline silicon film 428. Although the contact resistance between the high resistance film 418 and the drain electrode 423 is extremely high, the contact resistance between the film 418 and the impurity-doped polycrystalline silicon film 426 is very low, and the contact resistance between the drain electrode 426 and the impurity-doped polycrystalline silicon film 428 is very low, too. Hence, the film 428 interposed between the high resistance film 418 and the drain electrode 426 decreases the contact resistance between the film 418 and the drain electrode 426.

Figure 128:
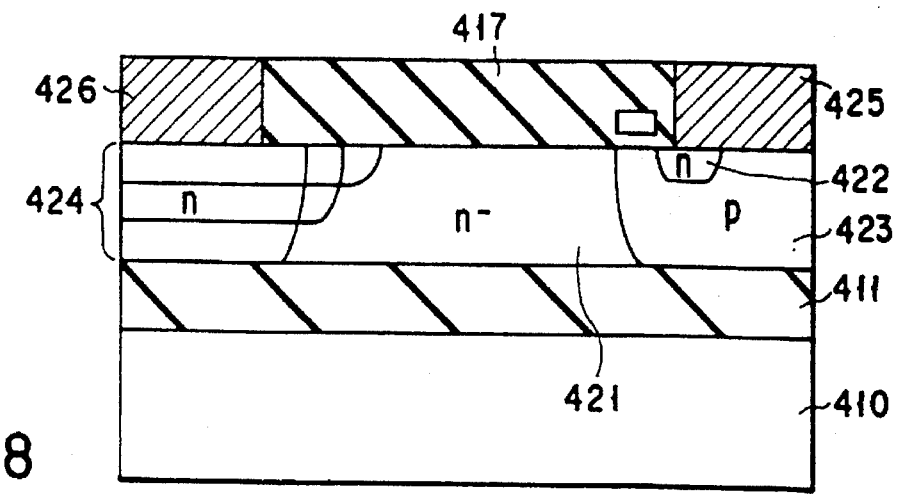
FIG. 128 is a cross sectional view illustrating a fifth modification of the MOSFET shown in FIG. 123, which has no high resistance film.

FIG. 128 shows a modified MOSFET, which has no high resistance film. The p type base layer 423, the n type drain layer 424, and the like may be formed shallower than the silicon oxide film 411, as in the diodes shown in FIGS. 114, 115 and 116. Further, the n type drain layer 424 may comprise three diffusion layers formed by diffusing the impurity three times to the same depth, each time using a diffusion window having a different lateral length, as practiced in the diode illustrated in FIG. 117.

Figure 129:
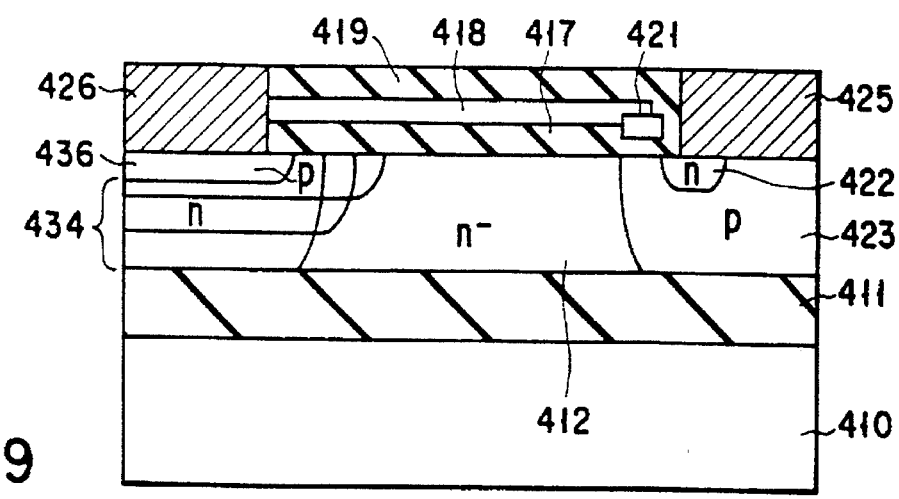
FIG. 129 is a cross sectional view illustrating a lateral type IGBT which is a third embodiment of the fifth aspect of this invention.

FIG. 129 illustrates a lateral type IGBT (Insulated Gate Bipolar Transistor) which is a third embodiment of the fifth aspect of this invention. The elements identical or similar to those shown in FIG. 123 are designated at the same numerals in FIG. 129 and will not be described in detail.

The IGBT shown in FIG. 129 is similar in basic structure to the MOSFET of FIG. 123. In the IGBT, the n type base layer 434 corresponds to the n type drain layer 424 shown in FIG. 123. A p type drain layer 436 is formed in the surface of the n type base layer 434.

This structure is a lateral type IGBT comprising a bipolar transistor and a power MOSFET, both formed monolithically, in a single chip. As in the diode of FIG. 113, the n type base layer 434 has been formed by triple diffusion and is relatively deep, reaching the silicon oxide film 411, and the high resistance film 418 performs the same function as its counterpart of the diode of FIG. 113. Hence, the electric field concentration at the edge portion of the n type base layer 434 is mitigated. As a result, the IGBT has a high breakdown voltage.

A few modifications of the IGBT shown in FIG. 129 will be described, with reference to FIGS. 130 to 134.

Figure 130:
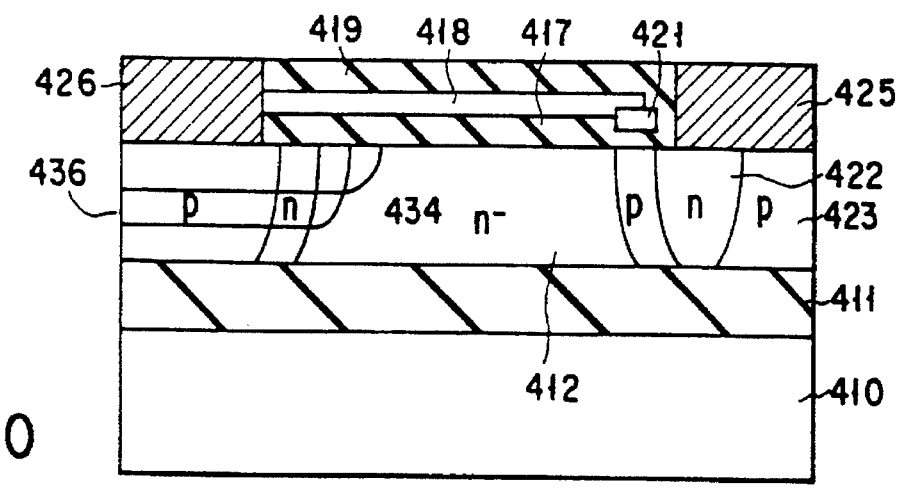
FIG. 130 is a cross sectional view showing a first modification of the IGBT shown in FIG. 129, wherein the n type source layer and the p type drain layer are deep, reaching the oxide film.

FIG. 130 shows a modified IGBT, wherein the active layer 412 is so thin that the n type source layer 422 and the p type drain layer 436 are deep, reaching the oxide film 411, as in the MOSFET of FIG. 124. Since the p type drain layer 436 contacts the silicon oxide film 411, a channel may be formed of a p type inversion layer in the bottom of the active layer 412. To prevent this, the n type base layer 434 has high impurity concentration of $1 \times 10^{17}$ cm$^{-3}$ or more. The p type drain 436 may be as shallow as in the IGBT of FIG. 129, not reaching the silicon oxide film 411. If this is the case, no p type inversion layer, or a channel, will be formed in the bottom of the active layer 412.

Figure 131:
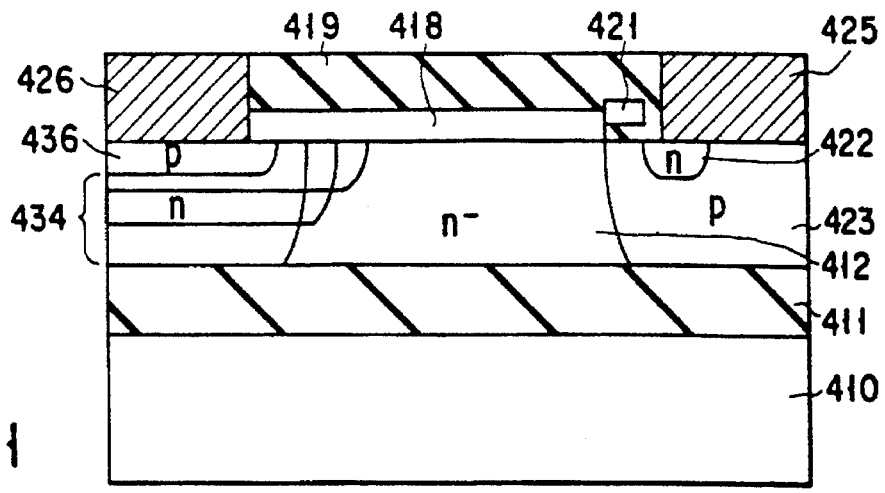
FIG. 131 is a cross sectional view showing a second modification of the IGBT shown in FIG. 129, in which the high resistance film is formed directly on the active layer.
Figure 132:
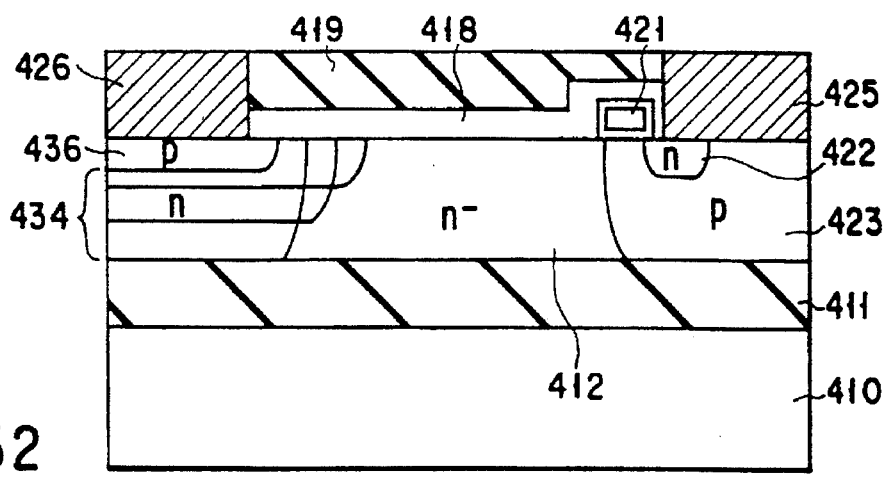
FIG. 132 is a cross sectional view showing a third modification of the IGBT shown in FIG. 129, wherein the high resistance film is connected to the source electrode, not to the gate electrode.

FIG. 131 shows another modified IGBT, in which the high resistance film 418 is formed directly on the active layer 412. The modified IGBT shown in FIG. 132 is characterized in that the high resistance film 418 is connected to the source electrode 425, not to the gate electrode 421.

Figure 133:
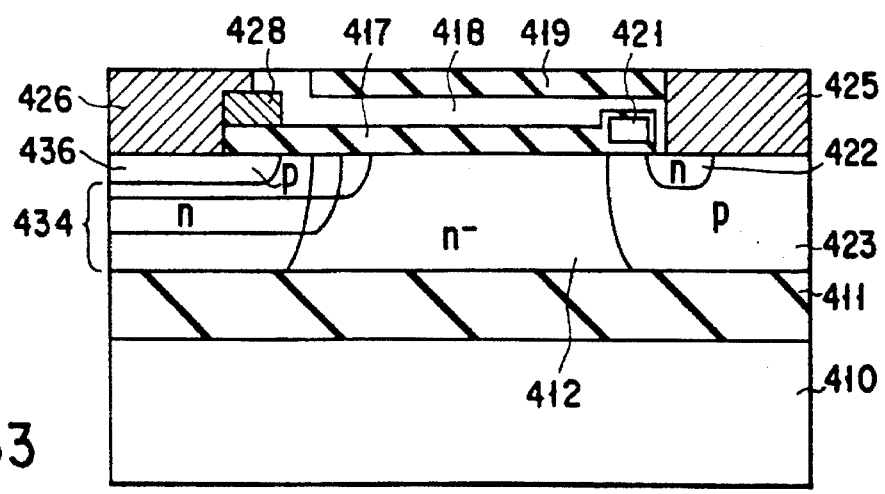
FIG. 133 is a cross sectional view showing a fourth modification of the IGBT shown in FIG. 129, wherein the high resistance film is connected at one end to the electrode.

FIG. 133 shows a modified IGBT, wherein the high resistance film 418 is connected at its drain-side portion to the drain electrode 426 by an impurity-doped polycrystalline silicon film 428. As in the MOSFET of FIG. 127, the impurity-doped polycrystalline silicon film 428, which is interposed between the high resistance film 418 and the drain electrode 426 decreases the contact resistance between the film 418 and the drain electrode 426.

FIG. 134 shows another modified IGBT, which has no high resistance film. The p type base layer 423, the n type drain layer 424, and the like may be formed shallower than the silicon oxide film 411, as in the diodes shown in FIGS. 114, 115 and 116. In addition, the n type drain layer 424 may comprise three diffusion layers formed by diffusing the impurity three times to the same depth, each time using a diffusion window having a different lateral length, as practiced in the diode illustrated in FIG. 117.

Another IGBT, which is a fourth embodiment of the fifth aspect of the invention, will be described with reference to FIG. 136. This embodiment is a lateral type IGBT.

As is shown in FIG. 136, a silicon oxide film 451 is formed on a silicon substrate 450. The silicon oxide film 451 has a thickness ranging from 1 to 5 μm. An n⁻ type high resistance silicon layer (active layer) 452 having a thickness of 5 μm or less is formed on the silicon oxide film 451. A p type base layer 453 and an n type base layer (buffer layer) 454 are formed by diffusing impurities into the active layer 452. They are spaced apart from each other by a predetermined distance, both reaching the silicon oxide film 451. An n⁺ type source layer 455 and a p⁺ type drain layer 456 are formed by means of impurity diffusion, in the p type base layer 453 and the n type base layer 454, respectively. That surface region of the p type base layer 453 which lies between the n⁺ type source layer 455 and the n⁻ type active layer 452 functions as channel region. A gate insulating film, about 60 nm thick, is formed on the channel region. A gate electrode 457 is formed on the gate insulating film. A source electrode 458 is formed, contacting both the n⁺ type source layer 455 and the p type base layer 453. A drain electrode 459 is formed, contacting the p type drain layer 456. An insulating protective film 460 is formed on that portion of the active layer 452 on which which neither the electrode 458 nor the electrode 459 is formed.

Figure 137:
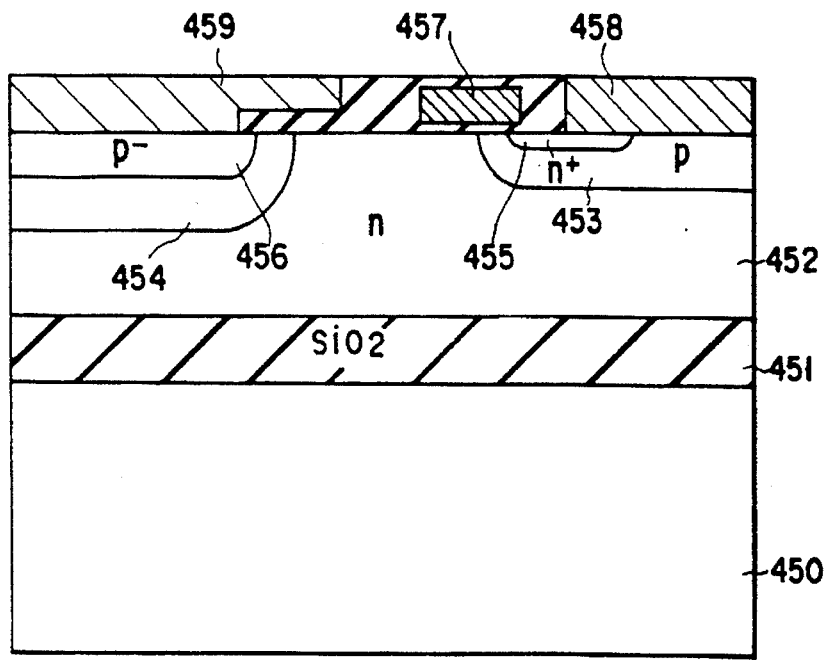
FIG. 137 is a cross sectional view showing a first modification of the IGBT shown in FIG. 136, wherein the active layer is comparatively thick.

FIG. 137 shows a modification of the IGBT shown in FIG. 136. The modified IGBT is characterized in that the n type active layer 452 is comparatively thick, having a portion located beneath the n type buffer layer 454. In other words, the n type buffer layer 454 is formed in the surface of the n type active layer 452. The p type drain layer 456 is formed in the surface of the buffer layer 454. The buffer layer 454 prevents punch-through, serving to enhance the breakdown voltage of the IGBT. The layer 454 also serves to reduce the efficiency of injecting holes from the p type drain layer 456 into the active layer 452, thus raising the turn-off speed of the IGBT, though increasing the on-resistance thereof.

Figure 138:
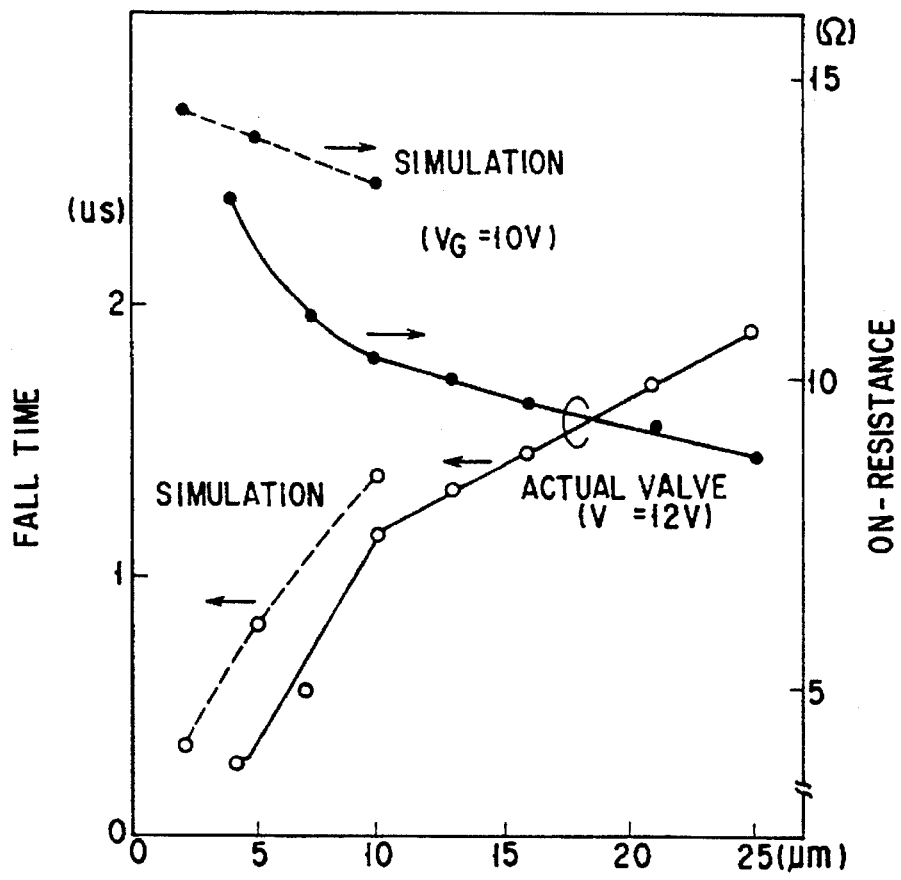
FIG. 138 is a graph representing the relation between the thickness of the active layer and the on-resistance, and the relation between the thickness and the turn-off time of the IGBT.

FIG. 138 represents the relation between the thickness of the active layer 452 and the on-resistance. The figure also also shows the relation between the thickness of the layer 452 and the fall time within which the IGBT is turned off when a current flows in the IGBT in the density of 100 A/cm$^2$. In FIG. 138, the broken lines indicate the simulated relations. As can be understood from FIG. 138, the on-resistance gradually increases as the thickness of the n type active layer 452 decreases. In contrast, the fall time greatly decreases as the thickness of the layer 452 decreases; in particular, it abruptly decreases when the thickness is 10 μm or less. The on-resistance increases when the thickness of the layer 452 is 10 μm or less. Hence, it is desirable that the n type active layer 452 have a thickness ranging from 4 μm to 10 μm.

Figure 139:
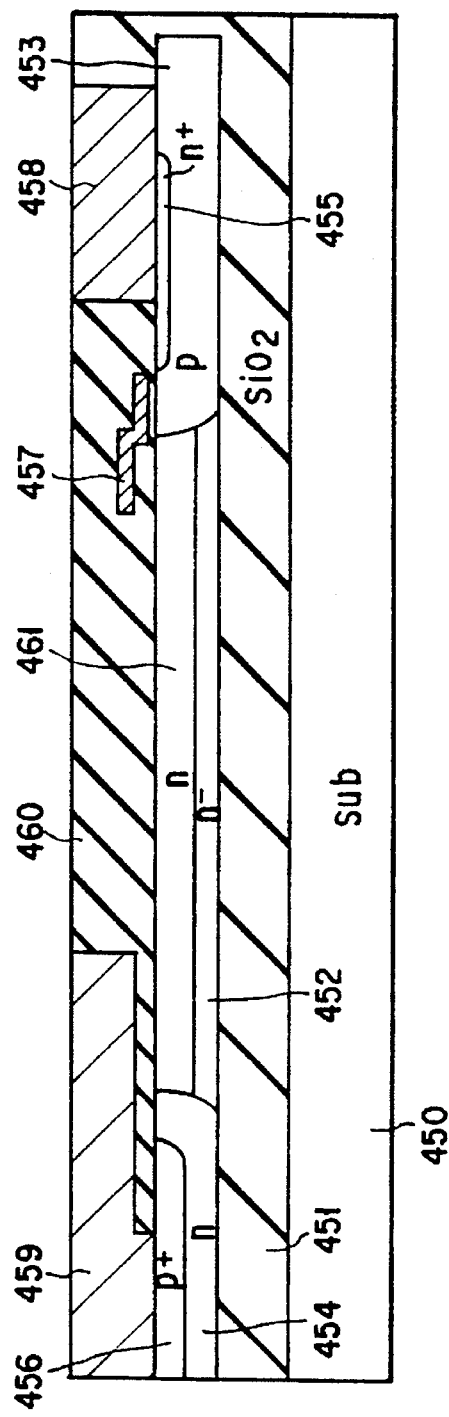
FIG. 139 is a cross sectional view showing a second modification of the IGBT shown in FIG. 136, wherein the n type impurity layer has been formed by diffusing the impurity from the entire surface of the active layer.

FIG. 139 shows a modification of the IGBT shown in FIG. 136. This modified IGBT is characterized by an n type impurity layer 461 which has been formed by diffusing the impurity from the entire surface of the active layer 452. The active layer 452 has a thickness of 10 μm or less, preferably 5 μm or less. The active layer 452 has a vertical gradient of impurity concentration. The electric field concentration at the bottom of the active layer 452 is moderated, improving the trade-off and increasing the breakdown voltage.

Figure 140:
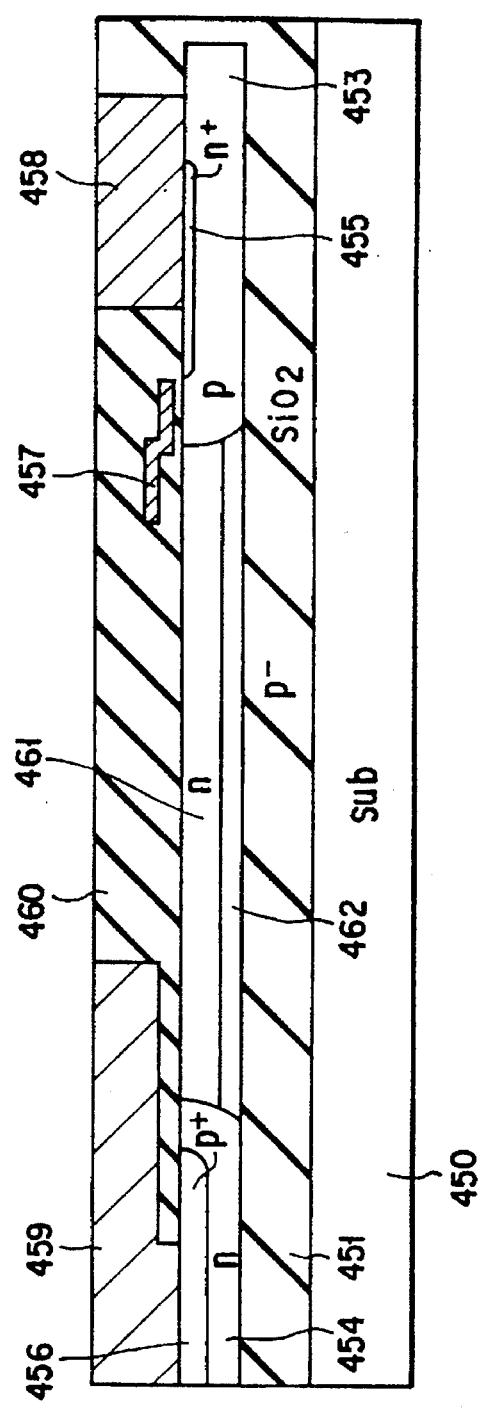
FIG. 140 is a cross section view showing a modification of the IGBT shown in FIG. 139, which has a p⁻ type active layer, instead of an n⁻ type active layer.

FIG. 140 shows a modification of the IGBT shown in FIG. 139, which has a p$^-$ type active layer, instead of an n$^-$ type active layer. An n type impurity layer 461 which has been formed by diffusing the impurity from the entire surface of the active layer 452. This IGBT has high breakdown voltage for the same reason as the IGBT shown in FIG. 139.

Figure 141:
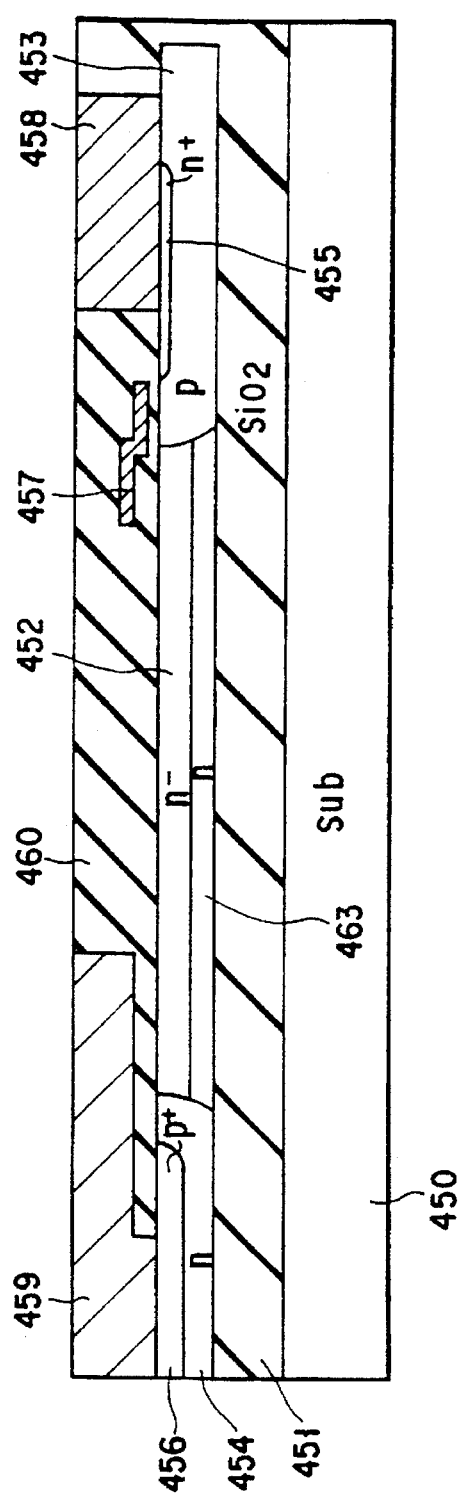
FIG. 141 is a cross sectional view showing a third modification of the IGBT shown in FIG. 136, wherein the n type impurity layer has been formed by diffusing the impurity from the entire bottom of the active layer.

FIG. 141 shows another modification of the IGBT shown in FIG. 136. In this modified IGBT, the n type impurity layer 463 has been formed by diffusing the impurity from the entire bottom of the active layer 452. The active layer 452 therefore has a vertical gradient of impurity concentration. The electric field concentration at the bottom of the active layer 452 is moderated, improving the trade-off and increasing the breakdown voltage.

Figure 142:
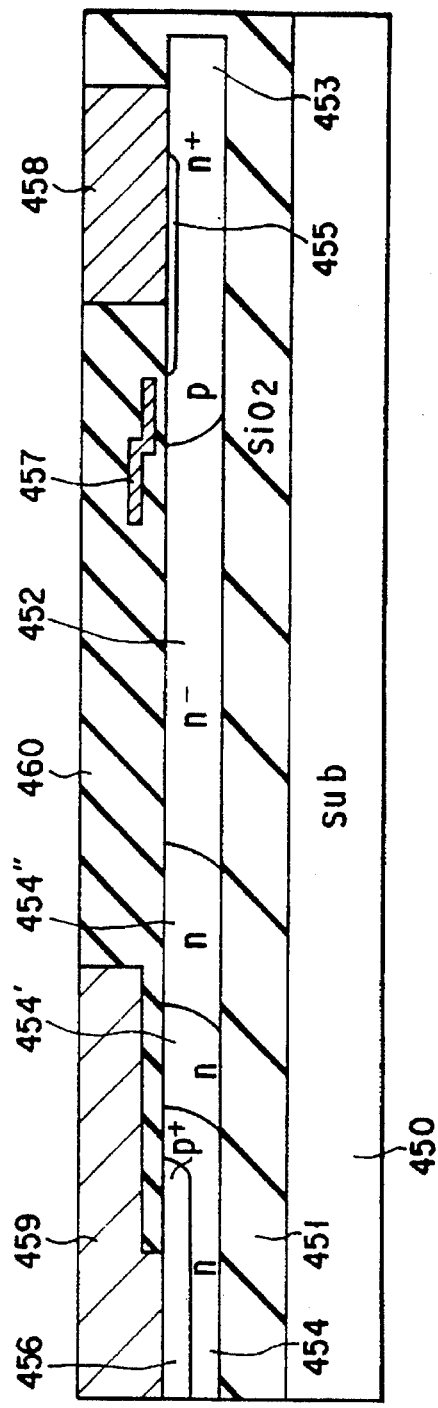
FIG. 142 is a cross sectional view showing a fourth modification of the IGBT shown in FIG. 136, wherein the n type base layer has been formed by diffusing the impurity twice or more, each time using a diffusion window of a different width.

FIG. 142 illustrates still another modification of the IGBT shown in FIG. 136, wherein the n type base layer has been formed by diffusing the impurity twice or more, each time using a diffusion window of a different width. In this IGBT, too, the diffusion layers 454' and 454" forming the base layer 454 mitigate the lateral electric field, whereby the trade-off is improved and the breakdown voltage is increased.

Figure 143:
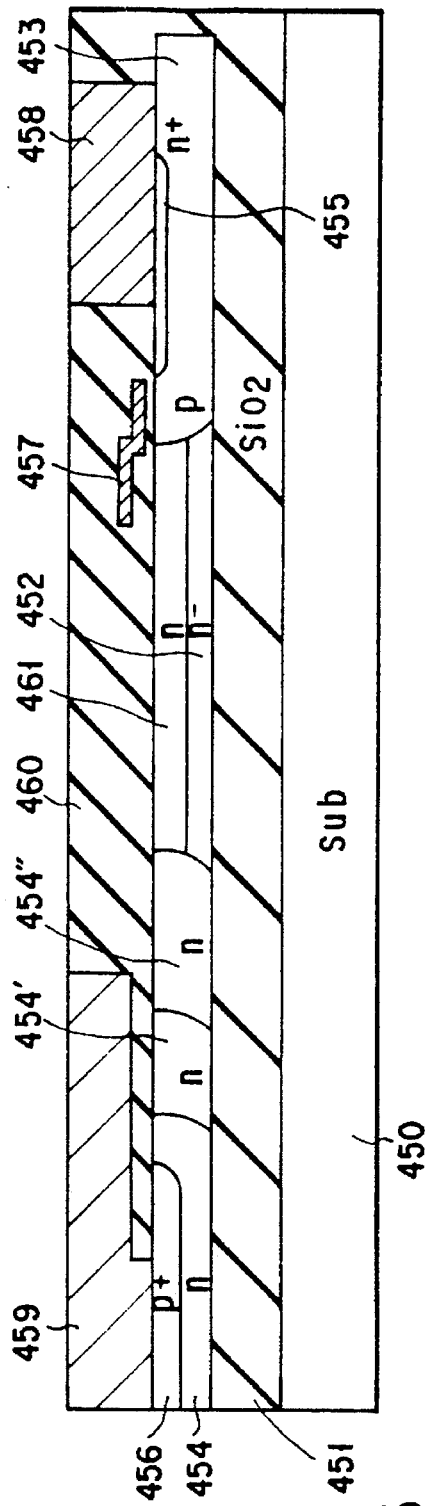
FIG. 143 is a cross sectional view illustrating a first modification of the IGBT shown in FIG. 142, wherein the n type impurity layer has been formed by diffusing the impurity from the entire surface of the active layer.
Figure 144:
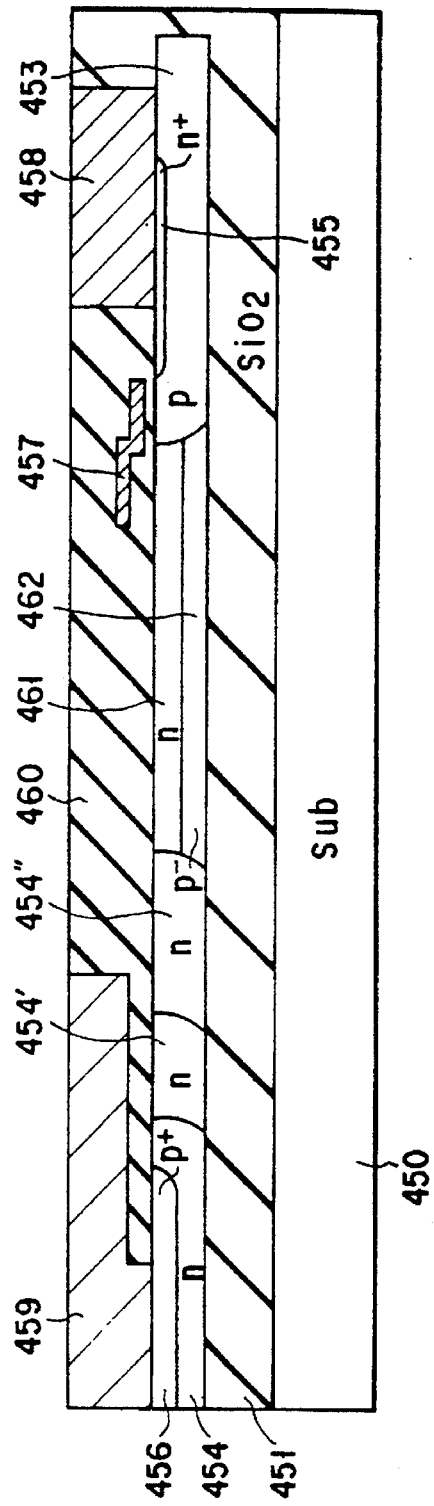
FIG. 144 is a cross sectional view showing a modification of the IGBT shown in FIG. 143, which has a p⁻ type active layer, instead of an n– type active layer.
Figure 145:
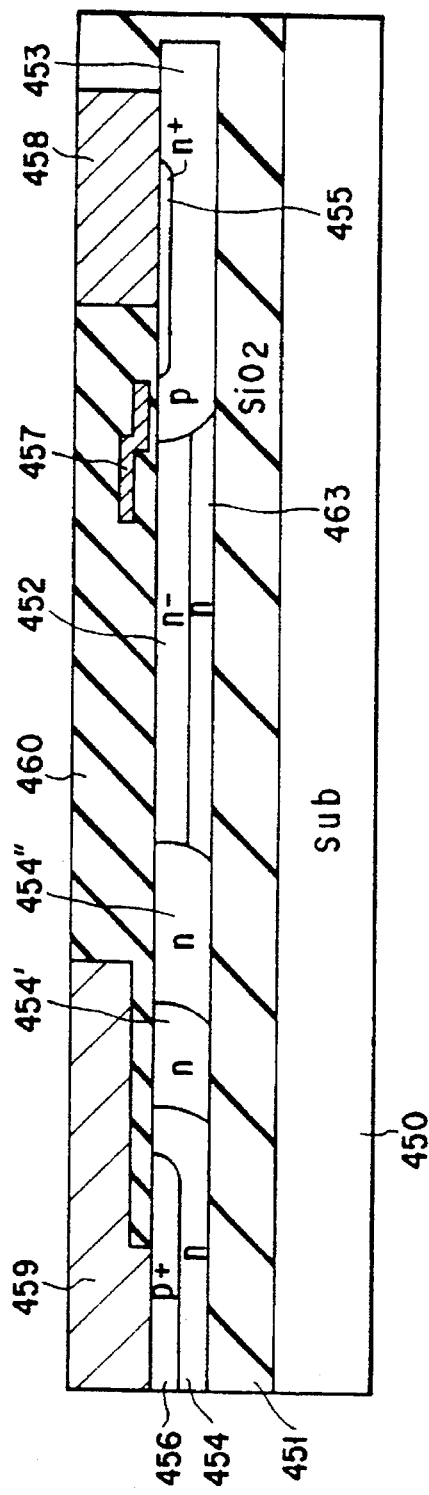

FIGS. 143 to 145 show three modifications of the IGBT shown in FIG. 142, which have been formed by modifying the active layer in the same way as in the IGBTs of FIGS. 139 to 141, respectively. With the structures of FIGS. 143 to 145, too, the trade-off is improved and the breakdown voltage is increased.

Figure 146:
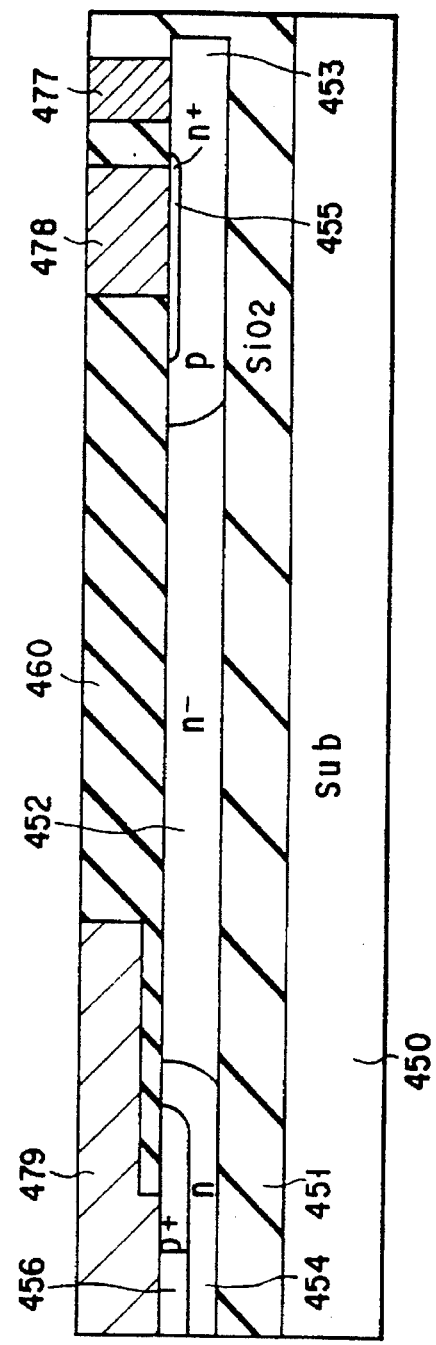

FIG. 146 illustrates a thyristor manufactured by partly modifying the structure shown in FIG. 136. In this figure, the reference numerals 477, 478, and 479 denote the gate, the cathode, and the anode. This structure can applied to other high breakdown devices of lateral structure, such as EST, MCT, and GTO.

Figure 147:
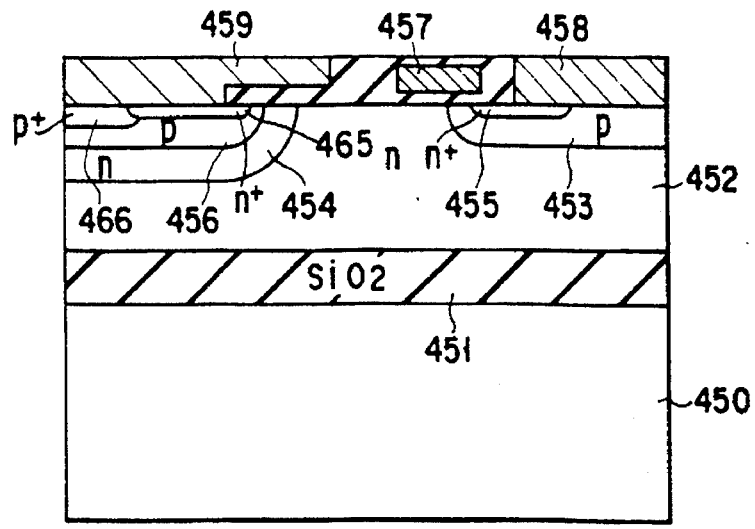

FIG. 147 shows a lateral type IGBT manufactured by modifying the drain of the IGBT shown in FIG. 137. An n type layer 465 and a p type layer 466, both having a high impurity concentration, are formed in the surface of the p type drain layer 456. The drain electrode 459 contacts both layers 465 and 466. The n type layer 465 is provided for control the hole-injection efficiency, thereby to enhance the turn-off speed of the IGBT. The n type layer 465 may either be a single stripe or be island-shaped comprising a plurality of strips. The p type layer 466 is provided for improving the drain contact, but may be dispensed with. Also in this modified IGBT, the n type active layer 452 is thin, preferably 10 μm or less thick, whereby the turn-off speed is increased.

Figure 148:
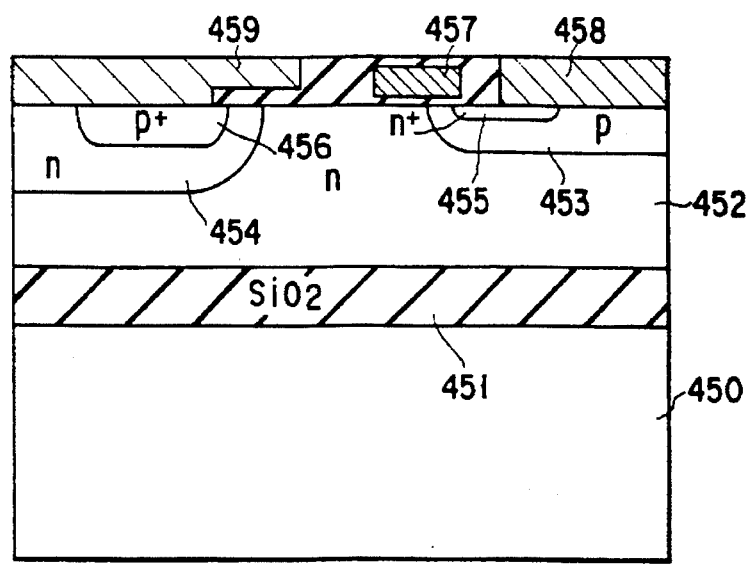

FIG. 148 also shows an IGBT manufactured by modifying the drain of the IGBT shown in FIG. 137. This is anode-short-circuited IGBT, in which part of the n type buffer layer 454 contacts the drain electrode 459, and which has an improved turn-off speed. The turn-off speed is even increased since the n type active layer 452 is thin. In this IGBT, an n type layer may be formed at the contact between the n type buffer layer 454 and the drain electrode 459, in order to reduce the contact resistance.

Figure 149:
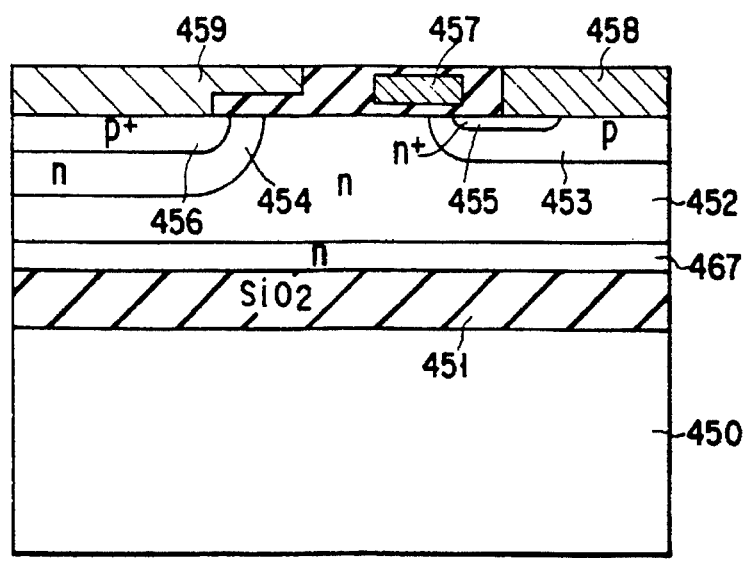

FIG. 149 shows a modification of the IGBT shown in FIG. 137. This modified IGBT is characterized in that an n type layer 467 is formed in the bottom of the n type active layer 452. The layer 467 has a higher impurity concentration than the active layer 452. Generally, the thinner the active layer, the more the vertical electric field located below the drain layer is intensified, and the more the breakdown voltage is reduced. In this IGBT, the electric field in the oxide film 451 is intensified by the space charge generated as the n type layer 467 is depleted, but the electric field in the active layer 453 is mitigated. As a result, the IGBT maintains its high breakdown voltage. Since the n type active layer 453 is thin in this IGBT, too, the turn-off speed is high.

Figure 150:
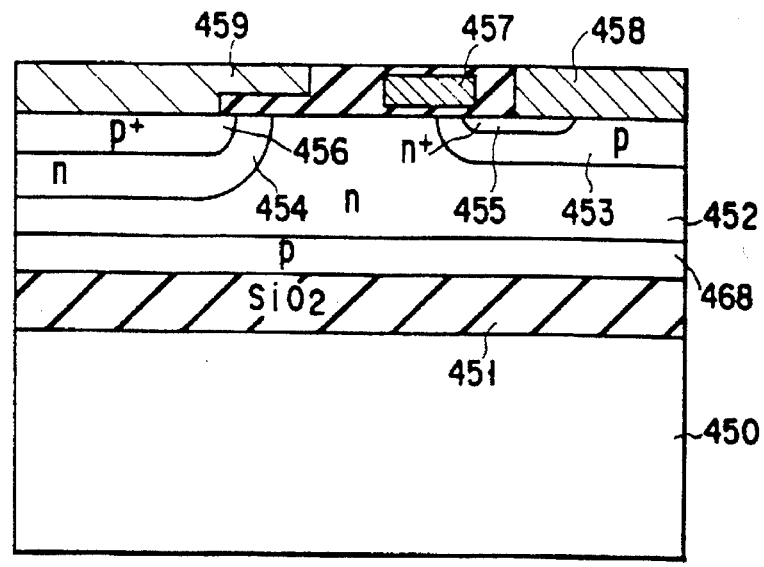

FIG. 150 shows another modification of the IGBT shown in FIG. 137. In this modified IGBT, a p type silicon layer 468 is formed on the oxide film 451, the n type active layer 452 is formed on the p type silicon layer 468 by diffusing the impurity into the silicon layer 468, and the IGBT elements are formed in the active layer 452. The p type semiconductor layer 468 including the active layer 452 is thin, preferably 10 μm or less thick. The device is therefore a lateral type IGBT which has a high turn-off speed.

Figure 151:
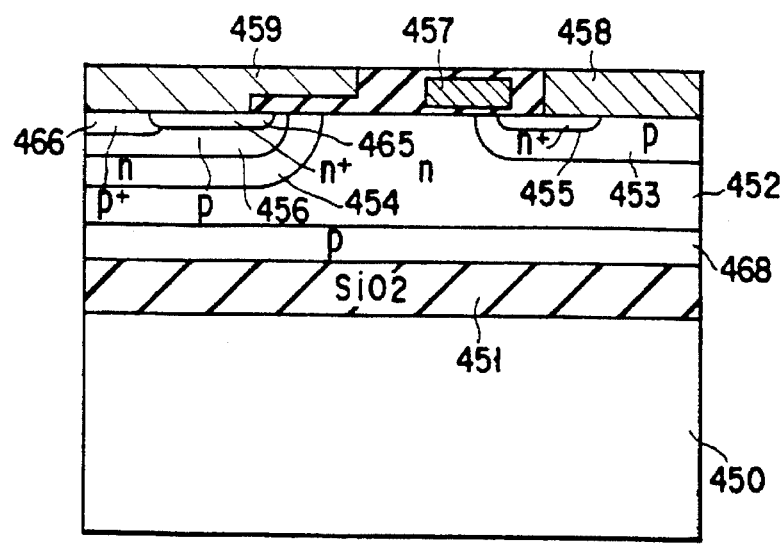

FIG. 151 shows still another modification of the IGBT shown in FIG. 137. As in the modified IGBT of FIG. 150, an n type active layer 452 is formed by diffusion in the surface of the p type silicon layer 468 isolated by the oxide layer 451 from the silicon substrate (support substrate) 450. The IGBT elements identical to those shown in FIG. 147 are formed in the n type active layer 452.

Figure 152:
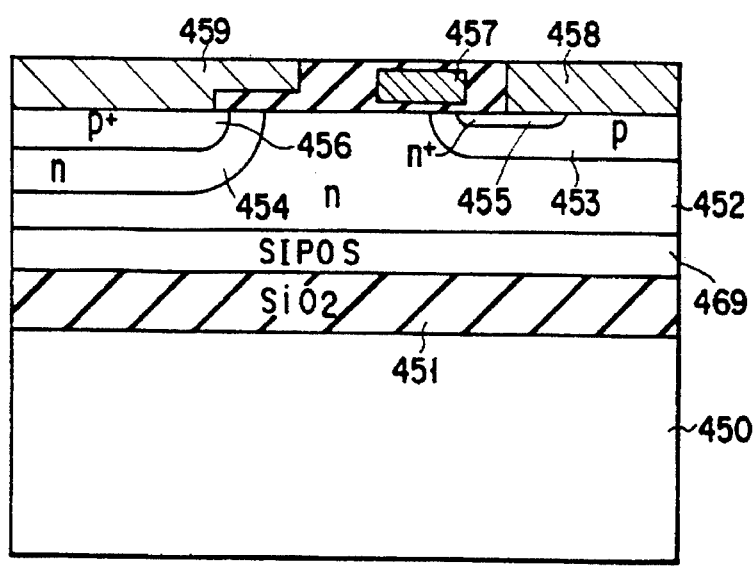

FIG. 152 shows another modification of the IGBT shown in FIG. 137. This modified IGBT differs from the IGBT of FIG. 137 and any other modification thereof, in that use is made of a dielectric isolation substrate. To be more precise, an SIPOS film 469 is interposed between the n type active layer 452 and the oxide film 451. The SIPOS film 469 may be replaced by a film which has a high respectively or high dielectric constant. Since the n type active layer 452 is relatively thin as in the IGBT of FIG. 137 and the other modifications thereof, this modified IGBT can be turned off at high speed, too.

Needless to say, the IGBTs shown in FIG. 136, FIG. 137, and FIGS. 139 to 152 can be changed to P-channel lateral IGBTs, merely by inverting the conductivity types of their elements.

FIG. 153 illustrates a high breakdown voltage diode which is a fifth embodiment of the fifth aspect of the present invention. As shown in this figure, a silicon oxide film 411 is formed on a silicon substrate 410, and an n⁻ type high resistance silicon active layer 412 is formed on the silicon oxide film 411. A p⁺ type layer 413 and an n⁺ type layer 414, both having a high impurity concentration, are formed in the surface of the silicon active layer 412, spaced away from each other. These layers 413 and 414 are used anode region and cathode region, respectively. An anode electrode 415 is formed on the p⁺ type layer 413, and a cathode electrode 416 is formed on an n⁺ type layer 414. An n type buffer layer 471 is formed in the bottom of the silicon active layer 412.

When a positive potential is applied to the cathode electrode 416 while the substrate 410 and the anode electrode 415 remain grounded, the pn junction will be reverse-biased. As a result, a depletion layer develops in the silicon active layer 412, and another depletion layer develop upwards from the interface between the oxide film 411 and the active layer 412. When the voltage applied increases over a specific value, the silicon active layer 412 is fully depleted. At the same time, an intense electric field is generated in the silicon active layer 412, extending downwards from the p⁺ type layer 413.

When reverse-biased, the n type buffer layer 471 formed in the bottom of the active layer 412 is depleted, whereby positive space charge is generated in the buffer layer 471. The space charge mitigates the electric field in the silicon active layer 412, whereby greater part of the voltage is applied on the oxide film 411 located beneath the silicon active layer 412. The diode therefore has a high breakdown voltage. The buffer layer 471 contains an impurity in a total amount of $3 \times 10^{12}$ cm⁻² or less, more preferably $5 \times 10^{11}$ to $2 \times 10^{12}$ cm⁻².

Figure 155:
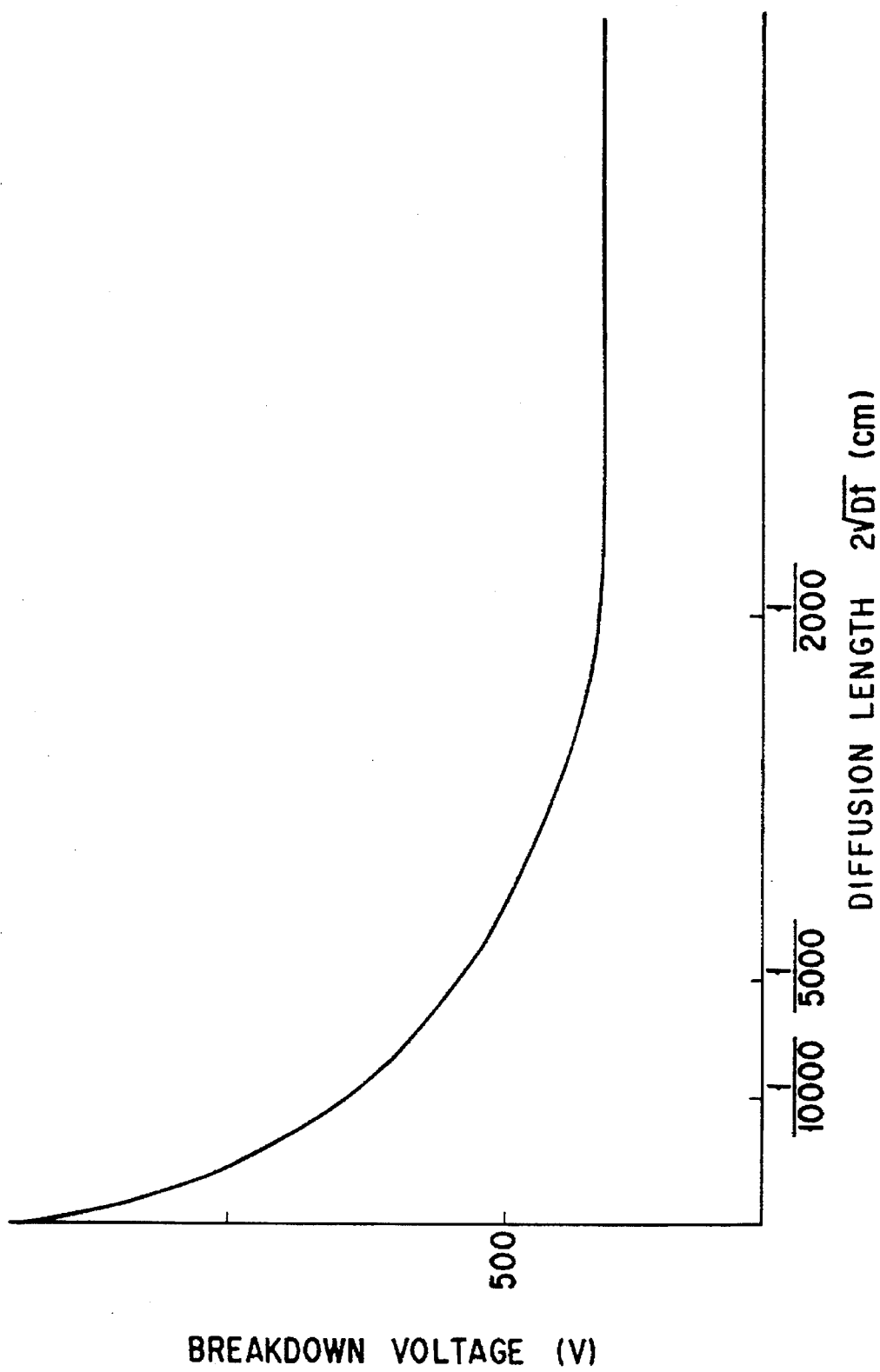

FIG. 155 is a graph representing the relationship between the diffusion length, $2 \times (Dt)^{1/2}$, of the n type buffer layer 471 and the breakdown voltage of the diode. The diffusion lengths plotted on the abscissa are of values, each for a optimal doped impurity amount. The curve shown in FIG. 155 is one obtained by determining the total amount of the impurity in the n type buffer layer 471. As evident form FIG. 155, the shorter the diffusion length, the higher the breakdown voltage —in the region where the diffusion length is less than 1/2000 cm. In this region, the breakdown voltage is comparatively high. In the region where the diffusion length is less than 1/4000 cm, the diode of FIG. 153 has a breakdown voltage of 500 V or more, which a diode must have to be driven in 200 V systems. Hence, the diode shown in FIG. 153 can be incorporated in 200 V systems.

FIG. 154 shows a modification of the diode shown in FIG. 153, wherein the n type buffer layer 472 is formed in a selected bottom portion of the silicon active layer 412. Formed at this particular position, the buffer layer 471 effectively moderates the electric field. This is because a greater part of the voltage is applied to the silicon active layer 412 located immediately below the drain. The modified diode can therefore has a sufficiently high breakdown voltage.

Figure 156:
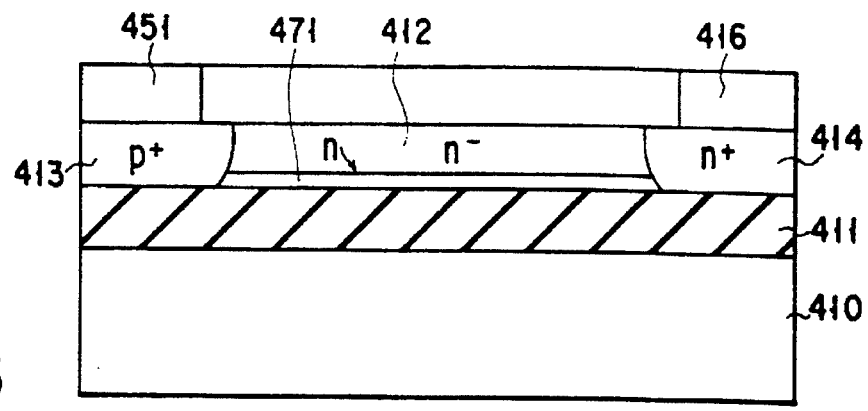

FIG. 156 shows another modification of the diode shown in FIG. 153. This modified diode is characterized in that the active layer 412 is thinner than in the diode of FIG. 153. Since the layer 412 is thin, the n type impurity layer reaches the oxide film 411 formed beneath the active layer 412. Nonetheless, the n type buffer layer 471, which is formed on the bottom of the active layer 412, serves to impart high breakdown voltage to the diode.

FIG. 157 shows a modification of the diode shown in FIG. 154 and characterized in that the active layer 412 is thinner. Although the n type impurity layer reaches the oxide film 411, the n buffer layer 472, which is formed in a selected bottom portion of the silicon active layer 412, effectively mitigates the electric field since a greater part of the voltage is applied to the silicon active layer 412 located immediately below the drain. This modified diode can therefore has a sufficiently high breakdown voltage.

As indicated, in the fifth embodiment of the fifth aspect of the invention, the n type buffer layer formed on the bottom of the active layer secure a high breakdown voltage, despite the active layer is relatively thin. An n type buffer layer may be formed in the same way in the diodes shown in FIGS. 113 to 122 which are the first embodiment of the fifth aspect of the invention.

FIG. 158 is a cross sectional view illustrating a high-speed diode which is a sixth embodiment of the fifth aspect of the present invention and which is formed on a dielectric isolation substrate.

As shown in FIG. 158, an insulating film 483 is formed between a semiconductor substrate 481 and a high resistance n type semiconductor substrate 482. The substrates 481 and 482 and the insulating film 483 constitute a dielectric isolation substrate. A p type anode layer 484 and an n type cathode layer 485 are formed in the surface of the high resistance n type semiconductor substrate 482. An anode electrode 486 is formed on the anode layer 484, and a cathode electrode 487 on the cathode layer 485.

As far as the structural features described in the preceding paragraph are concerned, the diode of FIG. 158 is similar to conventional ones. The diode is characterized in the following respects. First, an n⁺ type impurity layer 488 is formed in a selected surface portion of the anode layer 484, and a p⁺ type impurity layer 489 is formed in a selected surface portion of the cathode layer 485. Second, the anode electrode 486 is placed in ohmic contact with both the anode layer 484 and the n⁺ type impurity layer 488, and the cathode electrode 487 is set in ohmic contact with both the cathode layer 485 and the p⁺ type impurity layer 489.

The semiconductor substrate 482 in which the anode layer 484 and the cathode layer 485 are formed has a thickness of 2 to 10 µm. This specific range of thickness is important as will be explained with reference to FIG. 159.

FIG. 159 is a graph which represents the relationship which the on-voltage Vf and reverse restoration time trr of the diode shown in FIG. 158 have with respect to the thickness ts of the semiconductor substrate 482. As can be understood from FIG. 159, the less the thickness ts of the substrate 482, the shorter the reverse restoration time trr. It is also clear from FIG. 159 that trr≦0.3 µsec if ts≦10 µm, and that the on-voltage Vf increases sharply if ts≦2 µm. Hence, the reverse restoration time trr of the diode can be rendered relatively short without lifetime control (e.g., application of an electron beam) if the thickness ts of the semiconductor substrate 482 is set at 2 to 10 µm. Since the substrate 482 has a thickness of 2 to 10 µm, the diode of FIG. 158 can operate at high speed.

A dielectric isolation semiconductor substrate for use in a seventh embodiment of the fifth aspect of the invention will now be described, with reference to FIGS. 160A and 160B. FIG. 160A is a plan view of the substrate, and FIG. 160B is a sectional view taken along line A—A' in FIG. 160B. As shown in FIG. 160B, the substrate comprises an upper semiconductor substrate 491, a lower semiconductor substrate 493, and an oxide insulating film 492 interposed between the substrates 491 and 493. The surface of the upper substrate 491 has been polished, reducing the thickness of the substrate 491 to a a predetermined value. The lower substrate 493 has grooves 494 in its surface. The grooves 494 form a lattice, some extending parallel to one another and the others extending parallel to one another and at right angles to the first-mentioned grooves. An oxide film 495 covers the surface of the lower substrate 493, filling the grooves 494.

How to manufacture the dielectric isolation semiconductor substrate shown in FIGS. 160A and 160B will be explained, with reference to FIGS. 161A to 161C.

First, as shown in FIG. 161A, the upper silicon substrate 491 and the lower silicon substrate 493 are bonded together, sandwiching the oxide film 492 between them. Grooves 494 are then cut in the surface of the lower substrate 493, each having a width of several microns, preferably 1 μm or less, and a depth of several microns to tens of microns. Next, as shown in FIG. 161B, an oxide film 495 is formed on the surface of the lower substrate 493, filling the grooves 494. The grooves 494 will be filled completely with oxide 495 if they have a width of 1 μm or less. Thereafter, as shown in FIG. 161C, the surface of the upper substrate 491 is polished, reducing the thickness to a predetermined value.

Since the oxide films 492 and 499 sandwiches the silicon substrate 493, the warping of the substrates 493 is minimized. It is only the surface region of the oxide film 495 that is removed after device elements have been formed in the dielectric isolation semiconductor substrate. Thus, the film 495 remain covering the surface of the lower substrate 493, as well as in the grooves 494. It is therefore unnecessary to form a protective film on the surface of the lower silicon substrate 493. This helps to simplify the method of manufacturing devices in the dielectric isolation semiconductor substrate.

The dielectric isolation semiconductor substrate shown in FIGS. 160A and 160B warps only little even if the oxide film 492 is relatively thick. This serves to simplify the method of manufacturing devices in the substrate, and ultimately contributes to production of low-cost power ICs.

FIG. 162 shows a modification of the semiconductor substrate shown in FIGS. 160A and 160B. The modified substrate is characterized in that a polycrystalline silicon layer 496 is formed on the oxide film 495 by means of low-pressure CVD method (OK?). This modified is advantageous in the case where the grooves 494 have a width of 1 μm or more. If the grooves 494 are Polycrystalline silicon 496 can be filled in the grooves 494 if the grooves 494 are 1 μm or more. If the grooves 494 are 1 μm or more deep, it is no longer possible to fill them by means of thermal oxidation. To fill the groove 494 completely, polycrystalline silicon 496 is applied in the modified substrate of FIG. 162. Since the polycrystalline silicon layer 496 covers the back of the dielectric isolation semiconductor substrate, thereby concealing the oxide film 495 completely. The oxide film 495 will not, therefore, be removed when ectchants are applied to the structure to remove other oxide films in the process of fabricating device elements.

The oxide films used as insulating films in the dielectric isolation semiconductor substrate of FIGS. 160A and 160B are oxide films can be replaced by any other electrically insulating films. Furthermore, the dielectric isolation semiconductor substrate may be formed by any method other than bonding two semiconductor substrate together.

In the fifth aspect of the invention, as described above in detail, two more more diffusion layers are formed in such specific shapes that electric field concentration is mitigated at the edge portion of the lowermost diffusion layer is mitigated (particularly, the curved portion of the bottom thereof). Therefore, any device according to the fifth aspect of the invention has dialectic isolation structure and secures a sufficiently high breakdown voltage.

High breakdown voltage semiconductor devices according to a sixth aspect of the invention will now be described.

In a dielectric isolation structure, a high breakdown voltage device and a logic circuit can be formed on one and the same substrate. SOI (Silicon on Insulation) technique is known in which a device is formed on an SOI substrate comprising an insulating film and a semiconductor (active) layer formed on the insulating film. If the SOI technique is applied to the dielectric isolation structure, the device and the logic circuit can be isolated perfectly.

A semiconductor device having an SOI substrate is known to have high breakdown voltage with respect to the vertical direction even if its active layer is as thin as 0.3 μm or less. The thin active layer serves to achieve lateral element isolation by using trenches. This element isolation is suitable and desirable for power ICs. Since the active layer is thin, however, it is necessary to lower the impurity concentration of the n⁻ type drift region in the active layer in order to increase the breakdown voltage with respect to the lateral direction. To lower the impurity concentration, the n⁻ type drift region must be 200 μm or more long. Various methods are available to lower the impurity concentration without lengthening the drift region. One of them is to form an SIPOS (Semi-Insulating Polycrystalline Silicon) layer 307 along the drift region as illustrated in FIG. 26, thereby to render the electric field intensity uniform in the horizontal direction. Another method is to provide an impurity concentration linearly varying in the horizontal direction, as is disclosed in Published Unexamined Japanese Patent Application 4-309234. These methods, however, includes some steps which are difficult to perform successfully.

In the sixth aspect of the present invention, impurity is diffused into an active layer in ordinary way several times, thereby defining an impurity concentration which varies stepwise in the lateral direction. A semiconductor device of dielectric isolation structure can thereby be provided which has high breakdown voltage without lengthening the drift region even if the active layer has a thickness of 0.3 μm or less.

The reason why the device according to the sixth aspect of the invention has a high breakdown voltage may be as follows.

If the impurity is diffused into an active layer having a thickness of 0.3 μm or less, the layer will have an impurity concentration which is virtually uniform in the vertical direction. Assume that the impurity concentration n(x) at any stepped portion of the device is of Gaussian distribution. Then, the following equation will hold:

$$n(x) = n_0 \exp(-x^2/a^2)$$

where $n_0$ is a difference in the impurity concentration between the top and bottom of the step, and "a" is a diffusion length $$(a = 2\sqrt{Dt}).$$

The maximum gradient $\Delta n_{max}$ for the equation is obtained at $x = a/\sqrt{2}$. Therefore:

$$\Delta n_{max} = |dn/dx(x = a/\sqrt{2})| =$$

$$|-\sqrt{2} \times \exp(-1/2) \times n_0/a| = 0.85776 \times n_0/a.$$

The electric field distribution in the lateral direction and that in the vertical direction are calculated by the Poisson equation as follows:

$$n(x) = \epsilon_s/q \cdot (dE_x/dx + dE_y/dy)$$

where $\epsilon_s$ is the permittivity in Si and q is the elementary charge.

The Avalanche breakdown voltage is given by the ionization integral as follows:

$$I = \int \alpha(E) dx$$

where $\alpha(E)$ is ionization rate and defined by the following equation:

$$\alpha(E) = A \times \exp(-B/E)$$

where A and B are constants.

From these numerical calculations, we obtained the following relationship between $n_0$ and a:

$$n_0 \sqrt{a} \leq 1 \times 10^{19}.$$

Hence, the following relationship is required:

$$\Delta n_{max} \leq 0.85776 \times 10^{19} / \sqrt{a}.$$

As mentioned above, the impurity concentration in the active layer varies stepwise in the lateral direction. The electric field in each stepped portion is much less intense than that at the non-stepped portion. Therefore it is desirable that the steps be narrowed. If the steps are too narrow, however, the electric fields at any adjacent steps interfere with each other, inevitably intensifying the electric field as a whole. In view of this, the steps should better be twice or more wider than the diffusion length, preferably about three to four times the diffusion length.

FIG. 163 is a graph representing the relationship between diffusion length and breakdown voltage, and FIG. 164 is a graph representing the relationship between the breakdown voltage and the number of steps. As can be seen from these figures, the sixth aspect of the invention can provide a semiconductor device of dielectric isolation structure which has high breakdown voltage without lengthening the drift region.

FIG. 165 illustrates a dielectric isolation semiconductor device according to the sixth aspect of the present invention. As shown in FIG. 165, a silicon oxide film (isolation insulating film) 512 is formed on a silicon substrate 511 and the thickness of this film is 3 μm. An $n^-$ type high resistance silicon (active) layer 513 is formed on the silicon oxide film 512, and the $n^-$ type active layer 513 is 0.1 μm thick and has an impurity concentration of $1.0 \times 10^{17}/cm^3$. A drain region 514 and a source region 515 are formed in the $n^-$ type active layer 513. A drain electrode 516 and a source electrode 517 are formed on these regions 514 and 515, respectively. An insulating film 518 is formed, extending between the electrodes 514 and 515. A gate electrode 519 is formed within the insulating film The $n^-$ active layer 513 has impurity concentration varying in three steps, in the lateral direction. This three-step distribution of impurity concentration can be achieved in the following way.

First, a first mask is formed on the $n^-$ active layer 513. Phosphorus is ion-implanted through the opening of the first mask into the layer 513 in a dose of $2 \times 10^{12}$ cm$^{-2}$. Then, phosphorus is ion-implanted into the layer 513 in the same dose (i.e., $2 \times 10^{12}$ cm$^{-2}$) by using a second mask having an opening longer than that of the first mask. Further, phosphorus is ion-implanted into the layer 513 in the same dose, by using a third mask having an opening longer than that of the second mask. The difference in the width of opening of each mask used is twice more more longer than the diffusion length, preferably three to four times longer. Next, the entire structure is heat-treated at about 1200° C., thereby diffusing the phosphorus in the active layer 513. As a result, the impurity concentration of the active layer 153 is varied in the lateral direction of the structure, in three steps, as illustrated in FIG. 166.

Devices identical to the dielectric isolation semiconductor device of FIG. 165 were made for experimental purpose. They were tested for their avalanche breakdown voltages, where were found to be 700 V on average.

The active layer 513 of the embodiment of FIG. 165 may have impurity concentration distribution of two to ten steps, instead of three steps as shown in FIG. 166. In the case where the number of steps is increased, the device which has the shorter diffusion length can have a sufficiently high breakdown voltage. Conversely, in the case where the number steps is decreased, the diffusion length must be increased in order that the device has a sufficiently high breakdown voltage.

FIG. 167 is a graph illustrating the relationship between the number of steps and the diffusion length with the breakdown voltage of the device taken as parameter. The curves shown in FIG. 167 are represented by the following general equation:

$$(n+1)[a+(V_b/200)+1.5] = V_b^2/13600$$

where $V_b$ is breakdown voltage (V), a is diffusion length (μm), and n is the number of steps.

As has been explained, in the sixth aspect of the invention it is possible to provide a dielectric isolation semiconductor device which has high breakdown voltage without lengthening the diffusion length even if the active layer has a thickness of 0.3 μm or less.

What is claimed is:

1. A diode comprising:

a substrate;

an insulating layer directly bonded with said substrate;

a high resistance semiconductor layer formed on said insulating layer;

a first impurity region of a first conductivity type, formed in said high resistance semiconductor layer;

a second impurity region of a second conductivity type, formed in said high resistance semiconductor layer;

a third impurity region of a second conductivity type, formed in a surface portion of said first impurity region;

a first electrode formed on said first impurity region and said third impurity region; and a second electrode formed on said second impurity region.

2. The diode according to claim 1, further comprising a fourth impurity region of a first conductivity type, formed in a surface of said second impurity region.

3. The diode according to claim 1, wherein said high resistance semiconductor layer has a thickness of 2 to 10 μm.

4. A diode comprising:

a substrate;

an insulating layer directly bonded with said substrate;

a high resistance semiconductor layer formed on said insulating layer;

a first impurity region of a first conductivity type, formed in said high resistance semiconductor layer;

a second impurity region of a second conductivity type, formed in said high resistance semiconductor layer;

a third impurity region of a first conductivity type, formed in a surface portion of said second impurity region;

a first electrode formed on said first impurity region and;

a second electrode formed on said second impurity region and said third impurity region.

5. The diode according to claim 4, wherein said high resistance semiconductor layer has a thickness of 2 to 10 μm.

* * * * *